United States Patent
Shahi et al.

(10) Patent No.: US 12,550,292 B1
(45) Date of Patent: Feb. 10, 2026

(54) HYBRID LIQUID-BASED DATA CENTER COOLING SYSTEMS

(71) Applicant: NVIDIA Corporation, Santa Clara, CA (US)

(72) Inventors: Pardeep Shahi, Arlington, TX (US); Ali Heydari, Napa, CA (US); Bahareh Eslami, Santa Clara, CA (US); Vahideh Radmard, Johnson city, NY (US)

(73) Assignee: NVIDIA Corporation, Santa Clara, CA (US)

( * ) Notice: Subject to any disclaimer, the term of this patent is extended or adjusted under 35 U.S.C. 154(b) by 220 days.

(21) Appl. No.: 18/108,392

(22) Filed: Feb. 10, 2023

(51) Int. Cl.
H05K 7/20 (2006.01)

(52) U.S. Cl.
CPC ..... *H05K 7/20263* (2013.01); *H05K 7/20236* (2013.01); *H05K 7/20254* (2013.01); *H05K 7/20272* (2013.01); *H05K 7/20772* (2013.01)

(58) Field of Classification Search
CPC .......... H05K 7/20236; H05K 7/20254; H05K 7/20772; H05K 7/20781; H05K 7/20263; H05K 7/20272
See application file for complete search history.

(56) References Cited

U.S. PATENT DOCUMENTS

| | | | | |
|---|---|---|---|---|
| 9,629,280 | B2 * | 4/2017 | Johnson | H05K 7/20254 |
| 2007/0201210 | A1 * | 8/2007 | Chow | H05K 7/20727 |
| | | | | 361/695 |
| 2018/0139864 | A1 * | 5/2018 | Hayashi | H05K 7/2039 |
| 2021/0243917 | A1 * | 8/2021 | Gao | H05K 7/20754 |
| 2022/0354026 | A1 * | 11/2022 | Kelley | H05K 7/20818 |
| 2023/0156959 | A1 * | 5/2023 | Malouin | H05K 7/20781 |
| | | | | 361/699 |
| 2023/0217625 | A1 * | 7/2023 | Gao | H05K 7/20781 |
| 2024/0032243 | A1 * | 1/2024 | Matteson | H05K 7/20263 |
| 2024/0196563 | A1 * | 6/2024 | Jia | H05K 7/20263 |

FOREIGN PATENT DOCUMENTS

| | | | |
|---|---|---|---|
| CN | 115413183 A | * 11/2022 | |
| JP | 6790855 B2 | * 11/2020 | G06F 1/20 |

* cited by examiner

*Primary Examiner* — Zachary Pape
(74) *Attorney, Agent, or Firm* — Lowenstein Sandler LLP

(57) ABSTRACT

Systems, methods, and technique for improved data center cooling. In at least one embodiment, a data center cooling system may include a heat exchange device that exchanges heat between a first coolant in a first cooling loop, which may absorb heat from one or more first components of a computing system, and a second liquid coolant in a second cooling loop, which may absorb heat from one or more second components of the computing system.

20 Claims, 49 Drawing Sheets

HYBRID LIQUID-BASED DATA CENTER COOLING SYSTEMS

FIELD

The present disclosure generally relates to data center cooling systems, and more particularly, data center cooling systems that employ liquid cooling techniques.

BACKGROUND

Cooling systems play an important role in data center operations and are responsible for cooling the data center environment and/or the computing and communications systems operating therein. Modern data centers, for example, can be densely populated with racks of computer servers (e.g., high-performance computing clusters) and network communications equipment (e.g., network switches) that can generate significant amounts of heat during operation, which the data center cooling system captures and transfers to an external environment (e.g., outside the data center premises). Existing cooling systems, however, are unable to effectively and/or efficiently cool modern data centers.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
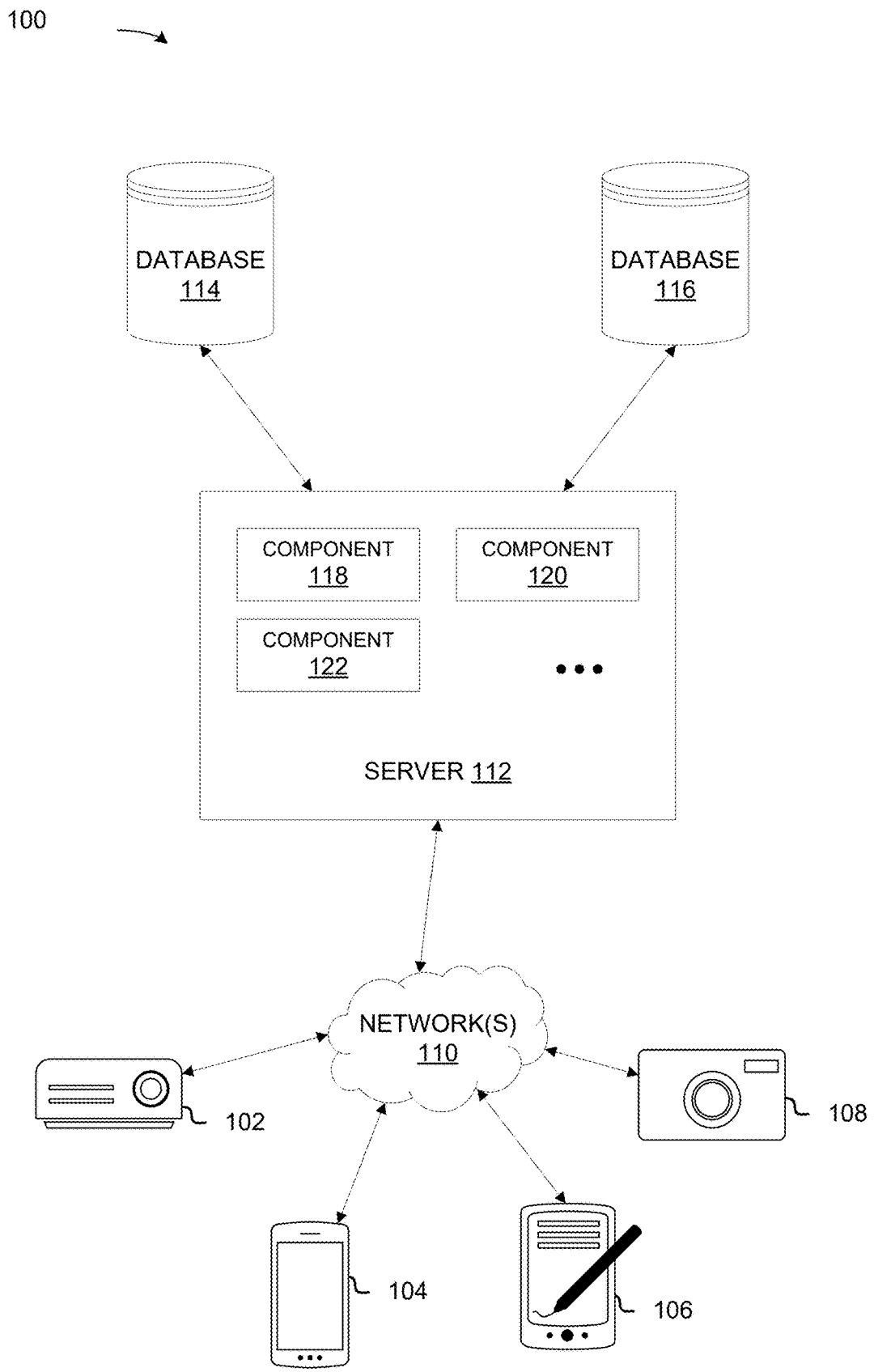
FIG. 1 illustrates a distributed system, in accordance with at least one embodiment.

In description that follows, numerous specific details are set forth to provide a more thorough understanding of at least one embodiment. However, it will be apparent to one skilled in applicable art that inventive concepts may be practiced without one or more of these specific details.

Cooling systems play an important role in data center operations and are responsible for cooling a data center environment and/or computing systems operating therein. Modern data centers, for example, can be densely populated with racks of computer servers (e.g., high-performance computing clusters) and network communications equipment (e.g., network switches) that can generate significant amounts of heat during operation, which a data center cooling system may capture and transfer to an external environment (e.g., outside a data center premises).

Conventional air-cooling systems circulate relatively cool air through a data center to draw heat away from computing systems and their components, which may then be discharged to an outside environment. But due to a relatively low thermal capacity of air, high flow rates are needed in such cooling systems. Sustaining such high flow rates, however, requires a significant amount of power, making air cooling systems relatively inefficient. Furthermore, even at high flow rates, an amount of cooling provided by such systems is limited and frequently inadequate for modern data centers.

More recently, liquid cooling techniques have been used in data center cooling systems, but current solutions remain limited in their ability to provide for effective and/or efficient cooling. For example, in direct-to-chip liquid cooling systems, heat generated by a component is transferred to a liquid coolant via a heat transfer device, such as a cold plate, thermally coupled to a component. But existing direct-to-chip (or direct) liquid cooling systems typically only target specific system components and rely upon air cooling to cool all other system components. As another example, in immersive liquid cooling systems, entire computing systems are placed in immersion tanks of dielectric liquid coolant, which serve to absorb heat generated by computing systems. Dielectric coolants used in immersive cooling systems, however, have relatively low thermal capacities (e.g., as compared to other liquid coolants, such as those in direct liquid cooling systems) and, thus, are not as effective or efficient (e.g., requiring higher flow rates to provide adequate cooling). Furthermore, because entire computing systems must be immersed in such systems, they are not well suited for use in rack-based deployments (e.g., in data centers where servers and network communications equipment are mounted in computing racks).

Hybrid liquid cooling systems and techniques are presented in this disclosure that overcome one or more issues described above and provide for more effective and/or efficient data center cooling. In at least one embodiment, a hybrid liquid cooling system may employ two or more liquid cooling techniques to effectively and efficiently cool one or more computing systems. In at least one embodiment, for example, a dual-mode liquid cooling system may employ direct-to-chip (or direct) liquid cooling and immersive liquid cooling techniques to cool one or more computing systems and/or system components thereof. In at least one embodiment, direct liquid cooling may be used to cool specific components within a broader immersive liquid cooled environment. In at least one embodiment, high-power density components of a computing system (e.g., CPUs, GPUs, high-speed data switches, etc.) may be cooled by flowing a first liquid coolant through one or more cold plates coupled thereto, while a computing system itself may comprise a sealed chassis that may be filled with a second immersive liquid coolant that may cool a computing system and its components generally.

In at least one embodiment, a hybrid liquid cooling system may include or employ a number of different cooling loops (or cooling cycles). In at least one embodiment, a dual-mode liquid cooling system may employ a pair of cooling loops—a primary and secondary cooling loop—for both direct and immersive liquid cooling, with each cooling loop circulating a separate liquid coolant. In at least one embodiment, one or more secondary cooling loops may operate to remove heat from computing systems and/or system components thereof, which may be transferred to one or more primary cooling loops using a pair of heat exchange devices (e.g., a pair of cooling distribution units). In at least one embodiment, one or more primary cooling loops, in turn, may carry heat to one or more external cooling devices (e.g., a free cooler or chiller), which may remove and discharge heat from one or more primary cooling loops to an ambient environment.

In at least one embodiment, a complexity of a dual-mode liquid cooling system may be reduced and/or an operating efficiency may be further improved. In at least one embodiment, for example, a primary cooling loop may not be included or used, which may simplify deployment and maintenance and improve an operating efficiency. In at least one embodiment, a dual-mode liquid cooling system may employ a common primary cooling loop (instead of two separate primary cooling loops) along with one or more secondary cooling loops for direct and immersive liquid cooling. In at least one embodiment, one or more secondary cooling loops operate to remove heat from computing systems and/or system components thereof, which may be transferred to a primary cooling loop using one or more heat exchange devices. In at least one embodiment, a primary cooling loop, in turn, may carry heat to an external cooling device, which may remove and discharge heat from said primary cooling loop to an ambient environment.

In at least one embodiment, a complexity of a dual-mode liquid cooling system may be reduced and/or an operating efficiency may be further improved. In at least one embodiment, for example, a primary cooling loop and a secondary cooling loop may not be included or used, which may simplify deployment and maintenance, and improve an operating efficiency. In at least one embodiment, a number of liquid coolants may also be reduced, which may allow for deployment in certain unique environments. In at least one embodiment, a dual-mode liquid cooling system may employ a primary cooling loop for a first cooling technique in which heat may be removed from computing systems and/or system components thereof and carried directly to an external cooling device. In at least one embodiment, a primary cooling loop may also operate in a dual loop arrangement with a secondary cooling loop for another liquid cooling technique. In at least one embodiment, for example, a dual-mode cooling system may employ a primary cooling loop for direct liquid cooling that may also operate in a dual loop arrangement with a secondary cooling loop for immersive liquid cooling. In at least one embodiment, a primary cooling loop may cool one or more first components of a computing system and additionally receive heat exchanged from a secondary cooling loop that may cool one or more second components of a computing system.

Servers and Data Centers

Following figures set forth, without limitation, exemplary network server and data center based systems that can be used to implement at least one embodiment.

FIG. 1 illustrates a distributed system 100, in accordance with at least one embodiment. In at least one embodiment, distributed system 100 includes one or more client computing devices 102, 104, 106, and 108, which are configured to execute and operate a client application such as a web browser, proprietary client, and/or variations thereof over one or more network(s) 110. In at least one embodiment, server 112 may be communicatively coupled with remote client computing devices 102, 104, 106, and 108 via network 110.

In at least one embodiment, server 112 may be adapted to run one or more services or software applications such as services and applications that may manage session activity of single sign-on (SSO) access across multiple data centers. In at least one embodiment, server 112 may also provide other services or software applications can include non-virtual and virtual environments. In at least one embodiment, these services may be offered as web-based or cloud services or under a Software as a Service (SaaS) model to users of client computing devices 102, 104, 106, and/or 108. In at least one embodiment, users operating client computing devices 102, 104, 106, and/or 108 may in turn utilize one or more client applications to interact with server 112 to utilize services provided by these components.

In at least one embodiment, software components 118, 120 and 122 of system 100 are implemented on server 112. In at least one embodiment, one or more components of system 100 and/or services provided by these components may also be implemented by one or more of client computing devices 102, 104, 106, and/or 108. In at least one embodiment, users operating client computing devices may then utilize one or more client applications to use services provided by these components. In at least one embodiment, these components may be implemented in hardware, firmware, software, or combinations thereof. It should be appreciated that various different system configurations are possible, which may be different from distributed system 100. The embodiment shown in FIG. 1 is thus one example of a distributed system for implementing an embodiment system and is not intended to be limiting.

In at least one embodiment, client computing devices 102, 104, 106, and/or 108 may include various types of computing systems. In at least one embodiment, a client computing device may include portable handheld devices (e.g., an iPhone®, cellular telephone, an iPad®, computing tablet, a personal digital assistant (PDA)) or wearable devices (e.g., a Google Glass® head mounted display), running software such as Microsoft Windows Mobile®, and/or a variety of mobile operating systems such as iOS, Windows Phone, Android, BlackBerry 10, Palm OS, and/or variations thereof. In at least one embodiment, devices may support various applications such as various Internet-related apps, e-mail, short message service (SMS) applications, and may use various other communication protocols. In at least one embodiment, client computing devices may also include general purpose personal computers including, by way of example, personal computers and/or laptop computers running various versions of Microsoft Windows®, Apple Macintosh®, and/or Linux operating systems. In at least one embodiment, client computing devices can be workstation computers running any of a variety of commercially-available UNIX® or UNIX-like operating systems, including without limitation a variety of GNU/Linux operating systems, such as Google Chrome OS. In at least one embodiment, client computing devices may also include electronic devices such as a thin-client computer, an Internet-enabled gaming system (e.g., a Microsoft Xbox gaming console with or without a Kinect® gesture input device), and/or a personal messaging device, capable of communicating over network(s) 110. Although distributed system 100 in FIG. 1 is shown with four client computing devices, any number of client computing devices may be supported. Other devices, such as devices with sensors, etc., may interact with server 112.

In at least one embodiment, network(s) 110 in distributed system 100 may be any type of network that can support data communications using any of a variety of available protocols, including without limitation TCP/IP (transmission control protocol/Internet protocol), SNA (systems network architecture), IPX (Internet packet exchange), AppleTalk, and/or variations thereof. In at least one embodiment, network(s) 110 can be a local area network (LAN), networks based on Ethernet, Token-Ring, a wide-area network, Internet, a virtual network, a virtual private network (VPN), an intranet, an extranet, a public switched telephone network (PSTN), an infra-red network, a wireless network (e.g., a network operating under any of the Institute of Electrical and Electronics (IEEE) 802.11 suite of protocols, Bluetooth®, and/or any other wireless protocol), and/or any combination of these and/or other networks.

In at least one embodiment, server 112 may be composed of one or more general purpose computers, specialized server computers (including, by way of example, PC (personal computer) servers, UNIX® servers, mid-range servers, mainframe computers, rack-mounted servers, etc.), server farms, server clusters, or any other appropriate arrangement and/or combination. In at least one embodiment, server 112 can include one or more virtual machines running virtual operating systems, or other computing architectures involving virtualization. In at least one embodiment, one or more flexible pools of logical storage devices can be virtualized to maintain virtual storage devices for a server. In at least one embodiment, virtual networks can be controlled by server 112 using software defined networking. In at least one embodiment, server 112 may be adapted to run one or more services or software applications.

In at least one embodiment, server 112 may run any operating system, as well as any commercially available server operating system. In at least one embodiment, server 112 may also run any of a variety of additional server applications and/or mid-tier applications, including HTTP (hypertext transport protocol) servers, FTP (file transfer protocol) servers, CGI (common gateway interface) servers, JAVA® servers, database servers, and/or variations thereof. In at least one embodiment, exemplary database servers include without limitation those commercially available from Oracle, Microsoft, Sybase, IBM (International Business Machines), and/or variations thereof.

In at least one embodiment, server 112 may include one or more applications to analyze and consolidate data feeds and/or event updates received from users of client computing devices 102, 104, 106, and 108. In at least one embodiment, data feeds and/or event updates may include, but are not limited to, Twitter® feeds, Facebook® updates or real-time updates received from one or more third party information sources and continuous data streams, which may include real-time events related to sensor data applications, financial tickers, network performance measuring tools (e.g., network monitoring and traffic management applications), clickstream analysis tools, automobile traffic monitoring, and/or variations thereof. In at least one embodiment, server 112 may also include one or more applications to display data feeds and/or real-time events via one or more display devices of client computing devices 102, 104, 106, and 108.

In at least one embodiment, distributed system 100 may also include one or more databases 114 and 116. In at least one embodiment, databases may provide a mechanism for storing information such as user interactions information, usage patterns information, adaptation rules information, and other information. In at least one embodiment, databases 114 and 116 may reside in a variety of locations. In at least one embodiment, one or more of databases 114 and 116 may reside on a non-transitory storage medium local to (and/or resident in) server 112. In at least one embodiment, databases 114 and 116 may be remote from server 112 and in communication with server 112 via a network-based or dedicated connection. In at least one embodiment, databases 114 and 116 may reside in a storage-area network (SAN). In at least one embodiment, any necessary files for performing functions attributed to server 112 may be stored locally on server 112 and/or remotely, as appropriate. In at least one embodiment, databases 114 and 116 may include relational databases, such as databases that are adapted to store, update, and retrieve data in response to SQL-formatted commands.

Figure 2:
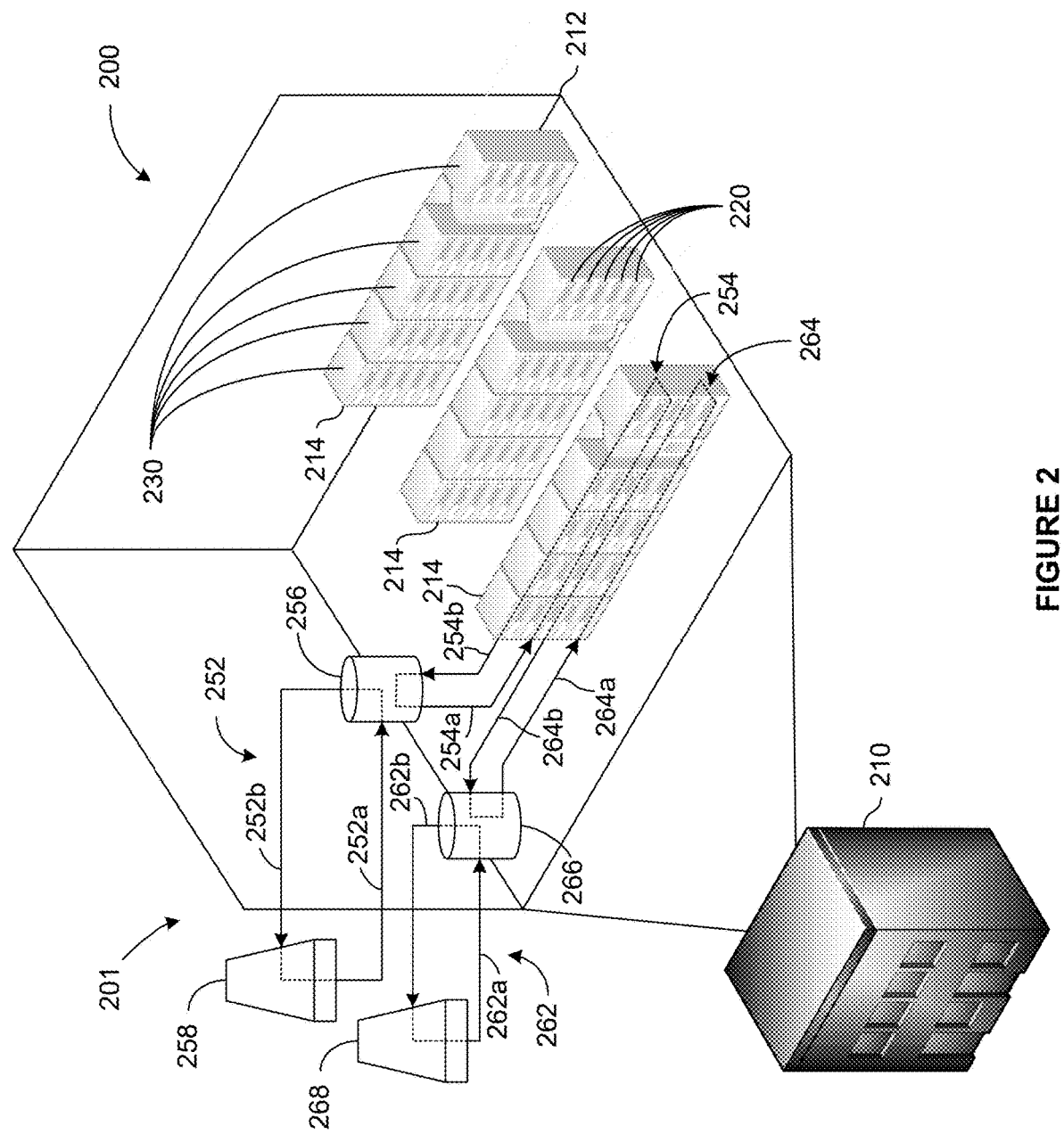
FIG. 2 illustrates an example data center environment, in accordance with at least one embodiment.

FIG. 2 illustrates an example data center environment 200 in accordance with at least one embodiment. In at least one embodiment, data center environment 200 may include a data center cooling system 201 that may be used for cooling a data center 210. In at least one embodiment, data center 210 may include one or more rooms 212 that have one or more computing systems 220 operating therein. In at least one embodiment, for example, data center 210 may have a number of computer servers and network communications systems operating therein. In at least one embodiment, computing systems 220 may take a form of computing system 620 illustrated in FIG. 6 and described with respect thereto. In at least one embodiment, computing systems 220 may be rack-based computing systems that are mounted in one or more computing racks 230. In at least one embodiment, computing racks 230 may be arranged in a series of rows 214. By way of example, as illustrated in FIG. 2, room 212 of data center 210 may include a number of computing racks 230 arranged in a series of rows 214, with each computing rack 230 housing a number of computing systems 220.

In at least one embodiment, a computing system 220 may include one or more system components, each of which may consume some amount of power during operation. An amount of power consumed by a system component may vary during operation, and system components may be described in terms of a peak amount of power (or peak power) that they may consume. In at least one embodiment, an amount of power consumed by a system component may be characterized in terms of a total power consumed (e.g., in Watts) or a power density or flux (e.g., in Watts/m$^3$ or Watts/cm$^2$). System components may also generate heat during operation, which may generally correspond to an amount of power consumed by a system component. An amount of heat generated by a system component may vary during operation, and system components may be described in terms of a peak thermal output that they may generate. In at least one embodiment, an amount of heat generated by a system component may be characterized in terms of a thermal flux (e.g., in Watts/m$^2$).

System components having a peak power or peak thermal output above a particular threshold may be referred to as high-power components. For example, system components having a power density of greater than 50-60 Watts/cm$^2$ may be considered high-power components. In at least one embodiment, for example, high-power components of a computing system 220 may include processing units or circuitry, such as central processing units (CPUs), graphical processing units (GPUs), data processing units (DPUs), field programmable gate arrays (FPGAs), or the like. In at least one embodiment, high-power components of a computing system 220 may include high-speed data switches, such as multi-GPU data switches (e.g., an NVSwitch), or the like. In at least one embodiment, high-power components of a computing system 220 may include high-speed data transmission devices, such as optical transceivers, or the like.

System components that have a peak power or peak thermal output below a particular threshold may be referred to as low-power components. For example, system components having a power density of less than 50-60 Watts/cm$^2$ may be considered low-power components. In at least one embodiment, for example, low-power components of computing system 220 may include a system memory, a chipset, such as a northbridge or southbridge chipset, data bus interfaces, such as peripheral component interconnect express (PCIe) or non-volatile memory express (NVMe) interfaces, peripheral devices, such as a network interfaces or storage devices, or the like. In at least one embodiment, a computing system 220 may include one or more high-power components and/or one or more low-power components.

In at least one embodiment, cooling system 201 may be used to cool one or more computing systems 220 of data center 210 and/or system components thereof. An architecture of cooling system 201 may depend on its application. In at least one embodiment, an architecture of cooling system 201 may depend on cooling needs of data center 210 and computing systems 220 operating therein. Cooling needs of data center 210, for example, may be characterized in terms of an aggregate power (e.g., in Watts) consumed by computing systems 220 that cooling system 201 is being used to support (or cool). By way of example, a data center 210 may have an overall cooling load of 1 MW. In at least one embodiment, cooling system 201 may employ one or more cooling techniques to support an overall cooling load of data center 210. In at least one embodiment, for example, cooling system 201 may use direct liquid cooling to support a portion of a data center cooling load (e.g., 60% or 600 kW), which may reflect an aggregate power consumed by high-power components of computing systems 220, and immersive cooling to support another portion of a data center cooling load (e.g., 40% or 400 kW), which may reflect an aggregate power consumed by low-power components of computing systems 220.

In at least one embodiment, an architecture of cooling system 201 may depend on conditions of an ambient environment in which cooling system 201 may be deployed, including for example, a temperature (e.g., a dry bulb temperature), a relative humidity, and/or an atmospheric pressure. An ambient temperature, for example, may influence an operating temperature at which a liquid coolant may be supplied. In some cases, a relative humidity may impact a temperature at which a liquid coolant may be safely used near computing systems 220, as too low an operating temperature may result in condensation that could damage computing systems 220 or other electronic systems within data center 210. In at least one embodiment, a heat exchange device may be used to transfer heat between liquid coolants at different operating temperatures.

In at least one embodiment, cooling system 201 may be a hybrid liquid cooling system that includes or employs one or more liquid cooling techniques. In at least one embodiment, for example, cooling system 201 may be a dual-mode liquid cooling system that employs direct-to-chip (or direct) liquid cooling and immersive liquid cooling techniques to cool computing systems 220 and/or system components thereof. In at least one embodiment, for instance, cooling system 201 may operate to cool a subset of system components of a computing system 220 using direct liquid cooling and may cool another subset of system components of computing system 220 using immersive liquid cooling. In at least one embodiment, for example, direct liquid cooling may be used to cool high-power components of a computing system 220 and immersive liquid cooling may be used to cool low-power components of computing system 220. In at least one embodiment, immersive liquid cooling may also operate to (indirectly) cool high-power components of computing system 220.

In at least one embodiment, cooling system 201 may comprise one or more cooling loops (or cooling cycles). In at least one embodiment, for example, cooling system 201 may be a hybrid liquid cooling system that employs a pair of cooling loops—a primary and secondary cooling loop—for each of one or more liquid cooling techniques. In at least one embodiment, for instance, a secondary cooling loop may operate to remove heat from computing systems 220 and/or system components thereof, which may be transferred to a primary cooling loop using a heat exchange device. In at least one embodiment, a primary cooling loop, in turn, may carry heat to an external cooling device that may remove heat from primary cooling loop and discharge it to an ambient environment, external to data center 210 and/or rooms 212 thereof.

In at least one embodiment, cooling system 201 may be a dual-mode liquid cooling system that employs a pair of cooling loops for direct liquid cooling and a pair of cooling loops for immersive liquid cooling. In at least one embodiment, as illustrated in FIG. 2, cooling system 201 may employ a primary cooling loop 252 and secondary cooling loop 254 for direct liquid cooling and a primary cooling loop 262 and secondary cooling loop 264 for immersive liquid cooling. In at least one embodiment, secondary cooling loops 254, 264 may operate to remove heat from computing systems 220 and/or system components thereof, which may be transferred to primary cooling loops 252, 262 using heat exchange devices 256, 266. In at least one embodiment, for example, heat generated by high-power components of computing systems 220 may be removed using secondary cooling loop 254 and heat generated by low-power components of computing systems 220 may be removed using secondary cooling loop 264. In at least one embodiment, primary cooling loops 252, 262, in turn, may carry heat removed from computing systems 220 and/or system components thereof to external cooling devices 258, 268, which may remove and discharge heat from primary cooling loops 252, 262 to an ambient environment, external to data center 210 and/or rooms 212 thereof.

In at least one embodiment, a first liquid coolant may be circulated in primary cooling loop 252 and a second liquid coolant may be circulated in secondary cooling loop 254. In at least one embodiment, first liquid coolant may be or include water or deionized water. In at least one embodiment, first liquid coolant may be or include a refrigerant. In at least one embodiment, for example, first liquid coolant may be or include a hydrofluorocarbon (HFC) or an HFC blend such as R-134a, R-410a, R-404a, or the like. In at least one embodiment, first liquid coolant may have an ozone depletion potential (ODP) below a particular ODP threshold and/or a global warming potential (GWP) below a particular GWP threshold. In at least one embodiment, first liquid coolant may be a single-phase coolant. In at least one embodiment, first liquid coolant may be a dual-phase coolant. In at least one embodiment, first liquid coolant may not vaporize in primary cooling loop 252.

In at least one embodiment, second liquid coolant may be or include water or deionized water. In at least one embodiment, second liquid coolant may be or include a mixture of water and one or more additives. In at least one embodiment, for example, second liquid coolant may be or include a mixture of water and ethylene glycol (EGW) or water and propylene glycol (PGW). In at least one embodiment, for instance, second liquid coolant may be or include a 25% concentration mixture of water and propylene glycol (or PG-25). In at least one embodiment, second liquid coolant may be or include a refrigerant. In at least one embodiment, for example, second liquid coolant may be or include a hydrofluorocarbon (HFC) or an HFC blend such as R-134a, R-410a, R-404a, or the like. In at least one embodiment, second liquid coolant may be a dielectric (or non-conductive) coolant. In at least on embodiment, second liquid coolant may be or include fluorochemicals, fluorocarbons, hydrocarbons, or the like. In at least one embodiment, second liquid coolant may be or include oil such as mineral oils, synthetic oils, natural oils, or the like. In at least one embodiment, second liquid coolant may be or include an engineered fluid such as BitCool® BC-888 dielectric coolant or ElectroCool® EC-100 dielectric coolant, marketed by Engineered Fluids, Inc. of Saint Petersburg, Florida. In at least one embodiment, second liquid coolant may have an ozone depletion potential (ODP) below a particular ODP threshold and/or a global warming potential (GWP) below a particular GWP threshold. In at least one embodiment, second liquid coolant may be a single-phase coolant. In at least one embodiment, second liquid coolant may be a dual-phase coolant. In at least one embodiment, second liquid coolant may not vaporize in secondary cooling loop 254.

In at least one embodiment, first liquid coolant may be circulated in primary cooling loop 252 between external cooling device 258 and heat exchange device 256, which may be in bi-directional fluid communication with each another. In at least on embodiment, for example, first liquid coolant may flow from an outlet of external cooling device 258 to an inlet of heat exchange device 256, as part of supply path 252a of primary cooling loop 252, and may flow from an outlet of heat exchange device 256 to an inlet of external cooling device 258, as part of return path 252b of primary cooling loop 252. In at least one embodiment, second liquid coolant may be circulated in secondary cooling loop 254 between heat exchange device 256 and computing systems 220, which may be in bi-directional fluid communication with one another. In at least one embodiment, for example, second liquid coolant may flow from an outlet of heat exchanged device 256 to an inlet of computing systems 220, as part of supply path 254a. In at least one embodiment, second liquid coolant may pass through computing systems 220 and absorb heat therefrom (as discussed further below), after which it may flow from an outlet of computing systems 220 to an inlet of heat exchange device 256, as part of return path 254b. For convenience of illustration, primary cooling loop 252 and secondary cooling loop 254 are illustrated in FIG. 2 using solid and dashed lines. However, it will be appreciated that primary cooling loop 252 and secondary cooling loop 254 may be comprised of a number of plumbing features, including for example, tubing, hoses, or pipes (e.g., polyvinyl chloride (PVC) pipes or flexible ethylene propylene diene monomer (EPDM) tubing), manifolds, valves, joints, couplings, fittings, or the like.

In at least one embodiment, heat exchange device 256 and/or external cooling device 258 may operate to control a flow rate of first liquid coolant in primary cooling loop 252. In at least one embodiment, for example, heat exchange device 256 and/or external cooling device 258 may include one or more pumps and/or valves that may operate to control a pressure along primary cooling loop 252, for example, along supply path 252a and/or return path 252b. In at least one embodiment, heat exchange device 256 may operate to control a flow rate of second liquid coolant in secondary cooling loop 254. In at least one embodiment, for example, heat exchange device 256 may include one or more pumps and/or valves that may operate to control a pressure along secondary cooling loop 254, for example, along supply path 254a and return path 254b. In at least one embodiment, heat exchange device 256 and/or external cooling device 258 may include a controller that can be used to effectuate such control. In at least one embodiment, cooling system 201 may include an independent controller that can be used to effectuate such control.

In at least one embodiment, external cooling device 258 may supply first liquid coolant to heat exchange device 256 at an initial temperature and may receive first liquid coolant from heat exchange device 256 at a return temperature. In at least one embodiment, external cooling device 258 may be configured to supply first liquid coolant at a particular temperature, for example, between 2-46° Celsius, and may receive first liquid coolant at a relatively higher return temperature, for example, between 10-15° Celsius higher. In at least one embodiment, external cooling device 258 may operate to remove heat from first liquid coolant received from heat exchange device 256 and cool it to a particular temperature. In at least on embodiment, for example, external cooling device 258 may restore first liquid coolant received from heat exchange device 256 to its initial supply temperature. In at least one embodiment, external cooling device 258 may then recirculate first liquid coolant in primary cooling loop 252, back along supply path 252a. In at least one embodiment, external cooling device 258 may discharge heat removed from first liquid coolant to an ambient environment.

In at least one embodiment, external cooling device 258 may be or include a free cooler. In at least one embodiment, external cooling device 258 may be or include a free cooler that uses air of an ambient environment, which may be at a relatively low temperature, to remove heat from and cool a liquid coolant. In at least one embodiment, external cooling device 258 may be or include a free cooler that employs a natural or induced draft cooling tower. In at least one embodiment, external cooling device 258 may be or include a chiller that removes heat from first liquid coolant. In at least one embodiment, may be or include a chiller that employs a vapor-compression, adsorption refrigeration, or absorption refrigeration cycle. In at least one embodiment, external cooling device 258 may be or include a water-based chiller. In at least one embodiment, external cooling device 258 may be or include a direct expansion (DX) cooling unit that removes heat from first liquid coolant. In at least one embodiment, external cooling device 258 may be or include a DX cooling unit that uses a condensed refrigerant.

In at least one embodiment, heat exchange device 256 may supply second liquid coolant to computing systems 220 at an initial supply temperature and may receive second liquid coolant from computing systems 220 at a return temperature. In at least one embodiment, heat exchange device 256 may be configured to supply second liquid coolant to computing systems 220 at a particular temperature, for example, between 17-50° Celsius, and may receive second liquid coolant back from computing systems 220 at a relatively higher return temperature, for example, between 10-15° Celsius higher. In at least one embodiment, heat exchange device 256 may operate to remove heat from second liquid coolant received from computing systems 220. In at least one embodiment, for example, heat exchange device 256 may restore second liquid coolant received from computing systems 220 to its initial supply temperature. In at least one embodiment, heat exchange device 256 may then recirculate second liquid coolant in secondary cooling loop 254, back along supply path 254a. In at least one embodiment, for example, heat exchange device 256 may operate to remove heat from second liquid coolant by transferring heat from second liquid coolant to first liquid coolant circulating in primary cooling loop 252.

In at least one embodiment, for instance, heat exchange device 256 may receive first liquid coolant from external cooling device 258 at an initial supply temperature, which may be relatively lower than a temperature of second liquid coolant returned by computing systems 220. Heat exchange device 256 may transfer heat from second liquid coolant to first liquid coolant, thereby reducing a temperature of second liquid coolant and raising a temperature of first liquid coolant. Heat exchange device 256 may then recirculate cooled second liquid coolant back to computing systems 220 and return heated first liquid coolant back to external cooling device 258. In at least one embodiment, for example, heat exchange device 256 may be or include a liquid-to-liquid cooling distribution unit (CDU) having a heat exchanger provided therein, which may be used to transfer heat from second liquid coolant to first liquid coolant.

In at least one embodiment, heat may be absorbed from computing systems 220 by flowing second liquid coolant through one or more heat transfer devices. In at least one embodiment, for example, second liquid coolant may enter a computing system 220 and flow through one or more heat transfer devices disposed therein before exiting computing system 220. In at least one embodiment, each heat transfer device may be thermally coupled to one or more system components of computing system 220. In at least one embodiment, for example, one or more heat transfer devices may each be thermally coupled to one or more high-power components. In at least one embodiment, a heat transfer device may be coupled to a system component using an adhesive such as a thermal epoxy. In at least one embodiment, a heat transfer device may be mechanically coupled to a system component, or a support structure (e.g., a PCB board) adjacent thereto, such that heat transfer device may be in physical contact with or proximity to a system component. In at least one embodiment, a thermal interface material (TIM) may be positioned between a heat transfer device and a system component in order to enhance thermal coupling therebetween.

In at least one embodiment, a heat transfer device may operate to cool one or more system components by transferring heat from system components to second liquid coolant flowing therethrough. In at least one embodiment, for example, a heat transfer device may be or include a cold plate that may absorb heat from one or more system components and transfer it to second liquid coolant flowing therethrough. In at least one embodiment, a cold plate may be a plate made of a thermally conductive material, such as copper, aluminum, steel or stainless steel, having one or more internal passages formed therein through which second liquid coolant may flow. In at least one embodiment, a cold plate may absorb heat from one or more system components via conduction and transfer heat to second liquid coolant via convection.

In at least one embodiment, a third liquid coolant may be circulated in primary cooling loop 262 and a fourth liquid coolant may be circulated in secondary cooling loop 264. In at least one embodiment, third liquid coolant may be or include water or deionized water. In at least one embodiment, third liquid coolant may be or include a refrigerant. In at least one embodiment, for example, third liquid coolant may be or include a hydrofluorocarbon (HFC) or an HFC blend such as R-134a, R-410a, R-404a, or the like. In at least one embodiment, third liquid coolant may have an ozone depletion potential (ODP) below a particular ODP threshold and/or a global warming potential (GWP) below a particular GWP threshold. In at least one embodiment, third liquid coolant may be a single-phase coolant. In at least one embodiment, third liquid coolant may be a dual-phase coolant. In at least one embodiment, third liquid coolant may not vaporize in primary cooling loop 262.

In at least one embodiment, fourth liquid coolant may be a dielectric (or non-conductive) coolant in which electronic components, such as system components of computing systems 220, may be immersed without causing a short circuit. In at least on embodiment, fourth liquid coolant may be or include fluorochemicals, fluorocarbons, hydrocarbons, or the like. In at least one embodiment, fourth liquid coolant may be or include oil such as mineral oils, synthetic oils, natural oils, or the like. In at least one embodiment, fourth liquid coolant may be or include an engineered fluid such as BitCool® BC-888 dielectric coolant or ElectroCool® EC-100 dielectric coolant, marketed by Engineered Fluids, Inc. of Saint Petersburg, Florida. In at least one embodiment, fourth liquid coolant may have an ozone depletion potential (ODP) below a particular ODP threshold and/or a global warming potential (GWP) below a particular GWP threshold. In at least one embodiment, fourth liquid coolant may be a single-phase coolant. In at least one embodiment, fourth liquid coolant may be a dual-phase coolant. In at least one embodiment, fourth liquid coolant may not vaporize in secondary cooling loop 264.

In at least one embodiment, third liquid coolant may be circulated in primary cooling loop 262 between external cooling device 268 and heat exchange device 266, which may be in bi-directional fluid communication with each another. In at least on embodiment, for example, third liquid coolant may flow from an outlet of external cooling device 268 to an inlet of heat exchange device 266, as part of supply path 262a of primary cooling loop 262, and may flow from an outlet of heat exchange device 266 to an inlet of external cooling device 268, as part of return path 262b of primary cooling loop 262. In at least one embodiment, fourth liquid coolant may be circulated in secondary cooling loop 264 between heat exchange device 266 and computing systems 220, which may be in bi-directional fluid communication with one another. In at least one embodiment, for example, fourth liquid coolant may flow from an outlet of heat exchange device 266 to an inlet of computing systems 220, as part of supply path 264a. Fourth liquid coolant may pass through computing systems 220 and absorb heat therefrom (as discussed further below), after which it may flow from an outlet of computing systems 220 to an inlet of heat exchange device 266, as part of return path 264b. For convenience of illustration, primary cooling loop 262 and secondary cooling loop 264 are illustrated in FIG. 2 using solid and dashed lines. However, it will be appreciated that primary cooling loop 262 and secondary cooling loop 264 may be comprised of a number of plumbing features, including for example, tubing, hoses, or pipes (e.g., PVC pipes or flexible EPDM tubing), manifolds, valves, joints, couplings, fittings, or the like).

In at least one embodiment, heat exchange device 266 and/or external cooling device 268 may operate to control a flow rate of third liquid coolant in primary cooling loop 262. In at least one embodiment, for example, heat exchange device 266 and/or external cooling device 268 may include one or more pumps and/or valves that may operate to control a pressure along primary cooling loop 262, for example, along supply path 262a and/or return path 262b. In at least one embodiment, heat exchange device 266 may operate to control a flow rate of fourth liquid coolant in secondary cooling loop 264. In at least one embodiment, for example, heat exchange device 266 may include one or more pumps that may operate to control a pressure along secondary cooling loop 264, for example, along supply path 264a and return path 264b. In at least one embodiment, heat exchange device 266 and/or external cooling device 268 may include a controller that can be used to effectuate such control. In at least one embodiment, cooling system 201 may include an independent controller that can be used to effectuate such control.

In at least one embodiment, external cooling device 268 may supply third liquid coolant to heat exchange device 266 at an initial temperature and may receive third liquid coolant from heat exchange device 266 at a return temperature. In at least one embodiment, external cooling device 268 may be configured to supply third liquid coolant at a particular temperature, for example, between 2-46° Celsius, and may receive third liquid coolant from heat exchange device 266 at a relatively higher return temperature, for example, between 10-15° Celsius higher. In at least one embodiment, external cooling device 268 may operate to remove heat from third liquid coolant received from heat exchange device 266 and cool it to a particular temperature. In at least on embodiment, for example, external cooling device 268 may restore third liquid coolant received from heat exchange device 266 to its initial supply temperature. In at least one embodiment, external cooling device 268 may then recirculate third liquid coolant in primary cooling loop 262, back along supply path 262a. In at least one embodiment, external cooling device 268 may discharge heat removed from third liquid coolant to an ambient environment.

In at least one embodiment, external cooling device 268 may be or include a free cooler, which for example, may employ a natural or induced draft cooling tower. In at least one embodiment, external cooling device 268 may be or include a chiller that removes heat from third liquid coolant. In at least one embodiment, may be or include a chiller that employs a vapor-compression, adsorption refrigeration, or absorption refrigeration cycle. In at least one embodiment, external cooling device 268 may be or include a water-based chiller. In at least one embodiment, external cooling device 268 may be or include a direct expansion (DX) cooling unit that removes heat from third liquid coolant. In at least one embodiment, external cooling device 268 may be or include a DX cooling unit that uses a condensed refrigerant.

In at least one embodiment, heat exchange device 266 may supply fourth liquid coolant to computing systems 220 at an initial supply temperature and may receive fourth liquid coolant from computing systems 220 at a return temperature. In at least one embodiment, heat exchange device 266 may be configured to supply fourth liquid coolant to computing systems 220 at a particular temperature, for example, between 17-50° Celsius, and may receive fourth liquid coolant back from computing systems 220 at a relatively higher return temperature, for example, between 10-15° Celsius higher. In at least one embodiment, heat exchange device 266 may operate to remove heat from fourth liquid coolant received from computing systems 220. In at least one embodiment, for example, heat exchange device 266 may restore fourth liquid coolant received from computing systems 220 to its initial supply temperature. In at least one embodiment, heat exchange device 266 may then recirculate fourth liquid coolant in secondary cooling loop 264, back along supply path 264a. In at least one embodiment, for example, heat exchange device 266 may operate to remove heat from fourth liquid coolant by transferring heat from fourth liquid coolant to third liquid coolant circulating in primary cooling loop 262.

In at least one embodiment, for instance, heat exchange device 266 may receive third liquid coolant from external cooling device 268 at an initial supply temperature, which may be relatively lower than a temperature of fourth liquid coolant returned by computing systems 220. Heat exchange device 266 may transfer heat from fourth liquid coolant to third liquid coolant, thereby reducing a temperature of fourth liquid coolant and raising a temperature of third liquid coolant. Heat exchange device 266 may then recirculate cooled fourth liquid coolant back to computing systems 220 and return heated third liquid coolant back to external cooling device 268. In at least one embodiment, for example, heat exchange device 266 may be or include a liquid-to-liquid cooling distribution unit (CDU) having a heat exchanger provided therein, which may be used to transfer heat from fourth liquid coolant to third liquid coolant.

In at least one embodiment, heat may be absorbed from computing systems 220 by immersing and flowing fourth liquid coolant over one or more system components thereof. In at least one embodiment, fourth liquid coolant may flow across one or more system components of computing systems 220 and absorb heat therefrom via convection. In at least one embodiment, for example, computing system 220 may comprise a sealed chassis that houses its system components. Fourth liquid coolant may be used to, partially or completely, fill a sealed chassis such that one or more system components of computing system 220 are immersed therein. In at least on embodiment, for example, low power components of computing system 220 may be immersed in fourth liquid coolant. As fourth liquid coolant flows through computing system 220, for example, between an inlet and outlet provided in sealed chassis, it may pass across and absorb heat from system components immersed therein. In at least on embodiment, or more heat transfer devices used for direct cooling may also be housed in sealed chassis of computing system 220 and immersed within fourth liquid coolant therein. As fourth liquid coolant flows through computing system 220, it may pass across and absorb heat from heat transfer devices, indirectly cooling one or more additional system components coupled thereto.

Figure 3:
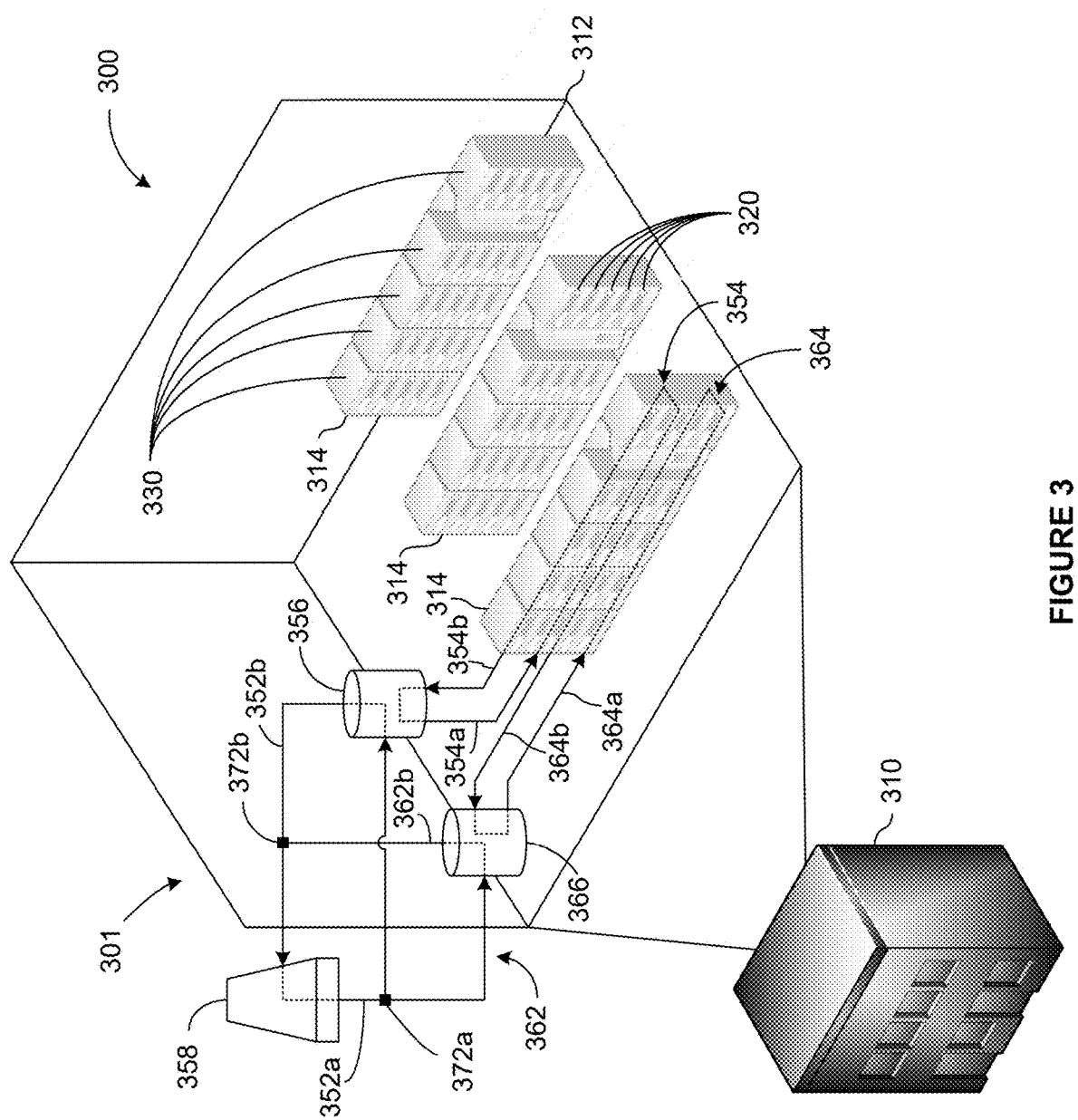
FIG. 3 illustrates an example data center environment, in accordance with at least one embodiment.

FIG. 3 illustrates an example data center environment 300 in accordance with at least one embodiment. Data center environment 300 is similar to data center environment 200 of FIG. 2, with similar elements being identified with similar reference numerals, and so, for sake of brevity, their structure, function, and/or operation are not repeated in detail herein. However, in contrast to data center environment 200, data center environment 300 includes a data center cooling system 301 having a notably different architecture, as described in further detail below.

In at least one embodiment, data center environment 300 may include a cooling system 30 that may be used for cooling computing systems 320, which may reside and operate in data center 310. In at least one embodiment, computing systems 320 may take a form of computing system 620 illustrated in FIG. 6 and described with respect thereto. In at least one embodiment, computing systems 320 may be rack-based computing systems that are mounted in a series of computing racks 350, which may be arranged in a series of rows 314. In at least one embodiment, computing systems 320 may include one or more system components, each of which may consume some amount of power and generate some amount of heat during operation. In at least one embodiment, computing systems 320 may include one or more high-power components and/or one or more low-power components.

In at least one embodiment, cooling system 301 may be a hybrid liquid cooling system that includes or employs one or more liquid cooling techniques. In at least one embodiment, for example, cooling system 301 may be a dual-mode liquid cooling system that employs direct-to-chip (or direct) liquid cooling and immersive liquid cooling techniques to cool computing systems 320 and/or system components thereof. In at least one embodiment, for instance, cooling system 301 may operate to cool a subset of system components of a computing system 320 using direct liquid cooling and may cool another subset of system components of computing system 320 using immersive liquid cooling. In at least one embodiment, for example, direct liquid cooling may be used to cool high-power components of a computing system 320 and immersive liquid cooling may be used to cool low-power components of computing system 320. In at least one embodiment, immersive liquid cooling may also operate to (indirectly) cool high-power components of computing system 320.

In at least one embodiment, cooling system 301 may comprise one or more cooling loops (or cooling cycles). In at least one embodiment, for example, cooling system 301 may be a hybrid liquid cooling system that employs a pair of cooling loops—a primary and secondary cooling loop—for each of one or more liquid cooling techniques. In at least one embodiment, for example, cooling system 301 may be a dual-mode liquid cooling system that employs primary and secondary cooling loops for direct liquid cooling and immersive liquid cooling. In at least one embodiment, cooling system 301 may employ a common primary cooling loop (instead of two distinct primary cooling loops, as in cooling system 201 of FIG. 2) and two secondary cooling loops for direct liquid cooling and immersive liquid cooling. In at least one embodiment, a complexity of cooling system 301 may be reduced and/or an operating efficiency may be improved. In at least one embodiment, for example, relative to cooling system 201, a second primary cooling loop 262 may not be included or used. This may simplify deployment and maintenance and improve an operating efficiency of cooling system 301, for example, as a second external cooling device 268 may not be included or used and a power associated with operation of such components may not be consumed.

In at least one embodiment, as illustrated in FIG. 3, cooling system 301 may employ a primary cooling loop 352 and secondary cooling loops 354, 364 for direct liquid cooling and immersive liquid cooling, respectively. In at least one embodiment, secondary cooling loops 354, 364 may operate to remove heat from computing systems 320 and/or system components thereof, which may be transferred to primary cooling loop 352 using heat exchange devices 356, 366. In at least one embodiment, for example, heat generated by high-power components of computing systems 320 may be removed using secondary cooling loop 354 and heat generated by low-power components of computing systems 320 may be removed using secondary cooling loop 364. In at least one embodiment, primary cooling loop 352, in turn, may carry heat removed from computing systems 320 and/or system components thereof to an external cooling device 358, which may remove and discharge heat from primary cooling loops 352 to an ambient environment.

In at least one embodiment, a first liquid coolant may be circulated in primary cooling loop 352, a second liquid coolant may be circulated in secondary cooling loop 354, and a third liquid coolant may be circulated in secondary cooling loop 364. In at least one embodiment, first liquid coolant may be or include water or deionized water. In at least one embodiment, first liquid coolant may be or include a refrigerant. In at least one embodiment, for example, first liquid coolant may be or include a hydrofluorocarbon (HFC) or an HFC blend such as R-134a, R-410a, R-404a, or the like. In at least one embodiment, first liquid coolant may have an ozone depletion potential (ODP) below a particular ODP threshold and/or a global warming potential (GWP) below a particular GWP threshold. In at least one embodiment, first liquid coolant may be a single-phase coolant. In at least one embodiment, first liquid coolant may be a dual-phase coolant. In at least one embodiment, first liquid coolant may not vaporize in primary cooling loop 352.

In at least one embodiment, second liquid coolant may be or include water or deionized water. In at least one embodiment, second liquid coolant may be or include a mixture of water and one or more additives. In at least one embodiment, for example, second liquid coolant may be or include a mixture of water and ethylene glycol (EGW) or water and propylene glycol (PGW). In at least one embodiment, for instance, second liquid coolant may be or include a 25% concentration mixture of water and propylene glycol (or PG-25). In at least one embodiment, second liquid coolant may be or include a refrigerant. In at least one embodiment, for example, second liquid coolant may be or include a hydrofluorocarbon (HFC) or an HFC blend such as R-134a, R-410a, R-404a, or the like. In at least one embodiment, second liquid coolant may be a dielectric (or non-conductive) coolant. In at least on embodiment, second liquid coolant may be or include fluorochemicals, fluorocarbons, hydrocarbons, or the like. In at least one embodiment, second liquid coolant may be or include oil such as mineral oils, synthetic oils, natural oils, or the like. In at least one embodiment, second liquid coolant may be or include an engineered fluid such as BitCool® BC-888 dielectric coolant or ElectroCool® EC-100 dielectric coolant, marketed by Engineered Fluids, Inc. of Saint Petersburg, Florida. In at least one embodiment, second liquid coolant may have an ozone depletion potential (ODP) below a particular ODP threshold and/or a global warming potential (GWP) below a particular GWP threshold. In at least one embodiment, second liquid coolant may be a single-phase coolant. In at least one embodiment, second liquid coolant may be a dual-phase coolant. In at least one embodiment, second liquid coolant may not vaporize in secondary cooling loop 354.

In at least one embodiment, third liquid coolant may be a dielectric (or non-conductive) coolant in which electronic components, such as system components of computing systems 320, may be immersed without causing a short circuit. In at least on embodiment, third liquid coolant may be or include fluorochemicals, fluorocarbons, hydrocarbons, or the like. In at least one embodiment, third liquid coolant may be or include oil such as mineral oils, synthetic oils, natural oils, or the like. In at least one embodiment, third liquid coolant may be or include an engineered fluid such as BitCool® BC-888 dielectric coolant or ElectroCool® EC-100 dielectric coolant, marketed by Engineered Fluids, Inc. of Saint Petersburg, Florida. In at least one embodiment, third liquid coolant may have an ozone depletion potential (ODP) below a particular ODP threshold and/or a global warming potential (GWP) below a particular GWP threshold. In at least one embodiment, third liquid coolant may be a single-phase coolant. In at least one embodiment, third liquid coolant may be a dual-phase coolant. In at least one embodiment, third liquid coolant may not vaporize in secondary cooling loop 364.

In at least one embodiment, first liquid coolant may be circulated in primary cooling loop 352 between external cooling device 358 and heat exchange devices 356, 366, which may be in bi-directional fluid communication with each another. In at least on embodiment, for example, as part of a supply path 352a, first liquid coolant may flow from an outlet of external cooling device 358 to hydraulic valve 372a, where it may branch off with a portion of first liquid coolant continuing to heat exchange device 356 and another portion of first liquid coolant continuing to heat exchange device 366. As part of a return path 352b, a portion of first liquid coolant may flow from an outlet of heat exchange device 356 and another portion of first liquid coolant may flow from an outlet of heat exchange device 366 to a hydraulic valve 372b, where they may merge and continue along to an inlet of external cooling device 358.

In at least one embodiment, second liquid coolant may be circulated in secondary cooling loop 354 between heat exchange device 356 and computing systems 320, which may be in bi-directional fluid communication with one another. In at least one embodiment, for example, second liquid coolant may flow from an outlet of heat exchanged device 356 to an inlet of computing systems 320, as part of supply path 354a. Second liquid coolant may pass through computing systems 320 and absorb heat therefrom (as discussed further below), after which it may flow from an outlet of computing systems 320 to an inlet of heat exchange device 356, as part of return path 354b.

In at least one embodiment, third liquid coolant may be circulated in secondary cooling loop 364 between heat exchange device 366 and computing systems 320, which may be in bi-directional fluid communication with one another. In at least one embodiment, for example, third liquid coolant may flow from an outlet of heat exchanged device 366 to an inlet of computing systems 320, as part of supply path 364a. Third liquid coolant may pass through computing systems 320 and absorb heat therefrom (as discussed further below), after which it may flow from an outlet of computing systems 320 to an inlet of heat exchange device 366, as part of return path 364*b*. For convenience of illustration, primary cooling loop 352, secondary cooling loop 354, and secondary cooling loop 364 are illustrated in FIG. 3 using solid and dashed lines. However, it will be appreciated that each cooling loop may be comprised of a number of plumbing features, including for example, tubing, hoses, or pipes (e.g., PVC pipes or flexible EPDM tubing), manifolds, valves, joints, couplings, fittings, or the like).

In at least one embodiment, heat exchange devices 356, 366 and/or external cooling device 358 may operate to control a flow rate of first liquid coolant in primary cooling loop 352. In at least one embodiment, for example, heat exchange devices 356, 366 and/or external cooling device 358 may include one or more pumps and/or valves that may operate to control a pressure along primary cooling loop 352, for example, along supply path 352*a* and/or return path 352*b*. In at least one embodiment, heat exchange devices 356, 366 may respectively operate to control a flow rate of second and third liquid coolant in secondary cooling loops 354, 364. In at least one embodiment, for example, heat exchange devices 356, 366 may include one or more pumps and/or valves that may operate to control a pressure along secondary cooling loops 354, 364, for example, along supply paths 354*a*, 364*a* and return paths 354*b*, 364*b*. In at least one embodiment, heat exchange devices 356, 366 and/or external cooling device 358 may include a controller that can be used to effectuate such control. In at least one embodiment, cooling system 301 may include an independent controller that can be used to effectuate such control.

In at least one embodiment, external cooling device 358 may supply first liquid coolant to heat exchange devices 356, 366 at an initial temperature and may receive first liquid coolant from heat exchange devices 356, 366 at a return temperature. In at least one embodiment, external cooling device 358 may be configured to supply first liquid coolant at a particular temperature, for example, between 2-46° Celsius, and may receive first liquid coolant from heat exchange device 356 at a relatively higher return temperature, for example, between 10-15° Celsius higher. In at least one embodiment, external cooling device 358 may operate to remove heat from first liquid coolant received from heat exchange devices 356, 366 and cool it to a particular temperature. In at least on embodiment, for example, external cooling device 358 may restore first liquid coolant received from heat exchange device 356 to its initial supply temperature. In at least one embodiment, external cooling device 358 may then recirculate first liquid coolant in primary cooling loop 352, back along supply path 352*a*. In at least one embodiment, external cooling device 358 may discharge heat removed from first liquid coolant to an ambient environment.

In at least one embodiment, external cooling device 358 may be or include a free cooler. In at least one embodiment, external cooling device 358 may be or include a free cooler that employs a natural or induced draft cooling tower. In at least one embodiment, external cooling device 358 may be or include a chiller that removes heat from first liquid coolant. In at least one embodiment, may be or include a chiller that employs a vapor-compression, adsorption refrigeration, or absorption refrigeration cycle. In at least one embodiment, external cooling device 358 may be or include a water-based chiller. In at least one embodiment, external cooling device 358 may be or include a direct expansion (DX) cooling unit that removes heat from first liquid coolant. In at least one embodiment, external cooling device 358 may be or include a DX cooling unit that uses a condensed refrigerant.

In at least one embodiment, heat exchange devices 356, 366 respectively may supply second and third liquid coolant to computing systems 320 at an initial supply temperature and may receive second and third liquid coolant from computing systems 320 at a return temperature. In at least one embodiment, heat exchange devices 356, 366 may be configured to supply second liquid coolant to computing systems 320 at a particular temperature, for example, between 17-50° Celsius, and may receive second and third liquid coolant back from computing systems 320 at a relatively higher return temperature, for example, between 10-15° Celsius higher. In at least one embodiment, heat exchange devices 356, 366 may operate to remove heat from second liquid coolant received from computing systems 320. In at least one embodiment, for example, heat exchange devices 356, 366 may restore second and third liquid coolant received from computing systems 320 to their initial supply temperature. In at least one embodiment, heat exchange devices 356, 366 may then recirculate second liquid coolant in secondary cooling loop 354, back along supply path 354*a* and third liquid coolant in secondary cooling loop 364, back along supply path 366*a*. In at least one embodiment, for example, heat exchange devices 356, 366 may respectively operate to remove heat from second and third liquid coolant by transferring heat therefrom to first liquid coolant circulating in primary cooling loop 352.

In at least one embodiment, for instance, heat exchange devices 356, 366 may receive first liquid coolant from external cooling device 358 at an initial supply temperature, which may be relatively lower than a temperature of second and third liquid coolant returned by computing systems 320. Heat exchange devices 356, 366 may transfer heat from second and third liquid coolants to first liquid coolant, thereby reducing a temperature of second and third liquid coolants and raising a temperature of first liquid coolant. Heat exchange devices 356, 366 may then recirculate cooled second and third liquid coolant back to computing systems 320 and return heated first liquid coolant back to external cooling device 358. In at least one embodiment, for example, heat exchange devices 356, 366 may be or include a liquid-to-liquid cooling distribution unit (CDU) having a heat exchanger provided therein, which may be used to transfer heat from second and third liquid coolants to first liquid coolant.

In at least one embodiment, heat may be absorbed from computing systems 320 in secondary cooling loop 354 by flowing second liquid coolant through one or more heat transfer devices. In at least one embodiment, for example, second liquid coolant may enter a computing system 320 and flow through one or more heat transfer devices disposed therein before exiting computing system 320. In at least one embodiment, each heat transfer device may be thermally coupled to one or more system components of computing system 320. In at least one embodiment, for example, one or more heat transfer devices may each be thermally coupled to one or more high-power components. In at least one embodiment, a heat transfer device may be coupled to a system component using an adhesive such as a thermal epoxy. In at least one embodiment, a heat transfer device may be mechanically coupled to a system component, or a support structure (e.g., a PCB board) adjacent thereto, such that heat transfer device may be in physical contact with or proximity to a system component. In at least one embodiment, a thermal interface material (TIM) may be positioned between a heat transfer device and a system component in order to enhance thermal coupling therebetween.

In at least one embodiment, a heat transfer device may operate to cool one or more system components by transferring heat from system components to second liquid coolant flowing therethrough. In at least one embodiment, for example, a heat transfer device may be or include a cold plate that may absorb heat from one or more system components and transfer it to second liquid coolant flowing therethrough. In at least one embodiment, a cold plate may be a plate made of a thermally conductive material, such as copper, aluminum, steel or stainless steel, having one or more internal passages formed therein through which second liquid coolant may flow. In at least one embodiment, a cold plate may absorb heat from one or more system components via conduction and transfer heat to second liquid coolant via convection.

In at least one embodiment, heat may be absorbed from computing systems 320 in secondary cooling loop 364 by immersing and flowing fourth liquid coolant over one or more system components thereof. In at least one embodiment, fourth liquid coolant may flow across one or more system components of computing systems 320 and absorb heat therefrom via convection. In at least one embodiment, for example, computing system 320 may comprise a sealed chassis that houses its system components. Fourth liquid coolant may be used to, partially or completely, fill a sealed chassis such that one or more system components of computing system 320 are immersed therein. In at least on embodiment, for example, low power components of computing system 320 may be immersed in fourth liquid coolant. As fourth liquid coolant flows through computing system 320, for example, between an inlet and outlet provided in sealed chassis, it may pass across and absorb heat from system components immersed therein. In at least on embodiment, or more heat transfer devices used for direct cooling may also be housed in sealed chassis of computing system 320 and immersed within fourth liquid coolant therein. As fourth liquid coolant flows through computing system 320, it may pass across and absorb heat from heat transfer devices, indirectly cooling one or more additional system components coupled thereto.

Figure 4:
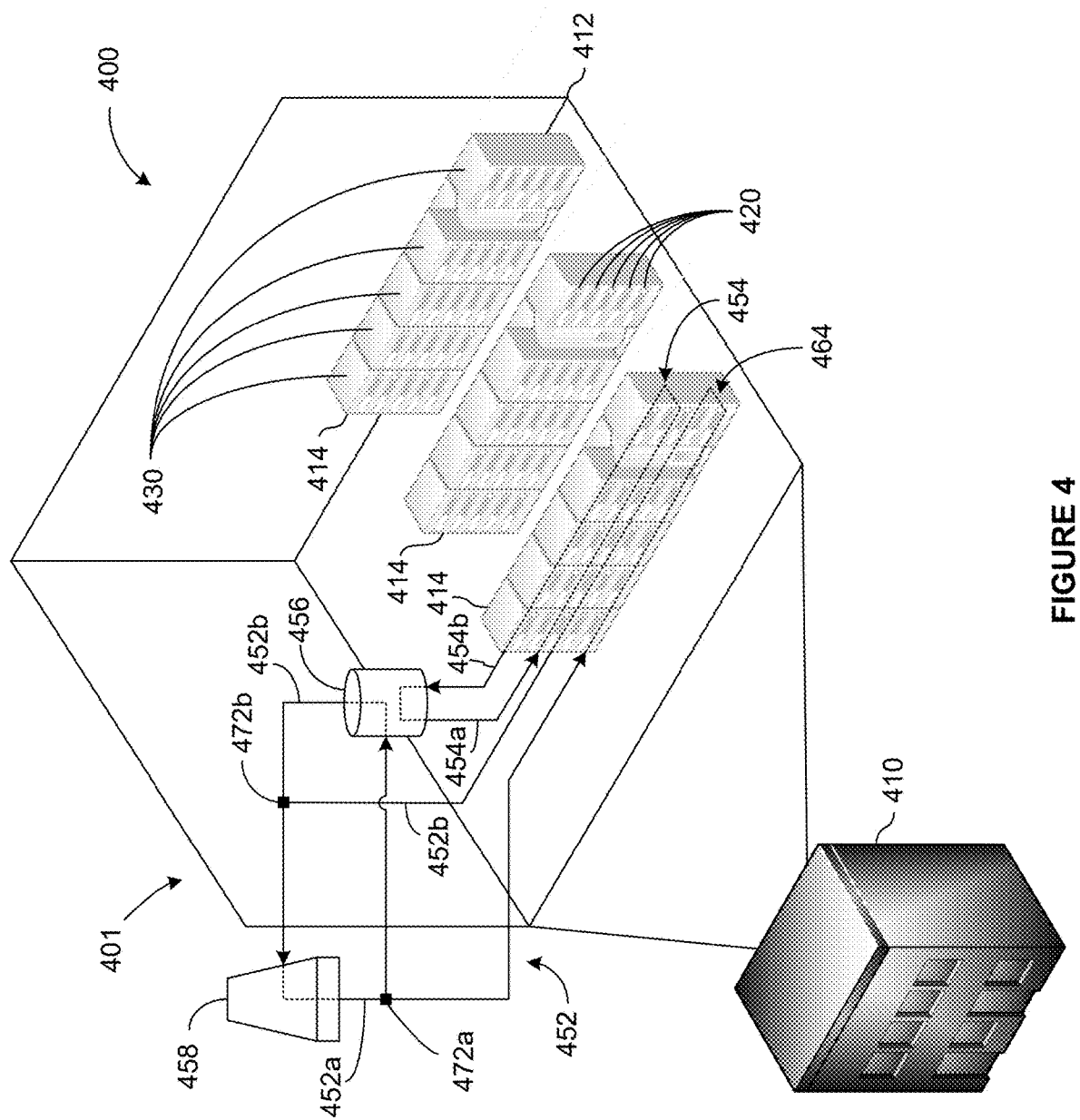
FIG. 4 illustrates an example data center environment, in accordance with at least one embodiment.

FIG. 4 illustrates an exemplary data center environment 400 in accordance with at least one embodiment. Data center environment 400 is similar to data center environment 200 of FIG. 2 and data center environment 300 of FIG. 3, with similar elements being identified with similar reference numerals, and so, for sake of brevity, their structure, function, and/or operation are not repeated in detail herein. However, in contrast to data center environment 200 and data center environment 300, data center environment 400 includes a data center cooling system 401 having a notably different architecture, as described in further detail below.

In at least one embodiment, data center environment 400 may include a cooling system 401 that may be used for cooling computing systems 420, which may reside and operate in data center 410. In at least one embodiment, computing systems 420 may take a form of computing system 620 illustrated in FIG. 6 and described with respect thereto. In at least one embodiment, computing systems 420 may be rack-based computing systems that are mounted in a series of computing racks 430, which may be arranged in a series of rows 414. In at least one embodiment, computing systems 420 may include one or more system components, each of which may consume some amount of power and generate some amount of heat during operation. In at least one embodiment, computing systems 420 may include one or more high-power components and/or one or more low-power components.

In at least one embodiment, cooling system 401 may be a hybrid liquid cooling system that includes or employs one or more liquid cooling techniques. In at least one embodiment, for example, cooling system 401 may be a dual-mode liquid cooling system that employs direct-to-chip (or direct) liquid cooling and immersive liquid cooling techniques to cool computing systems 420 and/or system components thereof. In at least one embodiment, for instance, cooling system 401 may operate to cool a subset of system components of a computing system 420 using direct liquid cooling and may cool another subset of system components of computing system 420 using immersive liquid cooling. In at least one embodiment, for example, direct liquid cooling may be used to cool high-power components of a computing system 420 and immersive liquid cooling may be used to cool low-power components of computing system 420. In at least one embodiment, immersive liquid cooling may also operate to (indirectly) cool high-power components of computing system 420.

In at least one embodiment, cooling system 401 may comprise one or more cooling loops (or cooling cycles). In at least one embodiment, for example, cooling system 401 may be a hybrid liquid cooling system that employs a primary cooling loop for a first cooling technique, which may also operate in a dual-loop arrangement with a secondary cooling loop for one or more other cooling techniques. In at least one embodiment, in a primary cooling loop, heat may be removed from computing systems 420 and/or system components thereof and carried directly to an external cooling device. In at least one embodiment, for example, cooling system 401 may be a dual-mode cooling system that employs a primary cooling loop for direct liquid cooling (e.g., cold plate cooling), which may also operate in a dual loop arrangement with a secondary cooling loop for immersive liquid cooling. In at least one embodiment, a complexity of cooling system 401 may be reduced and/or an operating efficiency may be improved. In at least one embodiment, for example, relative to cooling system 201, a second primary cooling loop 262 and a second secondary cooling loop 264 may not be included or used. In at least one embodiment, this may simplify deployment and maintenance and an operating efficiency of cooling system 401, for example, as a second heat exchange device 266 and second external cooling device 268 may not be included or used and a power associated with operation of such components may not be consumed. In at least one embodiment, a number of liquid coolants used may also be reduced, which may allow cooling system 401 to be used in certain deployment conditions. In at least one embodiment, cooling system 201 may utilize water as a liquid coolant in primary cooling loops 252, 262. In at least one embodiment, a data center facility may not have or provide access to water and such a deployment may not be possible. In at least one embodiment, cooling system 401 may not use water as a liquid coolant, and thus, may be suitable for use in such environments.

In at least one embodiment, as illustrated in FIG. 4, cooling system 401 may employ a primary cooling loop 452 for direct liquid cooling (e.g., cold plate cooling), which may also operate in a dual-loop arrangement with secondary cooling loop 454 for immersive liquid cooling. In at least one embodiment, for example, secondary cooling loop 454 may operate to remove heat from computing systems 420 and/or system components thereof, which may be transferred to primary cooling loop 452 using heat exchange device 456. In at least one embodiment, primary cooling loop 452 may also operate to remove heat directly from computing systems 420 and/or system components thereof. In at least one embodiment, primary cooling loop 452 may operate to remove heat directly from high-power components of computing systems 420 and indirectly (via secondary cooling loop 454) from low-power components of computing systems 420. In at least one embodiment, primary cooling loop 452 may carry heat removed (directly and indirectly via secondary cooling loop 454) from computing systems 420 and/or certain system components thereof to an external cooling device 458, which may remove heat therefrom and discharge it to an ambient environment.

In at least one embodiment, a first liquid coolant may be circulated in primary cooling loop 452 and a second liquid coolant may be circulated in secondary cooling loop 454. In at least one embodiment, first liquid coolant may be or include water or deionized water. In at least one embodiment, first liquid coolant may be or include a mixture of water and one or more additives. In at least one embodiment, for example, first liquid coolant may be or include a mixture of water and ethylene glycol (EGW) or water and propylene glycol (PGW). In at least one embodiment, for instance, first liquid coolant may be or include a 25% concentration mixture of water and propylene glycol (or PG-25). In at least one embodiment, first liquid coolant may be or include a refrigerant. In at least one embodiment, for example, first liquid coolant may be or include a hydrofluorocarbon (HFC) or an HFC blend such as R-134a, R-410a, R-404a, or the like. In at least one embodiment, first liquid coolant may be a dielectric (or non-conductive) coolant. In at least on embodiment, first liquid coolant may be or include fluorochemicals, fluorocarbons, hydrocarbons, or the like. In at least one embodiment, first liquid coolant may be or include oil such as mineral oils, synthetic oils, natural oils, or the like. In at least one embodiment, first liquid coolant may be or include an engineered fluid such as BitCool® BC-888 dielectric coolant or ElectroCool® EC-100 dielectric coolant, marketed by Engineered Fluids, Inc. of Saint Petersburg, Florida. In at least one embodiment, first liquid coolant may have an ozone depletion potential (ODP) below a particular ODP threshold and/or a global warming potential (GWP) below a particular GWP threshold. In at least one embodiment, first liquid coolant may be a single-phase coolant. In at least one embodiment, first liquid coolant may be a dual-phase coolant. In at least one embodiment, first liquid coolant may not vaporize in primary cooling loop 452.

In at least one embodiment, second liquid coolant may be a dielectric (or non-conductive) coolant in which electronic components, such as system components of computing systems 420, may be immersed without causing a short circuit. In at least on embodiment, second liquid coolant may be or include fluorochemicals, fluorocarbons, hydrocarbons, or the like. In at least one embodiment, second liquid coolant may be or include oil such as mineral oils, synthetic oils, natural oils, or the like. In at least one embodiment, second liquid coolant may be or include an engineered fluid such as BitCool® BC-888 dielectric coolant or ElectroCool® EC-100 dielectric coolant, marketed by Engineered Fluids, Inc. of Saint Petersburg, Florida. In at least one embodiment, second liquid coolant may have an ozone depletion potential (ODP) below a particular ODP threshold and/or a global warming potential (GWP) below a particular GWP threshold. In at least one embodiment, second liquid coolant may be a single-phase coolant. In at least one embodiment, second liquid coolant may be a dual-phase coolant. In at least one embodiment, second liquid coolant may not vaporize in secondary cooling loop 454.

In at least one embodiment, first liquid coolant may be circulated in primary cooling loop 452 between external cooling device 458 and heat exchange device 456 and computing systems 420, which may be in bi-directional fluid communication with each another. In at least on embodiment, for example, as part of a supply path 452a, first liquid coolant may flow from an outlet of external cooling device 458 to hydraulic valve 472a, where it may branch off with a portion of first liquid coolant continuing to heat exchange device 456 and another portion of first liquid coolant continuing to computing systems 420. In at least one embodiment, as part of a return path 452b, a portion of first liquid coolant may flow from an outlet of heat exchange device 456 and another portion of first liquid coolant may flow from an outlet of computing systems 420 to a hydraulic valve 472b, where they may merge and continue along to an inlet of external cooling device 458. For convenience of illustration, primary cooling loop 452 and secondary cooling loop 454 are illustrated in FIG. 4 using solid and dashed lines. However, it will be appreciated that each cooling loop may be comprised of a number of plumbing features, including for example, tubing, hoses, or pipes (e.g., PVC pipes or flexible EPDM tubing), manifolds, valves, joints, couplings, fittings, or the like.

In at least one embodiment, heat exchange device 456 and/or external cooling device 458 may operate to control a flow rate of first liquid coolant in primary cooling loop 452. In at least one embodiment, for example, heat exchange device 456 and/or external cooling device 458 may include one or more pumps and/or valves that may operate to control a pressure along primary cooling loop 452, for example, along supply path 452a and/or return path 452b. In at least one embodiment, heat exchange device 456 may operate to control a flow rate of second liquid coolant in secondary cooling loop 454. In at least one embodiment, for example, heat exchange device 456 may include one or more pumps and/or valves that may operate to control a pressure along secondary cooling loop 454, for example, along supply path 454a and return paths 454b. In at least one embodiment, heat exchange device 456 and/or external cooling device 458 may include a controller that can be used to effectuate such control. In at least one embodiment, cooling system 401 may include an independent controller that can be used to effectuate such control.

In at least one embodiment, external cooling device 458 may supply first liquid coolant to heat exchange device 456 and computing systems 420 at an initial temperature and may receive first liquid coolant from heat exchange device 456 and computing systems 420 at a return temperature. In at least one embodiment, external cooling device 458 may be configured to supply first liquid coolant at a particular temperature, for example, between 17-50° Celsius, and may receive first liquid coolant from heat exchange device 456 at a relatively higher return temperature, for example, between 10-15° Celsius higher. In at least one embodiment, external cooling device 458 may operate to remove heat from first liquid coolant received from heat exchange device 456 and computing systems 420 and cool it to a particular temperature. In at least on embodiment, for example, external cooling device 458 may restore first liquid coolant received from heat exchange device 456 and computing systems 420 to its initial supply temperature. In at least one embodiment, external cooling device 458 may then recirculate first liquid coolant in primary cooling loop 452, back along supply path 452a. In at least one embodiment, external cooling device 458 may discharge heat removed from first liquid coolant to an ambient environment.

In at least one embodiment, external cooling device 458 may be or include a free cooler. In at least one embodiment, external cooling device 458 may be or include a free cooler that employs a natural or induced draft cooling tower. In at least one embodiment, external cooling device 458 may be or include a chiller that removes heat from first liquid coolant. In at least one embodiment, may be or include a chiller that employs a vapor-compression, adsorption refrigeration, or absorption refrigeration cycle. In at least one embodiment, external cooling device 458 may be or include a water-based chiller. In at least one embodiment, external cooling device 458 may be or include a direct expansion (DX) cooling unit that removes heat from first liquid coolant. In at least one embodiment, external cooling device 458 may be or include a DX cooling unit that uses a condensed refrigerant.

In at least one embodiment, heat exchange device 456 may supply second liquid coolant to computing systems 420 at an initial supply temperature and may receive second liquid coolant from computing systems 420 at a return temperature. In at least one embodiment, heat exchange device 456 may be configured to supply second liquid coolant to computing systems 420 at a particular temperature, for example, between 21-54° Celsius, and may receive second liquid coolant back from computing systems 420 at a relatively higher return temperature, for example, between 10-15° Celsius higher. In at least one embodiment, heat exchange device 456 may operate to remove heat from second liquid coolant received from computing systems 420. In at least one embodiment, for example, heat exchange device 456 may restore second liquid coolant received from computing systems 420 to their initial supply temperature. In at least one embodiment, heat exchange device 456 may then recirculate second liquid coolant in secondary cooling loop 454, back along supply path 454a. In at least one embodiment, for example, heat exchange device 456 may operate to remove heat from second liquid coolant by transferring heat therefrom to first liquid coolant circulating in primary cooling loop 452.

In at least one embodiment, for instance, heat exchange device 456 may receive first liquid coolant from external cooling device 458 at an initial supply temperature, which may be relatively lower than a temperature of second liquid coolant returned by computing systems 420. Heat exchange device 456 may transfer heat from second liquid coolant to first liquid coolant, thereby reducing a temperature of second liquid coolant and raising a temperature of first liquid coolant. Heat exchange device 456 may then recirculate cooled second liquid coolant back to computing systems 420 and return heated first liquid coolant back to external cooling device 458. In at least one embodiment, for example, heat exchange device 456 may be or include a liquid-to-liquid cooling distribution unit (CDU) having a heat exchanger provided therein, which may be used to transfer heat from second liquid coolant to first liquid coolant.

In at least one embodiment, heat may be absorbed from computing systems 420 in primary cooling loop 452 by flowing first liquid coolant through one or more heat transfer devices. In at least one embodiment, for example, first liquid coolant may enter a computing system 420 and flow through one or more heat transfer devices disposed therein before exiting computing system 420. In at least one embodiment, each heat transfer device may be thermally coupled to one or more system components of computing system 420. In at least one embodiment, for example, one or more heat transfer devices may each be thermally coupled to one or more high-power components. In at least one embodiment, a heat transfer device may be coupled to a system component using an adhesive such as a thermal epoxy. In at least one embodiment, a heat transfer device may be mechanically coupled to a system component, or a support structure (e.g., a PCB board) adjacent thereto, such that heat transfer device may be in physical contact with or proximity to a system component. In at least one embodiment, a thermal interface material (TIM) may be positioned between a heat transfer device and a system component in order to enhance thermal coupling therebetween.

In at least one embodiment, a heat transfer device may operate to cool one or more system components by transferring heat from system components to second liquid coolant flowing therethrough. In at least one embodiment, for example, a heat transfer device may be or include a cold plate that may absorb heat from one or more system components and transfer it to second liquid coolant flowing therethrough. In at least one embodiment, a cold plate may be a plate made of a thermally conductive material, such as copper, aluminum, steel or stainless steel, having one or more internal passages formed therein through which second liquid coolant may flow. In at least one embodiment, a cold plate may absorb heat from one or more system components via conduction and transfer heat to second liquid coolant via convection.

In at least one embodiment, heat may be absorbed from computing systems 420 in secondary cooling loop 454 by immersing and flowing second liquid coolant over one or more system components thereof. In at least one embodiment, second liquid coolant may flow across one or more system components of computing systems 420 and absorb heat therefrom via convection. In at least one embodiment, for example, computing system 420 may comprise a sealed chassis that houses its system components. In at least one embodiment, second liquid coolant may be used to, partially or completely, fill a sealed chassis such that one or more system components of computing system 420 are immersed therein. In at least on embodiment, for example, low power components of computing system 420 may be immersed in second liquid coolant. As second liquid coolant flows through computing system 420, for example, between an inlet and outlet provided in sealed chassis, it may pass across and absorb heat from system components immersed therein. In at least one embodiment, one or more heat transfer devices used for direct cooling may also be housed in sealed chassis of computing system 420 and immersed within second liquid coolant therein. In at least one embodiment, as second liquid coolant flows through computing system 420, it may pass across and absorb heat from heat transfer devices, indirectly cooling one or more additional system components coupled thereto.

Figure 5:
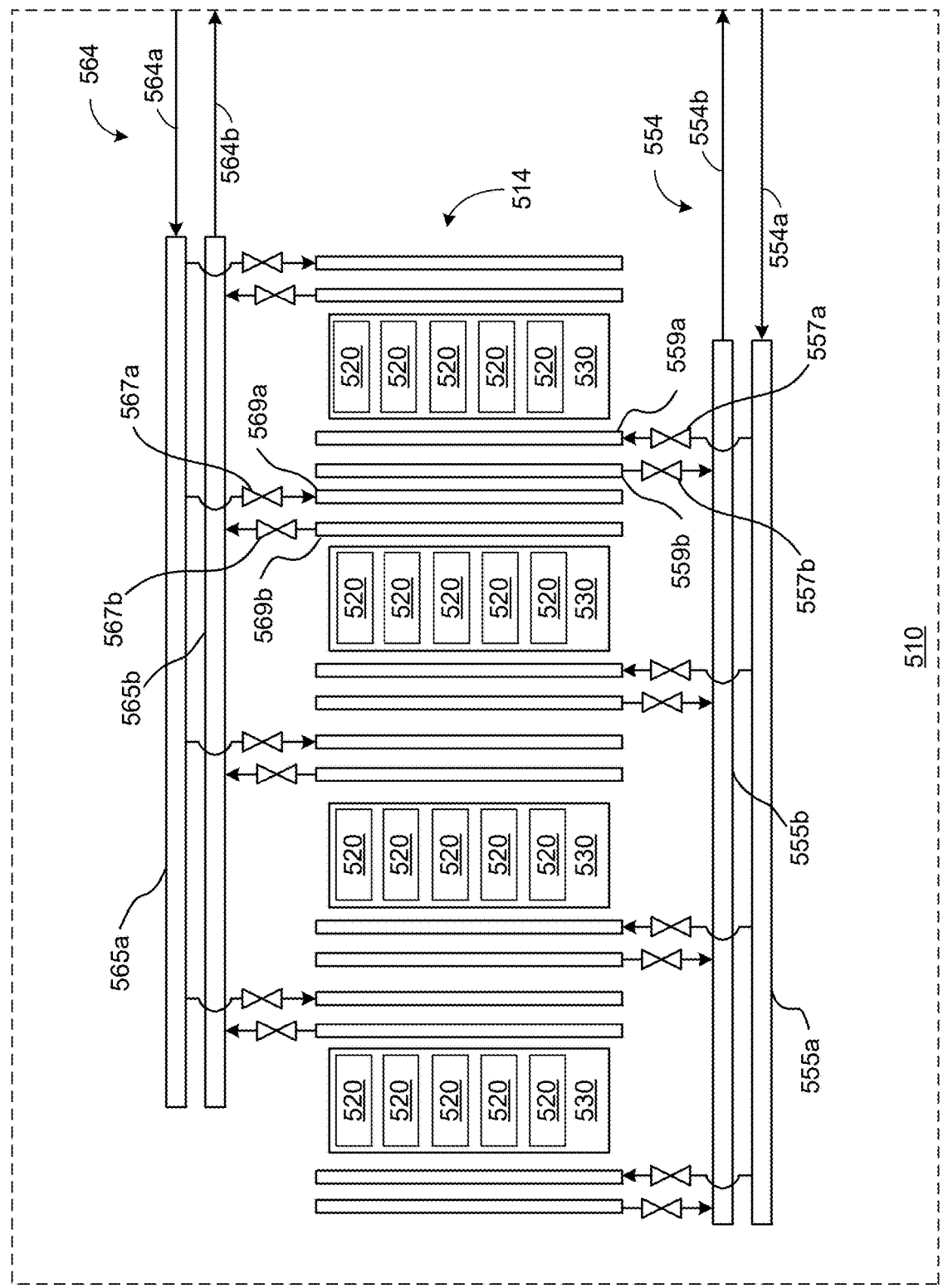
FIG. 5 illustrates an example data center environment, in accordance with at least one embodiment.

FIG. 5 illustrates an example data center environment 500 in accordance with at least one embodiment. Data center environment 500 is similar to data center environment 200 of FIG. 2, data center environment 300 of FIG. 3, and data center environment 400 of FIG. 4, with similar elements being identified with similar reference numerals, and so, for sake of brevity, their structure, function, and/or operation are not repeated in detail herein. FIG. 5 and its description below, however, notably provide additional detail regarding a structure, function, and/or operation of first cooling loop 554 and second cooling loop 564 (which may generally correspond to secondary cooling loops 254, 264 of FIG. 2, secondary cooling loops 354, 364 of FIG. 3, and primary cooling loop 452 and secondary cooling loop 454 of FIG. 4).

In at least one embodiment, data center environment 500 may include a cooling system 501 that may be used for cooling computing systems 520, which may reside and operate in data center 510. In at least one embodiment, computing systems 520 may be rack-based computing systems that are mounted in a series of computing racks 530, which may be arranged in a row 514. While one row 514 of computing racks 530 is shown in FIG. 3, it will be appreciated that cooling system 501 may be used to provide cooling for computing systems 520 in multiple rows 514 of computing racks 530 in one or more rooms of data center 510. Likewise, while multiple computing racks 530 having multiple computing systems 520 mounted therein are shown in FIG. 3, it will be appreciated that cooling system 501 may be used to provide cooling for an individual computing system 520 or an individual computing rack 530 of computing systems 520.

In at least one embodiment, cooling system 501 may be a hybrid liquid cooling system that includes or employs one or more liquid cooling techniques. In at least one embodiment, for example, cooling system 501 may be a dual-mode liquid cooling system that employs direct-to-chip (or direct) liquid cooling (e.g., cold plate cooling) and immersive liquid cooling techniques to cool computing systems 520 and/or system components thereof. In at least one embodiment, cooling system 501 may comprise one or more cooling loops (or cooling cycles).

In at least one embodiment, for example, cooling system 501 may employ a first cooling loop 554 for direct liquid cooling and a second cooling loop 564 for immersive liquid cooling, which may each operate to remove heat from computing systems 520 and/or system components thereof. In at least one embodiment, for instance, first cooling loop 554 may be used to cool a subset of system components of computing systems 520, such as high-power components, and second cooling loop 564 may be used to cool another subset of system components of computing systems 520, such as low-power components. In at least one embodiment, second cooling loop 564 may provide additional cooling to system components cooled by first cooling loop 554.

In at least one embodiment, heat removed from computing systems 520 by first cooling loop 554 and second cooling loop 564 may be transferred to one or more primary cooling loops (not illustrated) using one or more heat exchange devices, as in cooling systems 201, 301. Primary cooling loops, in turn, may carry heat to one or more external cooling devices, which may remove and discharge heat from primary cooling loops to an ambient environment, as in cooling systems 201, 301.

In at least one embodiment, heat removed from computing systems 520 by first cooling loop 554 may be carried directly to an external cooling device, as in cooling system 401 (e.g., with first cooling loop 554 being similar to primary cooling loop 452). In at least one embodiment, heat removed from computing systems 520 by second cooling loop 564 may be transferred to first cooling loop 554 using a heat exchange device (not illustrated), which in turn, may be carried to an external cooling device, as in cooling system 401.

In at least one embodiment, a first liquid coolant may be circulated in first cooling loop 554 and a second liquid coolant may be circulated in second cooling loop 564. In at least one embodiment, first liquid coolant may be circulated in first cooling loop 554 between a heat exchange device (as in cooling systems 201, 301) or external cooling device (as in cooling system 401) and computing systems 520, which may be in bi-directional fluid communication with one another. In at least one embodiment, for example, first liquid coolant may flow from an outlet of a heat exchange device or external cooling device to an inlet of computing systems 520, as part of a supply path 554a. First liquid coolant may pass through computing systems 520 and absorb heat therefrom (as discussed further below), after which it may flow from an outlet of computing systems 520 to an inlet of a heat exchange device or external cooling device, as part of return path 554b.

In at least one embodiment, first liquid coolant may traverse one or more supply manifolds and return manifolds along supply path 554a and return path 554b, respectively. In at least one embodiment, supply manifolds may operate to distribute first liquid coolant along a number of different branches and return manifolds may operate to collect and merge first liquid coolant from a number of different branches. In at least one embodiment, for example, first liquid coolant may flow from an outlet of heat exchange device 556 to a row supply manifold 555a, which may distribute first liquid coolant to one or more rack supply manifolds 559a. Rack supply manifolds 559a, in turn, may distribute first liquid coolant to one or more computing systems 520 coupled thereto. In at least one embodiment, after first liquid coolant passes through a computing system 520 (and absorbs heat therefrom), it may be collected by a rack return manifold 559b associated with computing rack 530 in which computing system 520 is mounted. In at least one embodiment, first liquid coolant may then flow from rack return manifold 559b to row return manifold 555b. Row return manifold 555b may collect first liquid coolant from one or more rack return manifolds 559b and return first liquid coolant to a heat exchange device or external cooling device.

In at least one embodiment, rack supply and rack return manifolds 559a, 559b may be coupled to and in fluid communication with row supply and row return manifolds 555a, 555b using rack supply and rack return valves 557a, 557b. In at least one embodiment, rack supply and rack return valves 557a, 557b may be used to regulate a flow of first liquid coolant to and from corresponding rack supply and rack return manifolds 559a, 559b. In at least one embodiment, for example, rack supply and rack return valves 557a, 557b may be placed in a fully open, a partially open or partially closed, and/or a fully closed state. In at least one embodiment, rack supply and rack return valves 557a, 557b may be hydraulic ball valves. In at least one embodiment, rack supply and rack return valves 557a, 557b may be coupled to rack supply and rack return manifolds 559a, 559 and/or row supply and row return manifolds 555a, 555b using a hydraulic coupling. In at least one embodiment, a hydraulic coupling may have a quick-disconnect feature that may allow rack supply and rack return valves 557a, 557b to be coupled and/or decoupled without any spillover of first liquid coolant. In at least one embodiment, for example, an FD-83 series stainless steel coupling manufactured by Eaton may be used for rack supply and rack return valves 557a, 557b. In at least one embodiment, computing systems 520 may be coupled to and in fluid communication with rack supply and rack return manifolds 559a, 559b. In at least one embodiment, for example, computing systems 520 may be coupled to rack supply and rack return manifolds 559a, 559b using a hydraulic coupling. In at least one embodiment, a hydraulic coupling may have a quick-disconnect feature that may allow computing systems 520 to be coupled and/or decoupled from rack supply and rack return manifolds 559a, 559b without any spillover of first liquid coolant. In at least one embodiment, for example, an SCG-09 quick-release coupling manufactured by Staubli may be used for coupling computing systems 520 to rack supply and rack return manifolds 559a, 559b.

It will be appreciated that first cooling loop 554 may comprise one or more plumbing features beyond those illustrated in FIG. 5, including for example, tubing, hoses, or pipes (e.g., PVC pipes or flexible EPDM tubing), manifolds, valves, joints, couplings, fittings, or the like). In at least one embodiment, for example, supply path 554a and return path 554b may traverse one or more additional supply or return manifolds beyond those illustrated. In at least one embodiment, for example, first liquid coolant may flow from an outlet of a heat exchange device or external cooling device to a data center supply manifold and/or a room supply manifold before reaching row supply manifold 555a. In at least one embodiment, a data center supply manifold may distribute first liquid coolant between one or more rooms of data center 510, and a room supply manifold may distribute first liquid coolant between one or more rows 514 of computing racks 530, for example, within a given room of data center 510. In at least one embodiment, first liquid coolant may flow from an outlet of row return manifold 555b to a data center return manifold and/or a room return manifold before returning to a heat exchange device or external cooling device. In at least one embodiment, a room return manifold may collect first liquid coolant from one or more row return manifolds 555b, and a data center return manifold may collect first liquid coolant from one or more rooms of data center 510.

In at least one embodiment, first liquid coolant distributed by rack supply manifolds 559a may flow through and absorb heat from computing systems 520 and/or one or more system components therein, before exiting computing systems 520 and being collected by rack return manifolds 559b. In at least one embodiment, for example, heat may be absorbed from computing systems 520 by flowing first liquid coolant through one or more heat transfer devices disposed therein, each of which may be thermally coupled to one or more system components of computing systems 520. In at least one embodiment, for example, one or more cold plates may be used to absorb heat from system components of computing systems 520 and transfer it to first liquid coolant flowing therethrough.

In at least one embodiment, where multiple heat transfer devices are used to cool a computing system 520, heat transfer devices may be arranged in serial and/or parallel fashion. In at least one embodiment, for example, heat transfer devices disposed in a computing system 520 may be serially coupled together and in fluid communication with one another. In at least one embodiment, first liquid coolant may flow through and absorb heat from each heat transfer device in sequential fashion. In at least one embodiment, where multiple heat transfer devices are used to cool a computing system 520, first liquid coolant may flow through and absorb heat from one or more heat transfer devices and/or subsets of serially coupled heat transfer devices in parallel. In at least one embodiment, for example, a local supply manifold (not illustrated) may receive first liquid coolant from an outlet of rack supply manifold 559a and distribute first liquid coolant to each heat transfer device and/or subset thereof. In at least one embodiment, first liquid coolant may flow through each heat transfer device and/or subset thereof in parallel, after which it may be collected by a local return manifold (not illustrated) before flowing to rack return manifold 559b.

In at least one embodiment, second liquid coolant may be circulated in second cooling loop 564 between a heat exchange device and computing systems 520, which may be in bi-directional fluid communication with one another. In at least one embodiment, for example, second liquid coolant may flow from an outlet of a heat exchanged device to an inlet of computing systems 520, as part of a supply path 564a. Second liquid coolant may pass through computing systems 520 and absorb heat therefrom (as discussed further below), after which it may flow from an outlet of computing systems 520 to an inlet of a heat exchange device, as part of return path 564b.

In at least one embodiment, second liquid coolant may traverse one or more supply manifolds or return manifolds along supply path 564a or return path 564b, respectively. In at least one embodiment, supply manifolds may operate to distribute second liquid coolant along a number of different branches and return manifolds may operate to collect and merge second liquid coolant from a number of different branches. In at least one embodiment, for example, second liquid coolant may flow from an outlet of heat exchange device 566 to a row supply manifold 565a, which may distribute second liquid coolant to one or more rack supply manifolds 569a. Rack supply manifolds 569a, in turn, may distribute second liquid coolant to one or more computing systems 520 coupled thereto. In at least one embodiment, after second liquid coolant passes through a computing system 520 (and absorbs heat therefrom), it may be collected by a rack return manifold 569b associated with computing rack 530 in which computing system 520 is mounted. Second liquid coolant may then flow from rack return manifold 569b to row return manifold 565b. Row return manifold 565b may collect second liquid coolant from one or more rack return manifolds 569b and return second liquid coolant to a heat exchange device.

In at least one embodiment, rack supply and rack return manifolds 569a, 569b may be coupled to and in fluid communication with row supply and row return manifolds 565a, 565b using rack supply and rack return valves 567a, 567b. In at least one embodiment, rack supply and rack return valves 567a, 567b may be used to regulate a flow of second liquid coolant to and from corresponding rack supply and rack return manifolds 569a, 569b. In at least one embodiment, for example, rack supply and rack return valves 567a, 567b may be placed in a fully open, a partially open or partially closed, and/or a fully closed state. In at least one embodiment, rack supply and rack return valves 567a, 567b may be hydraulic ball valves. In at least one embodiment, rack supply and rack return valves 567a, 567b may be coupled to rack supply and rack return manifolds 569a, 569b and/or row supply and row return manifolds 565a, 565b using a hydraulic coupling. In at least one embodiment, a hydraulic coupling may have a quick-disconnect feature that may allow rack supply and rack return valves 567a, 567b to be coupled and/or decoupled without any spillover of second liquid coolant. In at least one embodiment, for example, an FD-83 series stainless steel coupling manufactured by Eaton may be used for rack supply and rack return valves 567a, 567b. In at least one embodiment, computing systems 520 may be coupled to and in fluid communication with rack supply and rack return manifolds 569a, 569b. In at least one embodiment, for example, computing systems 520 may be coupled to rack supply and rack return manifolds 569a, 569b using a hydraulic coupling. In at least one embodiment, a hydraulic coupling may have a quick-disconnect feature that may allow computing systems 520 to be coupled and/or decoupled from rack supply and rack return manifolds 569a, 569b without any spillover of second liquid coolant. In at least one embodiment, for example, an SCG-09 quick-release coupling manufactured by Staubli may be used for coupling computing systems 520 to rack supply and rack return manifolds 569a, 569b.

It will be appreciated that second cooling loop 564 may comprise one or more plumbing features beyond those illustrated in FIG. 3, including for example, tubing, hoses, or pipes (e.g., PVC pipes or flexible EPDM tubing, manifolds, valves, joints, couplings, fittings, or the like). In at least one embodiment, for example, supply path 564a and return path 564b may traverse one or more additional supply or return manifolds beyond those illustrated. In at least one embodiment, for example, second liquid coolant may flow from an outlet of a heat exchange device to a data center supply manifold and/or a room supply manifold before reaching row supply manifold 565a. A data center supply manifold may distribute second liquid coolant between one or more rooms of data center 510, and a room supply manifold may distribute second liquid coolant between one or more rows 514 of computing racks 530, for example, within a given room of data center 510. Similarly, in at least one embodiment, second liquid coolant may flow from an outlet of row return manifold 565b to a data center return manifold and/or a room return manifold before returning to a heat exchange device. A room return manifold may collect second liquid coolant from one or more row return manifolds 565b, and a data center return manifold may collect second liquid coolant from one or more rooms of data center 510.

In at least one embodiment, second liquid coolant distributed by rack supply manifolds 569a may flow through and absorb heat from computing systems 520 and/or one or more system components therein, before exiting computing systems 520 and being collected by rack return manifolds 569b. In at least one embodiment, for example, second liquid coolant may flow across one or more system components of computing systems 520 and absorb heat therefrom via convection. In at least one embodiment, for example, a computing system 520 may comprise a sealed chassis that houses its system components. Second liquid coolant may be used to, partially or completely, fill a sealed chassis such that one or more system components of computing system 520 are immersed therein. In at least on embodiment, for example, low power components of computing system 520 may be immersed in second liquid coolant. As second liquid coolant flows through computing system 520, for example, between an inlet and outlet provided in its sealed chassis, it may pass across and absorb heat from system components immersed therein. In at least on embodiment, one or more heat transfer devices used for direct cooling may also be housed in sealed chassis of computing system 520 and immersed within second liquid coolant therein. As second liquid coolant flows through computing system 520, it may pass across and absorb heat from heat transfer devices, indirectly cooling one or more additional system components coupled thereto.

Figure 6:
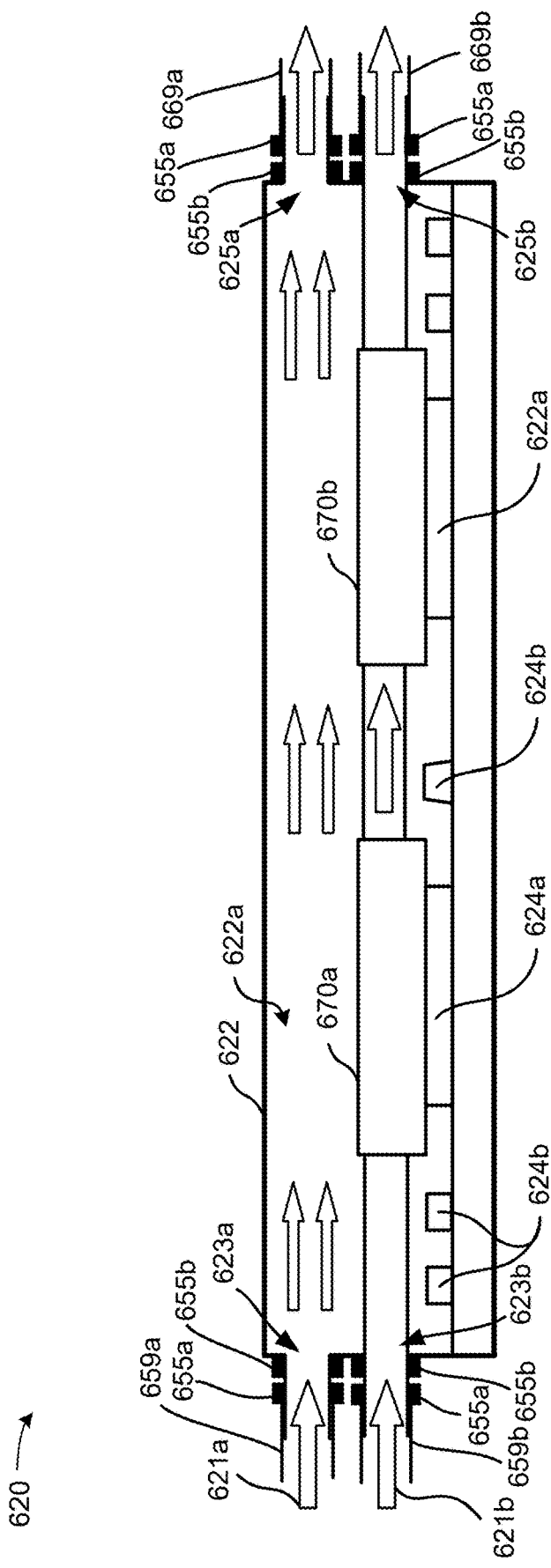
FIG. 6 illustrates an example computing system, in accordance with at least one embodiment.

FIG. 6 illustrates an example computing system 620 in accordance with at least one embodiment. In at least one embodiment, computing system 620 may be used in computing racks 230 of FIG. 2, computing racks 330 of FIG. 3, and/or computing racks 430 of FIG. 4. In at least one embodiment, computing system 620 may include one or more system components 624, each of which may consume some amount of power during operation. An amount of power consumed by a system component 624 may vary during operation, and system components may be described in terms of a peak amount of power (or peak power) that they may consume. System components 624 may also generate heat during operation, which may generally correspond to an amount of power consumed by a system component 624. An amount of heat generated by a system component 624 may vary during operation, and system components may be described in terms of a peak thermal output that they may generate.

System components 624 having a peak power or peak thermal output above a particular threshold may be referred to as high-power components 624a. Similarly, system components 624 that have a peak power or peak thermal output below a particular power threshold may be referred to as low-power components 624b. In at least one embodiment, computing system 620 may include one or more high-power components 624a and/or one or more low-power components 624b. In at least one embodiment, for example, high-power components 624a of computing system 620 may include processing units or circuitry, such as central processing units (CPUs), graphical processing units (GPUs), data processing units (DPUs), field programmable gate arrays (FPGAs), or the like. In at least one embodiment, high-power components 624a of computing system 620 may include high-speed data switches, such as multi-GPU data switches (e.g., an NVSwitch), or the like. In at least one embodiment, high-power components 624a of computing system 620 may include high-speed data transmission devices, such as optical transceivers, or the like. In at least one embodiment, low-power components 624b of computing system 620 may include a mother board, a system memory, a chipset, such as a northbridge or southbridge chipset, data bus interfaces, such as peripheral component interconnect express (PCIe) or non-volatile memory express (NVMe) interfaces, peripheral devices, such as a network interfaces or storage devices, or the like.

In at least on embodiment, computing system 620 may be cooled using a hybrid liquid cooling system that employs one or more liquid cooling techniques. In at least one embodiment, for example, computing system 620 may be cooled by a dual-mode liquid cooling system that employs direct-to-chip (or direct) liquid cooling (e.g., cold plate cooling) and immersive liquid cooling techniques to cool system components thereof. In at least one embodiment, for instance, a subset of system components 624 of computing system 620 may be cooled using direct liquid cooling and another subset of system components 624 may be cooled using immersive liquid cooling. In at least one embodiment, for example, direct liquid cooling may be used to cool high-power components 624a and immersive liquid cooling may be used to cool low-power components 624b. In at least one embodiment, immersive liquid cooling may also operate to (indirectly) cool high-power components 624b.

In at least one embodiment, computing system 620 may include a chassis 622 that may house system components 624. In at least one embodiment, for example, system components 624 may be coupled to a printed circuit board (PCB) that may provide connections between and interconnect system components 624. In at least one embodiment, computing system 620 may be a rack-based computing system and chassis 622 may be adapted to allow computing system 620 to be mechanically coupled to a computing rack. In at least one embodiment, for example, chassis 622 may include one or more brackets, holes, or slots so that computing system 620 may be mounted in a computing rack.

In at least one embodiment, chassis 622 may be a sealed chassis, for example, hermetically sealed, that forms a watertight and/or airtight inner chamber 622a. In at least one embodiment, chassis 622 may include one or more inlets and outlets formed on a surface thereof, through which liquid coolant may enter and exit computing system 620. In at least one embodiment, for example, chassis 622 may include an inlet and outlet for each of one or more liquid cooling techniques. In at least one embodiment, for instance, computing system 620 may include a first coolant inlet 623b and first coolant outlet 625b for direct cooling, through which a first liquid coolant 621b may enter and exit computing system 620, and a second coolant inlet 623a and second coolant outlet 625a for immersive cooling, through which a second liquid coolant 621a may enter and exit computing system 620.

In at least one embodiment, for example, first coolant inlet 623b and second coolant inlet 623a may be coupled to respective supply manifolds (not shown), which may provide first liquid coolant 621b and second liquid coolant 621a to computing system 620. In at least on embodiment, for example, a hydraulic coupling 655 may be used to couple first coolant inlet 623b and second coolant inlet 623a may be coupled to respective supply manifolds. In at least one embodiment, first coolant outlet 625b and second coolant outlet 625a may be coupled to respective return manifolds (not shown), which may collect first liquid coolant 621b and second liquid coolant 621a from computing system 620. In at least on embodiment, for example, a hydraulic coupling 655 may be used to couple first coolant outlet 625b and second coolant outlet 625a to respective return manifolds.

In at least one embodiment, hydraulic coupling 655 may have a quick-disconnect feature that may allow for coupling and/or decoupling without any coolant spillover. In at least one embodiment, for example, hydraulic coupling 655 may be an SCG-09 quick-release coupling manufactured by Staubli. In at least one embodiment, hydraulic coupling 655 may comprise a male component 655a and female component 655b that may interface with each other to affect fluid coupling. In at least one embodiment, one of male component 655a or female component 655b may be coupled to and in fluid communication with a first or second coolant inlet 623b, 623a or first or second coolant outlet 625b, 625a and a matching female component 655b or male component 655a may be coupled to and in fluid communication with a respective supply or return manifold. In at least one embodiment, for example, a matching female component 655b or male component 655a may be coupled to an end of a first supply or return conduit 659a, 669a or second system supply or return conduit 659b, 669b. In at least on embodiment, first supply or return conduit 659a, 669a and second system supply or return conduit 659b, 669b may be a tube, hose, or pipe (e.g., flexible EPDM tubing) that is coupled to and in fluid communication with a respective supply or return manifold.

In at least one embodiment, first liquid coolant 621a and second liquid coolant 621b may each flow through computing system 620 as part of a cooling loop, for example, as part of secondary cooling loops 254, 264 in cooling system 201 of FIG. 2, secondary cooling loops 354, 364 in cooling system 301 of FIG. 3, or primary cooling loop 452 and secondary cooling loop 454 in cooling system 401 of FIG. 4. In at least one embodiment, first liquid coolant 621b and second liquid coolant 621a may flow through and absorb heat from computing system 620 system components 624 therein. In at least one embodiment, for example, heat may be absorbed from computing system 620 by flowing first liquid coolant 621b through one or more heat transfer devices 670 disposed therein, each of which may be thermally coupled to one or more system components 624 of computing systems 620. In at least one embodiment, heat transfer devices 670 may be or include a cold plate that may transfer heat from system components 624 to first liquid coolant 621b flowing therethrough. In at least one embodiment, for example, heat transfer devices 670 may each be thermally coupled to one or more high-power components 624a and may transfer heat from high-power components 624a to first liquid coolant 621a flow therethrough.

In at least one embodiment, heat transfer devices 670 may be arranged in serial and/or parallel fashion. In at least one embodiment, for example, heat transfer devices 670 may be coupled together in serial fashion and in fluid communication with one another. In at least one embodiment, first liquid coolant 621b may flow through and absorb heat from each heat transfer device 670 in sequential fashion. In at least one embodiment, as illustrated in FIG. 6, heat transfer device 670a may be coupled to first coolant inlet 623b and first liquid coolant 621b may enter computing system 620 and flow through heat transfer device 670a. In at least one embodiment, heat transfer device 670a, in turn, may be coupled to heat transfer device 670b, and after exiting heat transfer device 670a (and absorbing heat from system components 624a coupled thereto) first liquid coolant 621a may flow through heat transfer device 670b. In at least one embodiment, heat transfer device 670b may be coupled to first coolant outlet 625b, and after exiting heat transfer device 670b (and absorbing heat from system components 624a coupled thereto) first liquid coolant 621b may flow out of computing system 620.

In at least one embodiment, where multiple heat transfer devices 670 are used to cool computing system 620, first liquid coolant 621b may flow through and absorb heat from one or more heat transfer devices 670 and/or subsets of serially coupled heat transfer devices 670 in parallel. In at least one embodiment, for example, a local supply manifold (not illustrated) may receive first liquid coolant 621b and distribute it to each heat transfer device 670 and/or serially coupled subset thereof. In at least one embodiment, first liquid coolant 621b may flow through each heat transfer device 670 and/or serially coupled subset thereof in parallel, after which it may be collected by a local return manifold (not illustrated). In at least one embodiment, a local supply and return manifold may be provided within chassis 622. In at least one embodiment, local supply and return manifold may be provided external to chassis 622, which may be accommodated by additional coolant inlets and outlets (not shown).

In at least one embodiment, second liquid coolant 621a may flow through and absorb heat from computing system 620 and/or system components 624 therein. In at least one embodiment, for example, second liquid coolant 621a may flow across system components 624 of computing systems 620 and absorb heat therefrom via convection. In at least one embodiment, for example, second liquid coolant 621a may be used to, partially or completely, fill chassis 612 such that one or more system components 624 are immersed therein. In at least on embodiment, for example, low power components 624b may be immersed in second liquid coolant 621a. In at least one embodiment, as second liquid coolant 621a flows through computing system 620, for example, between second coolant inlet 623a and second coolant outlet 625a, it may pass across and absorb heat from system components 624 immersed therein. In at least on embodiment, heat transfer devices 670 may also be immersed within second liquid coolant 621*a*. In at least one embodiment, as second liquid coolant 621*a* flows through computing system 620, it may pass across and absorb heat from heat transfer devices 670 and indirectly from system components 624, such as high-power components 624*a*, coupled thereto.

Figure 7:
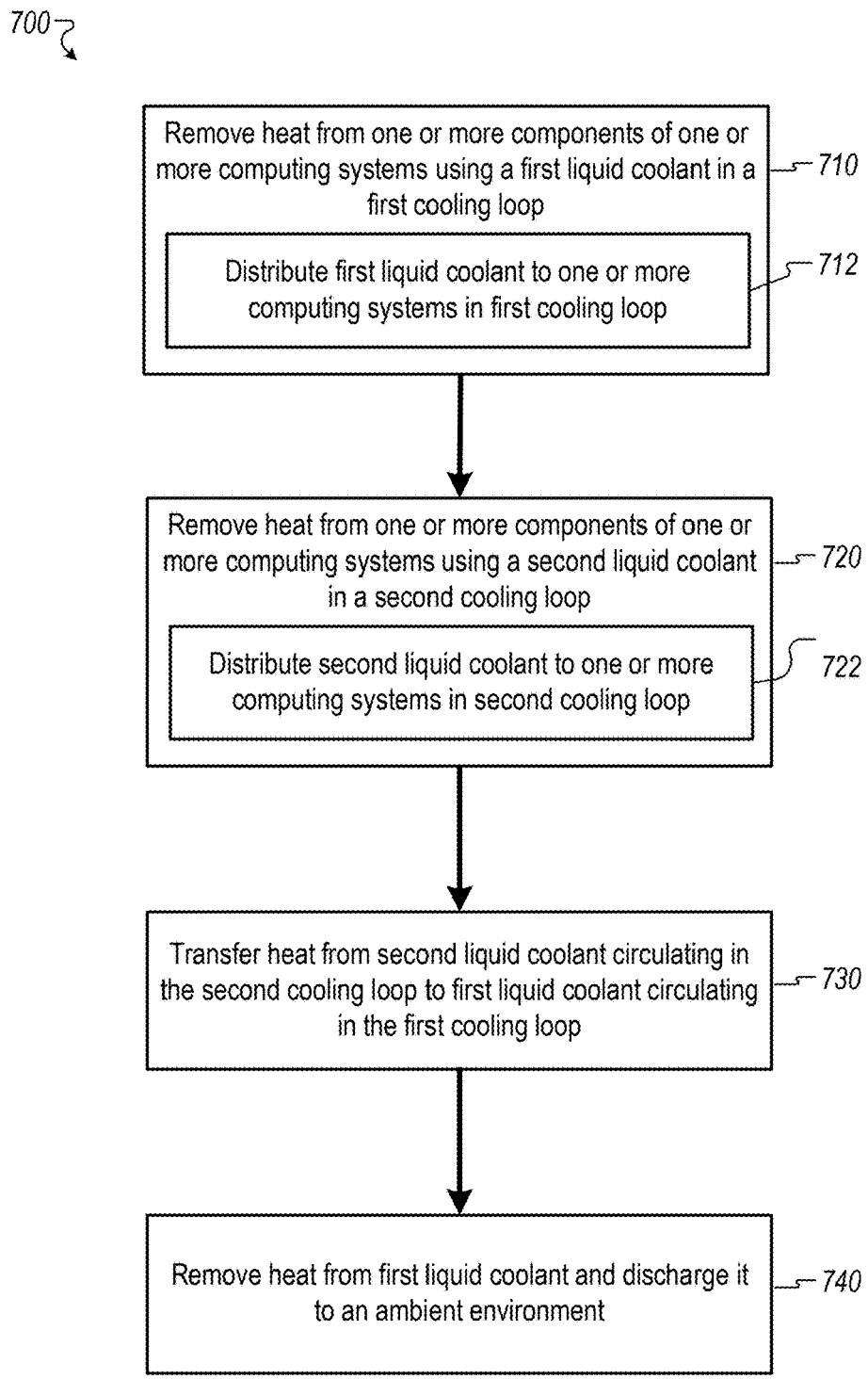
FIG. 7 illustrates a flow diagram of an example method for cooling a data center, in accordance with at least one embodiment.

FIG. 7 illustrates a flow diagram of an exemplary method 700 for cooling a data center, in accordance with at least one embodiment. For sake of simplicity and clarity, method 700 is depicted and described as a series of operations. However, such operations may be performed in other orders and/or concurrently, and with other operations not presented or described herein. Furthermore, not all illustrated operations may be required in implementing method 700. Those skilled in applicable art will also understand and appreciate that method 700 could be represented as a series of interrelated states or events via a state diagram. Additionally, it will be appreciated that method 700 is capable of being stored on an article of manufacture. The term "article of manufacture," as used herein, is intended to encompass a computer-readable device or storage media provided with a computer program and/or executable instructions that, when executed, affect one or more operations. In at least one embodiment, method 700 may be performed by a hybrid liquid cooling system. In at least one embodiment, method 700 may be performed by a dual-mode liquid cooling system. In at least one embodiment, method 700 may be performed by cooling system 401.

In at least one embodiment, at block 710, a system may remove heat from one or more components of one or more computing systems using a first liquid coolant circulated in a first cooling loop. In at least one embodiment, at block 712, a system may distribute a first liquid coolant to one or more computing systems in a first cooling loop. In at least one embodiment, first liquid coolant may absorb heat from one or more computing systems by flowing first liquid coolant through one or more heat transfer devices, such as cold plates. In at least one embodiment, each heat transfer device may be thermally coupled to one or more system components of one or more computing systems. In at least one embodiment, for example, each heat transfer device may be thermally coupled to one or more high-power components of one or more computing systems.

In at least one embodiment, at block 720, a system may remove heat from one or more components of one or more computing systems using a second liquid coolant circulated in a second cooling loop. In at least one embodiment, at block 722, a system may distribute a second liquid coolant to one or more computing systems in a second cooling loop. In at least one embodiment, second liquid coolant may absorb heat from one or more computing systems by immersing and flowing second liquid coolant over one or more system components thereof. In at least one embodiment, for example, one or more computing systems may comprise a sealed chassis that houses its system components. In at least one embodiment, second liquid coolant may flow across one or more system components of one or more computing systems and absorb heat therefrom via convection. In at least on embodiment, for example, one or more low-power components of one or more computing systems may be immersed in second liquid coolant. In at least one embodiment, as second liquid coolant flows through one or more computing systems, for example, between an inlet and outlet provided in a sealed chassis thereof, it may pass across and absorb heat from system components immersed therein. In at least one embodiment, one or more heat transfer devices may also be housed in a sealed chassis and immersed within second liquid coolant therein. In at least one embodiment, as second liquid coolant flows through one or more computing systems, it may pass across and absorb heat from heat transfer devices.

In at least one embodiment, at block 730, a system may transfer heat from second liquid coolant circulating in a second cooling loop to first liquid coolant circulating in said first cooling loop. In at least one embodiment, a system may include a heat exchange device that receives first liquid coolant at an initial supply temperature and a second liquid coolant at a return temperature, for example, after it has removed heat from one or more components of one or more computing systems at block 720. In at least one embodiment, a heat exchange device may transfer heat from second liquid coolant to first liquid coolant, thereby reducing a temperature of second liquid coolant and raising a temperature of first liquid coolant. In at least one embodiment, for example, a heat exchange device may be or include a liquid-to-liquid cooling distribution unit (CDU) having a heat exchanger provided therein.

In at least one embodiment, at block 740, a system may remove heat from first liquid coolant and discharge it to an ambient environment. In at least one embodiment, a system may include an external cooling device that may receive first liquid coolant at a return temperature. In at least one embodiment, for example, an external cooling device may receive first liquid after it has absorbed heat from one or more system components of one or more computing systems at block 710 and/or had heat transferred from second liquid coolant circulating in a second cooling loop at block 730. In at least one embodiment an external cooling device may remove heat from first liquid coolant and cool it to a particular temperature. In at least on embodiment, an external cooling device may restore first liquid coolant to an initial supply temperature. In at least one embodiment, an external cooling device may discharge heat removed from first liquid coolant to an ambient environment. In at least one embodiment, an external cooling device may be or include a free cooler.

Figure 8:
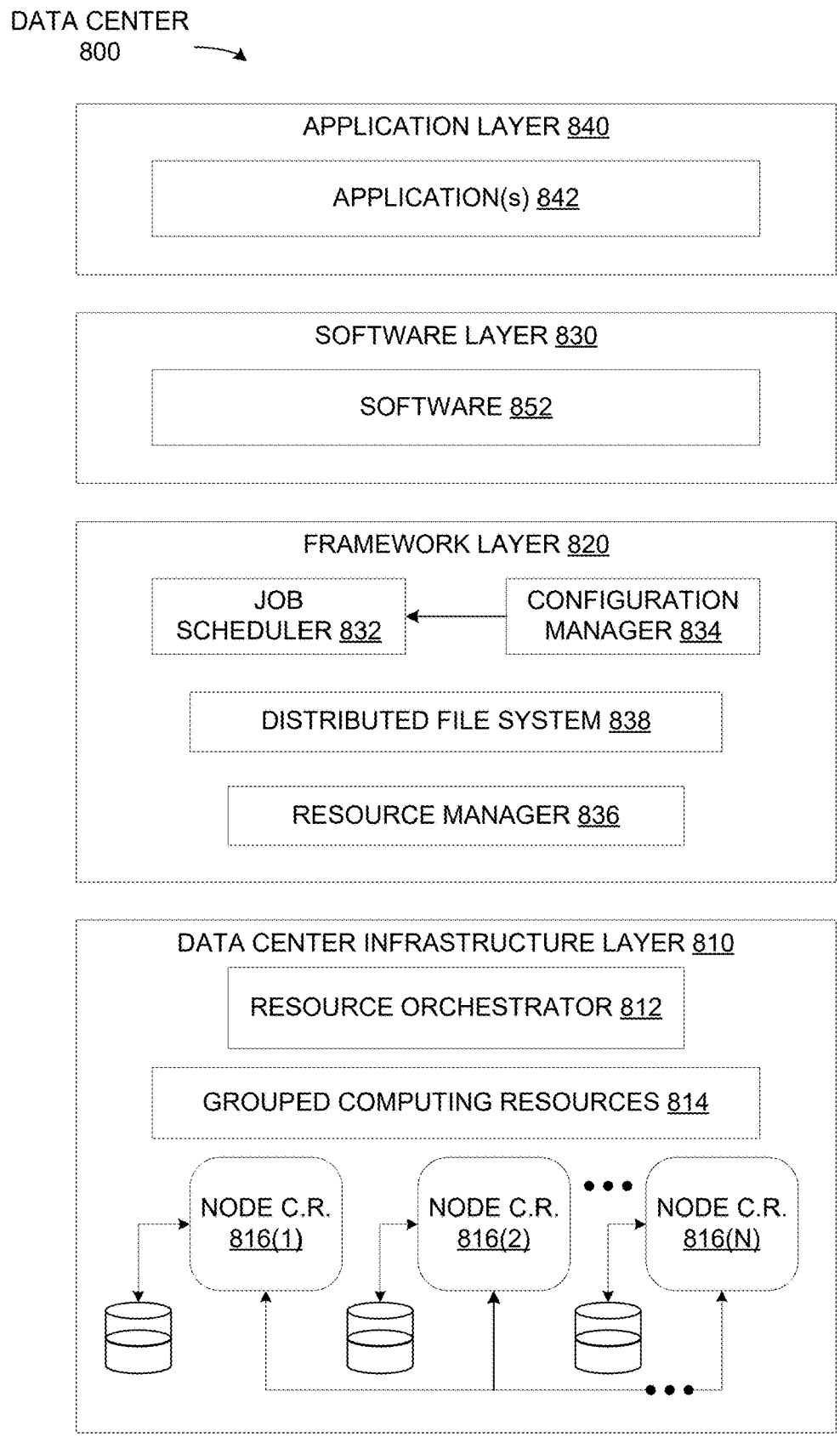
FIG. 8 illustrates an exemplary data center, in accordance with at least one embodiment.

FIG. 8 illustrates an exemplary data center 800, in accordance with at least one embodiment. In at least one embodiment, data center 800 includes, without limitation, a data center infrastructure layer 810, a framework layer 8280, a software layer 830 and an application layer 840.

In at least one embodiment, as shown in FIG. 8, data center infrastructure layer 810 may include a resource orchestrator 812, grouped computing resources 814, and node computing resources ("node C.R.s") 816(1)-816(N), where "N" represents any whole, positive integer. In at least one embodiment, node C.R.s 816(1)-816(N) may include, but are not limited to, any number of central processing units ("CPUs") or other processors (including accelerators, field programmable gate arrays ("FPGAs"), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 816(1)-816(N) may be a server having one or more of above-mentioned computing resources.

In at least one embodiment, grouped computing resources 814 may include separate groupings of node C.R.s housed within one or more racks (not shown), or many racks housed in data centers at various geographical locations (also not shown). Separate groupings of node C.R.s within grouped computing resources 814 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 812 may configure or otherwise control one or more node C.R.s 816(1)-816(N) and/or grouped computing resources 814. In at least one embodiment, resource orchestrator 812 may include a software design infrastructure ("SDI") management entity for data center 800. In at least one embodiment, resource orchestrator 812 may include hardware, software or some combination thereof.

In at least one embodiment, as shown in FIG. 8, framework layer 8280 includes, without limitation, a job scheduler 832, a configuration manager 834, a resource manager 836 and a distributed file system 838. In at least one embodiment, framework layer 8280 may include a framework to support software 852 of software layer 830 and/or one or more application(s) 842 of application layer 840. In at least one embodiment, software 852 or application(s) 842 may respectively include web-based service software or applications, such as those provided by Amazon Web Services, Google Cloud and Microsoft Azure. In at least one embodiment, framework layer 8280 may be, but is not limited to, a type of free and open-source software web application framework such as Apache Spark™ (hereinafter "Spark") that may utilize distributed file system 838 for large-scale data processing (e.g., "big data"). In at least one embodiment, job scheduler 832 may include a Spark driver to facilitate scheduling of workloads supported by various layers of data center 800. In at least one embodiment, configuration manager 834 may be capable of configuring different layers such as software layer 830 and framework layer 8280, including Spark and distributed file system 838 for supporting large-scale data processing. In at least one embodiment, resource manager 836 may be capable of managing clustered or grouped computing resources mapped to or allocated for support of distributed file system 838 and job scheduler 832. In at least one embodiment, clustered or grouped computing resources may include grouped computing resource 814 at data center infrastructure layer 810. In at least one embodiment, resource manager 836 may coordinate with resource orchestrator 812 to manage these mapped or allocated computing resources.

In at least one embodiment, software 852 included in software layer 830 may include software used by at least portions of node C.R.s 816(1)-816(N), grouped computing resources 814, and/or distributed file system 838 of framework layer 8280. One or more types of software may include, but are not limited to, Internet web page search software, e-mail virus scan software, database software, and streaming video content software.

In at least one embodiment, application(s) 842 included in application layer 840 may include one or more types of applications used by at least portions of node C.R.s 816(1)-816(N), grouped computing resources 814, and/or distributed file system 838 of framework layer 8280. In at least one or more types of applications may include, without limitation, CUDA applications, 5G network applications, artificial intelligence application, data center applications, and/or variations thereof.

In at least one embodiment, any of configuration manager 834, resource manager 836, and resource orchestrator 812 may implement any number and type of self-modifying actions based on any amount and type of data acquired in any technically feasible fashion. In at least one embodiment, self-modifying actions may relieve a data center operator of data center 800 from making possibly bad configuration decisions and possibly avoiding underutilized and/or poor performing portions of a data center.

Figure 9:
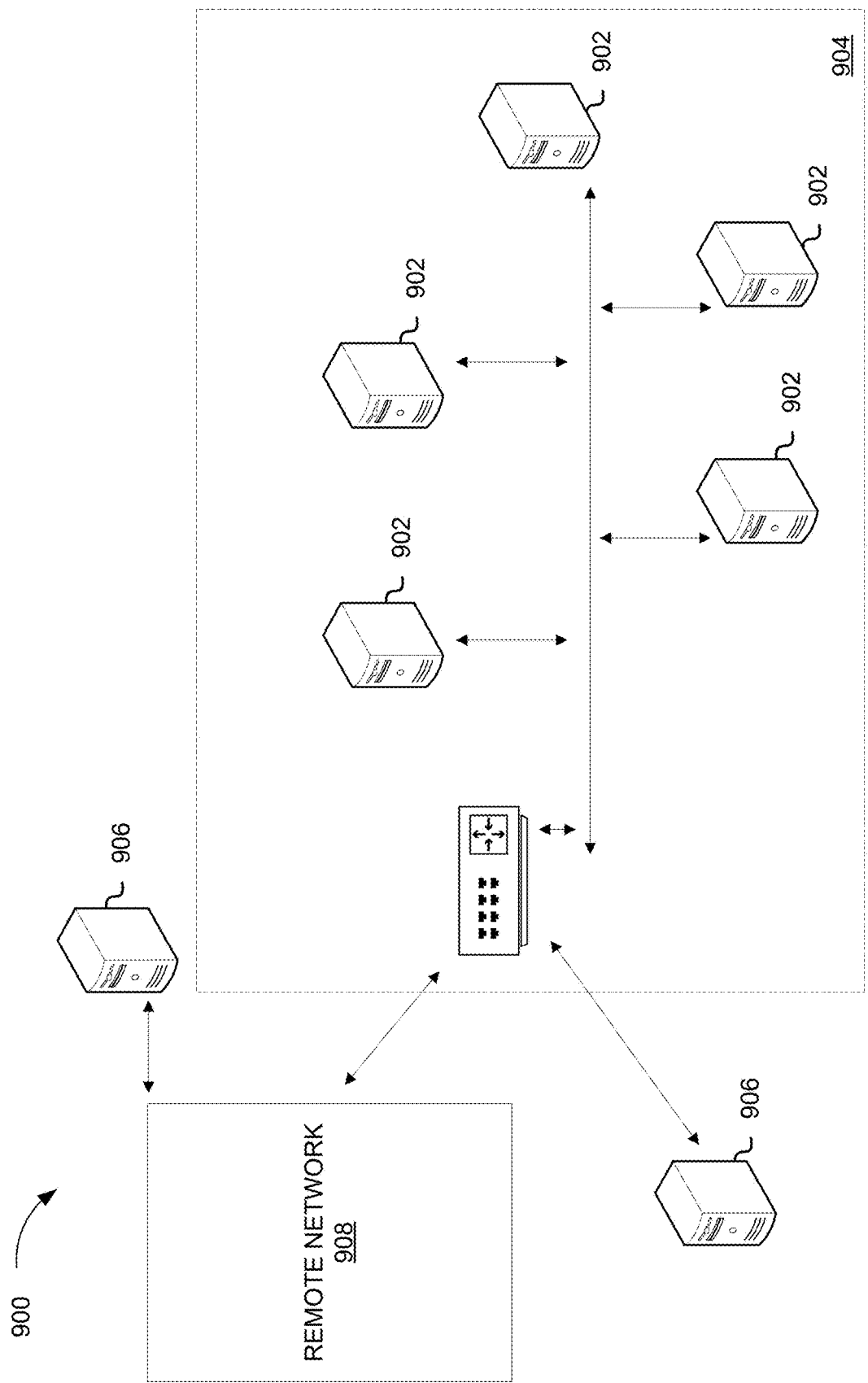
FIG. 9 illustrates a client-server network, in accordance with at least one embodiment.

FIG. 9 illustrates a client-server network 904 formed by a plurality of network server computers 902 which are interlinked, in accordance with at least one embodiment. In at least one embodiment, each network server computer 902 stores data accessible to other network server computers 902 and to client computers 906 and networks 908 which link into a wide area network 904. In at least one embodiment, configuration of a client-server network 904 may change over time as client computers 906 and one or more networks 908 connect and disconnect from a network 904, and as one or more trunk line server computers 902 are added or removed from a network 904. In at least one embodiment, when a client computer 906 and a network 908 are connected with network server computers 902, client-server network includes such client computer 906 and network 908. In at least one embodiment, the term computer includes any device or machine capable of accepting data, applying prescribed processes to data, and supplying results of processes.

In at least one embodiment, client-server network 904 stores information which is accessible to network server computers 902, remote networks 908 and client computers 906. In at least one embodiment, network server computers 902 are formed by main frame computers minicomputers, and/or microcomputers having one or more processors each. In at least one embodiment, server computers 902 are linked together by wired and/or wireless transfer media, such as conductive wire, fiber optic cable, and/or microwave transmission media, satellite transmission media or other conductive, optic or electromagnetic wave transmission media. In at least one embodiment, client computers 906 access a network server computer 902 by a similar wired or a wireless transfer medium. In at least one embodiment, a client computer 906 may link into a client-server network 904 using a modem and a standard telephone communication network. In at least one embodiment, alternative carrier systems such as cable and satellite communication systems also may be used to link into client-server network 904. In at least one embodiment, other private or time-shared carrier systems may be used. In at least one embodiment, network 904 is a global information network, such as the Internet. In at least one embodiment, network is a private intranet using similar protocols as the Internet, but with added security measures and restricted access controls. In at least one embodiment, network 904 is a private, or semi-private network using proprietary communication protocols.

In at least one embodiment, client computer 906 is any end user computer, and may also be a mainframe computer, mini-computer or microcomputer having one or more microprocessors. In at least one embodiment, server computer 902 may at times function as a client computer accessing another server computer 902. In at least one embodiment, remote network 908 may be a local area network, a network added into a wide area network through an independent service provider (ISP) for the Internet, or another group of computers interconnected by wired or wireless transfer media having a configuration which is either fixed or changing over time. In at least one embodiment, client computers 906 may link into and access a network 904 independently or through a remote network 908.

Figure 10:
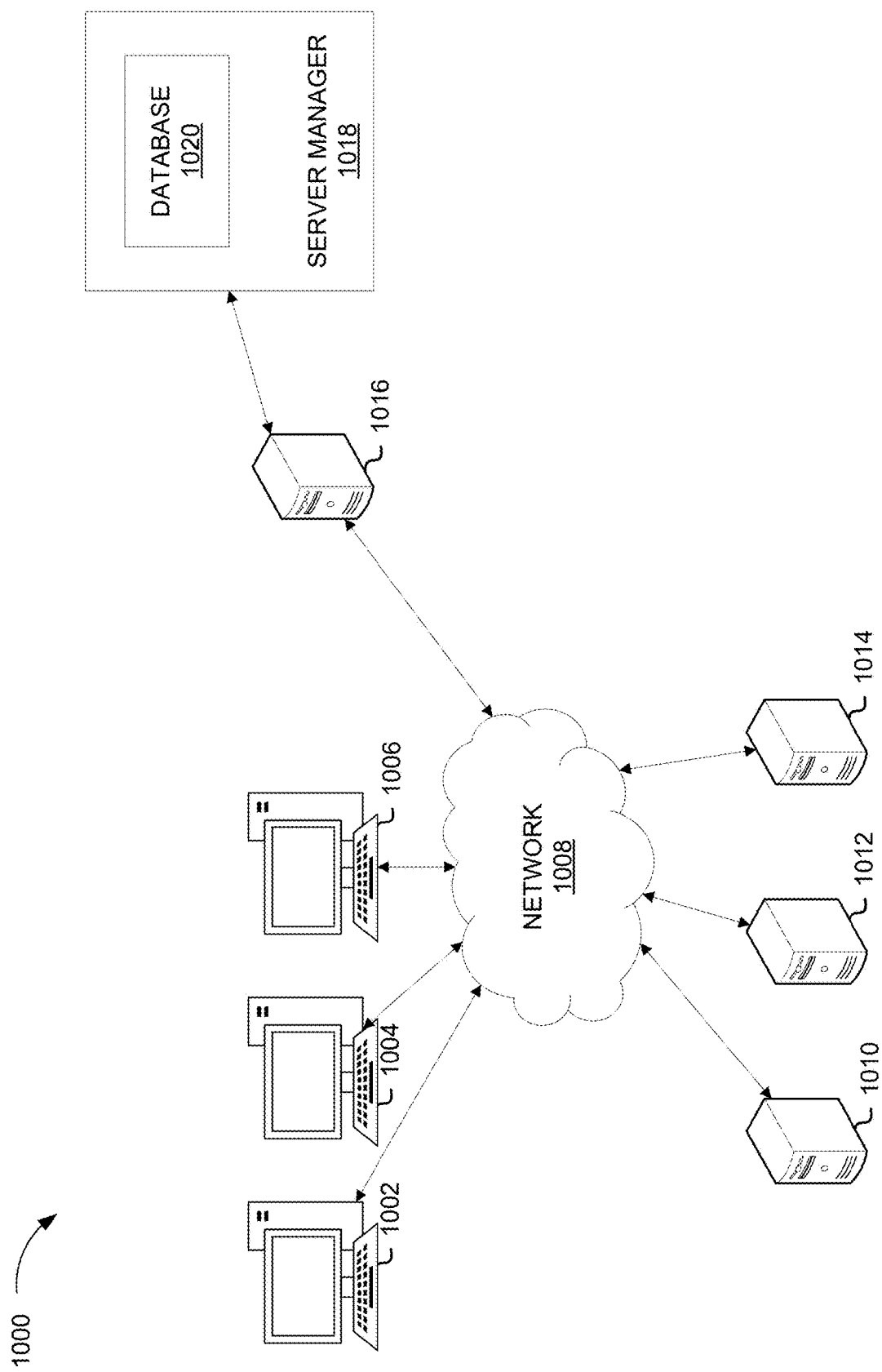
FIG. 10 illustrates a computer network, in accordance with at least one embodiment.

FIG. 10 illustrates a computer network 1008 connecting one or more computing machines, in accordance with at least one embodiment. In at least one embodiment, network 1008 may be any type of electronically connected group of computers including, for instance, the following networks: Internet, Intranet, Local Area Networks (LAN), Wide Area Networks (WAN) or an interconnected combination of these network types. In at least one embodiment, connectivity within a network 1008 may be a remote modem, Ethernet (IEEE 802.3), Token Ring (IEEE 802.5), Fiber Distributed Datalink Interface (FDDI), Asynchronous Transfer Mode (ATM), or any other communication protocol. In at least one embodiment, computing devices linked to a network may be desktop, server, portable, handheld, set-top box, personal digital assistant (PDA), a terminal, or any other desired type or configuration. In at least one embodiment, depending on their functionality, network connected devices may vary widely in processing power, internal memory, and other performance aspects. In at least one embodiment, communications within a network and to or from computing devices connected to a network may be either wired or wireless. In at least one embodiment, network 1008 may include, at least in part, the world-wide public Internet which generally connects a plurality of users in accordance with a client-server model in accordance with a transmission control protocol/internet protocol (TCP/IP) specification. In at least one embodiment, client-server network is a dominant model for communicating between two computers. In at least one embodiment, a client computer ("client") issues one or more commands to a server computer ("server"). In at least one embodiment, server fulfills client commands by accessing available network resources and returning information to a client pursuant to client commands. In at least one embodiment, client computer systems and network resources resident on network servers are assigned a network address for identification during communications between elements of a network. In at least one embodiment, communications from other network connected systems to servers will include a network address of a relevant server/network resource as part of communication so that an appropriate destination of a data/request is identified as a recipient. In at least one embodiment, when a network 1008 comprises the global Internet, a network address is an IP address in a TCP/IP format which may, at least in part, route data to an e-mail account, a website, or other Internet tool resident on a server. In at least one embodiment, information and services which are resident on network servers may be available to a web browser of a client computer through a domain name (e.g. www.site.com) which maps to an IP address of a network server.

In at least one embodiment, a plurality of clients 1002, 1004, and 1006 are connected to a network 1008 via respective communication links. In at least one embodiment, each of these clients may access a network 1008 via any desired form of communication, such as via a dial-up modem connection, cable link, a digital subscriber line (DSL), wireless or satellite link, or any other form of communication. In at least one embodiment, each client may communicate using any machine that is compatible with a network 1008, such as a personal computer (PC), work station, dedicated terminal, personal data assistant (PDA), or other similar equipment. In at least one embodiment, clients 1002, 1004, and 1006 may or may not be located in a same geographical area.

In at least one embodiment, a plurality of servers 1010, 1012, and 1014 are connected to a network 1008 to serve clients that are in communication with a network 1008. In at least one embodiment, each server is typically a powerful computer or device that manages network resources and responds to client commands. In at least one embodiment, servers include computer readable data storage media such as hard disk drives and RAM memory that store program instructions and data. In at least one embodiment, servers 1010, 1012, 1014 run application programs that respond to client commands. In at least one embodiment, server 1010 may run a web server application for responding to client requests for HTML pages and may also run a mail server application for receiving and routing electronic mail. In at least one embodiment, other application programs, such as an FTP server or a media server for streaming audio/video data to clients may also be running on a server 1010. In at least one embodiment, different servers may be dedicated to performing different tasks. In at least one embodiment, server 1010 may be a dedicated web server that manages resources relating to web sites for various users, whereas a server 1012 may be dedicated to provide electronic mail (email) management. In at least one embodiment, other servers may be dedicated for media (audio, video, etc.), file transfer protocol (FTP), or a combination of any two or more services that are typically available or provided over a network. In at least one embodiment, each server may be in a location that is the same as or different from that of other servers. In at least one embodiment, there may be multiple servers that perform mirrored tasks for users, thereby relieving congestion or minimizing traffic directed to and from a single server. In at least one embodiment, servers 1010, 1012, 1014 are under control of a web hosting provider in a business of maintaining and delivering third party content over a network 1008.

In at least one embodiment, web hosting providers deliver services to two different types of clients. In at least one embodiment, one type, which may be referred to as a browser, requests content from servers 1010, 1012, 1014 such as web pages, email messages, video clips, etc. In at least one embodiment, a second type, which may be referred to as a user, hires a web hosting provider to maintain a network resource such as a web site, and to make it available to browsers. In at least one embodiment, users contract with a web hosting provider to make memory space, processor capacity, and communication bandwidth available for their desired network resource in accordance with an amount of server resources a user desires to utilize.

In at least one embodiment, in order for a web hosting provider to provide services for both of these clients, application programs which manage a network resources hosted by servers must be properly configured. In at least one embodiment, program configuration process involves defining a set of parameters which control, at least in part, an application program's response to browser requests and which also define, at least in part, a server resources available to a particular user.

In one embodiment, an intranet server 1016 is in communication with a network 1008 via a communication link. In at least one embodiment, intranet server 1016 is in communication with a server manager 1018. In at least one embodiment, server manager 1018 comprises a database of an application program configuration parameters which are being utilized in servers 1010, 1012, 1014. In at least one embodiment, users modify a database 1020 via an intranet 1016, and a server manager 1018 interacts with servers 1010, 1012, 1014 to modify application program parameters so that they match a content of a database. In at least one embodiment, a user logs onto an intranet server 1016 by connecting to an intranet 1016 via computer 1002 and entering authentication information, such as a username and password.

In at least one embodiment, when a user wishes to sign up for new service or modify an existing service, an intranet server 1016 authenticates a user and provides a user with an interactive screen display/control panel that allows a user to access configuration parameters for a particular application program. In at least one embodiment, a user is presented with a number of modifiable text boxes that describe aspects of a configuration of a user's web site or other network resource. In at least one embodiment, if a user desires to increase memory space reserved on a server for its web site, a user is provided with a field in which a user specifies a desired memory space. In at least one embodiment, in response to receiving this information, an intranet server 1016 updates a database 1020. In at least one embodiment, server manager 1018 forwards this information to an appropriate server, and a new parameter is used during application program operation. In at least one embodiment, an intranet server 1016 is configured to provide users with access to configuration parameters of hosted network resources (e.g., web pages, email, FTP sites, media sites, etc.), for which a user has contracted with a web hosting service provider.

Figure 11A:
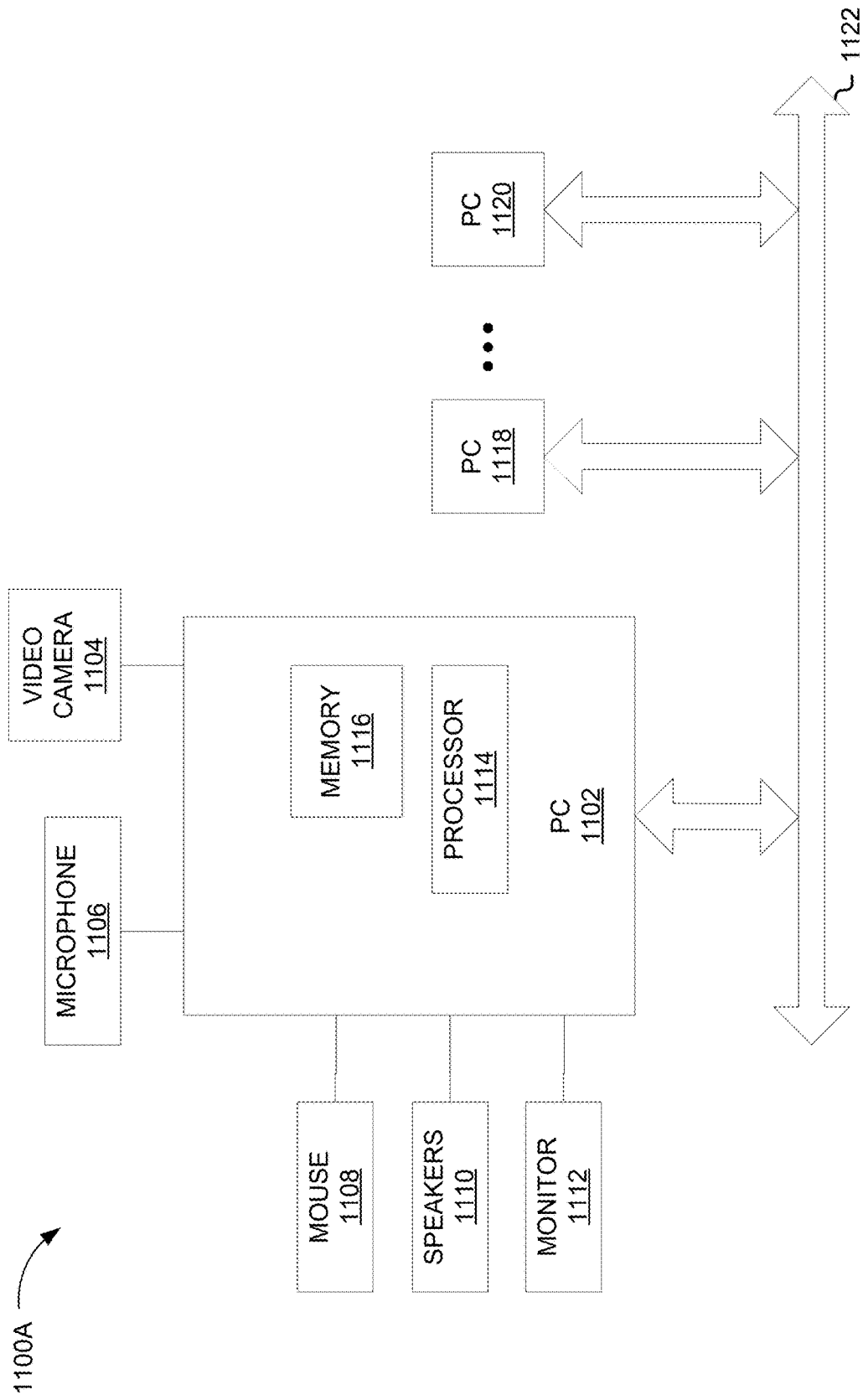
FIG. 11A illustrates a networked computer system, in accordance with at least one embodiment.

FIG. 11A illustrates a networked computer system 1100A, in accordance with at least one embodiment. In at least one embodiment, networked computer system 1100A comprises a plurality of nodes or personal computers ("PCs") 1102, 1118, 1120. In at least one embodiment, personal computer or node 1102 comprises a processor 1114, memory 1116, video camera 1104, microphone 1106, mouse 1108, speakers 1110, and monitor 1112. In at least one embodiment, PCs 1102, 1118, 1120 may each run one or more desktop servers of an internal network within a given company, for instance, or may be servers of a general network not limited to a specific environment. In at least one embodiment, there is one server per PC node of a network, so that each PC node of a network represents a particular network server, having a particular network URL address. In at least one embodiment, each server defaults to a default web page for that server's user, which may itself contain embedded URLs pointing to further subpages of that user on that server, or to other servers or pages on other servers on a network.

In at least one embodiment, nodes 1102, 1118, 1120 and other nodes of a network are interconnected via medium 1122. In at least one embodiment, medium 1122 may be, a communication channel such as an Integrated Services Digital Network ("ISDN"). In at least one embodiment, various nodes of a networked computer system may be connected through a variety of communication media, including local area networks ("LANs"), plain-old telephone lines ("POTS"), sometimes referred to as public switched telephone networks ("PSTN"), and/or variations thereof. In at least one embodiment, various nodes of a network may also constitute computer system users inter-connected via a network such as the Internet. In at least one embodiment, each server on a network (running from a particular node of a network at a given instance) has a unique address or identification within a network, which may be specifiable in terms of an URL.

In at least one embodiment, a plurality of multi-point conferencing units ("MCUs") may thus be utilized to transmit data to and from various nodes or "endpoints" of a conferencing system. In at least one embodiment, nodes and/or MCUs may be interconnected via an ISDN link or through a local area network ("LAN"), in addition to various other communications media such as nodes connected through the Internet. In at least one embodiment, nodes of a conferencing system may, in general, be connected directly to a communications medium such as a LAN or through an MCU, and that a conferencing system may comprise other nodes or elements such as routers, servers, and/or variations thereof.

In at least one embodiment, processor 1114 is a general-purpose programmable processor. In at least one embodiment, processors of nodes of networked computer system 1100A may also be special-purpose video processors. In at least one embodiment, various peripherals and components of a node such as those of node 1102 may vary from those of other nodes. In at least one embodiment, node 1118 and node 1120 may be configured identically to or differently than node 1102. In at least one embodiment, a node may be implemented on any suitable computer system in addition to PC systems.

Figure 11B:
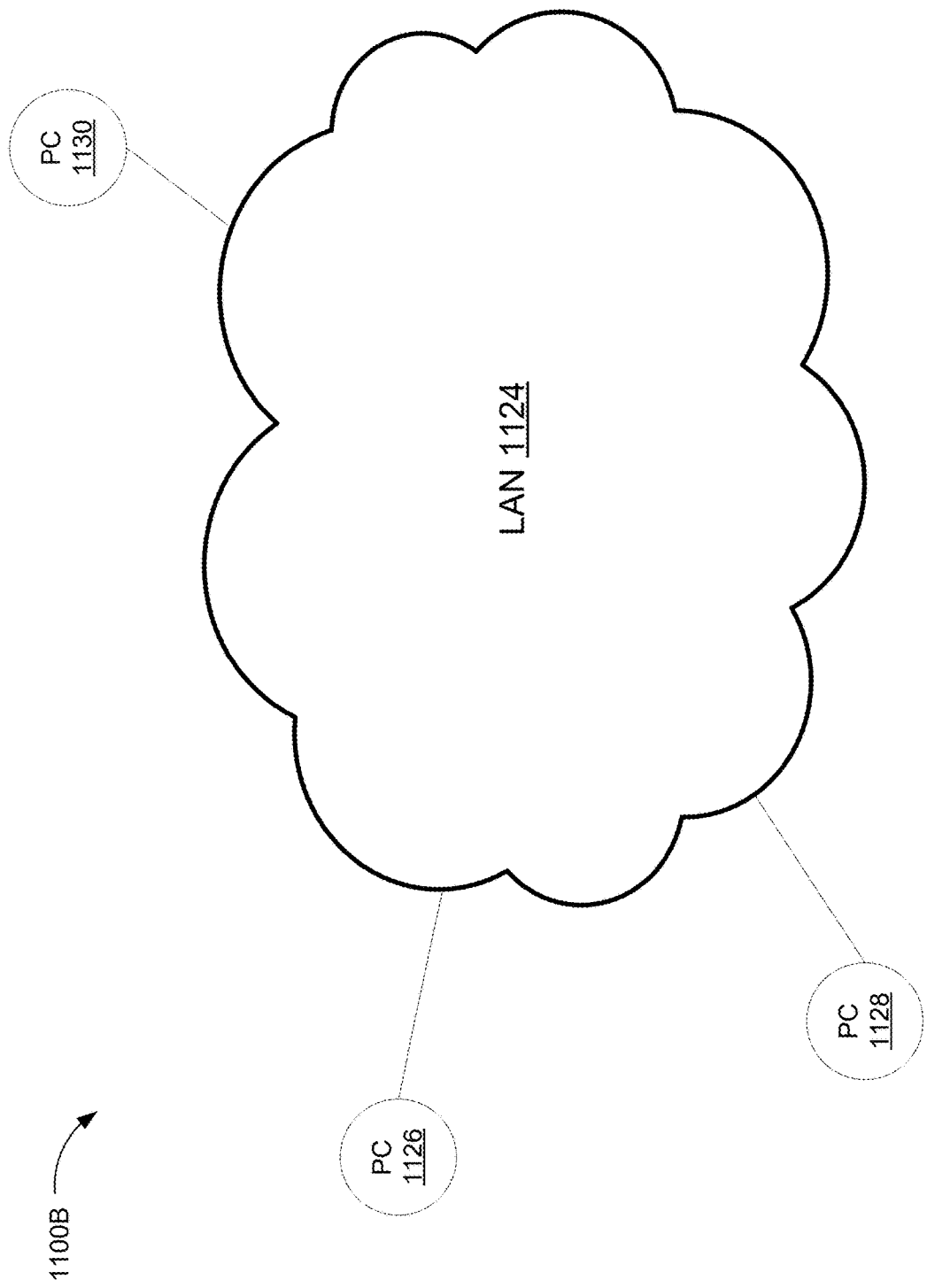
FIG. 11B illustrates a networked computer system, in accordance with at least one embodiment.

FIG. 11B illustrates a networked computer system 1100B, in accordance with at least one embodiment. In at least one embodiment, system 1100B illustrates a network such as LAN 1124, which may be used to interconnect a variety of nodes that may communicate with each other. In at least one embodiment, attached to LAN 1124 are a plurality of nodes such as PC nodes 1126, 1128, 1130. In at least one embodiment, a node may also be connected to the LAN via a network server or other means. In at least one embodiment, system 1100B comprises other types of nodes or elements, for example including routers, servers, and nodes.

Figure 11C:
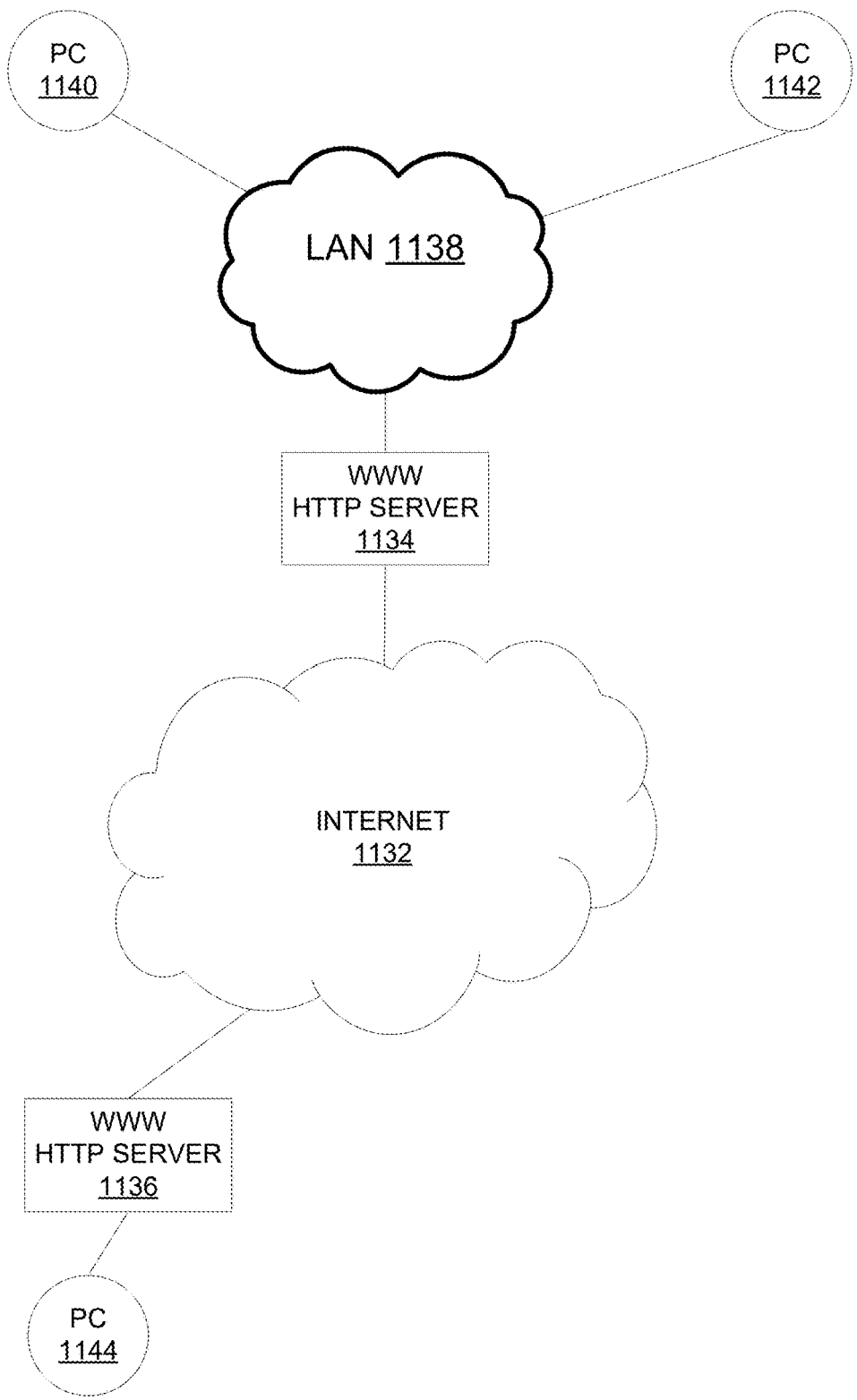
FIG. 11C illustrates a networked computer system, in accordance with at least one embodiment.

FIG. 11C illustrates a networked computer system 1100C, in accordance with at least one embodiment. In at least one embodiment, system 1100C illustrates a WWW system having communications across a backbone communications network such as Internet 1132, which may be used to interconnect a variety of nodes of a network. In at least one embodiment, WWW is a set of protocols operating on top of the Internet, and allows a graphical interface system to operate thereon for accessing information through the Internet. In at least one embodiment, attached to Internet 1132 in WWW are a plurality of nodes such as PCs 1140, 1142, 1144. In at least one embodiment, a node is interfaced to other nodes of WWW through a WWW HTTP server such as servers 1134, 1136. In at least one embodiment, PC 1144 may be a PC forming a node of network 1132 and itself running its server 1136, although PC 1144 and server 1136 are illustrated separately in FIG. 11C for illustrative purposes.

In at least one embodiment, WWW is a distributed type of application, characterized by WWW HTTP, WWW's protocol, which runs on top of the Internet's transmission control protocol/Internet protocol ("TCP/IP"). In at least one embodiment, WWW may thus be characterized by a set of protocols (i.e., HTTP) running on the Internet as its "backbone."

In at least one embodiment, a web browser is an application running on a node of a network that, in WWW-compatible type network systems, allows users of a particular server or node to view such information and thus allows a user to search graphical and text-based files that are linked together using hypertext links that are embedded in documents or files available from servers on a network that understand HTTP. In at least one embodiment, when a given web page of a first server associated with a first node is retrieved by a user using another server on a network such as the Internet, a document retrieved may have various hypertext links embedded therein and a local copy of a page is created local to a retrieving user. In at least one embodiment, when a user clicks on a hypertext link, locally-stored information related to a selected hypertext link is typically sufficient to allow a user's machine to open a connection across the Internet to a server indicated by a hypertext link.

In at least one embodiment, more than one user may be coupled to each HTTP server, for example through a LAN such as LAN 1138 as illustrated with respect to WWW HTTP server 1134. In at least one embodiment, system 1100C may also comprise other types of nodes or elements. In at least one embodiment, a WWW HTTP server is an application running on a machine, such as a PC. In at least one embodiment, each user may be considered to have a unique "server," as illustrated with respect to PC 1144. In at least one embodiment, a server may be considered to be a server such as WWW HTTP server 1134, which provides access to a network for a LAN or plurality of nodes or plurality of LANs. In at least one embodiment, there are a plurality of users, each having a desktop PC or node of a network, each desktop PC potentially establishing a server for a user thereof. In at least one embodiment, each server is associated with a particular network address or URL, which, when accessed, provides a default web page for that user. In at least one embodiment, a web page may contain further links (embedded URLs) pointing to further subpages of that user on that server, or to other servers on a network or to pages on other servers on a network.

Cloud Computing and Services

The following figures set forth, without limitation, exemplary cloud-based systems that can be used to implement at least one embodiment.

In at least one embodiment, cloud computing is a style of computing in which dynamically scalable and often virtualized resources are provided as a service over the Internet. In at least one embodiment, users need not have knowledge of, expertise in, or control over technology infrastructure, which can be referred to as "in the cloud," that supports them. In at least one embodiment, cloud computing incorporates infrastructure as a service, platform as a service, software as a service, and other variations that have a common theme of reliance on the Internet for satisfying computing needs of users. In at least one embodiment, a typical cloud deployment, such as in a private cloud (e.g., enterprise network), or a data center (DC) in a public cloud (e.g., Internet) can consist of thousands of servers (or alternatively, VMs), hundreds of Ethernet, Fiber Channel or Fiber Channel over Ethernet (FCOE) ports, switching and storage infrastructure, etc. In at least one embodiment, cloud can also consist of network services infrastructure like IPsec VPN hubs, firewalls, load balancers, wide area network (WAN) optimizers etc. In at least one embodiment, remote subscribers can access cloud applications and services securely by connecting via a VPN tunnel, such as an IPsec VPN tunnel.

In at least one embodiment, cloud computing is a model for enabling convenient, on-demand network access to a shared pool of configurable computing resources (e.g., networks, servers, storage, applications, and services) that can be rapidly provisioned and released with minimal management effort or service provider interaction.

In at least one embodiment, cloud computing is characterized by on-demand self-service, in which a consumer can unilaterally provision computing capabilities, such as server time and network storage, as needed automatically without requiring human interaction with each service's provider. In at least one embodiment, cloud computing is characterized by broad network access, in which capabilities are available over a network and accessed through standard mechanisms that promote use by heterogeneous thin or thick client platforms (e.g., mobile phones, laptops, and PDAs). In at least one embodiment, cloud computing is characterized by resource pooling, in which a provider's computing resources are pooled to serve multiple consumers using a multi-tenant model, with different physical and virtual resources dynamically as-signed and reassigned according to consumer demand. In at least one embodiment, there is a sense of location independence in that a customer generally has no control or knowledge over an exact location of provided resources, but may be able to specify location at a higher level of abstraction (e.g., country, state, or data center). In at least one embodiment, examples of resources include storage, processing, memory, network bandwidth, and virtual machines. In at least one embodiment, cloud computing is characterized by rapid elasticity, in which capabilities can be rapidly and elastically provisioned, in some cases automatically, to quickly scale out and rapidly released to quickly scale in. In at least one embodiment, to a consumer, capabilities available for provisioning often appear to be unlimited and can be purchased in any quantity at any time. In at least one embodiment, cloud computing is characterized by measured service, in which cloud systems automatically control and optimize resource use by leveraging a metering capability at some level of abstraction appropriate to a type of service (e.g., storage, processing, bandwidth, and active user accounts). In at least one embodiment, resource usage can be monitored, controlled, and reported providing transparency for both a provider and consumer of a utilized service.

In at least one embodiment, cloud computing may be associated with various services. In at least one embodiment, cloud Software as a Service (SaaS) may refer to as service in which a capability provided to a consumer is to use a provider's applications running on a cloud infrastructure. In at least one embodiment, applications are accessible from various client devices through a thin client interface such as a web browser (e.g., web-based email). In at least one embodiment, consumer does not manage or control underlying cloud infrastructure including network, servers, operating systems, storage, or even individual application capabilities, with a possible exception of limited user-specific application configuration settings.

In at least one embodiment, cloud Platform as a Service (PaaS) may refer to a service in which a capability provided to a consumer is to deploy onto cloud infrastructure consumer-created or acquired applications created using programming languages and tools supported by a provider. In at least one embodiment, consumer does not manage or control underlying cloud infrastructure including networks, servers, operating systems, or storage, but has control over deployed applications and possibly application hosting environment configurations.

In at least one embodiment, cloud Infrastructure as a Service (IaaS) may refer to a service in which a capability provided to a consumer is to provision processing, storage, networks, and other fundamental computing resources where a consumer is able to deploy and run arbitrary software, which can include operating systems and applications. In at least one embodiment, consumer does not manage or control underlying cloud infrastructure, but has control over operating systems, storage, deployed applications, and possibly limited control of select networking components (e.g., host firewalls).

In at least one embodiment, cloud computing may be deployed in various ways. In at least one embodiment, a private cloud may refer to a cloud infrastructure that is operated solely for an organization. In at least one embodiment, a private cloud may be managed by an organization or a third party and may exist on-premises or off-premises. In at least one embodiment, a community cloud may refer to a cloud infrastructure that is shared by several organizations and supports a specific community that has shared concerns (e.g., mission, security requirements, policy, and compliance considerations). In at least one embodiment, a community cloud may be managed by organizations or a third party and may exist on-premises or off-premises. In at least one embodiment, a public cloud may refer to a cloud infrastructure that is made available to a general public or a large industry group and is owned by an organization providing cloud services. In at least one embodiment, a hybrid cloud may refer to a cloud infrastructure is a composition of two or more clouds (private, community, or public) that remain unique entities, but are bound together by standardized or proprietary technology that enables data and application portability (e.g., cloud bursting for load-balancing between clouds). In at least one embodiment, a cloud computing environment is service oriented with a focus on statelessness, low coupling, modularity, and semantic interoperability.

Figure 12:
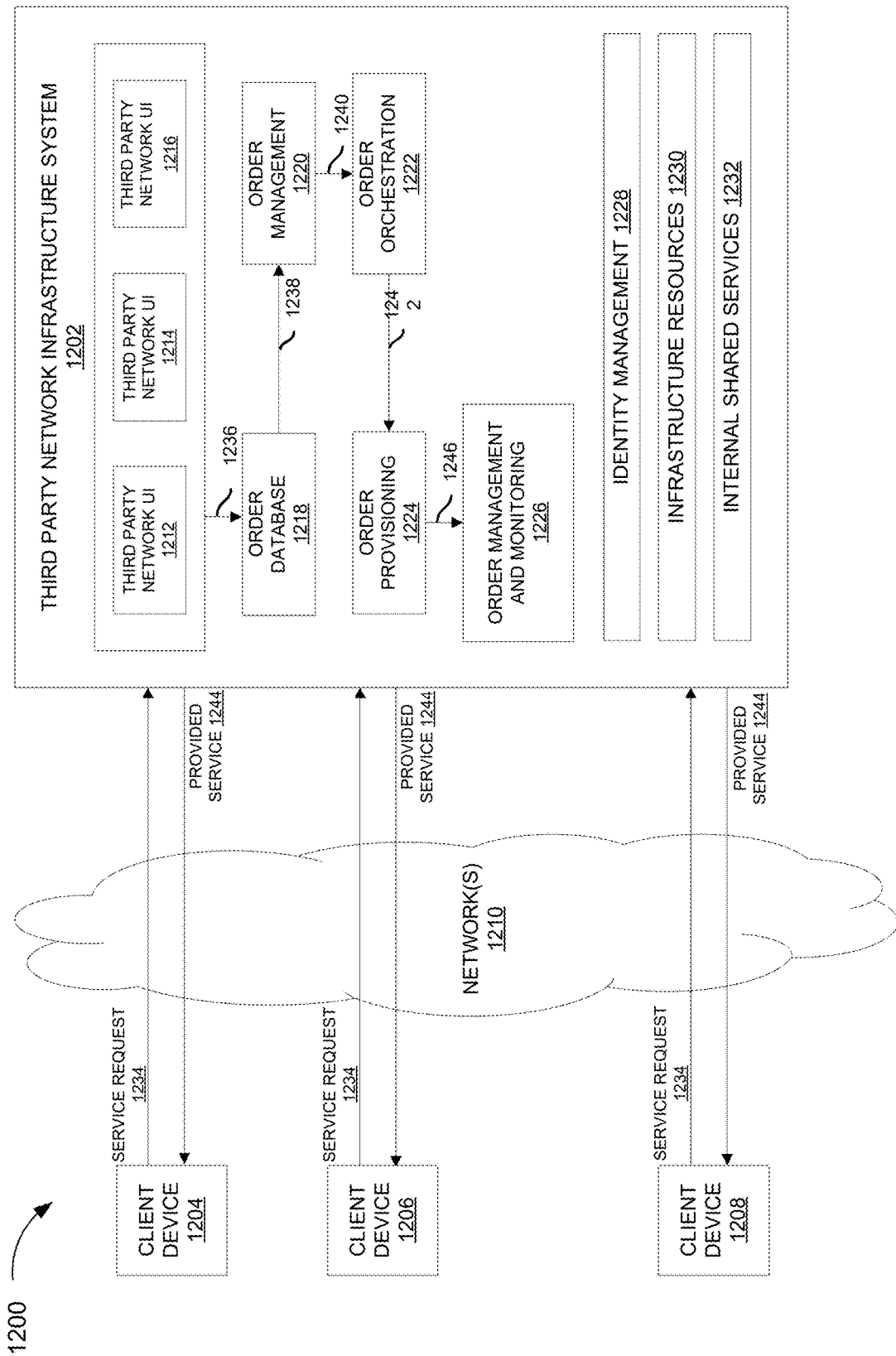
FIG. 12 illustrates one or more components of a system environment in which services may be offered as third party network services, in accordance with at least one embodiment.

FIG. 12 illustrates one or more components of a system environment 1200 in which services may be offered as third party network services, in accordance with at least one embodiment. In at least one embodiment, a third party network may be referred to as a cloud, cloud network, cloud computing network, and/or variations thereof. In at least one embodiment, system environment 1200 includes one or more client computing devices 1204, 1206, and 1208 that may be used by users to interact with a third party network infrastructure system 1202 that provides third party network services, which may be referred to as cloud computing services. In at least one embodiment, third party network infrastructure system 1202 may comprise one or more computers and/or servers.

It should be appreciated that third party network infrastructure system 1202 depicted in FIG. 12 may have other components than those depicted. Further, FIG. 12 depicts an embodiment of a third party network infrastructure system. In at least one embodiment, third party network infrastructure system 1202 may have more or fewer components than depicted in FIG. 12, may combine two or more components, or may have a different configuration or arrangement of components.

In at least one embodiment, client computing devices 1204, 1206, and 1208 may be configured to operate a client application such as a web browser, a proprietary client application, or some other application, which may be used by a user of a client computing device to interact with third party network infrastructure system 1202 to use services provided by third party network infrastructure system 1202. Although exemplary system environment 1200 is shown with three client computing devices, any number of client computing devices may be supported. In at least one embodiment, other devices such as devices with sensors, etc. may interact with third party network infrastructure system 1202. In at least one embodiment, network(s) 1210 may facilitate communications and exchange of data between client computing devices 1204, 1206, and 1208 and third party network infrastructure system 1202.

In at least one embodiment, services provided by third party network infrastructure system 1202 may include a host of services that are made available to users of a third party network infrastructure system on demand. In at least one embodiment, various services may also be offered including without limitation online data storage and backup solutions, Web-based e-mail services, hosted office suites and document collaboration services, database management and processing, managed technical support services, and/or variations thereof. In at least one embodiment, services provided by a third party network infrastructure system can dynamically scale to meet needs of its users.

In at least one embodiment, a specific instantiation of a service provided by third party network infrastructure system 1202 may be referred to as a "service instance." In at least one embodiment, in general, any service made available to a user via a communication network, such as the Internet, from a third party network service provider's system is referred to as a "third party network service." In at least one embodiment, in a public third party network environment, servers and systems that make up a third party network service provider's system are different from a customer's own on-premises servers and systems. In at least one embodiment, a third party network service provider's system may host an application, and a user may, via a communication network such as the Internet, on demand, order and use an application.

In at least one embodiment, a service in a computer network third party network infrastructure may include protected computer network access to storage, a hosted database, a hosted web server, a software application, or other service provided by a third party network vendor to a user. In at least one embodiment, a service can include password-protected access to remote storage on a third party network through the Internet. In at least one embodiment, a service can include a web service-based hosted relational database and a script-language middleware engine for private use by a networked developer. In at least one embodiment, a service can include access to an email software application hosted on a third party network vendor's web site.

In at least one embodiment, third party network infrastructure system 1202 may include a suite of applications, middleware, and database service offerings that are delivered to a customer in a self-service, subscription-based, elastically scalable, reliable, highly available, and secure manner. In at least one embodiment, third party network infrastructure system 1202 may also provide "big data" related computation and analysis services. In at least one embodiment, term "big data" is generally used to refer to extremely large data sets that can be stored and manipulated by analysts and researchers to visualize large amounts of data, detect trends, and/or otherwise interact with data. In at least one embodiment, big data and related applications can be hosted and/or manipulated by an infrastructure system on many levels and at different scales. In at least one embodiment, tens, hundreds, or thousands of processors linked in parallel can act upon such data in order to present it or simulate external forces on data or what it represents. In at least one embodiment, these data sets can involve structured data, such as that organized in a database or otherwise according to a structured model, and/or unstructured data (e.g., emails, images, data blobs (binary large objects), web pages, complex event processing). In at least one embodiment, by leveraging an ability of an embodiment to relatively quickly focus more (or fewer) computing resources upon an objective, a third party network infrastructure system may be better available to carry out tasks on large data sets based on demand from a business, government agency, research organization, private individual, group of like-minded individuals or organizations, or other entity.

In at least one embodiment, third party network infrastructure system 1202 may be adapted to automatically provision, manage and track a customer's subscription to services offered by third party network infrastructure system 1202. In at least one embodiment, third party network infrastructure system 1202 may provide third party network services via different deployment models. In at least one embodiment, services may be provided under a public third party network model in which third party network infrastructure system 1202 is owned by an organization selling third party network services and services are made available to a general public or different industry enterprises. In at least one embodiment, services may be provided under a private third party network model in which third party network infrastructure system 1202 is operated solely for a single organization and may provide services for one or more entities within an organization. In at least one embodiment, third party network services may also be provided under a community third party network model in which third party network infrastructure system 1202 and services provided by third party network infrastructure system 1202 are shared by several organizations in a related community. In at least one embodiment, third party network services may also be provided under a hybrid third party network model, which is a combination of two or more different models.

In at least one embodiment, services provided by third party network infrastructure system 1202 may include one or more services provided under Software as a Service (Saas) category, Platform as a Service (PaaS) category, Infrastructure as a Service (IaaS) category, or other categories of services including hybrid services. In at least one embodiment, a customer, via a subscription order, may order one or more services provided by third party network infrastructure system 1202. In at least one embodiment, third party network infrastructure system 1202 then performs processing to provide services in a customer's subscription order.

In at least one embodiment, services provided by third party network infrastructure system 1202 may include, without limitation, application services, platform services and infrastructure services. In at least one embodiment, application services may be provided by a third party network infrastructure system via a SaaS platform. In at least one embodiment, SaaS platform may be configured to provide third party network services that fall under a SaaS category. In at least one embodiment, SaaS platform may provide capabilities to build and deliver a suite of on-demand applications on an integrated development and deployment platform. In at least one embodiment, SaaS platform may manage and control underlying software and infrastructure for providing SaaS services. In at least one embodiment, by utilizing services provided by a SaaS platform, customers can utilize applications executing on a third party network infrastructure system. In at least one embodiment, customers can acquire an application services without a need for customers to purchase separate licenses and support. In at least one embodiment, various different SaaS services may be provided. In at least one embodiment, examples include, without limitation, services that provide solutions for sales performance management, enterprise integration, and business flexibility for large organizations.

In at least one embodiment, platform services may be provided by third party network infrastructure system 1202 via a PaaS platform. In at least one embodiment, PaaS platform may be configured to provide third party network services that fall under a PaaS category. In at least one embodiment, examples of platform services may include without limitation services that enable organizations to consolidate existing applications on a shared, common architecture, as well as an ability to build new applications that leverage shared services provided by a platform. In at least one embodiment, PaaS platform may manage and control underlying software and infrastructure for providing PaaS services. In at least one embodiment, customers can acquire PaaS services provided by third party network infrastructure system 1202 without a need for customers to purchase separate licenses and support.

In at least one embodiment, by utilizing services provided by a PaaS platform, customers can employ programming languages and tools supported by a third party network infrastructure system and also control deployed services. In at least one embodiment, platform services provided by a third party network infrastructure system may include database third party network services, middleware third party network services and third party network services. In at least one embodiment, database third party network services may support shared service deployment models that enable organizations to pool database resources and offer customers a Database as a Service in a form of a database third party network. In at least one embodiment, middleware third party network services may provide a platform for customers to develop and deploy various business applications, and third party network services may provide a platform for customers to deploy applications, in a third party network infrastructure system.

In at least one embodiment, various different infrastructure services may be provided by an IaaS platform in a third party network infrastructure system. In at least one embodiment, infrastructure services facilitate management and control of underlying computing resources, such as storage, networks, and other fundamental computing resources for customers utilizing services provided by a SaaS platform and a PaaS platform.

In at least one embodiment, third party network infrastructure system 1202 may also include infrastructure resources 1230 for providing resources used to provide various services to customers of a third party network infrastructure system. In at least one embodiment, infrastructure resources 1230 may include pre-integrated and optimized combinations of hardware, such as servers, storage, and networking resources to execute services provided by a Paas platform and a Saas platform, and other resources.

In at least one embodiment, resources in third party network infrastructure system 1202 may be shared by multiple users and dynamically re-allocated per demand. In at least one embodiment, resources may be allocated to users in different time zones. In at least one embodiment, third party network infrastructure system 1202 may enable a first set of users in a first time zone to utilize resources of a third party network infrastructure system for a specified number of hours and then enable a re-allocation of same resources to another set of users located in a different time zone, thereby maximizing utilization of resources.

In at least one embodiment, a number of internal shared services 1232 may be provided that are shared by different components or modules of third party network infrastructure system 1202 to enable provision of services by third party network infrastructure system 1202. In at least one embodiment, these internal shared services may include, without limitation, a security and identity service, an integration service, an enterprise repository service, an enterprise manager service, a virus scanning and white list service, a high availability, backup and recovery service, service for enabling third party network support, an email service, a notification service, a file transfer service, and/or variations thereof.

In at least one embodiment, third party network infrastructure system 1202 may provide comprehensive management of third party network services (e.g., SaaS, PaaS, and IaaS services) in a third party network infrastructure system. In at least one embodiment, third party network management functionality may include capabilities for provisioning, managing and tracking a customer's subscription received by third party network infrastructure system 1202, and/or variations thereof.

In at least one embodiment, as depicted in FIG. 12, third party network management functionality may be provided by one or more modules, such as an order management module 1220, an order orchestration module 1222, an order provisioning module 1224, an order management and monitoring module 1226, and an identity management module 1228. In at least one embodiment, these modules may include or be provided using one or more computers and/or servers, which may be general purpose computers, specialized server computers, server farms, server clusters, or any other appropriate arrangement and/or combination.

In at least one embodiment, at step 1234, a customer using a client device, such as client computing devices 1204, 1206 or 1208, may interact with third party network infrastructure system 1202 by requesting one or more services provided by third party network infrastructure system 1202 and placing an order for a subscription for one or more services offered by third party network infrastructure system 1202. In at least one embodiment, a customer may access a third party network User Interface (UI) such as third party network UI 1212, third party network UI 1214 and/or third party network UI 1216 and place a subscription order via these UIs. In at least one embodiment, order information received by third party network infrastructure system 1202 in response to a customer placing an order may include information identifying a customer and one or more services offered by a third party network infrastructure system 1202 that a customer intends to subscribe to.

In at least one embodiment, at step 1236, an order information received from a customer may be stored in an order database 1218. In at least one embodiment, if this is a new order, a new record may be created for an order. In at least one embodiment, order database 1218 can be one of several databases operated by third party network infrastructure system 1218 and operated in conjunction with other system elements.

In at least one embodiment, at step 1238, an order information may be forwarded to an order management module 1220 that may be configured to perform billing and accounting functions related to an order, such as verifying an order, and upon verification, booking an order.

In at least one embodiment, at step 1240, information regarding an order may be communicated to an order orchestration module 1222 that is configured to orchestrate provisioning of services and resources for an order placed by a customer. In at least one embodiment, order orchestration module 1222 may use services of order provisioning module 1224 for provisioning. In at least one embodiment, order orchestration module 1222 enables management of business processes associated with each order and applies business logic to determine whether an order should proceed to provisioning.

In at least one embodiment, at step 1242, upon receiving an order for a new subscription, order orchestration module 1222 sends a request to order provisioning module 1224 to allocate resources and configure resources needed to fulfill a subscription order. In at least one embodiment, order provisioning module 1224 enables an allocation of resources for services ordered by a customer. In at least one embodiment, order provisioning module 1224 provides a level of abstraction between third party network services provided by third party network infrastructure system 1200 and a physical implementation layer that is used to provision resources for providing requested services. In at least one embodiment, this enables order orchestration module 1222 to be isolated from implementation details, such as whether or not services and resources are actually provisioned in real-time or pre-provisioned and only allocated/assigned upon request.

In at least one embodiment, at step 1244, once services and resources are provisioned, a notification may be sent to subscribing customers indicating that a requested service is now ready for use. In at least one embodiment, information (e.g. a link) may be sent to a customer that enables a customer to start using requested services.

In at least one embodiment, at step 1246, a customer's subscription order may be managed and tracked by an order management and monitoring module 1226. In at least one embodiment, order management and monitoring module 1226 may be configured to collect usage statistics regarding a customer use of subscribed services. In at least one embodiment, statistics may be collected for an amount of storage used, an amount data transferred, a number of users, and an amount of system up time and system down time, and/or variations thereof.

In at least one embodiment, third party network infrastructure system 1200 may include an identity management module 1228 that is configured to provide identity services, such as access management and authorization services in third party network infrastructure system 1200. In at least one embodiment, identity management module 1228 may control information about customers who wish to utilize services provided by third party network infrastructure system 1202. In at least one embodiment, such information can include information that authenticates identities of such customers and information that describes which actions those customers are authorized to perform relative to various system resources (e.g., files, directories, applications, communication ports, memory segments, etc.). In at least one embodiment, identity management module 1228 may also include management of descriptive information about each customer and about how and by whom that descriptive information can be accessed and modified.

Figure 13:
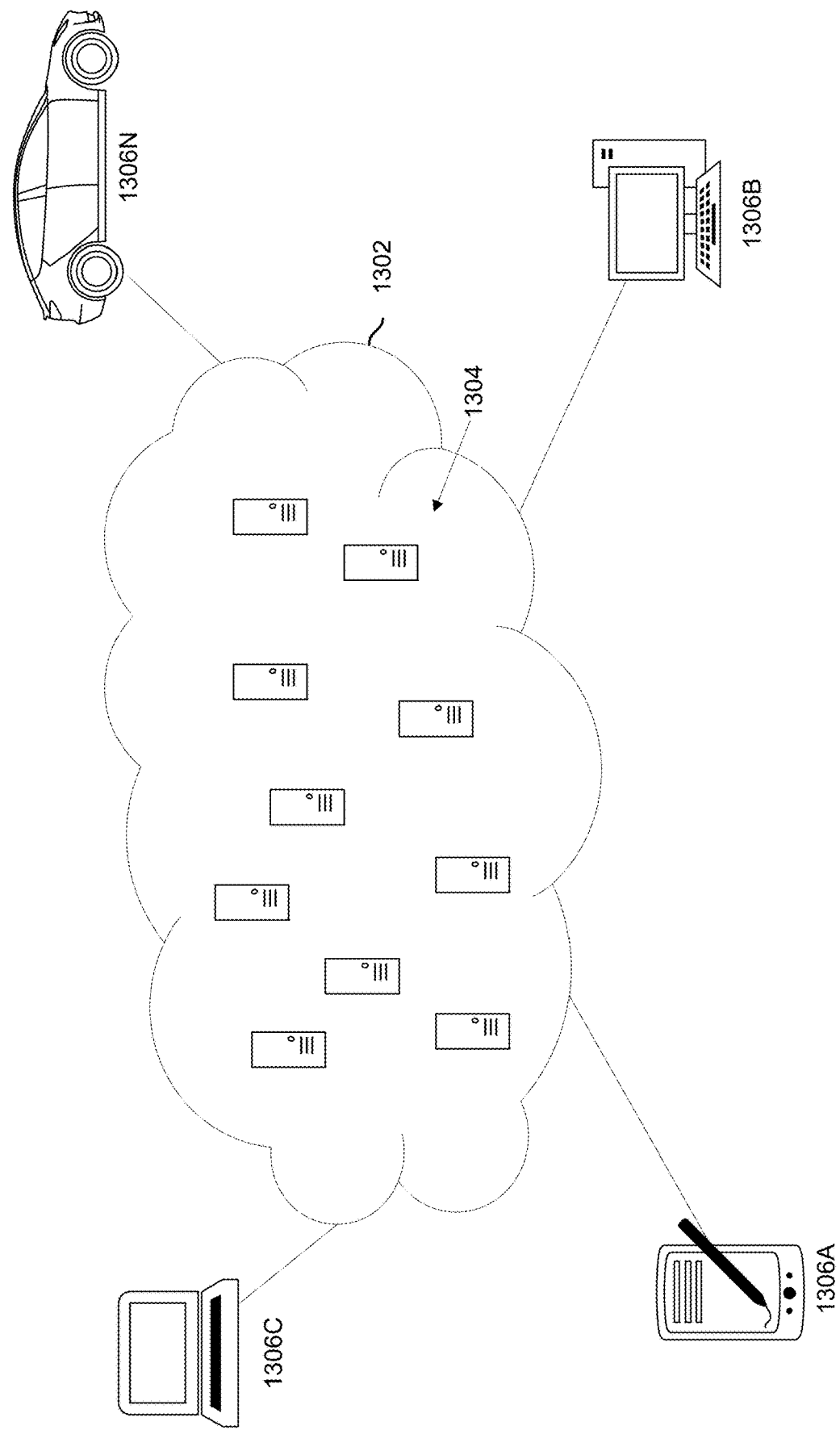
FIG. 13 illustrates a cloud computing environment, in accordance with at least one embodiment.

FIG. 13 illustrates a cloud computing environment 1302, in accordance with at least one embodiment. In at least one embodiment, cloud computing environment 1302 comprises one or more computer system/servers 1304 with which computing devices such as, personal digital assistant (PDA) or cellular telephone 1306A, desktop computer 1306B, laptop computer 1306C, and/or automobile computer system 1306N communicate. In at least one embodiment, this allows for infrastructure, platforms and/or software to be offered as services from cloud computing environment 1302, so as to not require each client to separately maintain such resources. It is understood that types of computing devices 1306A-N shown in FIG. 13 are intended to be illustrative only and that cloud computing environment 1302 can communicate with any type of computerized device over any type of network and/or network/addressable connection (e.g., using a web browser).

In at least one embodiment, a computer system/server 1304, which can be denoted as a cloud computing node, is operational with numerous other general purpose or special purpose computing system environments or configurations. In at least one embodiment, examples of computing systems, environments, and/or configurations that may be suitable for use with computer system/server 1304 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and/or variations thereof.

In at least one embodiment, computer system/server 1304 may be described in a general context of computer system-executable instructions, such as program modules, being executed by a computer system. In at least one embodiment, program modules include routines, programs, objects, components, logic, data structures, and so on, that perform particular tasks or implement particular abstract data types. In at least one embodiment, exemplary computer system/server 1304 may be practiced in distributed loud computing environments where tasks are performed by remote processing devices that are linked through a communications network. In at least one embodiment, in a distributed cloud computing environment, program modules may be located in both local and remote computer system storage media including memory storage devices.

Figure 14:
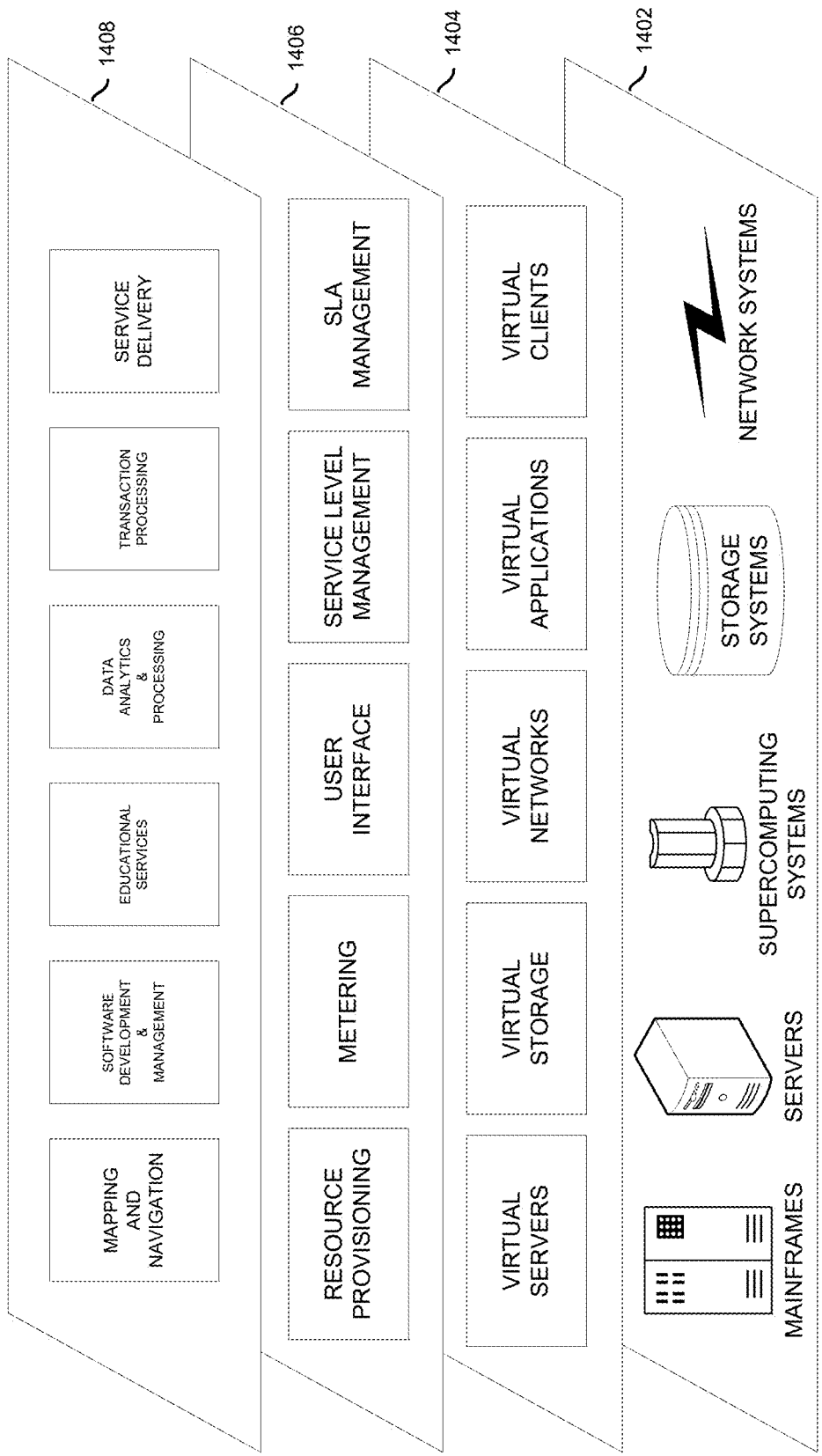
FIG. 14 illustrates a set of functional abstraction layers provided by a cloud computing environment, in accordance with at least one embodiment.

FIG. 14 illustrates a set of functional abstraction layers provided by cloud computing environment 1302 (FIG. 13), in accordance with at least one embodiment. It should be understood in advance that components, layers, and functions shown in FIG. 14 are intended to be illustrative only, and components, layers, and functions may vary.

In at least one embodiment, hardware and software layer 1402 includes hardware and software components. In at least one embodiment, examples of hardware components include mainframes, various RISC (Reduced Instruction Set Computer) architecture based servers, various computing systems, supercomputing systems, storage devices, networks, networking components, and/or variations thereof. In at least one embodiment, examples of software components include network application server software, various application server software, various database software, and/or variations thereof.

In at least one embodiment, virtualization layer 1404 provides an abstraction layer from which following exemplary virtual entities may be provided: virtual servers, virtual storage, virtual networks, including virtual private networks, virtual applications, virtual clients, and/or variations thereof.

In at least one embodiment, management layer 1406 provides various functions. In at least one embodiment, resource provisioning provides dynamic procurement of computing resources and other resources that are utilized to perform tasks within a cloud computing environment. In at least one embodiment, metering provides usage tracking as resources are utilized within a cloud computing environment, and billing or invoicing for consumption of these resources. In at least one embodiment, resources may comprise application software licenses. In at least one embodiment, security provides identity verification for users and tasks, as well as protection for data and other resources. In at least one embodiment, user interface provides access to a cloud computing environment for both users and system administrators. In at least one embodiment, service level management provides cloud computing resource allocation and management such that required service levels are met. In at least one embodiment, Service Level Agreement (SLA) management provides pre-arrangement for, and procurement of, cloud computing resources for which a future requirement is anticipated in accordance with an SLA.

In at least one embodiment, workloads layer 1408 provides functionality for which a cloud computing environment is utilized. In at least one embodiment, examples of workloads and functions which may be provided from this layer include: mapping and navigation, software development and management, educational services, data analytics and processing, transaction processing, and service delivery.

Supercomputing

The following figures set forth, without limitation, exemplary supercomputer-based systems that can be used to implement at least one embodiment.

In at least one embodiment, a supercomputer may refer to a hardware system exhibiting substantial parallelism and comprising at least one chip, where chips in a system are interconnected by a network and are placed in hierarchically organized enclosures. In at least one embodiment, a large hardware system filling a machine room, with several racks, each containing several boards/rack modules, each containing several chips, all interconnected by a scalable network, is one particular example of a supercomputer. In at least one embodiment, a single rack of such a large hardware system is another example of a supercomputer. In at least one embodiment, a single chip exhibiting substantial parallelism and containing several hardware components can equally be considered to be a supercomputer, since as feature sizes may decrease, an amount of hardware that can be incorporated in a single chip may also increase.

Figure 15:
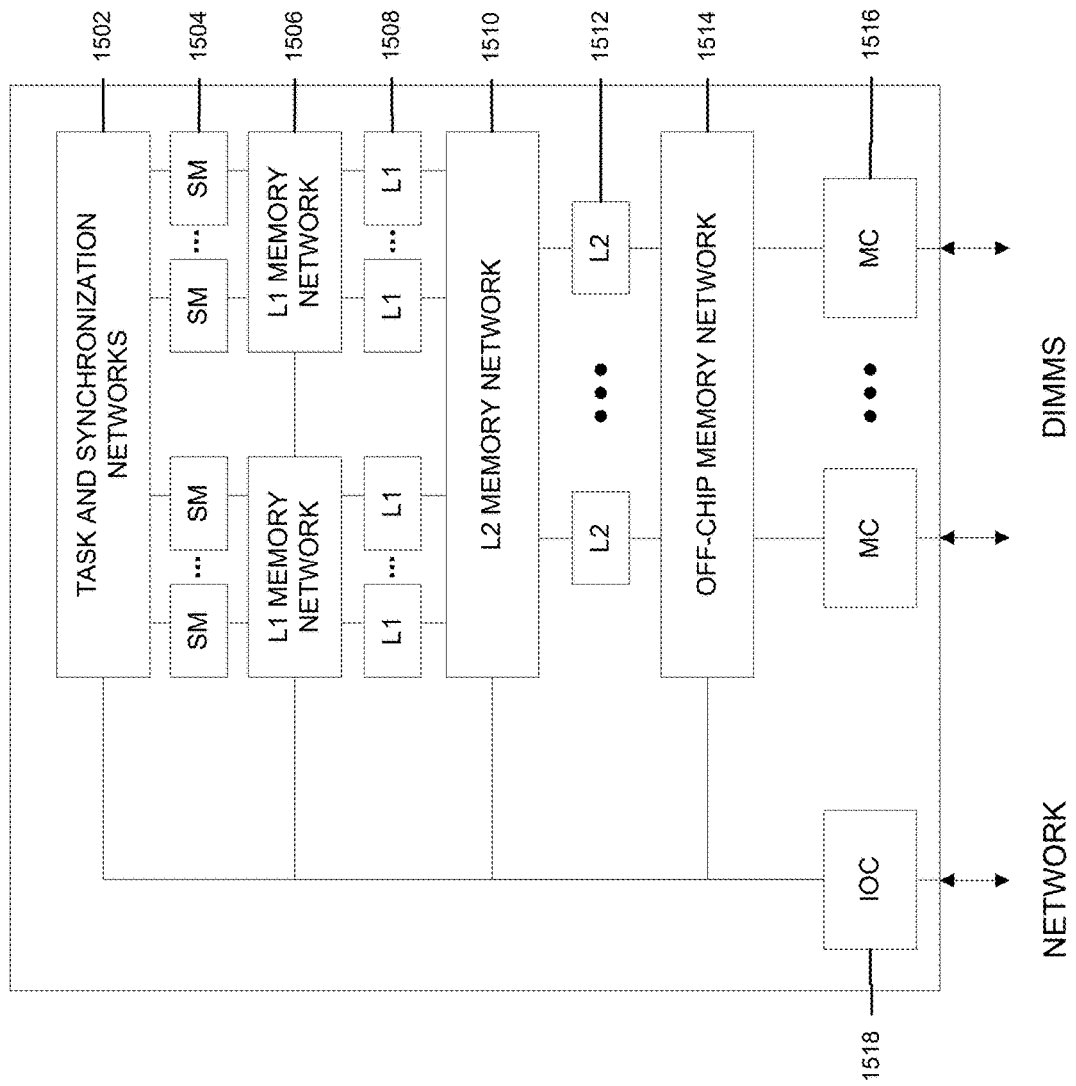
FIG. 15 illustrates a supercomputer at a chip level, in accordance with at least one embodiment.

FIG. 15 illustrates a supercomputer at a chip level, in accordance with at least one embodiment. In at least one embodiment, inside an FPGA or ASIC chip, main computation is performed within finite state machines (1504) called thread units. In at least one embodiment, task and synchronization networks (1502) connect finite state machines and are used to dispatch threads and execute operations in correct order. In at least one embodiment, a multi-level partitioned on-chip cache hierarchy (1508, 1512) is accessed using memory networks (1506, 1510). In at least one embodiment, off-chip memory is accessed using memory controllers (1516) and an off-chip memory network (1514). In at least one embodiment, I/O controller (1518) is used for cross-chip communication when a design does not fit in a single logic chip.

Figure 16:
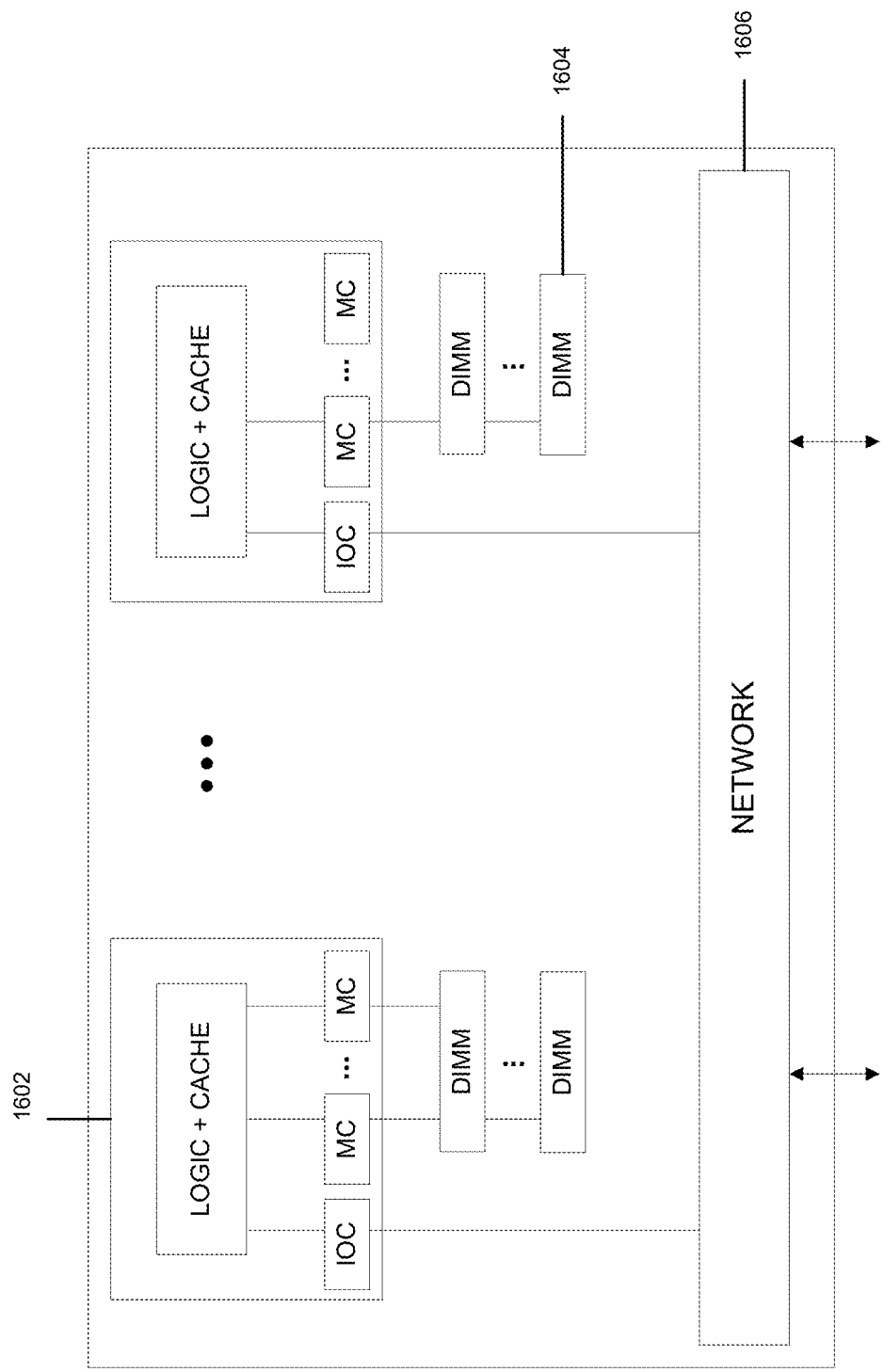
FIG. 16 illustrates a supercomputer at a rack module level, in accordance with at least one embodiment.
Figure 17:
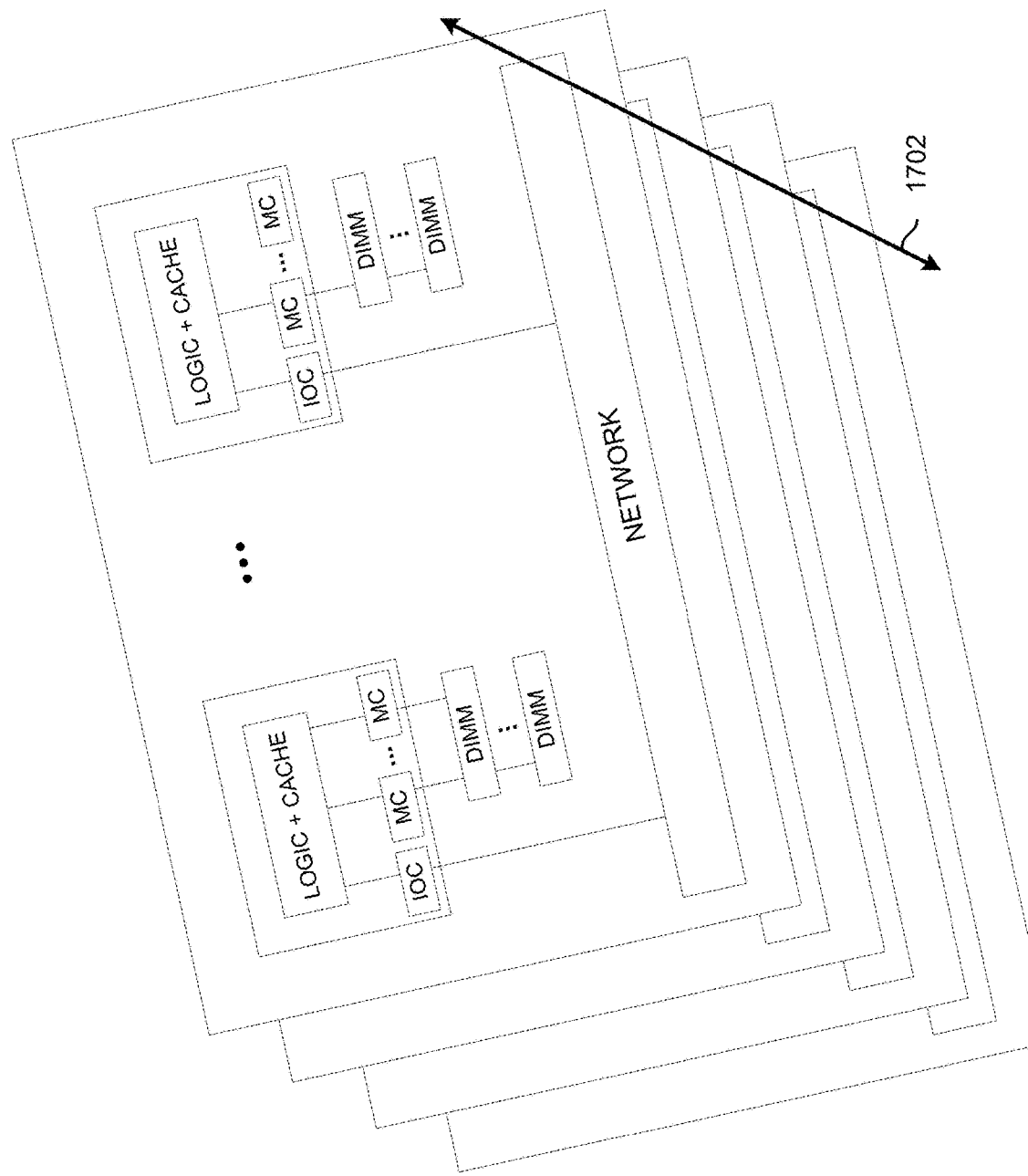
FIG. 17 illustrates a supercomputer at a rack level, in accordance with at least one embodiment.
Figure 18:
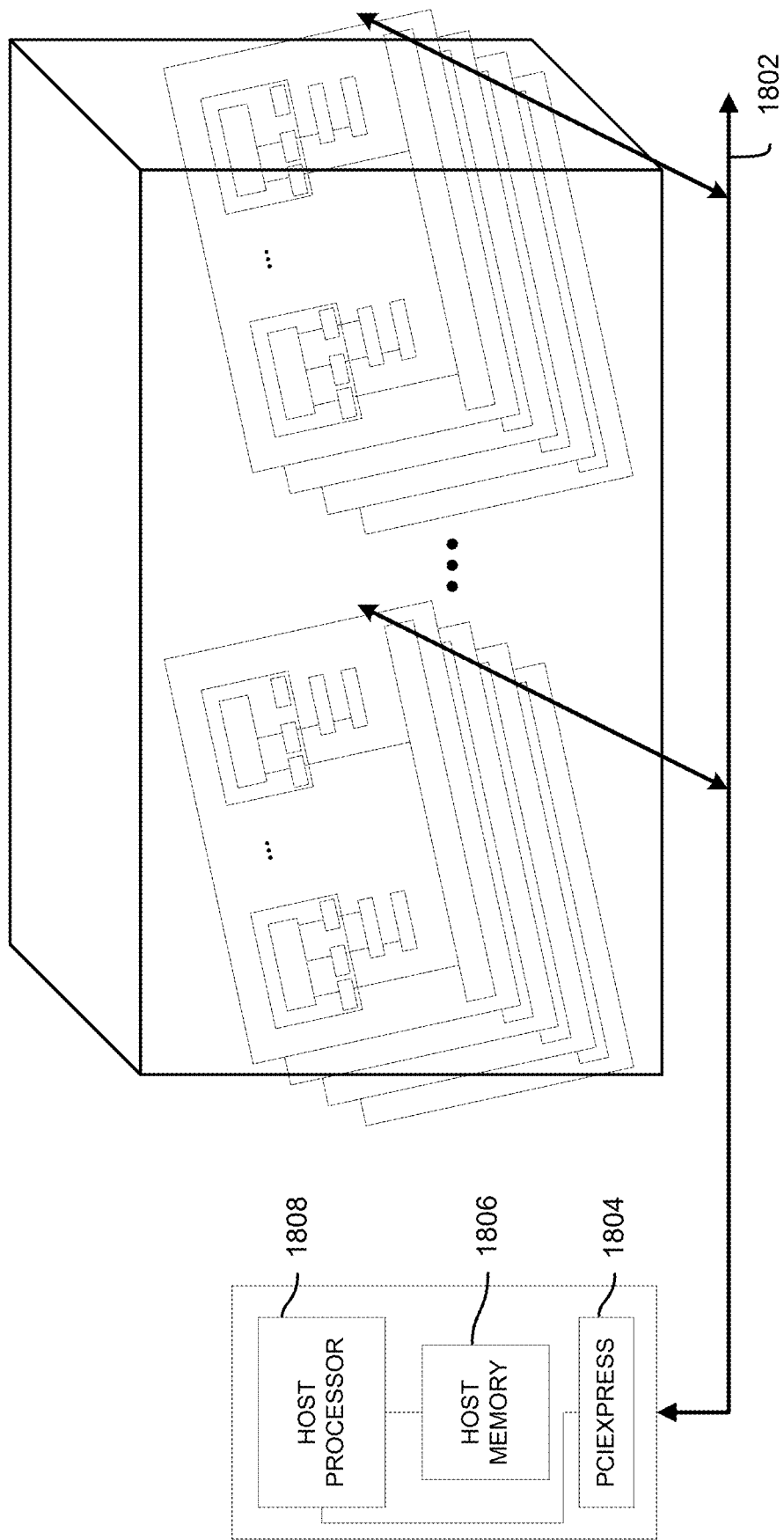
FIG. 18 illustrates a supercomputer at a whole system level, in accordance with at least one embodiment.

FIG. 16 illustrates a supercomputer at a rock module level, in accordance with at least one embodiment. In at least one embodiment, within a rack module, there are multiple FPGA or ASIC chips (1602) that are connected to one or more DRAM units (1604) which constitute main accelerator memory. In at least one embodiment, each FPGA/ASIC chip is connected to its neighbor FPGA/ASIC chip using wide busses on a board, with differential high speed signaling (1606). In at least one embodiment, each FPGA/ASIC chip is also connected to at least one high-speed serial communication cable.

17FIG. 17 illustrates a supercomputer at a rack level, in accordance with at least one embodiment. 18FIG. 18 illustrates a supercomputer at a whole system level, in accordance with at least one embodiment. In at least one embodiment, referring to 17FIG. 17 and 18FIG. 18, between rack modules in a rack and across racks throughout an entire system, high-speed serial optical or copper cables (1702, 1802) are used to realize a scalable, possibly incomplete hypercube network. In at least one embodiment, one of FPGA/ASIC chips of an accelerator is connected to a host system through a PCI-Express connection (1804). In at least one embodiment, host system comprises a host microprocessor (1808) that a software part of an application runs on and a memory consisting of one or more host memory DRAM units (1806) that is kept coherent with memory on an accelerator. In at least one embodiment, host system can be a separate module on one of racks, or can be integrated with one of a supercomputer's modules. In at least one embodiment, cube-connected cycles topology provide communication links to create a hypercube network for a large supercomputer. In at least one embodiment, a small group of FPGA/ASIC chips on a rack module can act as a single hypercube node, such that a total number of external links of each group is increased, compared to a single chip. In at least one embodiment, a group contains chips A, B, C and D on a rack module with internal wide differential busses connecting A, B, C and D in a torus organization. In at least one embodiment, there are 12 serial communication cables connecting a rack module to an outside world. In at least one embodiment, chip A on a rack module connects to serial communication cables 0, 1, 2. In at least one embodiment, chip B connects to cables 3, 4, 5. In at least one embodiment, chip C connects to 6, 7, 8. In at least one embodiment, chip D connects to 9, 10, 11. In at least one embodiment, an entire group {A, B, C, D} constituting a rack module can form a hypercube node within a supercomputer system, with up to 2^12=4096 rack modules (16384 FPGA/ASIC chips). In at least one embodiment, for chip A to send a message out on link 4 of group {A, B, C, D}, a message has to be routed first to chip B with an on-board differential wide bus connection. In at least one embodiment, a message arriving into a group {A, B, C, D} on link 4 (i.e., arriving at B) destined to chip A, also has to be routed first to a correct destination chip (A) internally within a group {A, B, C, D}. In at least one embodiment, parallel supercomputer systems of other sizes may also be implemented.

Artificial Intelligence

The following figures set forth, without limitation, exemplary artificial intelligence-based systems that can be used to implement at least one embodiment.

19FIG. 19A illustrates inference and/or training logic 1915 used to perform inferencing and/or training operations associated with one or more embodiments. Details regarding inference and/or training logic 1915 are provided below in conjunction with FIGS. 19A and/or 19B.

In at least one embodiment, inference and/or training logic 1915 may include, without limitation, code and/or data storage 1901 to store forward and/or output weight and/or input/output data, and/or other parameters to configure neurons or layers of a neural network trained and/or used for inferencing in aspects of one or more embodiments. In at least one embodiment, training logic 1915 may include, or be coupled to code and/or data storage 1901 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which such code corresponds. In at least one embodiment code and/or data storage 1901 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 1901 may be included with other on-chip or off-chip data storage, including a processor's L1, L2, or L3 cache or system memory.

In at least one embodiment, any portion of code and/or data storage 1901 may be internal or external to one or more processors or other hardware logic devices or circuits. In at least one embodiment, code and/or code and/or data storage 1901 may be cache memory, dynamic randomly addressable memory ("DRAM"), static randomly addressable memory ("SRAM"), non-volatile memory (e.g., flash memory), or other storage. In at least one embodiment, a choice of whether code and/or code and/or data storage 1901 is internal or external to a processor, for example, or comprising DRAM, SRAM, flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 1915 may include, without limitation, a code and/or data storage 1905 to store backward and/or output weight and/or input/output data corresponding to neurons or layers of a neural network trained and/or used for inferencing in aspects of one or more embodiments. In at least one embodiment, code and/or data storage 1905 stores weight parameters and/or input/output data of each layer of a neural network trained or used in conjunction with one or more embodiments during backward propagation of input/output data and/or weight parameters during training and/or inferencing using aspects of one or more embodiments. In at least one embodiment, training logic 1915 may include, or be coupled to code and/or data storage 1905 to store graph code or other software to control timing and/or order, in which weight and/or other parameter information is to be loaded to configure, logic, including integer and/or floating point units (collectively, arithmetic logic units (ALUs).

In at least one embodiment, code, such as graph code, causes loading of weight or other parameter information into processor ALUs based on an architecture of a neural network to which such code corresponds. In at least one embodiment, any portion of code and/or data storage 1905 may be included with other on-chip or off-chip data storage, including a processor's L1, L2, or L3 cache or system memory. In at least one embodiment, any portion of code and/or data storage 1905 may be internal or external to one or more processors or other hardware logic devices or circuits. In at least one embodiment, code and/or data storage 1905 may be cache memory, DRAM, SRAM, non-volatile memory (e.g., flash memory), or other storage. In at least one embodiment, a choice of whether code and/or data storage 1905 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, code and/or data storage 1901 and code and/or data storage 1905 may be separate storage structures. In at least one embodiment, code and/or data storage 1901 and code and/or data storage 1905 may be a combined storage structure. In at least one embodiment, code and/or data storage 1901 and code and/or data storage 1905 may be partially combined and partially separate. In at least one embodiment, any portion of code and/or data storage 1901 and code and/or data storage 1905 may be included with other on-chip or off-chip data storage, including a processor's L1, L2, or L3 cache or system memory.

In at least one embodiment, inference and/or training logic 1915 may include, without limitation, one or more arithmetic logic unit(s) ("ALU(s)") 1910, including integer and/or floating point units, to perform logical and/or mathematical operations based, at least in part on, or indicated by, training and/or inference code (e.g., graph code), a result of which may produce activations (e.g., output values from layers or neurons within a neural network) stored in an activation storage 1920 that are functions of input/output and/or weight parameter data stored in code and/or data storage 1901 and/or code and/or data storage 1905. In at least one embodiment, activations stored in activation storage 1920 are generated according to linear algebraic and or matrix-based mathematics performed by ALU(s) 1910 in response to performing instructions or other code, wherein weight values stored in code and/or data storage 1905 and/or data storage 1901 are used as operands along with other values, such as bias values, gradient information, momentum values, or other parameters or hyperparameters, any or all of which may be stored in code and/or data storage 1905 or code and/or data storage 1901 or another storage on or off-chip.

In at least one embodiment, ALU(s) 1910 are included within one or more processors or other hardware logic devices or circuits, whereas in another embodiment, ALU(s) 1910 may be external to a processor or other hardware logic device or circuit that uses them (e.g., a co-processor). In at least one embodiment, ALUs 1910 may be included within a processor's execution units or otherwise within a bank of ALUs accessible by a processor's execution units either within same processor or distributed between different processors of different types (e.g., central processing units, graphics processing units, fixed function units, etc.). In at least one embodiment, code and/or data storage 1901, code and/or data storage 1905, and activation storage 1920 may share a processor or other hardware logic device or circuit, whereas in another embodiment, they may be in different processors or other hardware logic devices or circuits, or some combination of same and different processors or other hardware logic devices or circuits. In at least one embodiment, any portion of activation storage 1920 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 1920 may be cache memory, DRAM, SRAM, non-volatile memory (e.g., flash memory), or other storage. In at least one embodiment, activation storage 1920 may be completely or partially within or external to one or more processors or other logical circuits. In at least one embodiment, a choice of whether activation storage 1920 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

Figure 19A:
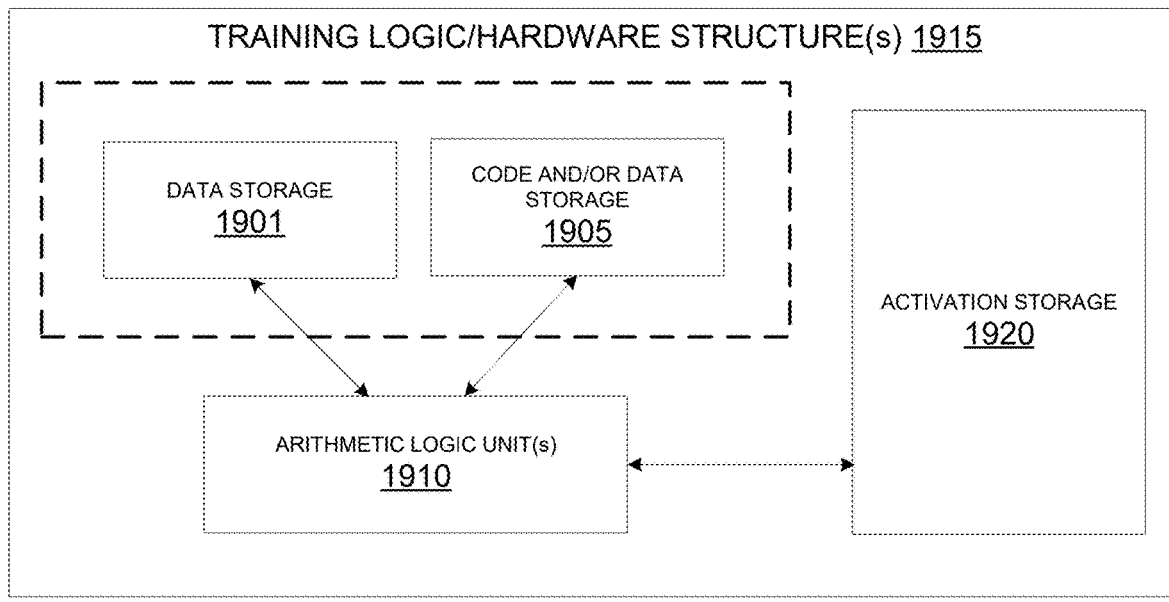
FIG. 19A illustrates inference and/or training logic, in accordance with at least one embodiment.

In at least one embodiment, inference and/or training logic 1915 illustrated in FIG. 19A may be used in conjunction with an application-specific integrated circuit ("ASIC"), such as a TensorFlow® Processing Unit from Google, an inference processing unit (IPU) from Graphcore™, or a Nervana® (e.g., "Lake Crest") processor from Intel Corp. In at least one embodiment, inference and/or training logic 1915 illustrated in FIG. 19A may be used in conjunction with central processing unit ("CPU") hardware, graphics processing unit ("GPU") hardware or other hardware, such as field programmable gate arrays ("FPGAs").

Figure 19B:
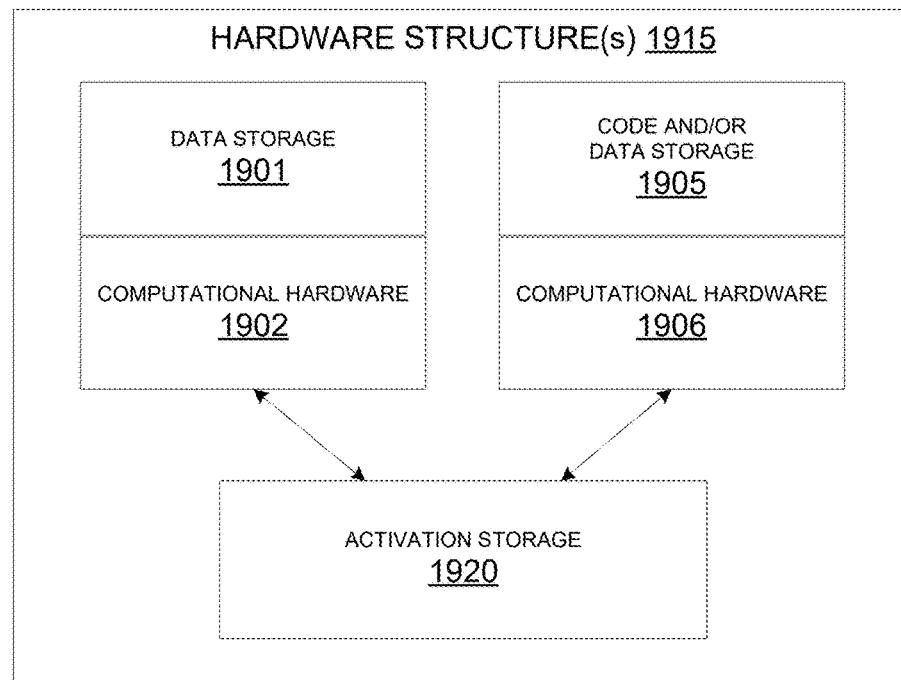
FIG. 19B illustrates inference and/or training logic, in accordance with at least one embodiment.

FIG. 19B illustrates inference and/or training logic 1915, according to at least one embodiment. In at least one embodiment, inference and/or training logic 1915 may include, without limitation, hardware logic in which computational resources are dedicated or otherwise exclusively used in conjunction with weight values or other information corresponding to one or more layers of neurons within a neural network. In at least one embodiment, inference and/or training logic 1915 illustrated in FIG. 19B may be used in conjunction with an application-specific integrated circuit (ASIC), such as TensorFlow® Processing Unit from Google, an inference processing unit (IPU) from Graphcore™, or a Nervana® (e.g., "Lake Crest") processor from Intel Corp. In at least one embodiment, inference and/or training logic 1915 illustrated in FIG. 19B may be used in conjunction with central processing unit (CPU) hardware, graphics processing unit (GPU) hardware or other hardware, such as field programmable gate arrays (FPGAs). In at least one embodiment, inference and/or training logic 1915 includes, without limitation, code and/or data storage 1901 and code and/or data storage 1905, which may be used to store code (e.g., graph code), weight values and/or other information, including bias values, gradient information, momentum values, and/or other parameter or hyperparameter information. In at least one embodiment illustrated in FIG. 19B, each of code and/or data storage 1901 and code and/or data storage 1905 is associated with a dedicated computational resource, such as computational hardware 1902 and computational hardware 1906, respectively. In at least one embodiment, each of computational hardware 1902 and computational hardware 1906 comprises one or more ALUs that perform mathematical functions, such as linear algebraic functions, only on information stored in code and/or data storage 1901 and code and/or data storage 1905, respectively, result of which is stored in activation storage 1920.

In at least one embodiment, each of code and/or data storage 1901 and 1905 and corresponding computational hardware 1902 and 1906, respectively, correspond to different layers of a neural network, such that resulting activation from one storage/computational pair 1901/1902 of code and/or data storage 1901 and computational hardware 1902 is provided as an input to a next storage/computational pair 1905/1906 of code and/or data storage 1905 and computational hardware 1906, in order to mirror a conceptual organization of a neural network. In at least one embodiment, each of storage/computational pairs 1901/1902 and 1905/1906 may correspond to more than one neural network layer. In at least one embodiment, additional storage/computation pairs (not shown) subsequent to or in parallel with storage/computation pairs 1901/1902 and 1905/1906 may be included in inference and/or training logic 1915.

Figure 20:
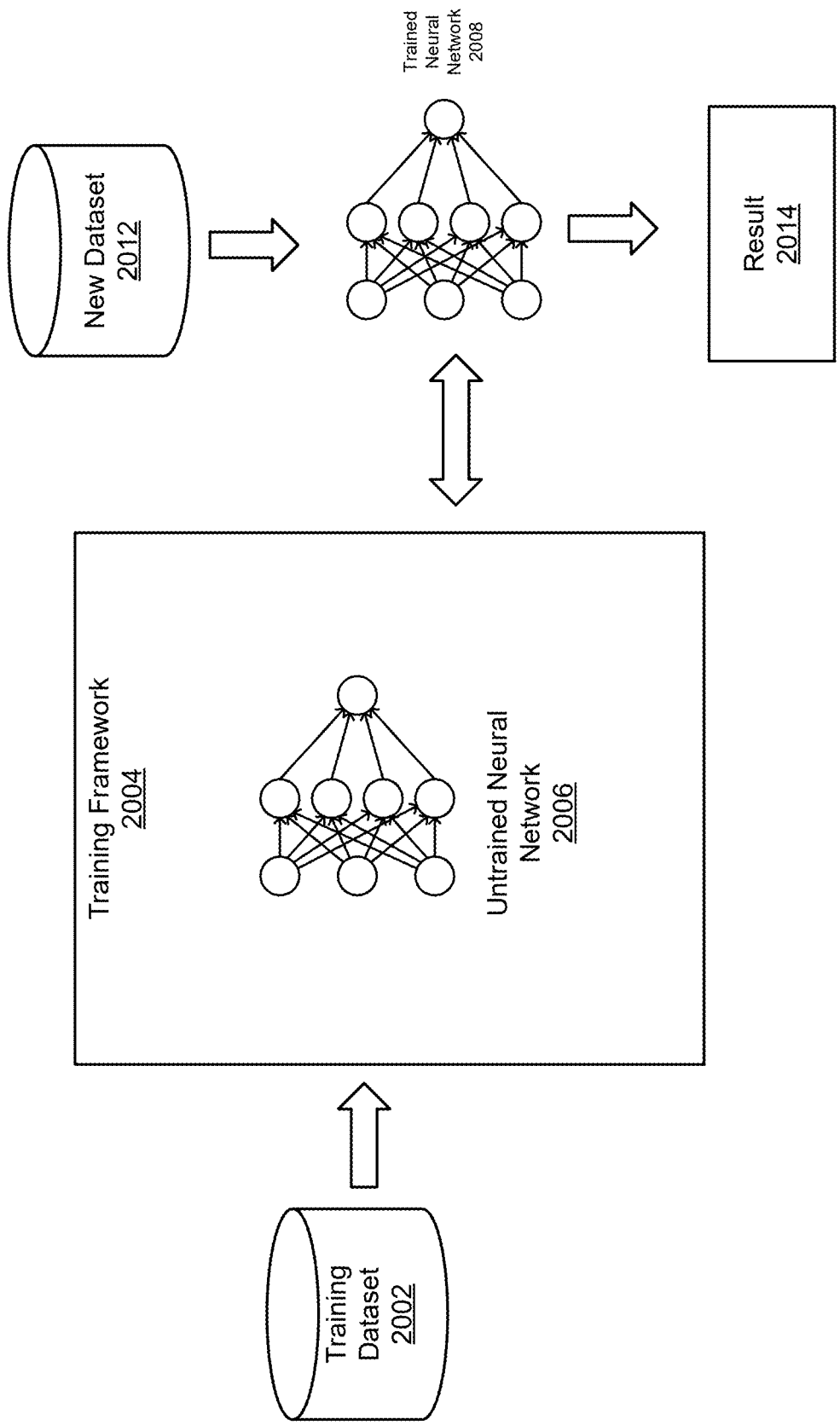
FIG. 20 illustrates training and deployment of a neural network, in accordance with at least one embodiment.

FIG. 20 illustrates training and deployment of a deep neural network, according to at least one embodiment. In at least one embodiment, untrained neural network 2006 is trained using a training dataset 2002. In at least one embodiment, training framework 2004 is a PyTorch framework, whereas in other embodiments, training framework 2004 is a TensorFlow, Boost, Caffe, Microsoft Cognitive Toolkit/CNTK, MXNet, Chainer, Keras, Deeplearning4j, or other training framework. In at least one embodiment, training framework 2004 trains an untrained neural network 2006 and enables it to be trained using processing resources described herein to generate a trained neural network 2008. In at least one embodiment, weights may be chosen randomly or by pre-training using a deep belief network. In at least one embodiment, training may be performed in either a supervised, partially supervised, or unsupervised manner.

In at least one embodiment, untrained neural network 2006 is trained using supervised learning, wherein training dataset 2002 includes an input paired with a desired output for an input, or where training dataset 2002 includes input having a known output and an output of neural network 2006 is manually graded. In at least one embodiment, untrained neural network 2006 is trained in a supervised manner and processes inputs from training dataset 2002 and compares resulting outputs against a set of expected or desired outputs. In at least one embodiment, errors are then propagated back through untrained neural network 2006. In at least one embodiment, training framework 2004 adjusts weights that control untrained neural network 2006. In at least one embodiment, training framework 2004 includes tools to monitor how well untrained neural network 2006 is converging towards a model, such as trained neural network 2008, suitable to generating correct answers, such as in result 2014, based on input data such as a new dataset 2012. In at least one embodiment, training framework 2004 trains untrained neural network 2006 repeatedly while adjust weights to refine an output of untrained neural network 2006 using a loss function and adjustment algorithm, such as stochastic gradient descent. In at least one embodiment, training framework 2004 trains untrained neural network 2006 until untrained neural network 2006 achieves a desired accuracy. In at least one embodiment, trained neural network 2008 can then be deployed to implement any number of machine learning operations.

In at least one embodiment, untrained neural network 2006 is trained using unsupervised learning, wherein untrained neural network 2006 attempts to train itself using unlabeled data. In at least one embodiment, unsupervised learning training dataset 2002 will include input data without any associated output data or "ground truth" data. In at least one embodiment, untrained neural network 2006 can learn groupings within training dataset 2002 and can determine how individual inputs are related to untrained dataset 2002. In at least one embodiment, unsupervised training can be used to generate a self-organizing map in trained neural network 2008 capable of performing operations useful in reducing dimensionality of new dataset 2012. In at least one embodiment, unsupervised training can also be used to perform anomaly detection, which allows identification of data points in new dataset 2012 that deviate from normal patterns of new dataset 2012.

In at least one embodiment, semi-supervised learning may be used, which is a technique in which in training dataset 2002 includes a mix of labeled and unlabeled data. In at least one embodiment, training framework 2004 may be used to perform incremental learning, such as through transferred learning techniques. In at least one embodiment, incremental learning enables trained neural network 2008 to adapt to new dataset 2012 without forgetting knowledge instilled within trained neural network 2008 during initial training.

5G Networks

The following figures set forth, without limitation, exemplary 5G network-based systems that can be used to implement at least one embodiment.

Figure 21:
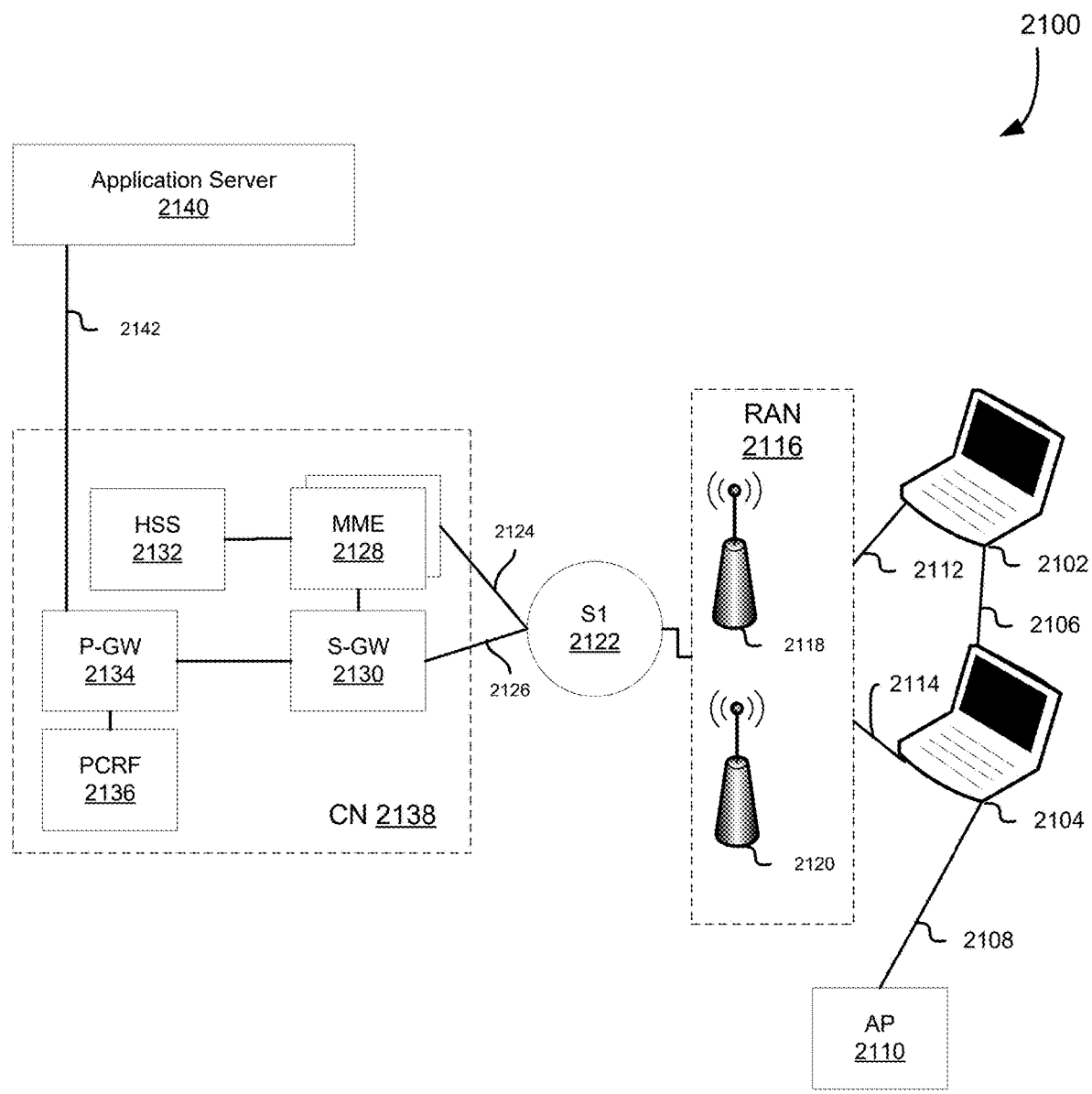
FIG. 21 illustrates an architecture of a system of a network, in accordance with at least one embodiment.

FIG. 21 illustrates an architecture of a system 2100 of a network, in accordance with at least one embodiment. In at least one embodiment, system 2100 is shown to include a user equipment (UE) 2102 and a UE 2104. In at least one embodiment, UEs 2102 and 2104 are illustrated as smartphones (e.g., handheld touchscreen mobile computing devices connectable to one or more cellular networks) but may also comprise any mobile or non-mobile computing device, such as Personal Data Assistants (PDAs), pagers, laptop computers, desktop computers, wireless handsets, or any computing device including a wireless communications interface.

In at least one embodiment, any of UEs 2102 and 2104 can comprise an Internet of Things (IoT) UE, which can comprise a network access layer designed for low-power IoT applications utilizing short-lived UE connections. In at least one embodiment, an IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. In at least one embodiment, a M2M or MTC exchange of data may be a machine-initiated exchange of data. In at least one embodiment, an IoT network describes interconnecting IoT UEs, which may include uniquely identifiable embedded computing devices (within Internet infrastructure), with short-lived connections. In at least one embodiment, an IoT UEs may execute background applications (e.g., keep alive messages, status updates, etc.) to facilitate connections of an IoT network.

In at least one embodiment, UEs 2102 and 2104 may be configured to connect, e.g., communicatively couple, with a radio access network (RAN) 2116. In at least one embodiment, RAN 2116 may be, for example, an Evolved Universal Mobile Telecommunications System (UMTS) Terrestrial Radio Access Network (E-UTRAN), a NextGen RAN (NG RAN), or some other type of RAN. In at least one embodiment, UEs 2102 and 2104 utilize connections 2112 and 2114, respectively, each of which comprises a physical communications interface or layer. In at least one embodiment, connections 2112 and 2114 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and variations thereof.

In at least one embodiment, UEs 2102 and 2104 may further directly exchange communication data via a ProSe interface 2106. In at least one embodiment, ProSe interface 2106 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

In at least one embodiment, UE 2104 is shown to be configured to access an access point (AP) 2110 via connection 2108. In at least one embodiment, connection 2108 can comprise a local wireless connection, such as a connection consistent with any IEEE 802.11 protocol, wherein AP 2110 would comprise a wireless fidelity (WiFi®) router. In at least one embodiment, AP 2110 is shown to be connected to an Internet without connecting to a core network of a wireless system.

In at least one embodiment, RAN 2116 can include one or more access nodes that enable connections 2112 and 2114. In at least one embodiment, these access nodes (ANs) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). In at least one embodiment, RAN 2116 may include one or more RAN nodes for providing macrocells, e.g., macro RAN node 2118, and one or more RAN nodes for providing femtocells or picocells (e.g., cells having smaller coverage areas, smaller user capacity, or higher bandwidth compared to macrocells), e.g., low power (LP) RAN node 2120.

In at least one embodiment, any of RAN nodes 2118 and 2120 can terminate an air interface protocol and can be a first point of contact for UEs 2102 and 2104. In at least one embodiment, any of RAN nodes 2118 and 2120 can fulfill various logical functions for RAN 2116 including, but not limited to, radio network controller (RNC) functions such as radio bearer management, uplink and downlink dynamic radio resource management and data packet scheduling, and mobility management.

In at least one embodiment, UEs 2102 and 2104 can be configured to communicate using Orthogonal Frequency-Division Multiplexing (OFDM) communication signals with each other or with any of RAN nodes 2118 and 2120 over a multi-carrier communication channel in accordance various communication techniques, such as, but not limited to, an Orthogonal Frequency Division Multiple Access (OFDMA) communication technique (e.g., for downlink communications) or a Single Carrier Frequency Division Multiple Access (SC-FDMA) communication technique (e.g., for uplink and ProSe or sidelink communications), and/or variations thereof. In at least one embodiment, OFDM signals can comprise a plurality of orthogonal sub-carriers.

In at least one embodiment, a downlink resource grid can be used for downlink transmissions from any of RAN nodes 2118 and 2120 to UEs 2102 and 2104, while uplink transmissions can utilize similar techniques. In at least one embodiment, a grid can be a time frequency grid, called a resource grid or time-frequency resource grid, which is a physical resource in a downlink in each slot. In at least one embodiment, such a time frequency plane representation is a common practice for OFDM systems, which makes it intuitive for radio resource allocation. In at least one embodiment, each column and each row of a resource grid corresponds to one OFDM symbol and one OFDM subcarrier, respectively. In at least one embodiment, a duration of a resource grid in a time domain corresponds to one slot in a radio frame. In at least one embodiment, a smallest time-frequency unit in a resource grid is denoted as a resource element. In at least one embodiment, each resource grid comprises a number of resource blocks, which describe a mapping of certain physical channels to resource elements. In at least one embodiment, each resource block comprises a collection of resource elements. In at least one embodiment, in a frequency domain, this may represent a smallest quantity of resources that currently can be allocated. In at least one embodiment, there are several different physical downlink channels that are conveyed using such resource blocks.

In at least one embodiment, a physical downlink shared channel (PDSCH) may carry user data and higher-layer signaling to UEs 2102 and 2104. In at least one embodiment, a physical downlink control channel (PDCCH) may carry information about a transport format and resource allocations related to PDSCH channel, among other things. In at least one embodiment, it may also inform UEs 2102 and 2104 about a transport format, resource allocation, and HARQ (Hybrid Automatic Repeat Request) information related to an uplink shared channel. In at least one embodiment, typically, downlink scheduling (assigning control and shared channel resource blocks to UE 2102 within a cell) may be performed at any of RAN nodes 2118 and 2120 based on channel quality information fed back from any of UEs 2102 and 2104. In at least one embodiment, downlink resource assignment information may be sent on a PDCCH used for (e.g., assigned to) each of UEs 2102 and 2104.

In at least one embodiment, a PDCCH may use control channel elements (CCEs) to convey control information. In at least one embodiment, before being mapped to resource elements, PDCCH complex valued symbols may first be organized into quadruplets, which may then be permuted using a sub-block interleaver for rate matching. In at least one embodiment, each PDCCH may be transmitted using one or more of these CCEs, where each CCE may correspond to nine sets of four physical resource elements known as resource element groups (REGs). In at least one embodiment, four Quadrature Phase Shift Keying (QPSK) symbols may be mapped to each REG. In at least one embodiment, PDCCH can be transmitted using one or more CCEs, depending on a size of a downlink control information (DCI) and a channel condition. In at least one embodiment, there can be four or more different PDCCH formats defined in LTE with different numbers of CCEs (e.g., aggregation level, L=1, 2, 4, or 8).

In at least one embodiment, an enhanced physical downlink control channel (EPDCCH) that uses PDSCH resources may be utilized for control information transmission. In at least one embodiment, EPDCCH may be transmitted using one or more enhanced control channel elements (ECCEs). In at least one embodiment, each ECCE may correspond to nine sets of four physical resource elements known as an enhanced resource element groups (EREGs). In at least one embodiment, an ECCE may have other numbers of EREGs in some situations.

In at least one embodiment, RAN 2116 is shown to be communicatively coupled to a core network (CN) 2138 via an S1 interface 2122. In at least one embodiment, CN 2138 may be an evolved packet core (EPC) network, a NextGen Packet Core (NPC) network, or some other type of CN. In at least one embodiment, S1 interface 2122 is split into two parts: S1-U interface 2126, which carries traffic data between RAN nodes 2118 and 2120 and serving gateway (S-GW) 2130, and a S1-mobility management entity (MME) interface 2124, which is a signaling interface between RAN nodes 2118 and 2120 and MMEs 2128.

In at least one embodiment, CN 2138 comprises MMEs 2128, S-GW 2130, Packet Data Network (PDN) Gateway (P-GW) 2134, and a home subscriber server (HSS) 2132. In at least one embodiment, MMEs 2128 may be similar in function to a control plane of legacy Serving General Packet Radio Service (GPRS) Support Nodes (SGSN). In at least one embodiment, MMEs 2128 may manage mobility aspects in access such as gateway selection and tracking area list management. In at least one embodiment, HSS 2132 may comprise a database for network users, including subscription related information to support a network entities' handling of communication sessions. In at least one embodiment, CN 2138 may comprise one or several HSSs 2132, depending on a number of mobile subscribers, on a capacity of an equipment, on an organization of a network, etc. In at least one embodiment, HSS 2132 can provide support for routing/roaming, authentication, authorization, naming/addressing resolution, location dependencies, etc.

In at least one embodiment, S-GW 2130 may terminate a S1 interface 2122 towards RAN 2116, and routes data packets between RAN 2116 and CN 2138. In at least one embodiment, S-GW 2130 may be a local mobility anchor point for inter-RAN node handovers and also may provide an anchor for inter-3GPP mobility. In at least one embodiment, other responsibilities may include lawful intercept, charging, and some policy enforcement.

In at least one embodiment, P-GW 2134 may terminate an SGi interface toward a PDN. In at least one embodiment, P-GW 2134 may route data packets between an EPC network 2138 and external networks such as a network including application server 2140 (alternatively referred to as application function (AF)) via an Internet Protocol (IP) interface 2142. In at least one embodiment, application server 2140 may be an element offering applications that use IP bearer resources with a core network (e.g., UMTS Packet Services (PS) domain, LTE PS data services, etc.). In at least one embodiment, P-GW 2134 is shown to be communicatively coupled to an application server 2140 via an IP communications interface 2142. In at least one embodiment, application server 2140 can also be configured to support one or more communication services (e.g., Voice-over-Internet Protocol (VOIP) sessions, PTT sessions, group communication sessions, social networking services, etc.) for UEs 2102 and 2104 via CN 2138.

In at least one embodiment, P-GW 2134 may further be a node for policy enforcement and charging data collection. In at least one embodiment, policy and Charging Enforcement Function (PCRF) 2136 is a policy and charging control element of CN 2138. In at least one embodiment, in a non-roaming scenario, there may be a single PCRF in a Home Public Land Mobile Network (HPLMN) associated with a UE's Internet Protocol Connectivity Access Network (IP-CAN) session. In at least one embodiment, in a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). In at least one embodiment, PCRF 2136 may be communicatively coupled to application server 2140 via P-GW 2134. In at least one embodiment, application server 2140 may signal PCRF 2136 to indicate a new service flow and select an appropriate Quality of Service (QoS) and charging parameters. In at least one embodiment, PCRF 2136 may provision this rule into a Policy and Charging Enforcement Function (PCEF) (not shown) with an appropriate traffic flow template (TFT) and QoS class of identifier (QCI), which commences a QoS and charging as specified by application server 2140.

Figure 22:
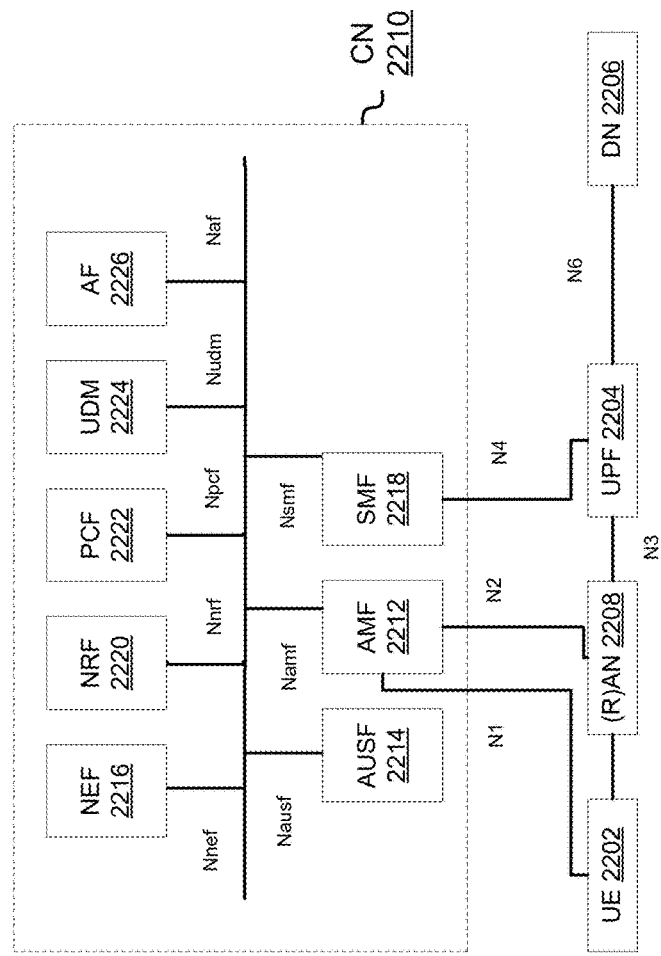
FIG. 22 illustrates an architecture of a system of a network, in accordance with at least one embodiment.

FIG. 22 illustrates an architecture of a system 2200 of a network in accordance with some embodiments. In at least one embodiment, system 2200 is shown to include a UE 2202, a 5G access node or RAN node (shown as (R) AN node 2208), a User Plane Function (shown as UPF 2204), a Data Network (DN 2206), which may be, for example, operator services, Internet access or 3rd party services, and a 5G Core Network (5GC) (shown as CN 2210).

In at least one embodiment, CN 2210 includes an Authentication Server Function (AUSF 2214); a Core Access and Mobility Management Function (AMF 2212); a Session Management Function (SMF 2218); a Network Exposure Function (NEF 2216); a Policy Control Function (PCF 2222); a Network Function (NF) Repository Function (NRF 2220); a Unified Data Management (UDM 2224); and an Application Function (AF 2226). In at least one embodiment, CN 2210 may also include other elements that are not shown, such as a Structured Data Storage network function (SDSF), an Unstructured Data Storage network function (UDSF), and variations thereof.

In at least one embodiment, UPF 2204 may act as an anchor point for intra-RAT and inter-RAT mobility, an external PDU session point of interconnect to DN 2206, and a branching point to support multi-homed PDU session. In at least one embodiment, UPF 2204 may also perform packet routing and forwarding, packet inspection, enforce user plane part of policy rules, lawfully intercept packets (UP collection); traffic usage reporting, perform QoS handling for user plane (e.g. packet filtering, gating, UL/DL rate enforcement), perform Uplink Traffic verification (e.g., SDF to QoS flow mapping), transport level packet marking in uplink and downlink, and downlink packet buffering and downlink data notification triggering. In at least one embodiment, UPF 2204 may include an uplink classifier to support routing traffic flows to a data network. In at least one embodiment, DN 2206 may represent various network operator services, Internet access, or third party services.

In at least one embodiment, AUSF 2214 may store data for authentication of UE 2202 and handle authentication related functionality. In at least one embodiment, AUSF 2214 may facilitate a common authentication framework for various access types.

In at least one embodiment, AMF 2212 may be responsible for registration management (e.g., for registering UE 2202, etc.), connection management, reachability management, mobility management, and lawful interception of AMF-related events, and access authentication and authorization. In at least one embodiment, AMF 2212 may provide transport for SM messages for SMF 2218, and act as a transparent proxy for routing SM messages. In at least one embodiment, AMF 2212 may also provide transport for short message service (SMS) messages between UE 2202 and an SMS function (SMSF) (not shown by FIG. 22). In at least one embodiment, AMF 2212 may act as Security Anchor Function (SEA), which may include interaction with AUSF 2214 and UE 2202 and receipt of an intermediate key that was established as a result of UE 2202 authentication process. In at least one embodiment, where USIM based authentication is used, AMF 2212 may retrieve security material from AUSF 2214. In at least one embodiment, AMF 2212 may also include a Security Context Management (SCM) function, which receives a key from SEA that it uses to derive access-network specific keys. In at least one embodiment, furthermore, AMF 2212 may be a termination point of RAN CP interface (N2 reference point), a termination point of NAS (NI) signaling, and perform NAS ciphering and integrity protection.

In at least one embodiment, AMF 2212 may also support NAS signaling with a UE 2202 over an N3 interworking-function (IWF) interface. In at least one embodiment, N3IWF may be used to provide access to untrusted entities. In at least one embodiment, N3IWF may be a termination point for N2 and N3 interfaces for control plane and user plane, respectively, and as such, may handle N2 signaling from SMF and AMF for PDU sessions and QoS, encapsulate/de-encapsulate packets for IPSec and N3 tunneling, mark N3 user-plane packets in uplink, and enforce QoS corresponding to N3 packet marking taking into account QoS requirements associated to such marking received over N2. In at least one embodiment, N3IWF may also relay uplink and downlink control-plane NAS (NI) signaling between UE 2202 and AMF 2212, and relay uplink and downlink user-plane packets between UE 2202 and UPF

2204. In at least one embodiment, N3IWF also provides mechanisms for IPsec tunnel establishment with UE 2202.

In at least one embodiment, SMF 2218 may be responsible for session management (e.g., session establishment, modify and release, including tunnel maintain between UPF and AN node); UE IP address allocation & management (including optional Authorization); Selection and control of UP function; Configures traffic steering at UPF to route traffic to proper destination; termination of interfaces towards Policy control functions; control part of policy enforcement and QoS; lawful intercept (for SM events and interface to LI System); termination of SM parts of NAS messages; downlink Data Notification; initiator of AN specific SM information, sent via AMF over N2 to AN; determine SSC mode of a session. In at least one embodiment, SMF 2218 may include following roaming functionality: handle local enforcement to apply QOS SLAB (VPLMN); charging data collection and charging interface (VPLMN); lawful intercept (in VPLMN for SM events and interface to LI System); support for interaction with external DN for transport of signaling for PDU session authorization/authentication by external DN.

In at least one embodiment, NEF 2216 may provide means for securely exposing services and capabilities provided by 3GPP network functions for third party, internal exposure/re-exposure, Application Functions (e.g., AF 2226), edge computing or fog computing systems, etc. In at least one embodiment, NEF 2216 may authenticate, authorize, and/or throttle AFs. In at least one embodiment, NEF 2216 may also translate information exchanged with AF 2226 and information exchanged with internal network functions. In at least one embodiment, NEF 2216 may translate between an AF-Service-Identifier and an internal 5GC information. In at least one embodiment, NEF 2216 may also receive information from other network functions (NFs) based on exposed capabilities of other network functions. In at least one embodiment, this information may be stored at NEF 2216 as structured data, or at a data storage NF using a standardized interfaces. In at least one embodiment, stored information can then be re-exposed by NEF 2216 to other NFs and AFs, and/or used for other purposes such as analytics.

In at least one embodiment, NRF 2220 may support service discovery functions, receive NF Discovery Requests from NF instances, and provide information of discovered NF instances to NF instances. In at least one embodiment, NRF 2220 also maintains information of available NF instances and their supported services.

In at least one embodiment, PCF 2222 may provide policy rules to control plane function(s) to enforce them, and may also support unified policy framework to govern network behavior. In at least one embodiment, PCF 2222 may also implement a front end (FE) to access subscription information relevant for policy decisions in a UDR of UDM 2224.

In at least one embodiment, UDM 2224 may handle subscription-related information to support a network entities' handling of communication sessions, and may store subscription data of UE 2202. In at least one embodiment, UDM 2224 may include two parts, an application FE and a User Data Repository (UDR). In at least one embodiment, UDM may include a UDM FE, which is in charge of processing of credentials, location management, subscription management and so on. In at least one embodiment, several different front ends may serve a same user in different transactions. In at least one embodiment, UDM-FE accesses subscription information stored in an UDR and performs authentication credential processing; user identification handling; access authorization; registration/mobility management; and subscription management. In at least one embodiment, UDR may interact with PCF 2222. In at least one embodiment, UDM 2224 may also support SMS management, wherein an SMS-FE implements a similar application logic as discussed previously.

In at least one embodiment, AF 2226 may provide application influence on traffic routing, access to a Network Capability Exposure (NCE), and interact with a policy framework for policy control. In at least one embodiment, NCE may be a mechanism that allows a 5GC and AF 2226 to provide information to each other via NEF 2216, which may be used for edge computing implementations. In at least one embodiment, network operator and third party services may be hosted close to UE 2202 access point of attachment to achieve an efficient service delivery through a reduced end-to-end latency and load on a transport network. In at least one embodiment, for edge computing implementations, 5GC may select a UPF 2204 close to UE 2202 and execute traffic steering from UPF 2204 to DN 2206 via N6 interface. In at least one embodiment, this may be based on UE subscription data, UE location, and information provided by AF 2226. In at least one embodiment, AF 2226 may influence UPF (re) selection and traffic routing. In at least one embodiment, based on operator deployment, when AF 2226 is considered to be a trusted entity, a network operator may permit AF 2226 to interact directly with relevant NFs.

In at least one embodiment, CN 2210 may include an SMSF, which may be responsible for SMS subscription checking and verification, and relaying SM messages to/from UE 2202 to/from other entities, such as an SMS-GMSC/IWMSC/SMS-router. In at least one embodiment, SMS may also interact with AMF 2212 and UDM 2224 for notification procedure that UE 2202 is available for SMS transfer (e.g., set a UE not reachable flag, and notifying UDM 2224 when UE 2202 is available for SMS).

In at least one embodiment, system 2200 may include following service-based interfaces: Namf: Service-based interface exhibited by AMF; Nsmf: Service-based interface exhibited by SMF; Nnef: Service-based interface exhibited by NEF; Npcf: Service-based interface exhibited by PCF; Nudm: Service-based interface exhibited by UDM; Naf: Service-based interface exhibited by AF; Nnrf: Service-based interface exhibited by NRF; and Nausf: Service-based interface exhibited by AUSF.

In at least one embodiment, system 2200 may include following reference points: N1: Reference point between UE and AMF; N2: Reference point between (R) AN and AMF; N3: Reference point between (R) AN and UPF; N4: Reference point between SMF and UPF; and N6: Reference point between UPF and a Data Network. In at least one embodiment, there may be many more reference points and/or service-based interfaces between a NF services in NFs, however, these interfaces and reference points have been omitted for clarity. In at least one embodiment, an NS reference point may be between a PCF and AF; an N7 reference point may be between PCF and SMF; an N11 reference point between AMF and SMF; etc. In at least one embodiment, CN 2210 may include an Nx interface, which is an inter-CN interface between MME and AMF 2212 in order to enable interworking between CN 2210 and CN 7216.

In at least one embodiment, system 2200 may include multiple RAN nodes (such as (R) AN node 2208) wherein an Xn interface is defined between two or more (R) AN node 2208 (e.g., gNBs) that connecting to 5GC 410, between a (R) AN node 2208 (e.g., gNB) connecting to CN 2210 and an eNB (e.g., a macro RAN node), and/or between two eNBs connecting to CN 2210.

In at least one embodiment, Xn interface may include an Xn user plane (Xn-U) interface and an Xn control plane (Xn-C) interface. In at least one embodiment, Xn-U may provide non-guaranteed delivery of user plane PDUs and support/provide data forwarding and flow control functionality. In at least one embodiment, Xn-C may provide management and error handling functionality, functionality to manage a Xn-C interface; mobility support for UE 2202 in a connected mode (e.g., CM-CONNECTED) including functionality to manage UE mobility for connected mode between one or more (R) AN node 2208. In at least one embodiment, mobility support may include context transfer from an old (source) serving (R) AN node 2208 to new (target) serving (R) AN node 2208; and control of user plane tunnels between old (source) serving (R) AN node 2208 to new (target) serving (R) AN node 2208.

In at least one embodiment, a protocol stack of a Xn-U may include a transport network layer built on Internet Protocol (IP) transport layer, and a GTP-U layer on top of a UDP and/or IP layer(s) to carry user plane PDUs. In at least one embodiment, Xn-C protocol stack may include an application layer signaling protocol (referred to as Xn Application Protocol (Xn-AP)) and a transport network layer that is built on an SCTP layer. In at least one embodiment, SCTP layer may be on top of an IP layer. In at least one embodiment, SCTP layer provides a guaranteed delivery of application layer messages. In at least one embodiment, in a transport IP layer point-to-point transmission is used to deliver signaling PDUs. In at least one embodiment, Xn-U protocol stack and/or a Xn-C protocol stack may be same or similar to an user plane and/or control plane protocol stack(s) shown and described herein.

Figure 23:
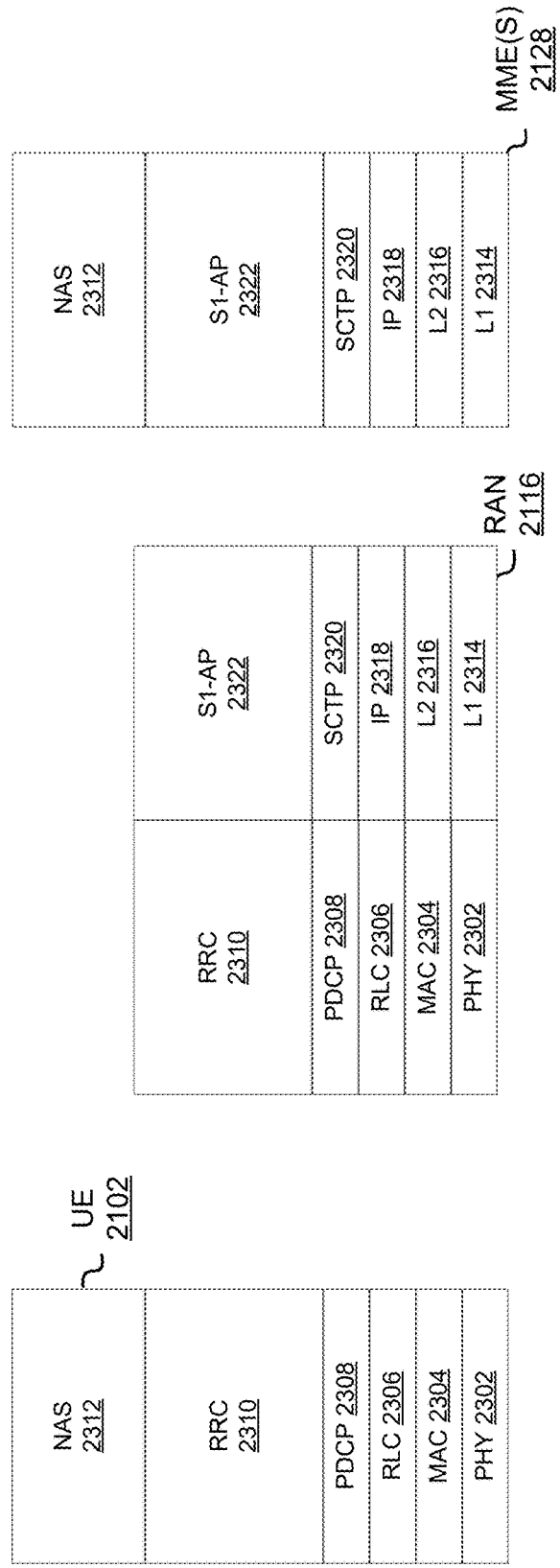
FIG. 23 illustrates a control plane protocol stack, in accordance with at least one embodiment.

FIG. 23 is an illustration of a control plane protocol stack in accordance with some embodiments. In at least one embodiment, a control plane 2300 is shown as a communications protocol stack between UE 2102 (or alternatively, UE 2104), RAN 2116, and MME(s) 2128.

In at least one embodiment, PHY layer 2302 may transmit or receive information used by MAC layer 2304 over one or more air interfaces. In at least one embodiment, PHY layer 2302 may further perform link adaptation or adaptive modulation and coding (AMC), power control, cell search (e.g., for initial synchronization and handover purposes), and other measurements used by higher layers, such as an RRC layer 2310. In at least one embodiment, PHY layer 2302 may still further perform error detection on transport channels, forward error correction (FEC) coding/de-coding of transport channels, modulation/demodulation of physical channels, interleaving, rate matching, mapping onto physical channels, and Multiple Input Multiple Output (MIMO) antenna processing.

In at least one embodiment, MAC layer 2304 may perform mapping between logical channels and transport channels, multiplexing of MAC service data units (SDUs) from one or more logical channels onto transport blocks (TB) to be delivered to PHY via transport channels, de-multiplexing MAC SDUs to one or more logical channels from transport blocks (TB) delivered from PHY via transport channels, multiplexing MAC SDUs onto TBs, scheduling information reporting, error correction through hybrid automatic repeat request (HARD), and logical channel prioritization.

In at least one embodiment, RLC layer 2306 may operate in a plurality of modes of operation, including: Transparent Mode (TM), Unacknowledged Mode (UM), and Acknowledged Mode (AM). In at least one embodiment, RLC layer 2306 may execute transfer of upper layer protocol data units (PDUs), error correction through automatic repeat request (ARQ) for AM data transfers, and concatenation, segmentation and reassembly of RLC SDUs for UM and AM data transfers. In at least one embodiment, RLC layer 2306 may also execute re-segmentation of RLC data PDUs for AM data transfers, reorder RLC data PDUs for UM and AM data transfers, detect duplicate data for UM and AM data transfers, discard RLC SDUs for UM and AM data transfers, detect protocol errors for AM data transfers, and perform RLC re-establishment.

In at least one embodiment, PDCP layer 2308 may execute header compression and decompression of IP data, maintain PDCP Sequence Numbers (SNs), perform in-sequence delivery of upper layer PDUs at re-establishment of lower layers, eliminate duplicates of lower layer SDUs at re-establishment of lower layers for radio bearers mapped on RLC AM, cipher and decipher control plane data, perform integrity protection and integrity verification of control plane data, control timer-based discard of data, and perform security operations (e.g., ciphering, deciphering, integrity protection, integrity verification, etc.).

In at least one embodiment, main services and functions of a RRC layer 2310 may include broadcast of system information (e.g., included in Master Information Blocks (MIBs) or System Information Blocks (SIBs) related to a non-access stratum (NAS)), broadcast of system information related to an access stratum (AS), paging, establishment, maintenance and release of an RRC connection between an UE and E-UTRAN (e.g., RRC connection paging, RRC connection establishment, RRC connection modification, and RRC connection release), establishment, configuration, maintenance and release of point-to-point radio bearers, security functions including key management, inter radio access technology (RAT) mobility, and measurement configuration for UE measurement reporting. In at least one embodiment, said MIBs and SIBs may comprise one or more information elements (IEs), which may each comprise individual data fields or data structures.

In at least one embodiment, UE 2102 and RAN 2116 may utilize a Uu interface (e.g., an LTE-Uu interface) to exchange control plane data via a protocol stack comprising PHY layer 2302, MAC layer 2304, RLC layer 2306, PDCP layer 2308, and RRC layer 2310.

In at least one embodiment, non-access stratum (NAS) protocols (NAS protocols 2312) form a highest stratum of a control plane between UE 2102 and MME(s) 2128. In at least one embodiment, NAS protocols 2312 support mobility of UE 2102 and session management procedures to establish and maintain IP connectivity between UE 2102 and P-GW 2134.

In at least one embodiment, Si Application Protocol (S1-AP) layer (Si-AP layer 2322) may support functions of a Si interface and comprise Elementary Procedures (EPs). In at least one embodiment, an EP is a unit of interaction between RAN 2116 and CN 2128. In at least one embodiment, S1-AP layer services may comprise two groups: UE-associated services and non UE-associated services. In at least one embodiment, these services perform functions including, but not limited to: E-UTRAN Radio Access Bearer (E-RAB) management, UE capability indication, mobility, NAS signaling transport, RAN Information Management (RIM), and configuration transfer.

In at least one embodiment, Stream Control Transmission Protocol (SCTP) layer (alternatively referred to as a stream control transmission protocol/internet protocol (SCTP/IP)

layer) (SCTP layer 2320) may ensure reliable delivery of signaling messages between RAN 2116 and MME(s) 2128 based, in part, on an IP protocol, supported by an IP layer 2318. In at least one embodiment, L2 layer 2316 and an L1 layer 2314 may refer to communication links (e.g., wired or wireless) used by a RAN node and MME to exchange information.

In at least one embodiment, RAN 2116 and MME(s) 2128 may utilize an S1-MME interface to exchange control plane data via a protocol stack comprising a L1 layer 2314, L2 layer 2316, IP layer 2318, SCTP layer 2320, and Si-AP layer 2322.

Figure 24:
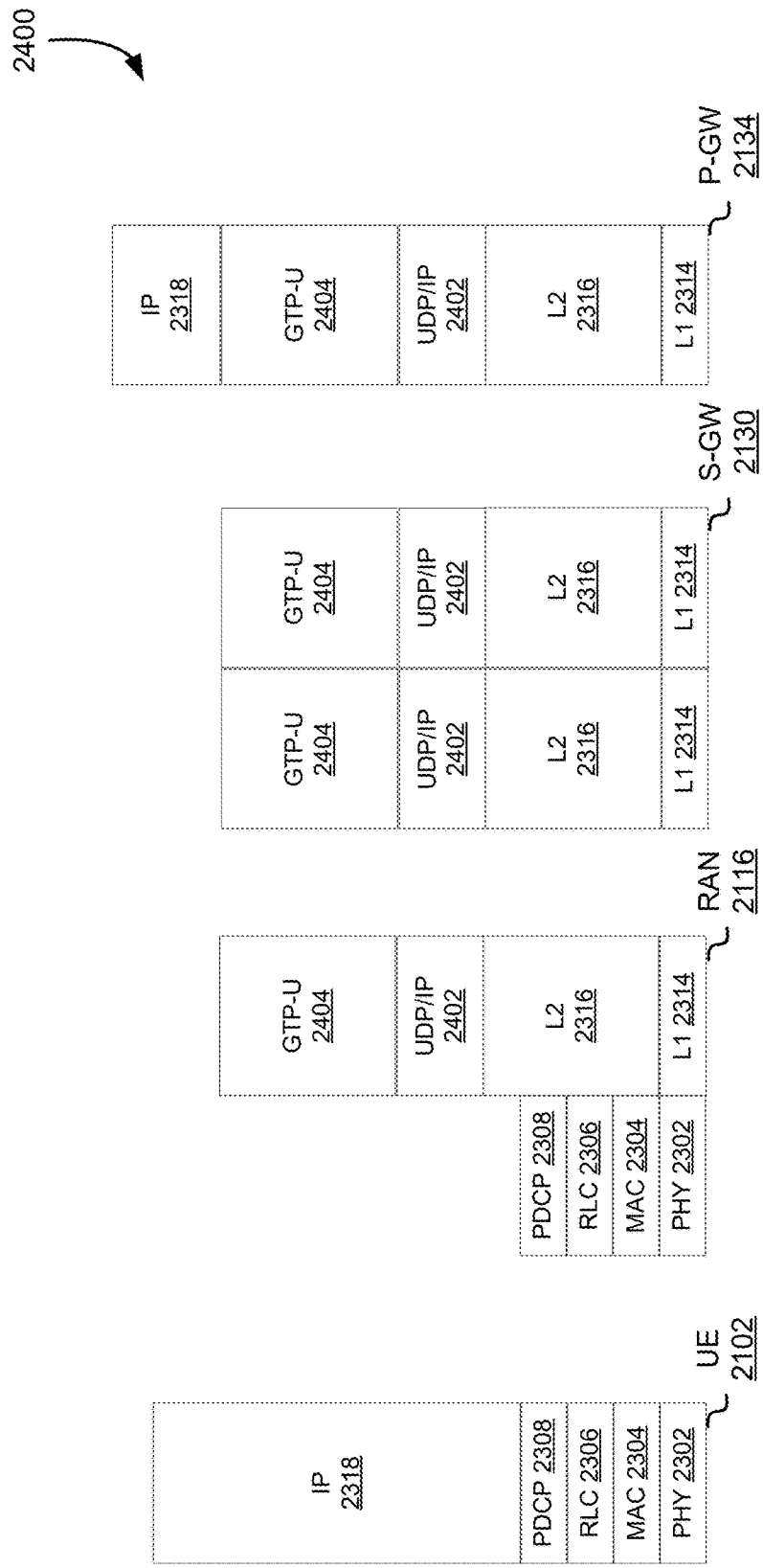
FIG. 24 illustrates a user plane protocol stack, in accordance with at least one embodiment.

FIG. 24 is an illustration of a user plane protocol stack in accordance with at least one embodiment. In at least one embodiment, a user plane 2400 is shown as a communications protocol stack between a UE 2102, RAN 2116, S-GW 2130, and P-GW 2134. In at least one embodiment, user plane 2400 may utilize a same protocol layers as control plane 2300. In at least one embodiment, for example, UE 2102 and RAN 2116 may utilize a Uu interface (e.g., an LTE-Uu interface) to exchange user plane data via a protocol stack comprising PHY layer 2302, MAC layer 2304, RLC layer 2306, PDCP layer 2308.

In at least one embodiment, General Packet Radio Service (GPRS) Tunneling Protocol for a user plane (GTP-U) layer (GTP-U layer 2404) may be used for carrying user data within a GPRS core network and between a radio access network and a core network. In at least one embodiment, user data transported can be packets in any of IPV4, IPV6, or PPP formats, for example. In at least one embodiment, UDP and IP security (UDP/IP) layer (UDP/IP layer 2402) may provide checksums for data integrity, port numbers for addressing different functions at a source and destination, and encryption and authentication on selected data flows. In at least one embodiment, RAN 2116 and S-GW 2130 may utilize an S1-U interface to exchange user plane data via a protocol stack comprising L1 layer 2314, L2 layer 2316, UDP/IP layer 2402, and GTP-U layer 2404. In at least one embodiment, S-GW 2130 and P-GW 2134 may utilize an S5/S8a interface to exchange user plane data via a protocol stack comprising L1 layer 2314, L2 layer 2316, UDP/IP layer 2402, and GTP-U layer 2404. In at least one embodiment, as discussed above with respect to FIG. 23, NAS protocols support a mobility of UE 2102 and session management procedures to establish and maintain IP connectivity between UE 2102 and P-GW 2134.

Figure 25:
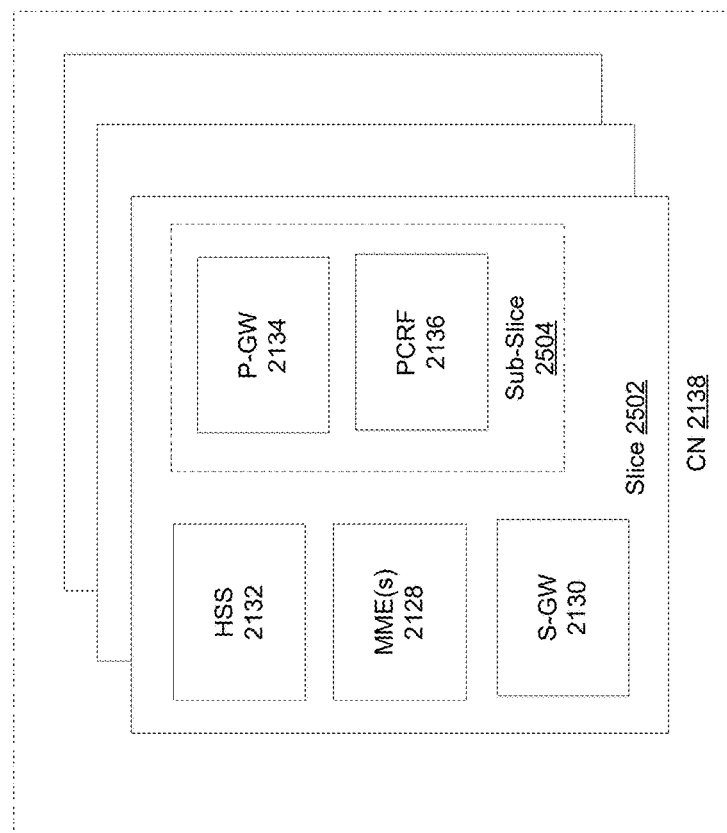
FIG. 25 illustrates components of a core network, in accordance with at least one embodiment.

FIG. 25 illustrates components 2500 of a core network in accordance with at least one embodiment. In at least one embodiment, components of CN 2138 may be implemented in one physical node or separate physical nodes including components to read and execute instructions from a machine-readable or computer-readable medium (e.g., a non-transitory machine-readable storage medium). In at least one embodiment, Network Functions Virtualization (NFV) is utilized to virtualize any or all of above described network node functions via executable instructions stored in one or more computer readable storage mediums (described in further detail below). In at least one embodiment, a logical instantiation of CN 2138 may be referred to as a network slice 2502 (e.g., network slice 2502 is shown to include HSS 2132, MME(s) 2128, and S-GW 2130). In at least one embodiment, a logical instantiation of a portion of CN 2138 may be referred to as a network sub-slice 2504 (e.g., network sub-slice 2504 is shown to include P-GW 2134 and PCRF 2136).

In at least one embodiment, NFV architectures and infrastructures may be used to virtualize one or more network functions, alternatively performed by proprietary hardware, onto physical resources comprising a combination of industry-standard server hardware, storage hardware, or switches. In at least one embodiment, NFV systems can be used to execute virtual or reconfigurable implementations of one or more EPC components/functions.

Figure 26:
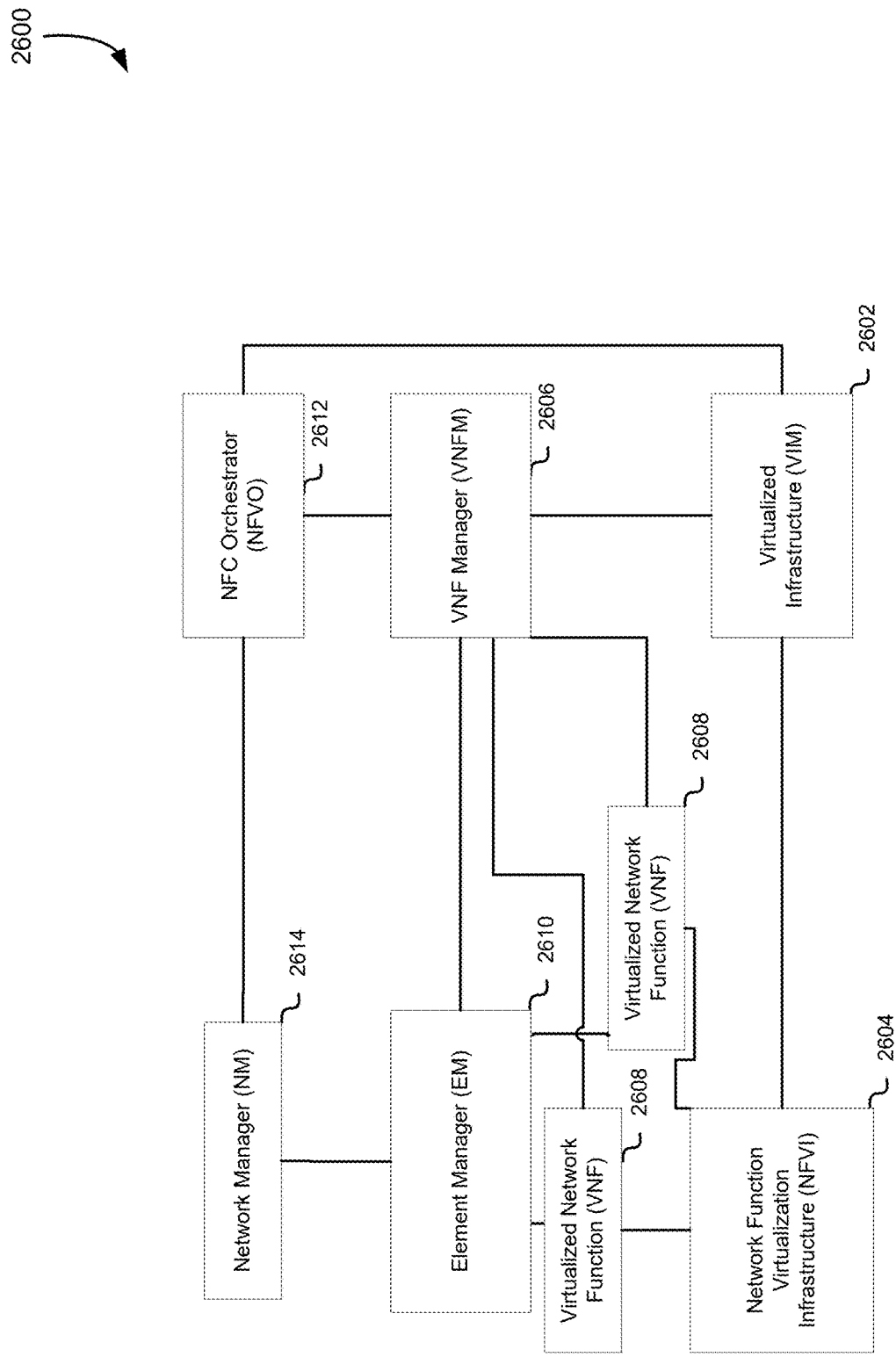
FIG. 26 illustrates components of a system to support network function virtualization (NFV), in accordance with at least one embodiment.

FIG. 26 is a block diagram illustrating components, according to at least one embodiment, of a system 2600 to support network function virtualization (NFV). In at least one embodiment, system 2600 is illustrated as including a virtualized infrastructure manager (shown as VIM 2602), a network function virtualization infrastructure (shown as NFVI 2604), a VNF manager (shown as VNFM 2606), virtualized network functions (shown as VNF 2608), an element manager (shown as EM 2610), an NFV Orchestrator (shown as NFVO 2612), and a network manager (shown as NM 2614).

In at least one embodiment, VIM 2602 manages resources of NFVI 2604. In at least one embodiment, NFVI 2604 can include physical or virtual resources and applications (including hypervisors) used to execute system 2600. In at least one embodiment, VIM 2602 may manage a life cycle of virtual resources with NFVI 2604 (e.g., creation, maintenance, and tear down of virtual machines (VMs) associated with one or more physical resources), track VM instances, track performance, fault and security of VM instances and associated physical resources, and expose VM instances and associated physical resources to other management systems.

In at least one embodiment, VNFM 2606 may manage VNF 2608. In at least one embodiment, VNF 2608 may be used to execute EPC components/functions. In at least one embodiment, VNFM 2606 may manage a life cycle of VNF 2608 and track performance, fault and security of virtual aspects of VNF 2608. In at least one embodiment, EM 2610 may track performance, fault and security of functional aspects of VNF 2608. In at least one embodiment, tracking data from VNFM 2606 and EM 2610 may comprise, for example, performance measurement (PM) data used by VIM 2602 or NFVI 2604. In at least one embodiment, both VNFM 2606 and EM 2610 can scale up/down a quantity of VNFs of system 2600.

In at least one embodiment, NFVO 2612 may coordinate, authorize, release and engage resources of NFVI 2604 in order to provide a requested service (e.g., to execute an EPC function, component, or slice). In at least one embodiment, NM 2614 may provide a package of end-user functions with responsibility for a management of a network, which may include network elements with VNFs, non-virtualized network functions, or both (management of VNFs may occur via an EM 2610).

Computer-Based Systems

The following figures set forth, without limitation, exemplary computer-based systems that can be used to implement at least one embodiment.

Figure 27:
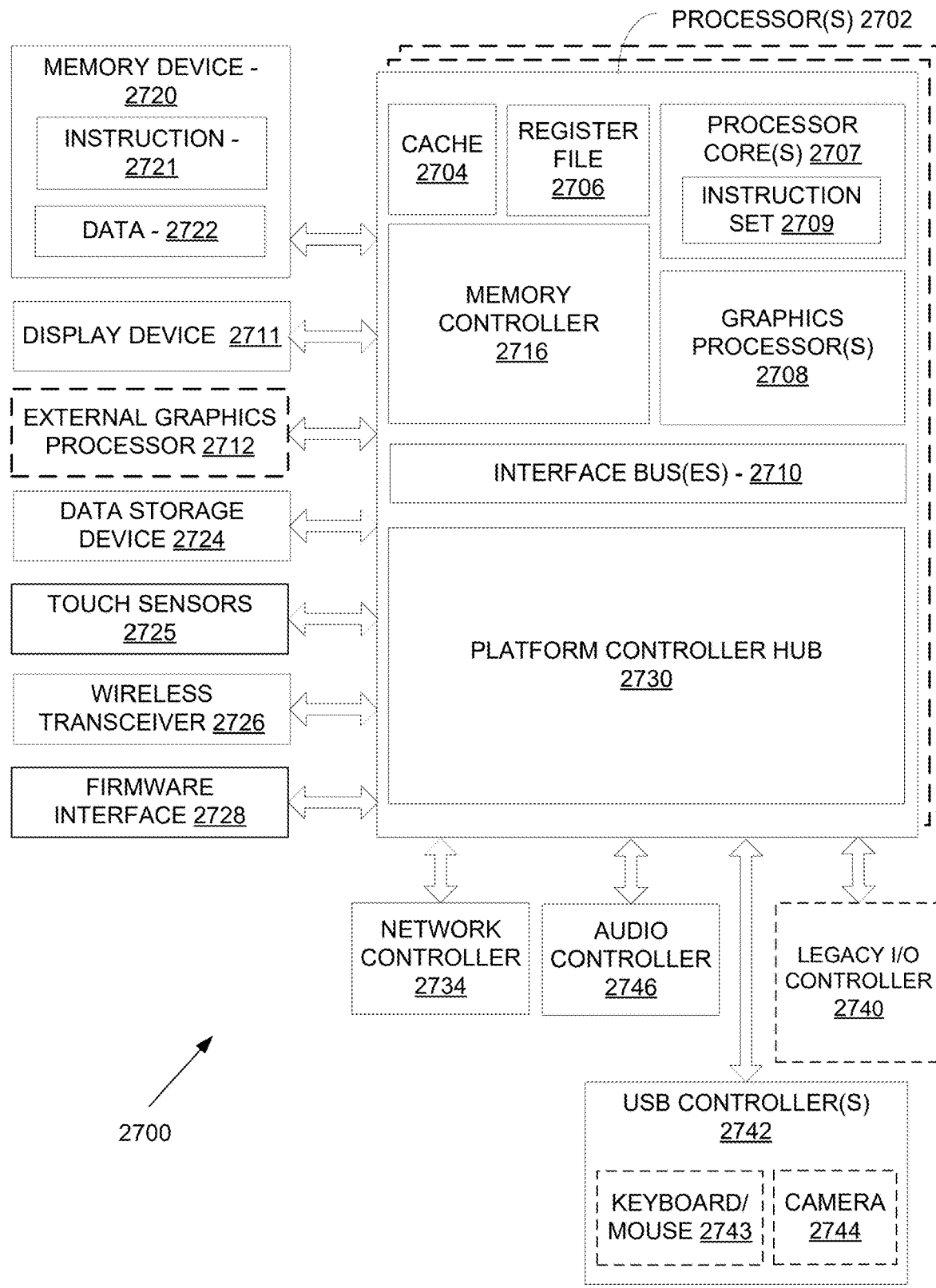
FIG. 27 illustrates a processing system, in accordance with at least one embodiment.

FIG. 27 illustrates a processing system 2700, in accordance with at least one embodiment. In at least one embodiment, processing system 2700 includes one or more processors 2702 and one or more graphics processors 2708, and may be a single processor desktop system, a multiprocessor workstation system, or a server system having a large number of processors 2702 or processor cores 2707. In at least one embodiment, processing system 2700 is a processing platform incorporated within a system-on-a-chip ("SoC") integrated circuit for use in mobile, handheld, or embedded devices.

In at least one embodiment, processing system 2700 can include, or be incorporated within a server-based gaming platform, a game console, a media console, a mobile gaming console, a handheld game console, or an online game console. In at least one embodiment, processing system 2700 is a mobile phone, smart phone, tablet computing device or mobile Internet device. In at least one embodiment, processing system 2700 can also include, couple with, or be integrated within a wearable device, such as a smart watch wearable device, smart eyewear device, augmented reality device, or virtual reality device. In at least one embodiment, processing system 2700 is a television or set top box device having one or more processors 2702 and a graphical interface generated by one or more graphics processors 2708.

In at least one embodiment, one or more processors 2702 each include one or more processor cores 2707 to process instructions which, when executed, perform operations for system and user software. In at least one embodiment, each of one or more processor cores 2707 is configured to process a specific instruction set 2709. In at least one embodiment, instruction set 2709 may facilitate Complex Instruction Set Computing ("CISC"), Reduced Instruction Set Computing ("RISC"), or computing via a Very Long Instruction Word ("VLIW"). In at least one embodiment, processor cores 2707 may each process a different instruction set 2709, which may include instructions to facilitate emulation of other instruction sets. In at least one embodiment, processor core 2707 may also include other processing devices, such as a digital signal processor ("DSP").

In at least one embodiment, processor 2702 includes cache memory ('cache") 2704. In at least one embodiment, processor 2702 can have a single internal cache or multiple levels of internal cache. In at least one embodiment, cache memory is shared among various components of processor 2702. In at least one embodiment, processor 2702 also uses an external cache (e.g., a Level 3 ("L3") cache or Last Level Cache ("LLC")) (not shown), which may be shared among processor cores 2707 using known cache coherency techniques. In at least one embodiment, register file 2706 is additionally included in processor 2702 which may include different types of registers for storing different types of data (e.g., integer registers, floating point registers, status registers, and an instruction pointer register). In at least one embodiment, register file 2706 may include general-purpose registers or other registers.

In at least one embodiment, one or more processor(s) 2702 are coupled with one or more interface bus(es) 2710 to transmit communication signals such as address, data, or control signals between processor 2702 and other components in processing system 2700. In at least one embodiment interface bus 2710, in one embodiment, can be a processor bus, such as a version of a Direct Media Interface ("DMI") bus. In at least one embodiment, interface bus 2710 is not limited to a DMI bus, and may include one or more Peripheral Component Interconnect buses (e.g., "PCI," PCI Express ("PCIe")), memory buses, or other types of interface buses. In at least one embodiment processor(s) 2702 include an integrated memory controller 2716 and a platform controller hub 2730. In at least one embodiment, memory controller 2716 facilitates communication between a memory device and other components of processing system 2700, while platform controller hub ("PCH") 2730 provides connections to Input/Output ("I/O") devices via a local I/O bus.

In at least one embodiment, memory device 2720 can be a dynamic random access memory ("DRAM") device, a static random access memory ("SRAM") device, flash memory device, phase-change memory device, or some other memory device having suitable performance to serve as processor memory. In at least one embodiment memory device 2720 can operate as system memory for processing system 2700, to store data 2722 and instructions 2721 for use when one or more processors 2702 executes an application or process. In at least one embodiment, memory controller 2716 also couples with an optional external graphics processor 2712, which may communicate with one or more graphics processors 2708 in processors 2702 to perform graphics and media operations. In at least one embodiment, a display device 2711 can connect to processor(s) 2702. In at least one embodiment display device 2711 can include one or more of an internal display device, as in a mobile electronic device or a laptop device or an external display device attached via a display interface (e.g., DisplayPort, etc.). In at least one embodiment, display device 2711 can include a head mounted display ("HMD") such as a stereoscopic display device for use in virtual reality ("VR") applications or augmented reality ("AR") applications.

In at least one embodiment, platform controller hub 2730 enables peripherals to connect to memory device 2720 and processor 2702 via a high-speed I/O bus. In at least one embodiment, I/O peripherals include, but are not limited to, an audio controller 2746, a network controller 2734, a firmware interface 2728, a wireless transceiver 2726, touch sensors 2725, a data storage device 2724 (e.g., hard disk drive, flash memory, etc.). In at least one embodiment, data storage device 2724 can connect via a storage interface (e.g., SATA) or via a peripheral bus, such as PCI, or PCIe. In at least one embodiment, touch sensors 2725 can include touch screen sensors, pressure sensors, or fingerprint sensors. In at least one embodiment, wireless transceiver 2726 can be a Wi-Fi transceiver, a Bluetooth transceiver, or a mobile network transceiver such as a 3G, 4G, or Long Term Evolution ("LTE") transceiver. In at least one embodiment, firmware interface 2728 enables communication with system firmware, and can be, for example, a unified extensible firmware interface ("UEFI"). In at least one embodiment, network controller 2734 can enable a network connection to a wired network. In at least one embodiment, a high-performance network controller (not shown) couples with interface bus 2710. In at least one embodiment, audio controller 2746 is a multi-channel high definition audio controller. In at least one embodiment, processing system 2700 includes an optional legacy I/O controller 2740 for coupling legacy (e.g., Personal System 2 ("PS/2")) devices to processing system 2700. In at least one embodiment, platform controller hub 2730 can also connect to one or more Universal Serial Bus ("USB") controllers 2742 connect input devices, such as keyboard and mouse 2743 combinations, a camera 2744, or other USB input devices.

In at least one embodiment, an instance of memory controller 2716 and platform controller hub 2730 may be integrated into a discreet external graphics processor, such as external graphics processor 2712. In at least one embodiment, platform controller hub 2730 and/or memory controller 2716 may be external to one or more processor(s) 2702. For example, in at least one embodiment, processing system 2700 can include an external memory controller 2716 and platform controller hub 2730, which may be configured as a memory controller hub and peripheral controller hub within a system chipset that is in communication with processor(s) 2702.

Figure 28:
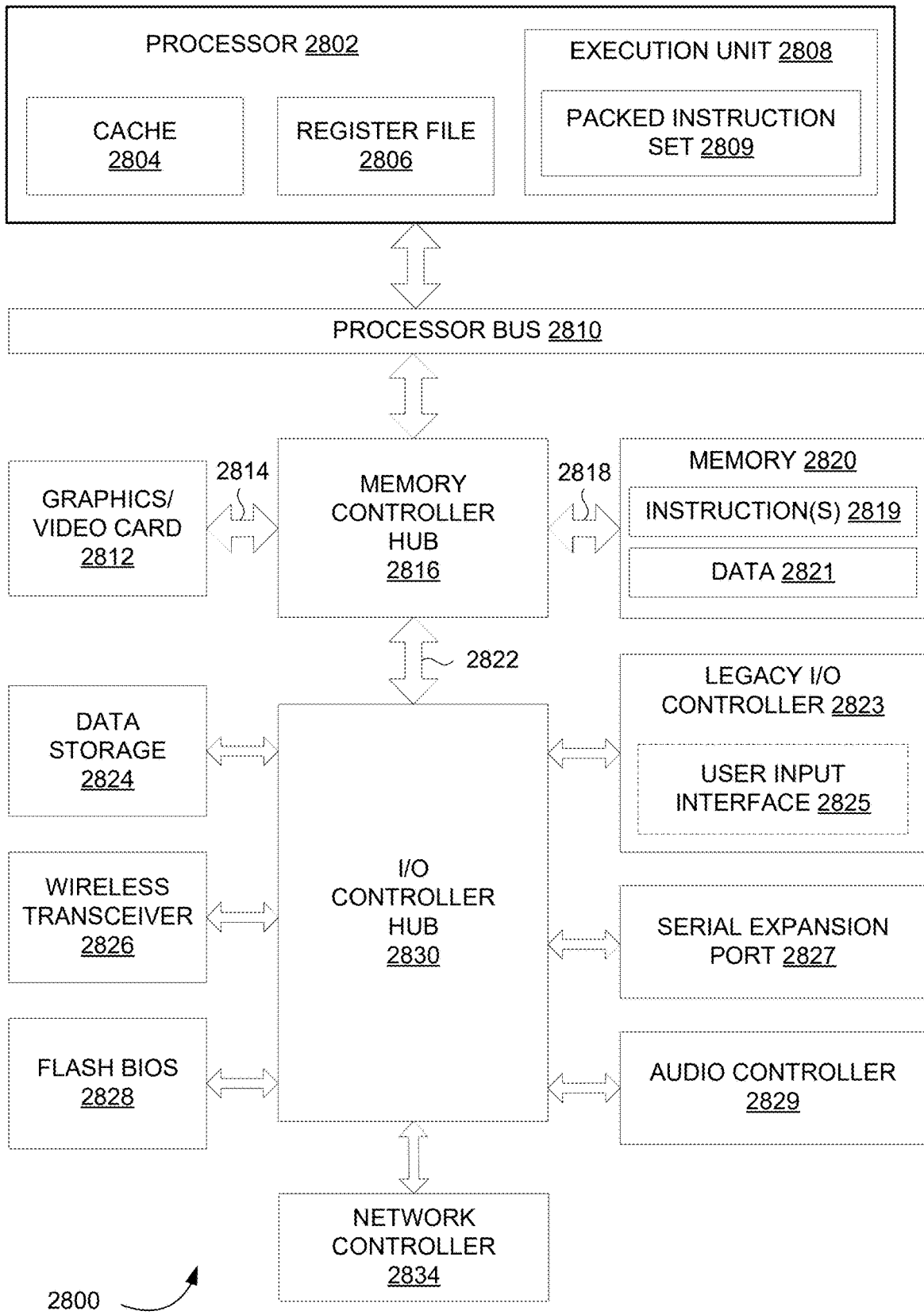
FIG. 28 illustrates a computer system, in accordance with at least one embodiment.

FIG. 28 illustrates a computer system 2800, in accordance with at least one embodiment. In at least one embodiment, computer system 2800 may be a system with interconnected devices and components, an SOC, or some combination. In at least on embodiment, computer system 2800 is formed with a processor 2802 that may include execution units to execute an instruction. In at least one embodiment, computer system 2800 may include, without limitation, a component, such as processor 2802 to employ execution units including logic to perform algorithms for processing data. In at least one embodiment, computer system 2800 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 2800 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 2800 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions.

In at least one embodiment, computer system 2800 may include, without limitation, processor 2802 that may include, without limitation, one or more execution units 2808 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 2800 is a single processor desktop or server system. In at least one embodiment, computer system 2800 may be a multiprocessor system. In at least one embodiment, processor 2802 may include, without limitation, a CISC microprocessor, a RISC microprocessor, a VLIW microprocessor, a processor implementing a combination of instruction sets, or any other processor device, such as a digital signal processor, for example. In at least one embodiment, processor 2802 may be coupled to a processor bus 2810 that may transmit data signals between processor 2802 and other components in computer system 2800.

In at least one embodiment, processor 2802 may include, without limitation, a Level 1 ("L1") internal cache memory ("cache") 2804. In at least one embodiment, processor 2802 may have a single internal cache or multiple levels of internal cache. In at least one embodiment, cache memory may reside external to processor 2802. In at least one embodiment, processor 2802 may also include a combination of both internal and external caches. In at least one embodiment, a register file 2806 may store different types of data in various registers including, without limitation, integer registers, floating point registers, status registers, and instruction pointer register.

In at least one embodiment, execution unit 2808, including, without limitation, logic to perform integer and floating point operations, also resides in processor 2802. Processor 2802 may also include a microcode ("ucode") read only memory ("ROM") that stores microcode for certain macro instructions. In at least one embodiment, execution unit 2808 may include logic to handle a packed instruction set 2809. In at least one embodiment, by including packed instruction set 2809 in an instruction set of a general-purpose processor 2802, along with associated circuitry to execute instructions, operations used by many multimedia applications may be performed using packed data in a general-purpose processor 2802. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 2808 may also be used in microcontrollers, embedded processors, graphics devices, DSPs, and other types of logic circuits. In at least one embodiment, computer system 2800 may include, without limitation, a memory 282280. In at least one embodiment, memory 282280 may be implemented as a DRAM device, an SRAM device, flash memory device, or other memory device. Memory 282280 may store instruction(s) 2819 and/or data 282281 represented by data signals that may be executed by processor 2802.

In at least one embodiment, a system logic chip may be coupled to processor bus 2810 and memory 282280. In at least one embodiment, a system logic chip may include, without limitation, a memory controller hub ("MCH") 2816, and processor 2802 may communicate with MCH 2816 via processor bus 2810. In at least one embodiment, MCH 2816 may provide a high bandwidth memory path 2818 to memory 282280 for instruction and data storage and for storage of graphics commands, data and textures. In at least one embodiment, MCH 2816 may direct data signals between processor 2802, memory 282280, and other components in computer system 2800 and to bridge data signals between processor bus 2810, memory 282280, and a system I/O 2822. In at least one embodiment, system logic chip may provide a graphics port for coupling to a graphics controller. In at least one embodiment, MCH 2816 may be coupled to memory 282280 through high bandwidth memory path 2818 and graphics/video card 2812 may be coupled to MCH 2816 through an Accelerated Graphics Port ("AGP") interconnect 2814.

In at least one embodiment, computer system 2800 may use system I/O 2822 that is a proprietary hub interface bus to couple MCH 2816 to I/O controller hub ("ICH") 2830. In at least one embodiment, ICH 2830 may provide direct connections to some I/O devices via a local I/O bus. In at least one embodiment, local I/O bus may include, without limitation, a high-speed I/O bus for connecting peripherals to memory 282280, a chipset, and processor 2802. Examples may include, without limitation, an audio controller 2829, a firmware hub ("flash BIOS") 2828, a wireless transceiver 2826, a data storage 2824, a legacy I/O controller 2823 containing a user input interface 2825 and a keyboard interface, a serial expansion port 2827, such as a USB, and a network controller 2834. Data storage 2824 may comprise a hard disk drive, a floppy disk drive, a CD-ROM device, a flash memory device, or other mass storage device.

In at least one embodiment, FIG. 28 illustrates a system, which includes interconnected hardware devices or "chips." In at least one embodiment, FIG. 28 may illustrate an exemplary SoC. In at least one embodiment, devices illustrated in FIG. 28 may be interconnected with proprietary interconnects, standardized interconnects (e.g., PCIe), or some combination thereof. In at least one embodiment, one or more components of system 2800 are interconnected using compute express link ("CXL") interconnects.

Figure 29:
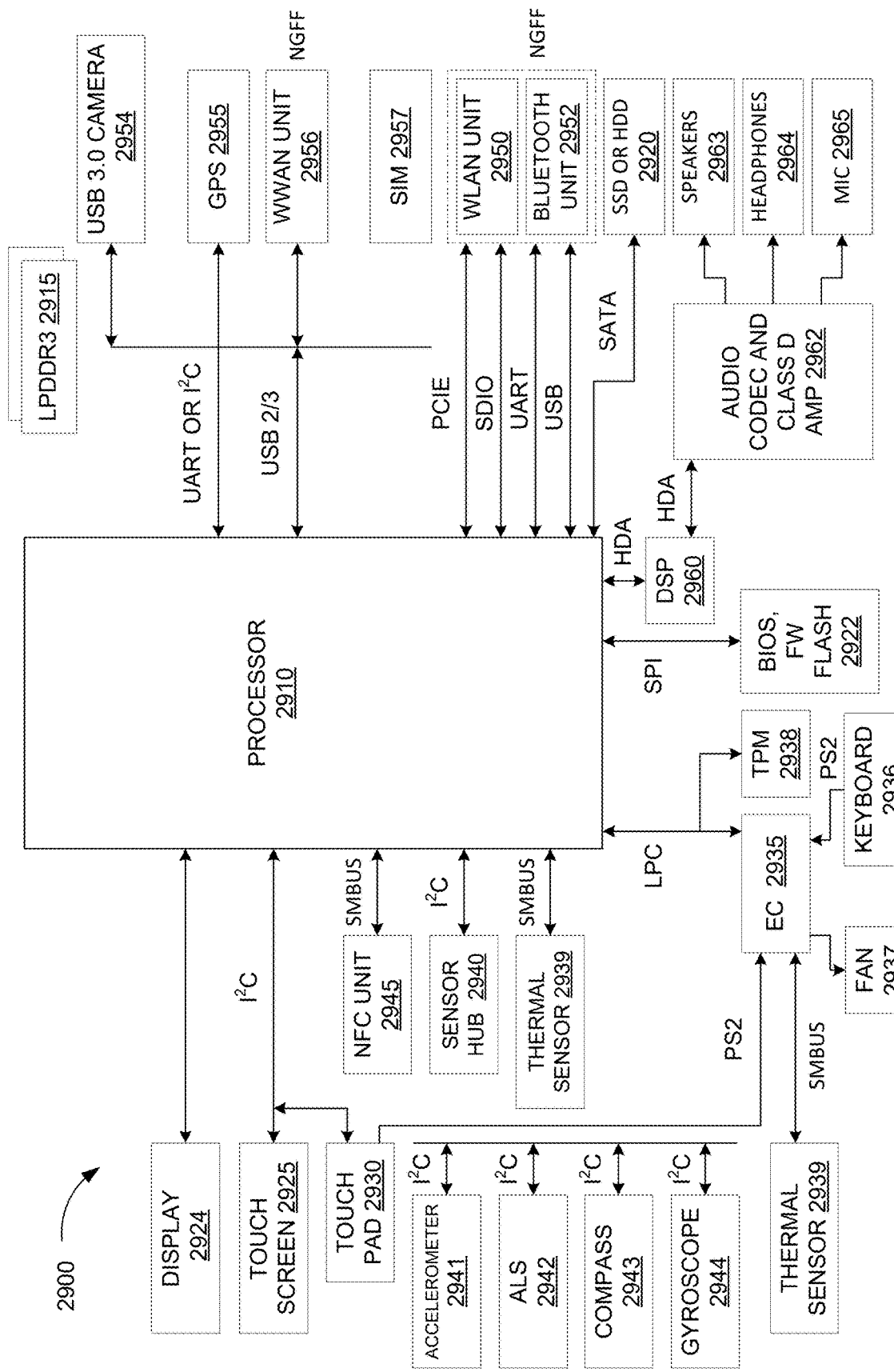
FIG. 29 illustrates a system, in accordance with at least one embodiment.

FIG. 29 illustrates a system 2900, in accordance with at least one embodiment. In at least one embodiment, system 2900 is an electronic device that utilizes a processor 2910. In at least one embodiment, system 2900 may be, for example and without limitation, a notebook, a tower server, a rack server, a blade server, a laptop, a desktop, a tablet, a mobile device, a phone, an embedded computer, or any other suitable electronic device.

In at least one embodiment, system 2900 may include, without limitation, processor 2910 communicatively coupled to any suitable number or kind of components, peripherals, modules, or devices. In at least one embodiment, processor 2910 is coupled using a bus or interface, such as an I$^2$C bus, a System Management Bus ("SMBus"), a Low Pin Count ("LPC") bus, a Serial Peripheral Interface ("SPI"), a High Definition Audio ("HDA") bus, a Serial Advance Technology Attachment ("SATA") bus, a USB (versions 1, 2, 3), or a Universal Asynchronous Receiver/Transmitter ("UART") bus. In at least one embodiment, FIG. 29 illustrates a system which includes interconnected hardware devices or "chips." In at least one embodiment, FIG. 29 may illustrate an exemplary SoC. In at least one embodiment, devices illustrated in FIG. 29 may be interconnected with proprietary interconnects, standardized interconnects (e.g., PCIe) or some combination thereof. In at least one embodiment, one or more components of FIG. 29 are interconnected using CXL interconnects.

In at least one embodiment, FIG. 29 may include a display 2924, a touch screen 2925, a touch pad 2930, a Near Field Communications unit ("NFC") 2945, a sensor hub 2940, a thermal sensor 2946, an Express Chipset ("EC") 2935, a Trusted Platform Module ("TPM") 2938, BIOS/firmware/flash memory ("BIOS, FW Flash") 2922, a DSP 2960, a Solid State Disk ("SSD") or Hard Disk Drive ("HDD") 2920, a wireless local area network unit ("WLAN") 2950, a Bluetooth unit 2952, a Wireless Wide Area Network unit ("WWAN") 2956, a Global Positioning System ("GPS") 2955, a camera ("USB 3.0 camera") 2954 such as a USB 3.0 camera, or a Low Power Double Data Rate ("LPDDR") memory unit ("LPDDR3") 2915 implemented in, for example, LPDDR3 standard. These components may each be implemented in any suitable manner.

In at least one embodiment, other components may be communicatively coupled to processor 2910 through components discussed above. In at least one embodiment, an accelerometer 2941, an Ambient Light Sensor ("ALS") 2942, a compass 2943, and a gyroscope 2944 may be communicatively coupled to sensor hub 2940. In at least one embodiment, a thermal sensor 2939, a fan 2937, a keyboard 2946, and a touch pad 2930 may be communicatively coupled to EC 2935. In at least one embodiment, a speaker 2963, a headphones 2964, and a microphone ("mic") 2965 may be communicatively coupled to an audio unit ("audio codec and class d amp") 2964, which may in turn be communicatively coupled to DSP 2960. In at least one embodiment, audio unit 2964 may include, for example and without limitation, an audio coder/decoder ("codec") and a class D amplifier. In at least one embodiment, a SIM card ("SIM") 2957 may be communicatively coupled to WWAN unit 2956. In at least one embodiment, components such as WLAN unit 2950 and Bluetooth unit 2952, as well as WWAN unit 2956 may be implemented in a Next Generation Form Factor ("NGFF").

Figure 30:
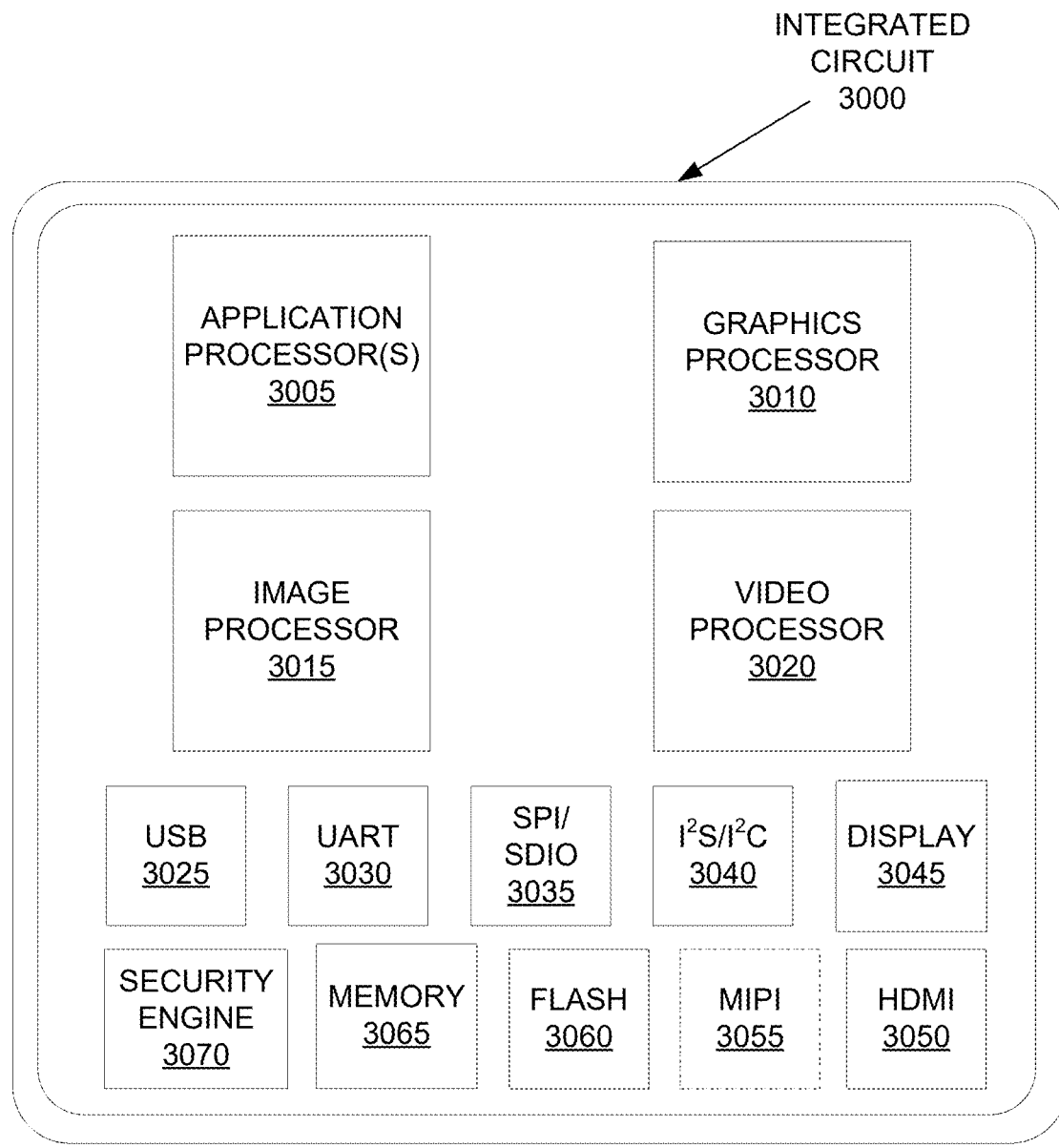
FIG. 30 illustrates an exemplary integrated circuit, in accordance with at least one embodiment.

FIG. 30 illustrates an exemplary integrated circuit 3000, in accordance with at least one embodiment. In at least one embodiment, exemplary integrated circuit 3000 is an SoC that may be fabricated using one or more IP cores. In at least one embodiment, integrated circuit 3000 includes one or more application processor(s) 3005 (e.g., CPUs), at least one graphics processor 3010, and may additionally include an image processor 3015 and/or a video processor 3020, any of which may be a modular IP core. In at least one embodiment, integrated circuit 3000 includes peripheral or bus logic including a USB controller 3025, a UART controller 3030, an SPI/SDIO controller 3035, and an I$^2$S/I$^2$C controller 3040. In at least one embodiment, integrated circuit 3000 can include a display device 3045 coupled to one or more of a high-definition multimedia interface ("HDMI") controller 3050 and a mobile industry processor interface ("MIPI") display interface 3055. In at least one embodiment, storage may be provided by a flash memory subsystem 3060 including flash memory and a flash memory controller. In at least one embodiment, a memory interface may be provided via a memory controller 3065 for access to SDRAM or SRAM memory devices. In at least one embodiment, some integrated circuits additionally include an embedded security engine 3070.

Figure 31:
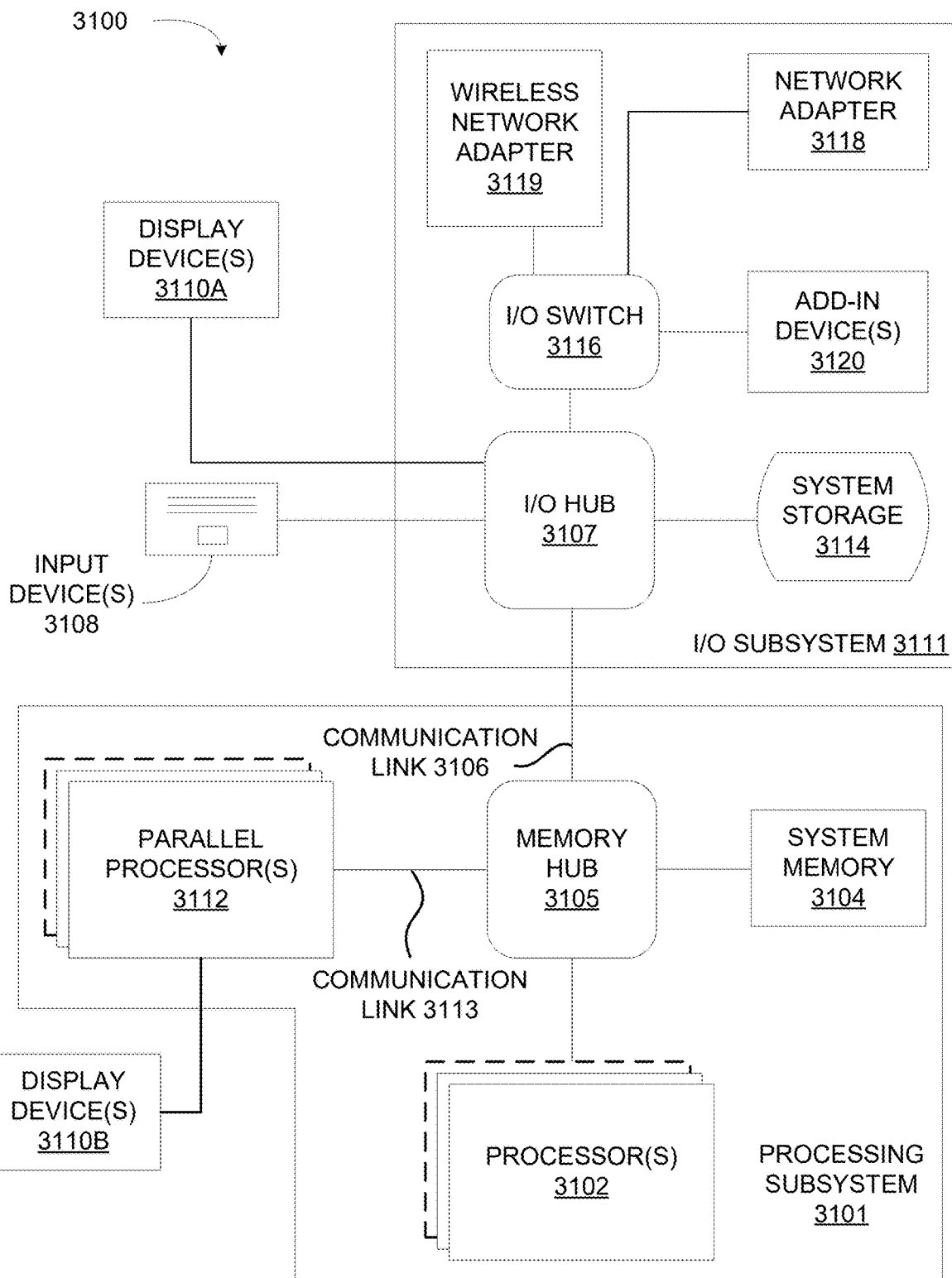
FIG. 31 illustrates a computing system, according to at least one embodiment.

FIG. 31 illustrates a computing system 3100, according to at least one embodiment; In at least one embodiment, computing system 3100 includes a processing subsystem 3101 having one or more processor(s) 3102 and a system memory 3104 communicating via an interconnection path that may include a memory hub 3105. In at least one embodiment, memory hub 3105 may be a separate component within a chipset component or may be integrated within one or more processor(s) 3102. In at least one embodiment, memory hub 3105 couples with an I/O subsystem 3111 via a communication link 3106. In at least one embodiment, I/O subsystem 3111 includes an I/O hub 3107 that can enable computing system 3100 to receive input from one or more input device(s) 3108. In at least one embodiment, I/O hub 3107 can enable a display controller, which may be included in one or more processor(s) 3102, to provide outputs to one or more display device(s) 3110A. In at least one embodiment, one or more display device(s) 3110A coupled with I/O hub 3107 can include a local, internal, or embedded display device.

In at least one embodiment, processing subsystem 3101 includes one or more parallel processor(s) 3112 coupled to memory hub 3105 via a bus or other communication link 3113. In at least one embodiment, communication link 3113 may be one of any number of standards based communication link technologies or protocols, such as, but not limited to PCIe, or may be a vendor specific communications interface or communications fabric. In at least one embodiment, one or more parallel processor(s) 3112 form a computationally focused parallel or vector processing system that can include a large number of processing cores and/or processing clusters, such as a many integrated core processor. In at least one embodiment, one or more parallel processor(s) 3112 form a graphics processing subsystem that can output pixels to one of one or more display device(s) 3110A coupled via I/O Hub 3107. In at least one embodiment, one or more parallel processor(s) 3112 can also include a display controller and display interface (not shown) to enable a direct connection to one or more display device(s) 3110B.

In at least one embodiment, a system storage unit 3114 can connect to I/O hub 3107 to provide a storage mechanism for computing system 3100. In at least one embodiment, an I/O switch 3116 can be used to provide an interface mechanism to enable connections between I/O hub 3107 and other components, such as a network adapter 3118 and/or wireless network adapter 3119 that may be integrated into a platform, and various other devices that can be added via one or more add-in device(s) 3120. In at least one embodiment, network adapter 3118 can be an Ethernet adapter or another wired network adapter. In at least one embodiment, wireless network adapter 3119 can include one or more of a Wi-Fi, Bluetooth, NFC, or other network device that includes one or more wireless radios.

In at least one embodiment, computing system 3100 can include other components not explicitly shown, including USB or other port connections, optical storage drives, video capture devices, and/or variations thereof, that may also be connected to I/O hub 3107. In at least one embodiment, communication paths interconnecting various components in FIG. 31 may be implemented using any suitable protocols, such as PCI based protocols (e.g., PCIe), or other bus or point-to-point communication interfaces and/or protocol(s), such as NVLink high-speed interconnect, or interconnect protocols.

In at least one embodiment, one or more parallel processor(s) 3112 incorporate circuitry optimized for graphics and video processing, including, for example, video output circuitry, and constitutes a graphics processing unit ("GPU"). In at least one embodiment, one or more parallel processor(s) 3112 incorporate circuitry optimized for general purpose processing. In at least embodiment, components of computing system 3100 may be integrated with one or more other system elements on a single integrated circuit. For example, in at least one embodiment, one or more parallel processor(s) 3112, memory hub 3105, processor(s) 3102, and I/O hub 3107 can be integrated into a SoC integrated circuit. In at least one embodiment, components of computing system 3100 can be integrated into a single package to form a system in package ("SIP") configuration. In at least one embodiment, at least a portion of components of computing system 3100 can be integrated into a multi-chip module ("MCM"), which can be interconnected with other multi-chip modules into a modular computing system. In at least one embodiment, I/O subsystem 3111 and display devices 3110B are omitted from computing system 3100.

Processing Systems

The following figures set forth, without limitation, exemplary processing systems that can be used to implement at least one embodiment.

Figure 32:
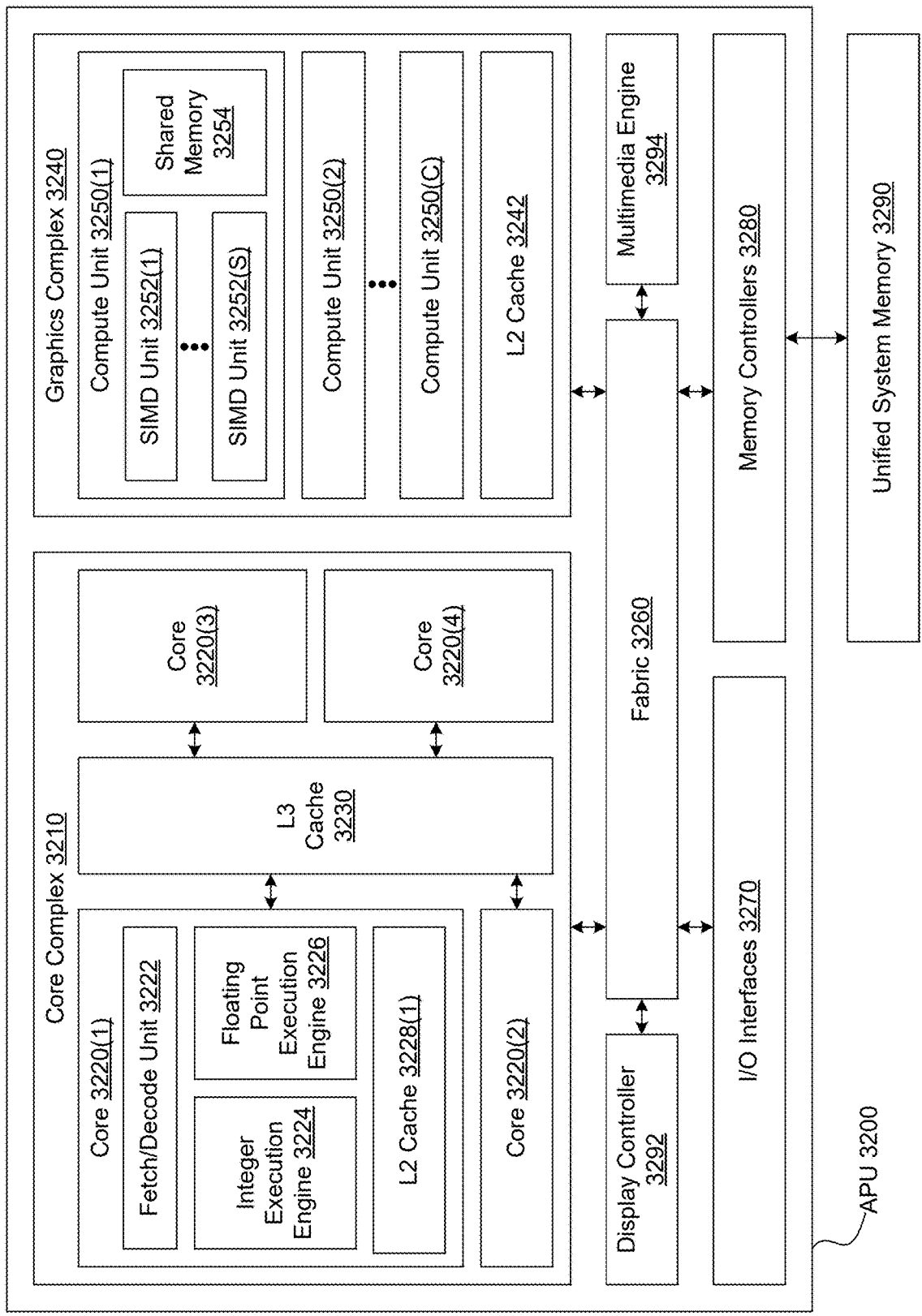
FIG. 32 illustrates an APU, in accordance with at least one embodiment.

FIG. 32 illustrates an accelerated processing unit ("APU") 3200, in accordance with at least one embodiment. In at least one embodiment, APU 3200 is developed by AMD Corporation of Santa Clara, CA. In at least one embodiment, APU 3200 can be configured to execute an application program, such as a CUDA program. In at least one embodiment, APU 3200 includes, without limitation, a core complex 3210, a graphics complex 3240, fabric 3260, I/O interfaces 3270, memory controllers 3280, a display controller 3292, and a multimedia engine 3294. In at least one embodiment, APU 3200 may include, without limitation, any number of core complexes 3210, any number of graphics complexes 3250, any number of display controllers 3292, and any number of multimedia engines 3294 in any combination. For explanatory purposes, multiple instances of like objects are denoted herein with reference numbers identifying an object and parenthetical numbers identifying an instance where needed.

In at least one embodiment, core complex 3210 is a CPU, graphics complex 3240 is a GPU, and APU 3200 is a processing unit that integrates, without limitation, 3210 and 3240 onto a single chip. In at least one embodiment, some tasks may be assigned to core complex 3210 and other tasks may be assigned to graphics complex 3240. In at least one embodiment, core complex 3210 is configured to execute main control software associated with APU 3200, such as an operating system. In at least one embodiment, core complex 3210 is a master processor of APU 3200, controlling and coordinating operations of other processors. In at least one embodiment, core complex 3210 issues commands that control an operation of graphics complex 3240. In at least one embodiment, core complex 3210 can be configured to execute host executable code derived from CUDA source code, and graphics complex 3240 can be configured to execute device executable code derived from CUDA source code.

In at least one embodiment, core complex 3210 includes, without limitation, cores 3220(1)-3220(4) and an L3 cache 3230. In at least one embodiment, core complex 3210 may include, without limitation, any number of cores 3220 and any number and type of caches in any combination. In at least one embodiment, cores 3220 are configured to execute instructions of a particular instruction set architecture ("ISA"). In at least one embodiment, each core 3220 is a CPU core.

In at least one embodiment, each core 3220 includes, without limitation, a fetch/decode unit 3222, an integer execution engine 3224, a floating point execution engine 3226, and an L2 cache 3228. In at least one embodiment, fetch/decode unit 3222 fetches instructions, decodes such instructions, generates micro-operations, and dispatches separate micro-instructions to integer execution engine 3224 and floating point execution engine 3226. In at least one embodiment, fetch/decode unit 3222 can concurrently dispatch one micro-instruction to integer execution engine 3224 and another micro-instruction to floating point execution engine 3226. In at least one embodiment, integer execution engine 3224 executes, without limitation, integer and memory operations. In at least one embodiment, floating point engine 3226 executes, without limitation, floating point and vector operations. In at least one embodiment, fetch-decode unit 3222 dispatches micro-instructions to a single execution engine that replaces both integer execution engine 3224 and floating point execution engine 3226.

In at least one embodiment, each core 3220(i), where i is an integer representing a particular instance of core 3220, may access L2 cache 3228(i) included in core 3220(i). In at least one embodiment, each core 3220 included in core complex 3210(j), where j is an integer representing a particular instance of core complex 3210, is connected to other cores 3220 included in core complex 3210(j) via L3 cache 3230(j) included in core complex 3210(j). In at least one embodiment, cores 3220 included in core complex 3210(j), where j is an integer representing a particular instance of core complex 3210, can access all of L3 cache 3230(j) included in core complex 3210(j). In at least one embodiment, L3 cache 3230 may include, without limitation, any number of slices.

In at least one embodiment, graphics complex 3240 can be configured to perform compute operations in a highly-parallel fashion. In at least one embodiment, graphics complex 3240 is configured to execute graphics pipeline operations such as draw commands, pixel operations, geometric computations, and other operations associated with rendering an image to a display. In at least one embodiment, graphics complex 3240 is configured to execute operations unrelated to graphics. In at least one embodiment, graphics complex 3240 is configured to execute both operations related to graphics and operations unrelated to graphics.

In at least one embodiment, graphics complex 3240 includes, without limitation, any number of compute units 3250 and an L2 cache 3242. In at least one embodiment, compute units 3250 share L2 cache 3242. In at least one embodiment, L2 cache 3242 is partitioned. In at least one embodiment, graphics complex 3240 includes, without limitation, any number of compute units 3250 and any number (including zero) and type of caches. In at least one embodiment, graphics complex 3240 includes, without limitation, any amount of dedicated graphics hardware.

In at least one embodiment, each compute unit 3250 includes, without limitation, any number of SIMD units 3252 and a shared memory 3254. In at least one embodiment, each SIMD unit 3252 implements a SIMD architecture and is configured to perform operations in parallel. In at least one embodiment, each compute unit 3250 may execute any number of thread blocks, but each thread block executes on a single compute unit 3250. In at least one embodiment, a thread block includes, without limitation, any number of threads of execution. In at least one embodiment, a workgroup is a thread block. In at least one embodiment, each SIMD unit 3252 executes a different warp. In at least one embodiment, a warp is a group of threads (e.g., 16 threads), where each thread in a warp belongs to a single thread block and is configured to process a different set of data based on a single set of instructions. In at least one embodiment, predication can be used to disable one or more threads in a warp. In at least one embodiment, a lane is a thread. In at least one embodiment, a work item is a thread. In at least one embodiment, a wavefront is a warp. In at least one embodiment, different wavefronts in a thread block may synchronize together and communicate via shared memory 3254.

In at least one embodiment, fabric 3260 is a system interconnect that facilitates data and control transmissions across core complex 3210, graphics complex 3240, I/O interfaces 3270, memory controllers 3280, display controller 3292, and multimedia engine 3294. In at least one embodiment, APU 3200 may include, without limitation, any amount and type of system interconnect in addition to or instead of fabric 3260 that facilitates data and control transmissions across any number and type of directly or indirectly linked components that may be internal or external to APU 3200. In at least one embodiment, I/O interfaces 3270 are representative of any number and type of I/O interfaces (e.g., PCI, PCI-Extended ("PCI-X"), PCIe, gigabit Ethernet ("GBE"), USB, etc.). In at least one embodiment, various types of peripheral devices are coupled to I/O interfaces 3270 In at least one embodiment, peripheral devices that are coupled to I/O interfaces 3270 may include, without limitation, keyboards, mice, printers, scanners, joysticks or other types of game controllers, media recording devices, external storage devices, network interface cards, and so forth.

In at least one embodiment, display controller AMD92 displays images on one or more display device(s), such as a liquid crystal display ("LCD") device. In at least one embodiment, multimedia engine 240 includes, without limitation, any amount and type of circuitry that is related to multimedia, such as a video decoder, a video encoder, an image signal processor, etc. In at least one embodiment, memory controllers 3280 facilitate data transfers between APU 3200 and a unified system memory 3290. In at least one embodiment, core complex 3210 and graphics complex 3240 share unified system memory 3290.

In at least one embodiment, APU 3200 implements a memory subsystem that includes, without limitation, any amount and type of memory controllers 3280 and memory devices (e.g., shared memory 3254) that may be dedicated to one component or shared among multiple components. In at least one embodiment, APU 3200 implements a cache subsystem that includes, without limitation, one or more cache memories (e.g., L2 caches 2728, L3 cache 3230, and L2 cache 3242) that may each be private to or shared between any number of components (e.g., cores 3220, core complex 3210, SIMD units 3252, compute units 3250, and graphics complex 3240).

Figure 33:
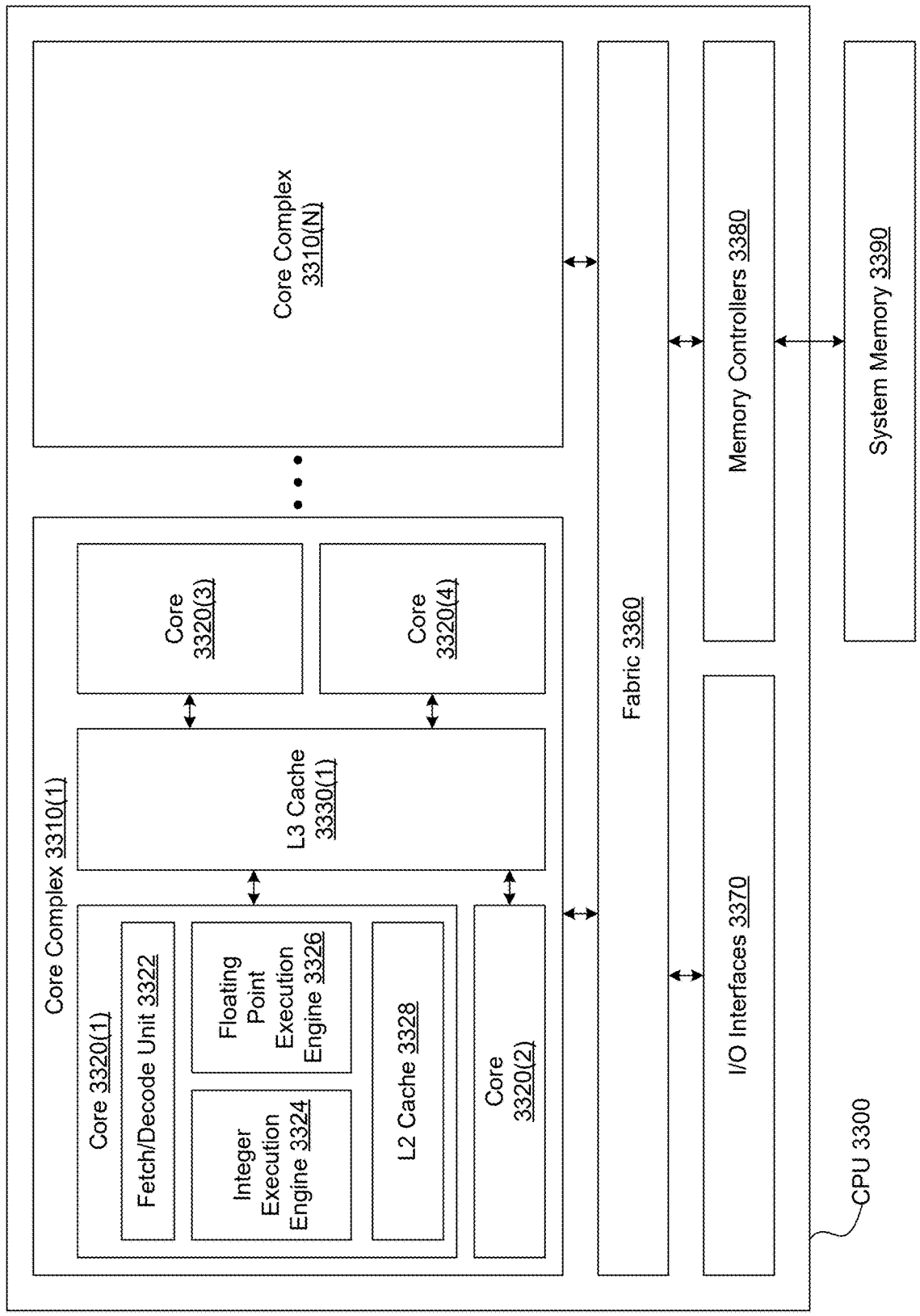
FIG. 33 illustrates a CPU, in accordance with at least one embodiment.

FIG. 33 illustrates a CPU 3300, in accordance with at least one embodiment. In at least one embodiment, CPU 3300 is developed by AMD Corporation of Santa Clara, CA. In at least one embodiment, CPU 3300 can be configured to execute an application program. In at least one embodiment, CPU 3300 is configured to execute main control software, such as an operating system. In at least one embodiment, CPU 3300 issues commands that control an operation of an external GPU (not shown). In at least one embodiment, CPU 3300 can be configured to execute host executable code derived from CUDA source code, and an external GPU can be configured to execute device executable code derived from such CUDA source code. In at least one embodiment, CPU 3300 includes, without limitation, any number of core complexes 3310, fabric 3360, I/O interfaces 3370, and memory controllers 3380.

In at least one embodiment, core complex 3310 includes, without limitation, cores 3320(1)-3320(4) and an L3 cache 3330. In at least one embodiment, core complex 3310 may include, without limitation, any number of cores 3320 and any number and type of caches in any combination. In at least one embodiment, cores 3320 are configured to execute instructions of a particular ISA. In at least one embodiment, each core 3320 is a CPU core.

In at least one embodiment, each core 3320 includes, without limitation, a fetch/decode unit 3322, an integer execution engine 3324, a floating point execution engine 3326, and an L2 cache 3328. In at least one embodiment, fetch/decode unit 3322 fetches instructions, decodes such instructions, generates micro-operations, and dispatches separate micro-instructions to integer execution engine 3324 and floating point execution engine 3326. In at least one embodiment, fetch/decode unit 3322 can concurrently dispatch one micro-instruction to integer execution engine 3324 and another micro-instruction to floating point execution engine 3326. In at least one embodiment, integer execution engine 3324 executes, without limitation, integer and memory operations. In at least one embodiment, floating point engine 3326 executes, without limitation, floating point and vector operations. In at least one embodiment, fetch-decode unit 3322 dispatches micro-instructions to a single execution engine that replaces both integer execution engine 3324 and floating point execution engine 3326.

In at least one embodiment, each core 3320(i), where i is an integer representing a particular instance of core 3320, may access L2 cache 3328(i) included in core 3320(i). In at least one embodiment, each core 3320 included in core complex 3310(j), where j is an integer representing a particular instance of core complex 3310, is connected to other cores 3320 in core complex 3310(j) via L3 cache 3330(j) included in core complex 3310(j). In at least one embodiment, cores 3320 included in core complex 3310(j), where j is an integer representing a particular instance of core complex 3310, can access all of L3 cache 3330(j) included in core complex 3310(*j*). In at least one embodiment, L3 cache 3330 may include, without limitation, any number of slices.

In at least one embodiment, fabric 3360 is a system interconnect that facilitates data and control transmissions across core complexes 3310(1)-3310(N) (where N is an integer greater than zero), I/O interfaces 3370, and memory controllers 3380. In at least one embodiment, CPU 3300 may include, without limitation, any amount and type of system interconnect in addition to or instead of fabric 3360 that facilitates data and control transmissions across any number and type of directly or indirectly linked components that may be internal or external to CPU 3300. In at least one embodiment, I/O interfaces 3370 are representative of any number and type of I/O interfaces (e.g., PCI, PCI-X, PCIe, GBE, USB, etc.). In at least one embodiment, various types of peripheral devices are coupled to I/O interfaces 3370 In at least one embodiment, peripheral devices that are coupled to I/O interfaces 3370 may include, without limitation, displays, keyboards, mice, printers, scanners, joysticks or other types of game controllers, media recording devices, external storage devices, network interface cards, and so forth.

In at least one embodiment, memory controllers 3380 facilitate data transfers between CPU 3300 and a system memory 3390. In at least one embodiment, core complex 3310 and graphics complex 3340 share system memory 3390. In at least one embodiment, CPU 3300 implements a memory subsystem that includes, without limitation, any amount and type of memory controllers 3380 and memory devices that may be dedicated to one component or shared among multiple components. In at least one embodiment, CPU 3300 implements a cache subsystem that includes, without limitation, one or more cache memories (e.g., L2 caches 3328 and L3 caches 3330) that may each be private to or shared between any number of components (e.g., cores 3320 and core complexes 3310).

Figure 34:
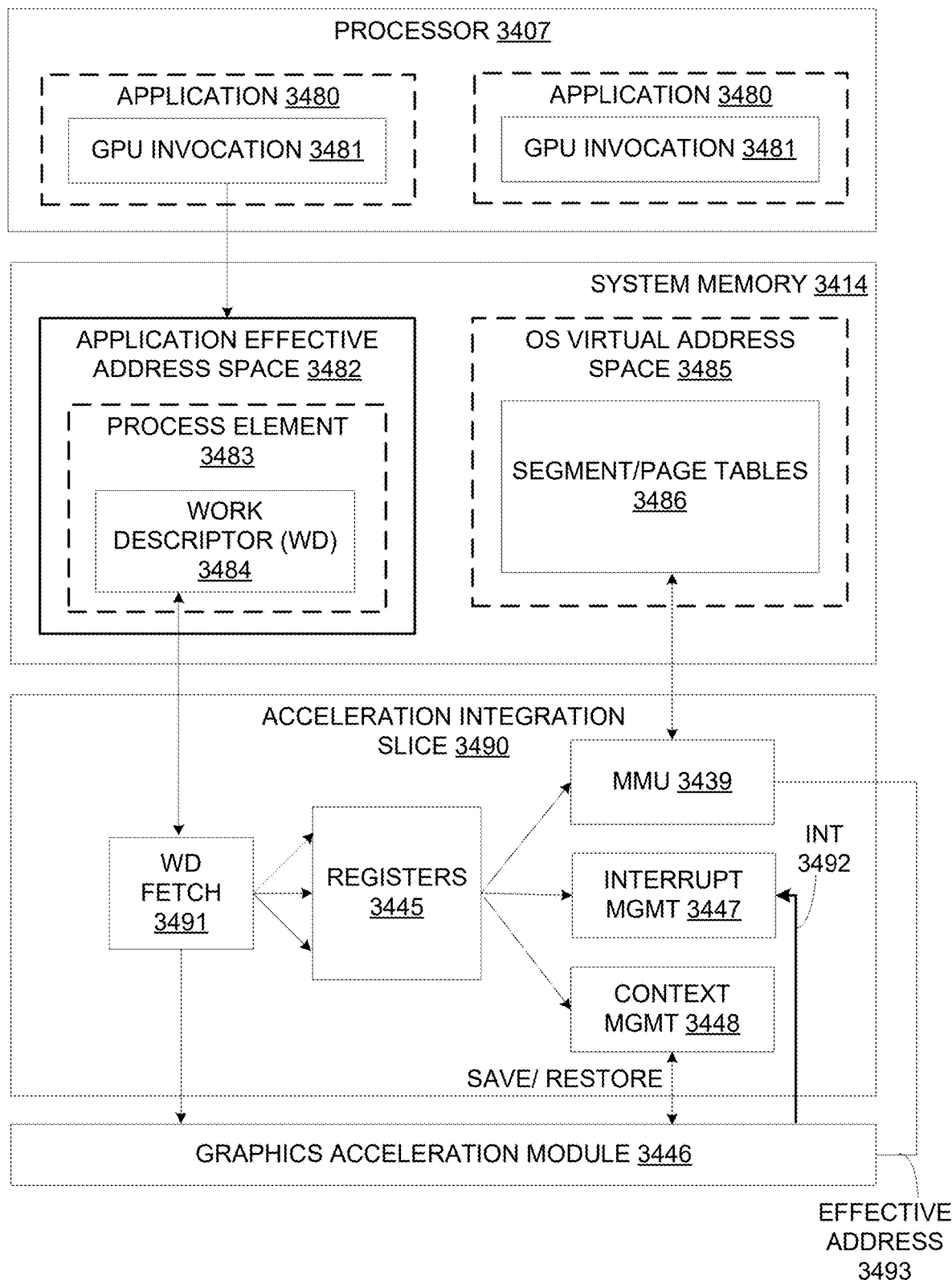
FIG. 34 illustrates an exemplary accelerator integration slice, in accordance with at least one embodiment.

FIG. 34 illustrates an exemplary accelerator integration slice 3490, in accordance with at least one embodiment. As used herein, a "slice" comprises a specified portion of processing resources of an accelerator integration circuit. In at least one embodiment, an accelerator integration circuit provides cache management, memory access, context management, and interrupt management services on behalf of multiple graphics processing engines included in a graphics acceleration module. Graphics processing engines may each comprise a separate GPU. Alternatively, graphics processing engines may comprise different types of graphics processing engines within a GPU such as graphics execution units, media processing engines (e.g., video encoders/decoders), samplers, and blit engines. In at least one embodiment, a graphics acceleration module may be a GPU with multiple graphics processing engines. In at least one embodiment, graphics processing engines may be individual GPUs integrated on a common package, line card, or chip.

An application effective address space 3482 within system memory 3414 stores process elements 3483. In one embodiment, process elements 3483 are stored in response to GPU invocations 3481 from applications 3480 executed on processor 3407. A process element 3483 contains process state for corresponding application 3480. A work descriptor ("WD") 3484 contained in process element 3483 can be a single job requested by an application or may contain a pointer to a queue of jobs. In at least one embodiment, WD 3484 is a pointer to a job request queue in application effective address space 3482.

Graphics acceleration module 3446 and/or individual graphics processing engines can be shared by all or a subset of processes in a system. In at least one embodiment, an infrastructure for setting up process state and sending WD 3484 to graphics acceleration module 3446 to start a job in a virtualized environment may be included.

In at least one embodiment, a dedicated-process programming model is implementation-specific. In this model, a single process owns graphics acceleration module 3446 or an individual graphics processing engine. Because graphics acceleration module 3446 is owned by a single process, a hypervisor initializes an accelerator integration circuit for an owning partition and an operating system initializes accelerator integration circuit for an owning process when graphics acceleration module 3446 is assigned.

In operation, a WD fetch unit 3491 in accelerator integration slice 3490 fetches next WD 3484 which includes an indication of work to be done by one or more graphics processing engines of graphics acceleration module 3446. Data from WD 3484 may be stored in registers 3445 and used by a memory management unit ("MMU") 3439, interrupt management circuit 3447 and/or context management circuit 3448 as illustrated. For example, one embodiment of MMU 3439 includes segment/page walk circuitry for accessing segment/page tables 3486 within OS virtual address space 3485. Interrupt management circuit 3447 may process interrupt events ("INT") 3492 received from graphics acceleration module 3446. When performing graphics operations, an effective address 3493 generated by a graphics processing engine is translated to a real address by MMU 3439.

In one embodiment, a same set of registers 3445 are duplicated for each graphics processing engine and/or graphics acceleration module 3446 and may be initialized by a hypervisor or operating system. Each of these duplicated registers may be included in accelerator integration slice 3490. Exemplary registers that may be initialized by a hypervisor are shown in Table 1.

TABLE 1

Hypervisor Initialized Registers

| | |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by an operating system are shown in Table 2.

TABLE 2

Operating System Initialized Registers

| | |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In one embodiment, each WD 3484 is specific to a particular graphics acceleration module 3446 and/or a particular graphics processing engine. It contains all information required by a graphics processing engine to do work or it can be a pointer to a memory location where an application has set up a command queue of work to be completed.

Figure 35A:
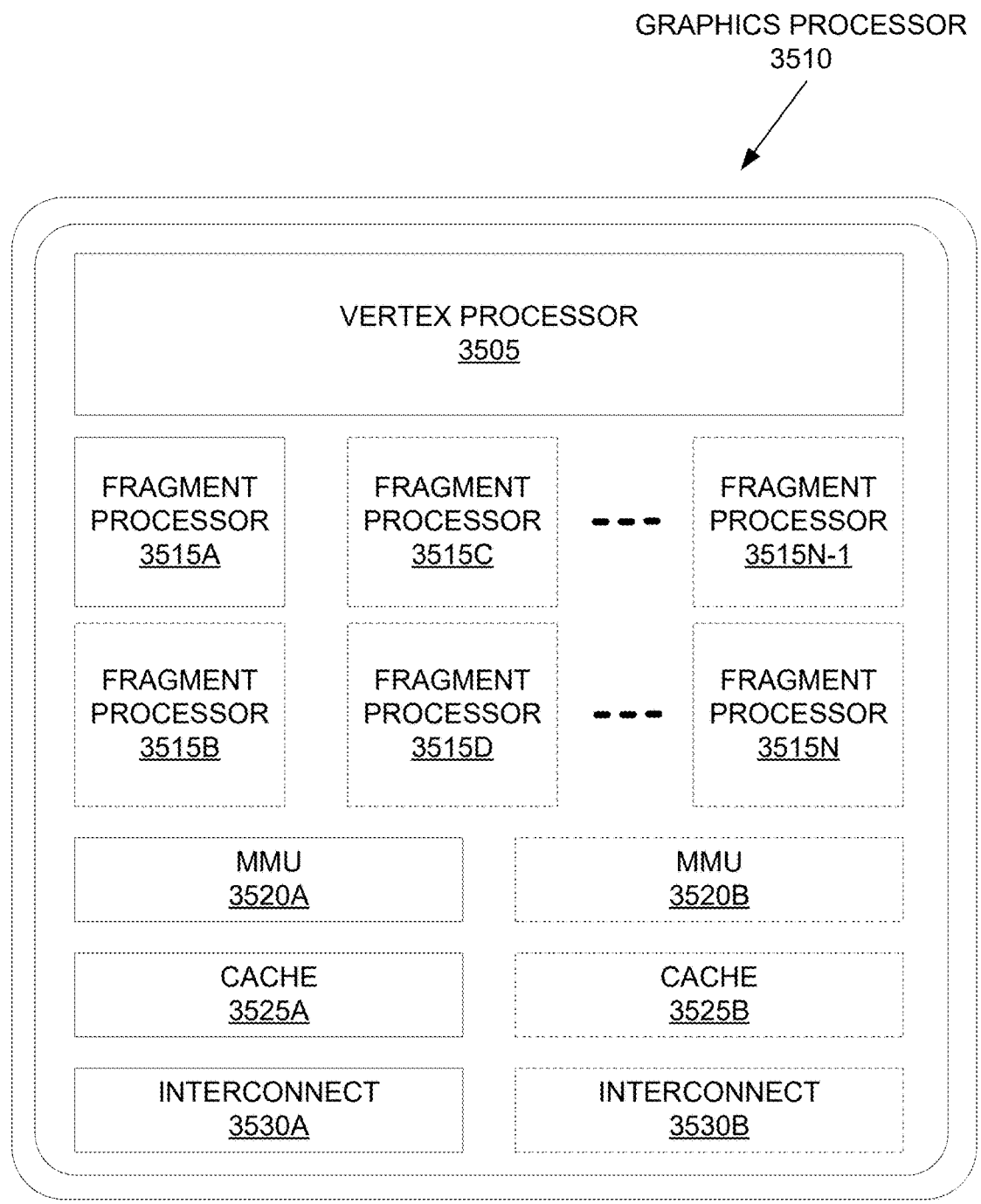
FIGS. 35A-35B illustrate exemplary graphics processors, in accordance with at least one embodiment.
Figure 35B:
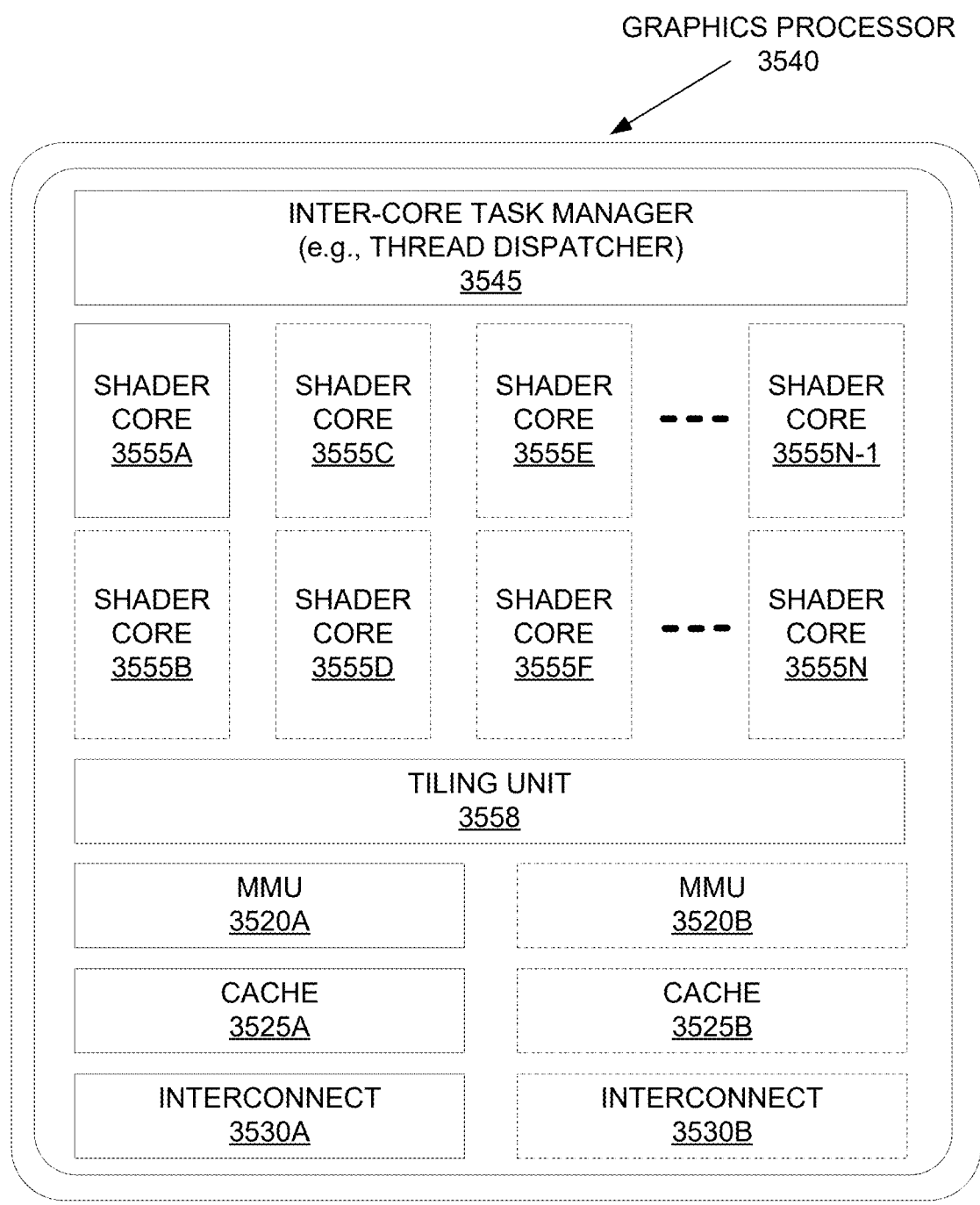

FIGS. 35A-35B illustrate exemplary graphics processors, in accordance with at least one embodiment. In at least one embodiment, any of the exemplary graphics processors may be fabricated using one or more IP cores. In addition to what is illustrated, other logic and circuits may be included in at least one embodiment, including additional graphics processors/cores, peripheral interface controllers, or general-purpose processor cores. In at least one embodiment, the exemplary graphics processors are for use within an SoC.

FIG. 35A illustrates an exemplary graphics processor 3510 of an SoC integrated circuit that may be fabricated using one or more IP cores, in accordance with at least one embodiment. FIG. 35B illustrates an additional exemplary graphics processor 3540 of an SoC integrated circuit that may be fabricated using one or more IP cores, in accordance with at least one embodiment. In at least one embodiment, graphics processor 3510 of FIG. 35A is a low power graphics processor core. In at least one embodiment, graphics processor 3540 of FIG. 35B is a higher performance graphics processor core. In at least one embodiment, each of graphics processors 3510, 3540 can be variants of graphics processor 3010 of FIG. 30.

In at least one embodiment, graphics processor 3510 includes a vertex processor 3505 and one or more fragment processor(s) 3515A-3515N (e.g., 3515A, 3515B, 3515C, 3515D, through 3515N-1, and 3515N). In at least one embodiment, graphics processor 3510 can execute different shader programs via separate logic, such that vertex processor 3505 is optimized to execute operations for vertex shader programs, while one or more fragment processor(s) 3515A-3515N execute fragment (e.g., pixel) shading operations for fragment or pixel shader programs. In at least one embodiment, vertex processor 3505 performs a vertex processing stage of a 3D graphics pipeline and generates primitives and vertex data. In at least one embodiment, fragment processor(s) 3515A-3515N use primitive and vertex data generated by vertex processor 3505 to produce a framebuffer that is displayed on a display device. In at least one embodiment, fragment processor(s) 3515A-3515N are optimized to execute fragment shader programs as provided for in an OpenGL API, which may be used to perform similar operations as a pixel shader program as provided for in a Direct 3D API.

In at least one embodiment, graphics processor 3510 additionally includes one or more MMU(s) 3520A-3520B, cache(s) 3525A-3525B, and circuit interconnect(s) 3530A-3530B. In at least one embodiment, one or more MMU(s) 3520A-3520B provide for virtual to physical address mapping for graphics processor 3510, including for vertex processor 3505 and/or fragment processor(s) 3515A-3515N, which may reference vertex or image/texture data stored in memory, in addition to vertex or image/texture data stored in one or more cache(s) 3525A-3525B. In at least one embodiment, one or more MMU(s) 3520A-3520B may be synchronized with other MMUs within a system, including one or more MMUs associated with one or more application processor(s) 3005, image processors 3015, and/or video processors 3020 of FIG. 30, such that each processor 3005-3020 can participate in a shared or unified virtual memory system. In at least one embodiment, one or more circuit interconnect(s) 3530A-3530B enable graphics processor 3510 to interface with other IP cores within an SoC, either via an internal bus of an SoC or via a direct connection.

In at least one embodiment, graphics processor 3540 includes one or more MMU(s) 3520A-3520B, caches 3525A-3525B, and circuit interconnects 3530A-3530B of graphics processor 3510 of FIG. 35A. In at least one embodiment, graphics processor 3540 includes one or more shader core(s) 3555A-3555N (e.g., 3555A, 3555B, 3555C, 3555D, 3555E, 3555F, through 3555N-1, and 3555N), which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 3540 includes an inter-core task manager 3545, which acts as a thread dispatcher to dispatch execution threads to one or more shader cores 3555A-3555N and a tiling unit 3558 to accelerate tiling operations for tile-based rendering, in which rendering operations for a scene are subdivided in image space, for example to exploit local spatial coherence within a scene or to optimize use of internal caches.

Figure 36A:
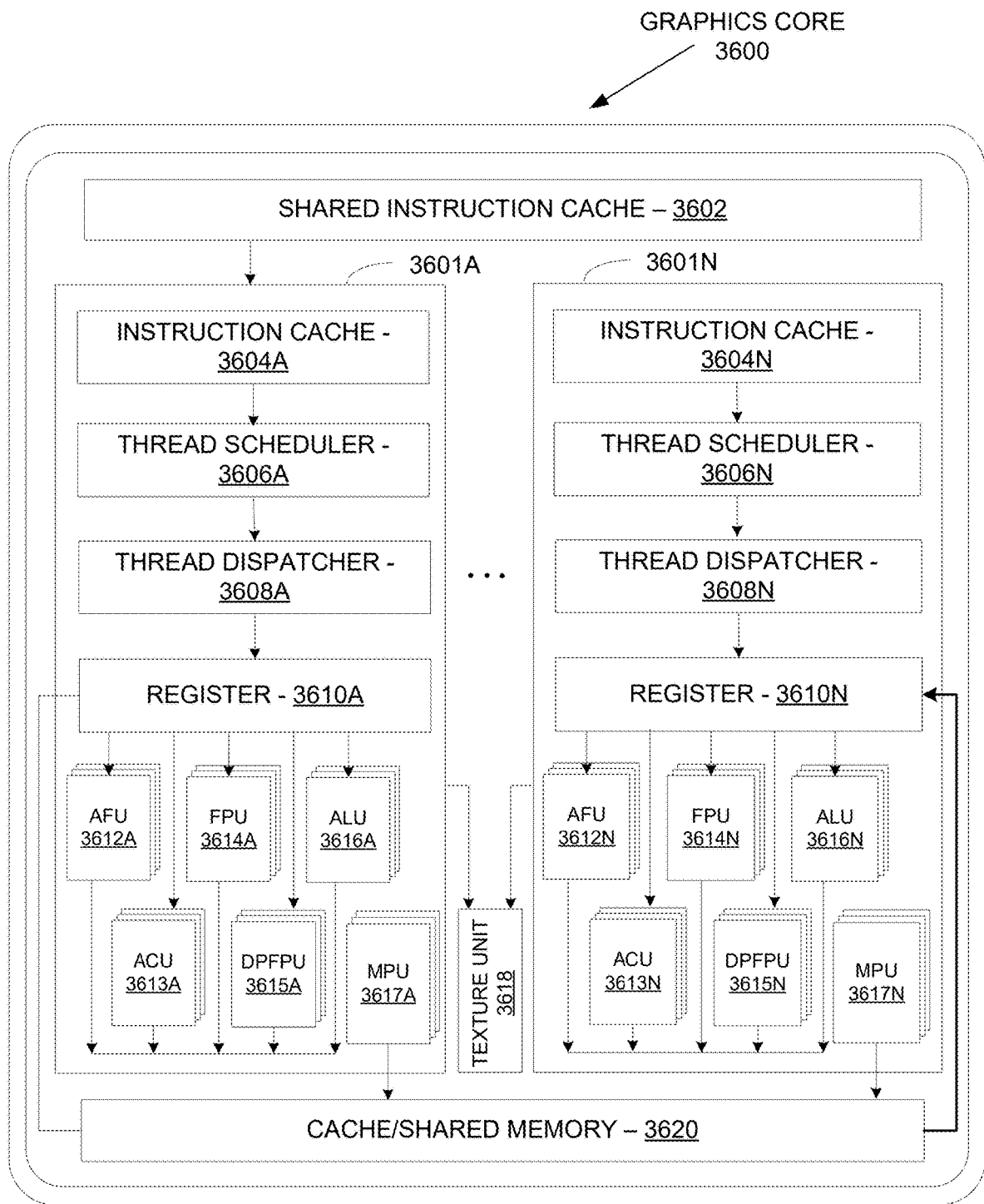
FIG. 36A illustrates a graphics core, in accordance with at least one embodiment.

FIG. 36A illustrates a graphics core 3600, in accordance with at least one embodiment. In at least one embodiment, graphics core 3600 may be included within graphics processor 3410 of FIG. 30. In at least one embodiment, graphics core 3600 may be a unified shader core 3555A-3555N as in 35FIG. 35B. In at least one embodiment, graphics core 3600 includes a shared instruction cache 3602, a texture unit 3618, and a cache/shared memory 3620 that are common to execution resources within graphics core 3600. In at least one embodiment, graphics core 3600 can include multiple slices 3601A-3601N or partition for each core, and a graphics processor can include multiple instances of graphics core 3600. Slices 3601A-3601N can include support logic including a local instruction cache 3604A-3604N, a thread scheduler 3606A-3606N, a thread dispatcher 3608A-3608N, and a set of registers 3610A-3610N. In at least one embodiment, slices 3601A-3601N can include a set of additional function units ("AFUs") 3612A-3612N, floating-point units ("FPUs") 3614A-3614N, integer arithmetic logic units ("ALUs") 3616-3616N, address computational units ("ACUs") 3613A-3613N, double-precision floating-point units ("DPFPUs") 3615A-3615N, and matrix processing units ("MPUs") 3617A-3617N.

In at least one embodiment, FPUs 3614A-3614N can perform single-precision (32-bit) and half-precision (16-bit) floating point operations, while DPFPUs 3615A-3615N perform double precision (64-bit) floating point operations. In at least one embodiment, ALUs 3616A-3616N can perform variable precision integer operations at 8-bit, 16-bit, and 32-bit precision, and can be configured for mixed precision operations. In at least one embodiment, MPUs 3617A-3617N can also be configured for mixed precision matrix operations, including half-precision floating point and 8-bit integer operations. In at least one embodiment, MPUs 3617-3617N can perform a variety of matrix operations to accelerate CUDA programs, including enabling support for accelerated general matrix to matrix multiplication ("GEMM"). In at least one embodiment, AFUs 3612A-3612N can perform additional logic operations not supported by floating-point or integer units, including trigonometric operations (e.g., Sine, Cosine, etc.).

Figure 36B:
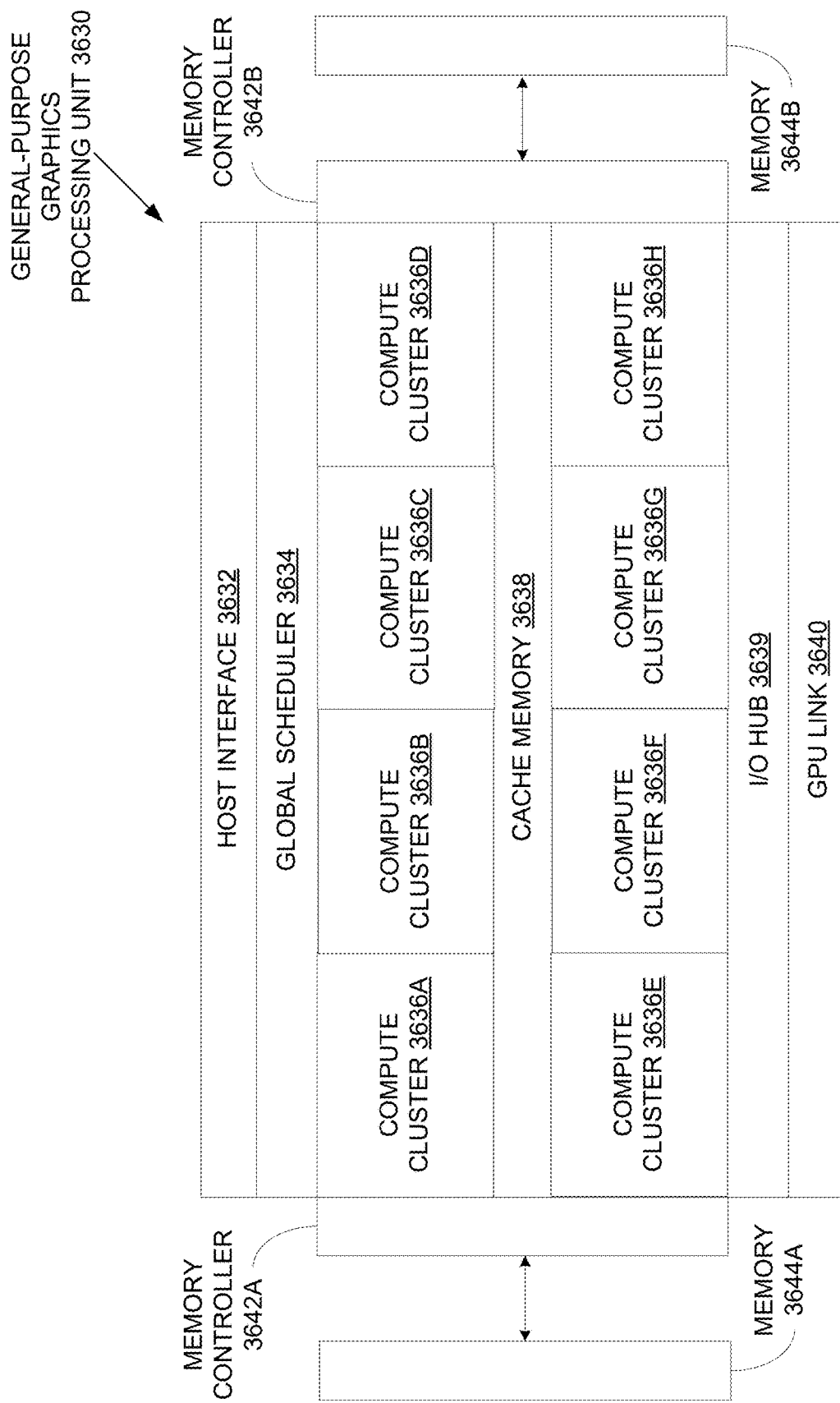
FIG. 36B illustrates a GPGPU, in accordance with at least one embodiment.

FIG. 36B illustrates a general-purpose graphics processing unit ("GPGPU") 3630, in accordance with at least one embodiment. In at least one embodiment, GPGPU 3630 is highly-parallel and suitable for deployment on a multi-chip module. In at least one embodiment, GPGPU 3630 can be configured to enable highly-parallel compute operations to be performed by an array of GPUs. In at least one embodiment, GPGPU 3630 can be linked directly to other instances of GPGPU 3630 to create a multi-GPU cluster to improve execution time for CUDA programs. In at least one embodiment, GPGPU 3630 includes a host interface 3632 to enable a connection with a host processor. In at least one embodiment, host interface 3632 is a PCIe interface. In at least one embodiment, host interface 3632 can be a vendor specific communications interface or communications fabric. In at least one embodiment, GPGPU 3630 receives commands from a host processor and uses a global scheduler 3634 to distribute execution threads associated with those commands to a set of compute clusters 3636A-3636H. In at least one embodiment, compute clusters 3636A-3636H share a cache memory 3638. In at least one embodiment, cache memory 3638 can serve as a higher-level cache for cache memories within compute clusters 3636A-3636H.

In at least one embodiment, GPGPU 3630 includes memory 3644A-3644B coupled with compute clusters 3636A-3636H via a set of memory controllers 3642A-3642B. In at least one embodiment, memory 3644A-3644B can include various types of memory devices including DRAM or graphics random access memory, such as synchronous graphics random access memory ("SGRAM"), including graphics double data rate ("GDDR") memory.

In at least one embodiment, compute clusters 3636A-3636H each include a set of graphics cores, such as graphics core 3600 of FIG. 36A, which can include multiple types of integer and floating point logic units that can perform computational operations at a range of precisions including suited for computations associated with CUDA programs. For example, in at least one embodiment, at least a subset of floating point units in each of compute clusters 3636A-3636H can be configured to perform 16-bit or 32-bit floating point operations, while a different subset of floating point units can be configured to perform 64-bit floating point operations.

In at least one embodiment, multiple instances of GPGPU 3630 can be configured to operate as a compute cluster. In at least one embodiment, compute clusters 3636A-3636H may implement any technically feasible communication techniques for synchronization and data exchange. In at least one embodiment, multiple instances of GPGPU 3630 communicate over host interface 3632. In at least one embodiment, GPGPU 3630 includes an I/O hub 3639 that couples GPGPU 3630 with a GPU link 3640 that enables a direct connection to other instances of GPGPU 3630. In at least one embodiment, GPU link 3640 is coupled to a dedicated GPU-to-GPU bridge that enables communication and synchronization between multiple instances of GPGPU 3630. In at least one embodiment GPU link 3640 couples with a high speed interconnect to transmit and receive data to other GPGPUs 3630 or parallel processors. In at least one embodiment, multiple instances of GPGPU 3630 are located in separate data processing systems and communicate via a network device that is accessible via host interface 3632. In at least one embodiment GPU link 3640 can be configured to enable a connection to a host processor in addition to or as an alternative to host interface 3632. In at least one embodiment, GPGPU 3630 can be configured to execute a CUDA program.

Figure 37A:
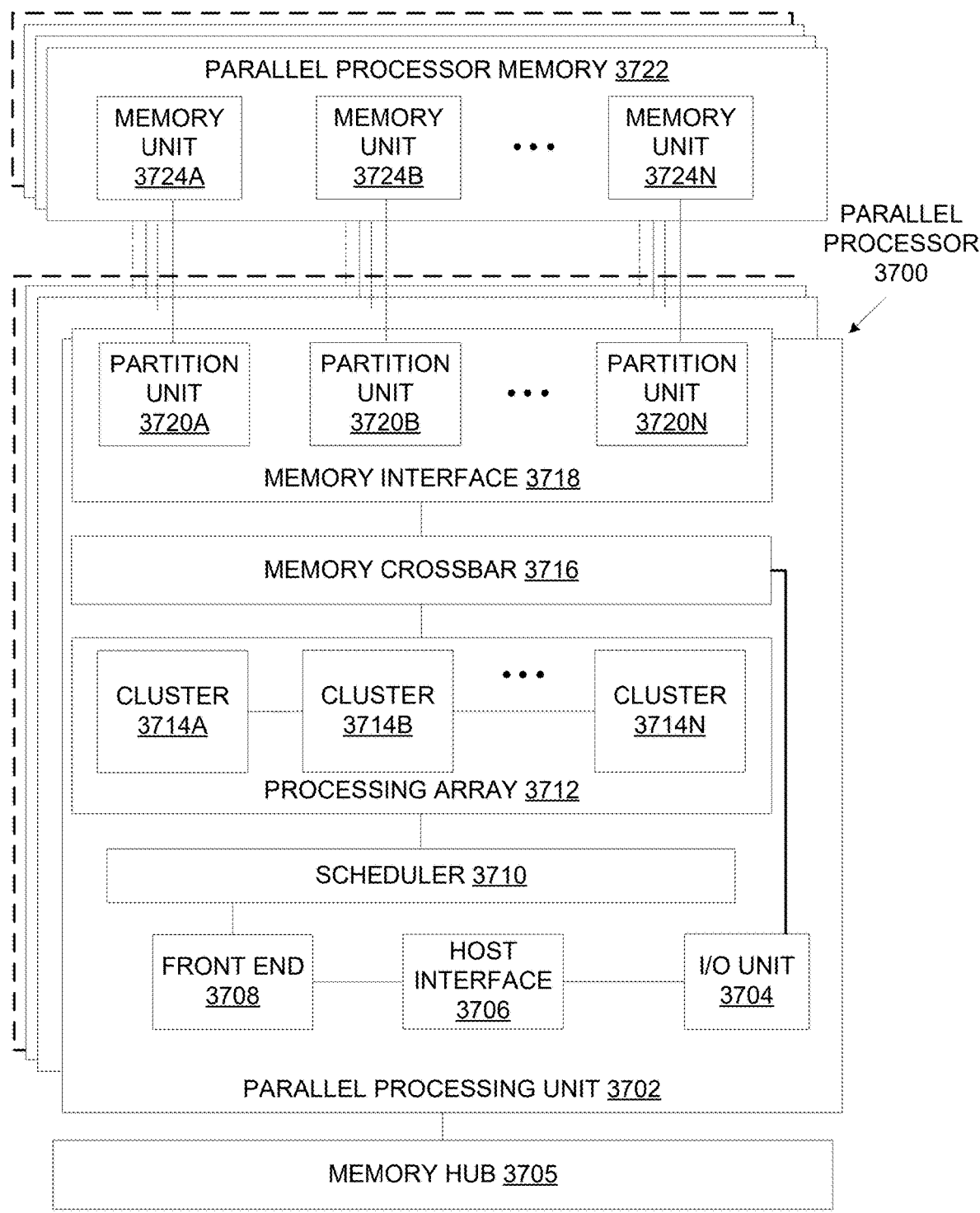
FIG. 37A illustrates a parallel processor, in accordance with at least one embodiment.

FIG. 37A illustrates a parallel processor 3700, in accordance with at least one embodiment. In at least one embodiment, various components of parallel processor 3700 may be implemented using one or more integrated circuit devices, such as programmable processors, application specific integrated circuits ("ASICs"), or FPGAs.

In at least one embodiment, parallel processor 3700 includes a parallel processing unit 3702. In at least one embodiment, parallel processing unit 3702 includes an I/O unit 3704 that enables communication with other devices, including other instances of parallel processing unit 3702. In at least one embodiment, I/O unit 3704 may be directly connected to other devices. In at least one embodiment, I/O unit 3704 connects with other devices via use of a hub or switch interface, such as memory hub 3705. In at least one embodiment, connections between memory hub 3705 and I/O unit 3704 form a communication link. In at least one embodiment, I/O unit 3704 connects with a host interface 3706 and a memory crossbar 3716, where host interface 3706 receives commands directed to performing processing operations and memory crossbar 3716 receives commands directed to performing memory operations.

In at least one embodiment, when host interface 3706 receives a command buffer via I/O unit 3704, host interface 3706 can direct work operations to perform those commands to a front end 3708. In at least one embodiment, front end 3708 couples with a scheduler 3710, which is configured to distribute commands or other work items to a processing array 3712. In at least one embodiment, scheduler 3710 ensures that processing array 3712 is properly configured and in a valid state before tasks are distributed to processing array 3712. In at least one embodiment, scheduler 3710 is implemented via firmware logic executing on a microcontroller. In at least one embodiment, microcontroller implemented scheduler 3710 is configurable to perform complex scheduling and work distribution operations at coarse and fine granularity, enabling rapid preemption and context switching of threads executing on processing array 3712. In at least one embodiment, host software can prove workloads for scheduling on processing array 3712 via one of multiple graphics processing doorbells. In at least one embodiment, workloads can then be automatically distributed across processing array 3712 by scheduler 3710 logic within a microcontroller including scheduler 3710.

In at least one embodiment, processing array 3712 can include up to "N" clusters (e.g., cluster 3714A, cluster 3714B, through cluster 3714N). In at least one embodiment, each cluster 3714A-3714N of processing array 3712 can execute a large number of concurrent threads. In at least one embodiment, scheduler 3710 can allocate work to clusters 3714A-3714N of processing array 3712 using various scheduling and/or work distribution algorithms, which may vary depending on a workload arising for each type of program or computation. In at least one embodiment, scheduling can be handled dynamically by scheduler 3710, or can be assisted in part by compiler logic during compilation of program logic configured for execution by processing array 3712. In at least one embodiment, different clusters 3714A-3714N of processing array 3712 can be allocated for processing different types of programs or for performing different types of computations.

In at least one embodiment, processing array 3712 can be configured to perform various types of parallel processing operations. In at least one embodiment, processing array 3712 is configured to perform general-purpose parallel compute operations. For example, in at least one embodiment, processing array 3712 can include logic to execute processing tasks including filtering of video and/or audio data, performing modeling operations, including physics operations, and performing data transformations.

In at least one embodiment, processing array 3712 is configured to perform parallel graphics processing operations. In at least one embodiment, processing array 3712 can include additional logic to support execution of such graphics processing operations, including, but not limited to texture sampling logic to perform texture operations, as well as tessellation logic and other vertex processing logic. In at least one embodiment, processing array 3712 can be configured to execute graphics processing related shader programs such as, but not limited to vertex shaders, tessellation shaders, geometry shaders, and pixel shaders. In at least one embodiment, parallel processing unit 3702 can transfer data from system memory via I/O unit 3704 for processing. In at least one embodiment, during processing, transferred data can be stored to on-chip memory (e.g., a parallel processor memory 3722) during processing, then written back to system memory.

In at least one embodiment, when parallel processing unit 3702 is used to perform graphics processing, scheduler 3710 can be configured to divide a processing workload into approximately equal sized tasks, to better enable distribution of graphics processing operations to multiple clusters 3714A-3714N of processing array 3712. In at least one embodiment, portions of processing array 3712 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 3714A-3714N may be stored in buffers to allow intermediate data to be transmitted between clusters 3714A-3714N for further processing.

In at least one embodiment, processing array 3712 can receive processing tasks to be executed via scheduler 3710, which receives commands defining processing tasks from front end 3708. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 3710 may be configured to fetch indices corresponding to tasks or may receive indices from front end 3708. In at least one embodiment, front end 3708 can be configured to ensure processing array 3712 is configured to a valid state before a workload specified by incoming command buffers (e.g., batch-buffers, push buffers, etc.) is initiated.

In at least one embodiment, each of one or more instances of parallel processing unit 3702 can couple with parallel processor memory 3722. In at least one embodiment, parallel processor memory 3722 can be accessed via memory crossbar 3716, which can receive memory requests from processing array 3712 as well as I/O unit 3704. In at least one embodiment, memory crossbar 3716 can access parallel processor memory 3722 via a memory interface 3718. In at least one embodiment, memory interface 3718 can include multiple partition units (e.g., a partition unit 3720A, partition unit 3720B, through partition unit 3720N) that can each couple to a portion (e.g., memory unit) of parallel processor memory 3722. In at least one embodiment, a number of partition units 3720A-3720N is configured to be equal to a number of memory units, such that a first partition unit 3720A has a corresponding first memory unit 3724A, a second partition unit 3720B has a corresponding memory unit 3724B, and an Nth partition unit 3720N has a corresponding Nth memory unit 3724N. In at least one embodiment, a number of partition units 3720A-3720N may not be equal to a number of memory devices.

In at least one embodiment, memory units 3724A-3724N can include various types of memory devices, including DRAM or graphics random access memory, such as SGRAM, including GDDR memory. In at least one embodiment, memory units 3724A-3724N may also include 3D stacked memory, including but not limited to high bandwidth memory ("HBM"). In at least one embodiment, render targets, such as frame buffers or texture maps may be stored across memory units 3724A-3724N, allowing partition units 3720A-3720N to write portions of each render target in parallel to efficiently use available bandwidth of parallel processor memory 3722. In at least one embodiment, a local instance of parallel processor memory 3722 may be excluded in favor of a unified memory design that utilizes system memory in conjunction with local cache memory.

In at least one embodiment, any one of clusters 3714A-3714N of processing array 3712 can process data that will be written to any of memory units 3724A-3724N within parallel processor memory 3722. In at least one embodiment, memory crossbar 3716 can be configured to transfer an output of each cluster 3714A-3714N to any partition unit 3720A-3720N or to another cluster 3714A-3714N, which can perform additional processing operations on an output. In at least one embodiment, each cluster 3714A-3714N can communicate with memory interface 3718 through memory crossbar 3716 to read from or write to various external memory devices. In at least one embodiment, memory crossbar 3716 has a connection to memory interface 3718 to communicate with I/O unit 3704, as well as a connection to a local instance of parallel processor memory 3722, enabling processing units within different clusters 3714A-3714N to communicate with system memory or other memory that is not local to parallel processing unit 3702. In at least one embodiment, memory crossbar 3716 can use virtual channels to separate traffic streams between clusters 3714A-3714N and partition units 3720A-3720N.

In at least one embodiment, multiple instances of parallel processing unit 3702 can be provided on a single add-in card, or multiple add-in cards can be interconnected. In at least one embodiment, different instances of parallel processing unit 3702 can be configured to interoperate even if different instances have different numbers of processing cores, different amounts of local parallel processor memory, and/or other configuration differences. For example, in at least one embodiment, some instances of parallel processing unit 3702 can include higher precision floating point units relative to other instances. In at least one embodiment, systems incorporating one or more instances of parallel processing unit 3702 or parallel processor 3700 can be implemented in a variety of configurations and form factors, including but not limited to desktop, laptop, or handheld personal computers, servers, workstations, game consoles, and/or embedded systems.

Figure 37B:
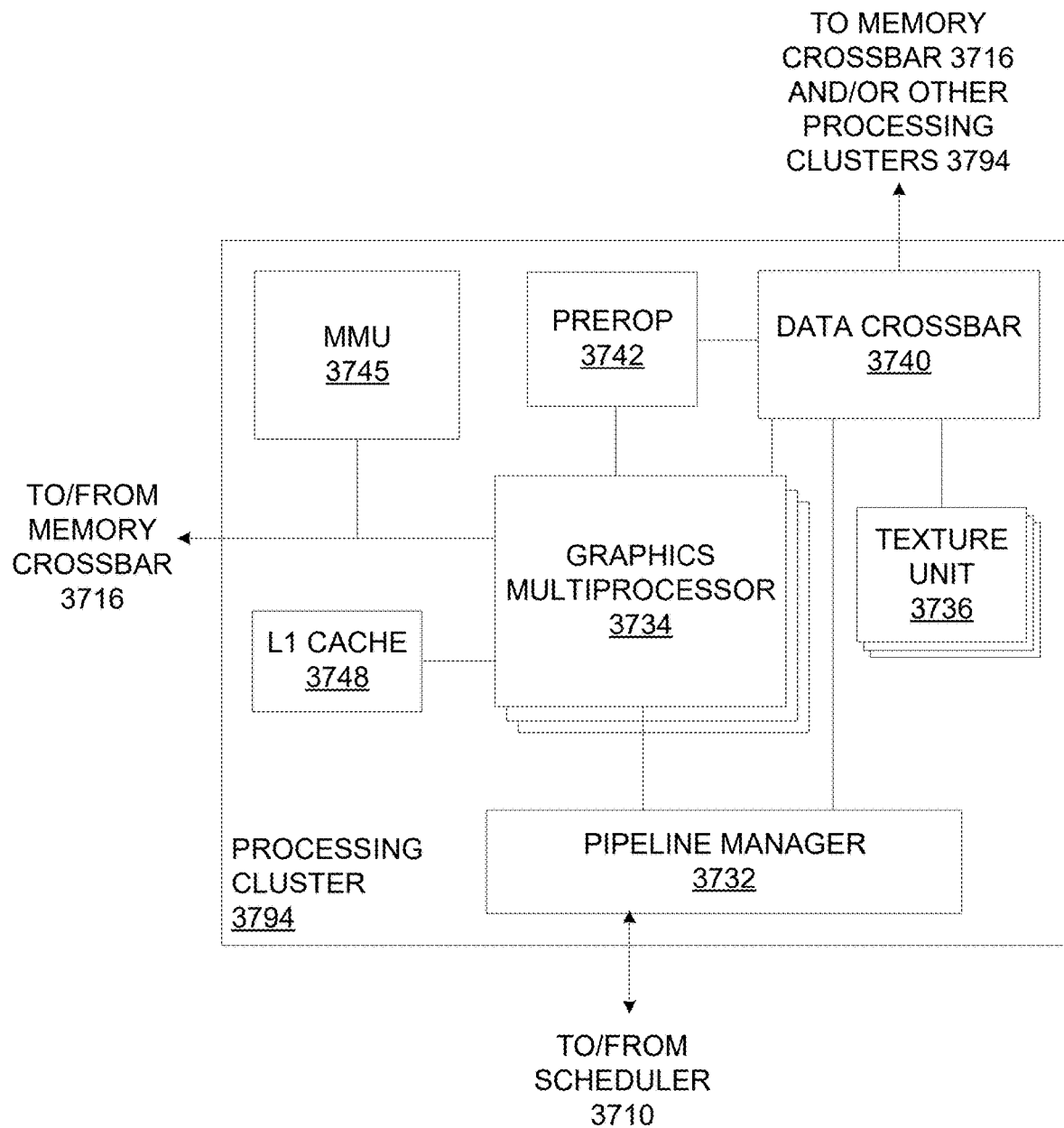
FIG. 37B illustrates a processing cluster, in accordance with at least one embodiment.

FIG. 37B illustrates a processing cluster 3794, in accordance with at least one embodiment. In at least one embodiment, processing cluster 3794 is included within a parallel processing unit. In at least one embodiment, processing cluster 3794 is one of processing clusters 3714A-3714N of FIG. 37. In at least one embodiment, processing cluster 3794 can be configured to execute many threads in parallel, where the term "thread" refers to an instance of a particular program executing on a particular set of input data. In at least one embodiment, single instruction, multiple data ("SIMD") instruction issue techniques are used to support parallel execution of a large number of threads without providing multiple independent instruction units. In at least one embodiment, single instruction, multiple thread ("SIMT") techniques are used to support parallel execution of a large number of generally synchronized threads, using a common instruction unit configured to issue instructions to a set of processing engines within each processing cluster 3794.

In at least one embodiment, operation of processing cluster 3794 can be controlled via a pipeline manager 3732 that distributes processing tasks to SIMT parallel processors. In at least one embodiment, pipeline manager 3732 receives instructions from scheduler 3710 of FIG. 37 and manages execution of those instructions via a graphics multiprocessor 3734 and/or a texture unit 3736. In at least one embodiment, graphics multiprocessor 3734 is an exemplary instance of a SIMT parallel processor. However, in at least one embodiment, various types of SIMT parallel processors of differing architectures may be included within processing cluster 3794. In at least one embodiment, one or more instances of graphics multiprocessor 3734 can be included within processing cluster 3794. In at least one embodiment, graphics multiprocessor 3734 can process data and a data crossbar 3740 can be used to distribute processed data to one of multiple possible destinations, including other shader units. In at least one embodiment, pipeline manager 3732 can facilitate distribution of processed data by specifying destinations for processed data to be distributed via data crossbar 3740.

In at least one embodiment, each graphics multiprocessor 3734 within processing cluster 3794 can include an identical set of functional execution logic (e.g., arithmetic logic units, load/store units ("LSUs"), etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 3794 constitute a thread. In at least one embodiment, a set of threads executing across a set of parallel processing engines is a thread group. In at least one embodiment, a thread group executes a program on different input data. In at least one embodiment, each thread within a thread group can be assigned to a different processing engine within graphics multiprocessor 3734. In at least one embodiment, a thread group may include fewer threads than a number of processing engines within graphics multiprocessor 3734. In at least one embodiment, when a thread group includes fewer threads than a number of processing engines, one or more of processing engines may be idle during cycles in which that thread group is being processed. In at least one embodiment, a thread group may also include more threads than a number of processing engines within graphics multiprocessor 3734. In at least one embodiment, when a thread group includes more threads than a number of processing engines within graphics multiprocessor 3734, processing can be performed over consecutive clock cycles. In at least one embodiment, multiple thread groups can be executed concurrently on graphics multiprocessor 3734.

In at least one embodiment, graphics multiprocessor 3734 includes an internal cache memory to perform load and store operations. In at least one embodiment, graphics multiprocessor 3734 can forego an internal cache and use a cache memory (e.g., L1 cache 3748) within processing cluster 3794. In at least one embodiment, each graphics multiprocessor 3734 also has access to Level 2 ("L2") caches within partition units (e.g., partition units 3720A-3720N of FIG. 37A) that are shared among all processing clusters 3794 and may be used to transfer data between threads. In at least one embodiment, graphics multiprocessor 3734 may also access off-chip global memory, which can include one or more of local parallel processor memory and/or system memory. In at least one embodiment, any memory external to parallel processing unit 3702 may be used as global memory. In at least one embodiment, processing cluster 3794 includes multiple instances of graphics multiprocessor 3734 that can share common instructions and data, which may be stored in L1 cache 3748.

In at least one embodiment, each processing cluster 3794 may include an MMU 3745 that is configured to map virtual addresses into physical addresses. In at least one embodiment, one or more instances of MMU 3745 may reside within memory interface 3718 of FIG. 37. In at least one embodiment, MMU 3745 includes a set of page table entries ("PTEs") used to map a virtual address to a physical address of a tile and optionally a cache line index. In at least one embodiment, MMU 3745 may include address translation lookaside buffers ("TLBs") or caches that may reside within graphics multiprocessor 3734 or L1 cache 3748 or processing cluster 3794. In at least one embodiment, a physical address is processed to distribute surface data access locality to allow efficient request interleaving among partition units. In at least one embodiment, a cache line index may be used to determine whether a request for a cache line is a hit or miss.

In at least one embodiment, processing cluster 3794 may be configured such that each graphics multiprocessor 3734 is coupled to a texture unit 3736 for performing texture mapping operations, e.g., determining texture sample positions, reading texture data, and filtering texture data. In at least one embodiment, texture data is read from an internal texture L1 cache (not shown) or from an L1 cache within graphics multiprocessor 3734 and is fetched from an L2 cache, local parallel processor memory, or system memory, as needed. In at least one embodiment, each graphics multiprocessor 3734 outputs a processed task to data crossbar 3740 to provide a processed task to another processing cluster 3794 for further processing or to store a processed task in an L2 cache, a local parallel processor memory, or a system memory via memory crossbar 3716. In at least one embodiment, a pre-raster operations unit ("preROP") 3742 is configured to receive data from graphics multiprocessor 3734, direct data to ROP units, which may be located with partition units as described herein (e.g., partition units 3720A-3720N of FIG. 37). In at least one embodiment, PreROP 3742 can perform optimizations for color blending, organize pixel color data, and perform address translations.

Figure 37C:
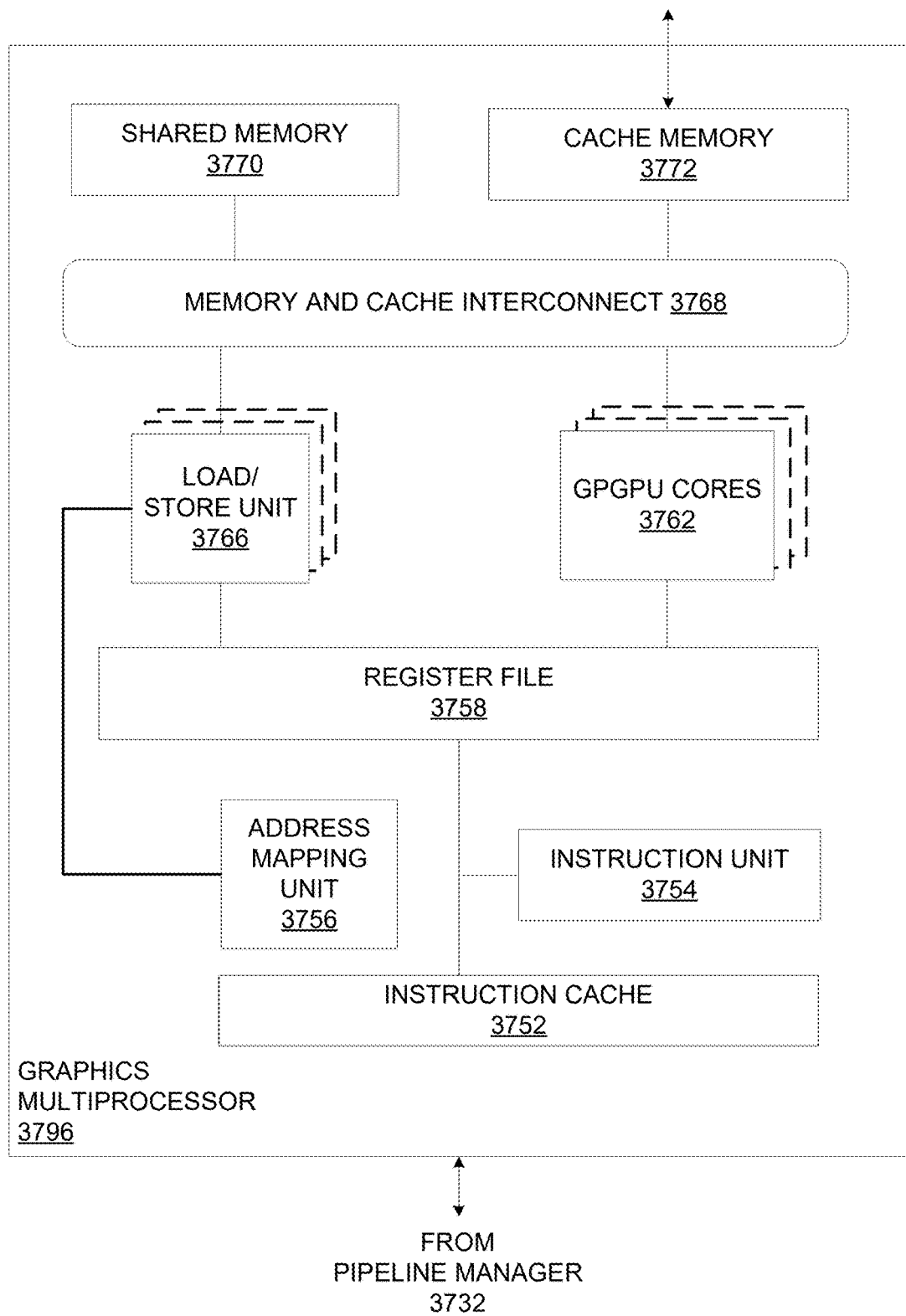
FIG. 37C illustrates a graphics multiprocessor, in accordance with at least one embodiment.

FIG. 37C illustrates a graphics multiprocessor 3796, in accordance with at least one embodiment. In at least one embodiment, graphics multiprocessor 3796 is graphics multiprocessor 3734 of FIG. 37B. In at least one embodiment, graphics multiprocessor 3796 couples with pipeline manager 3732 of processing cluster 3794. In at least one embodiment, graphics multiprocessor 3796 has an execution pipeline including but not limited to an instruction cache 3752, an instruction unit 3754, an address mapping unit 3756, a register file 3758, one or more GPGPU cores 3762, and one or more LSUs 3766. GPGPU cores 3762 and LSUs 3766 are coupled with cache memory 3772 and shared memory 3770 via a memory and cache interconnect 3768.

In at least one embodiment, instruction cache 3752 receives a stream of instructions to execute from pipeline manager 3732. In at least one embodiment, instructions are cached in instruction cache 3752 and dispatched for execution by instruction unit 3754. In at least one embodiment, instruction unit 3754 can dispatch instructions as thread groups (e.g., warps), with each thread of a thread group assigned to a different execution unit within GPGPU core 3762. In at least one embodiment, an instruction can access any of a local, shared, or global address space by specifying an address within a unified address space. In at least one embodiment, address mapping unit 3756 can be used to translate addresses in a unified address space into a distinct memory address that can be accessed by LSUs 3766.

In at least one embodiment, register file 3758 provides a set of registers for functional units of graphics multiprocessor 3796. In at least one embodiment, register file 3758 provides temporary storage for operands connected to data paths of functional units (e.g., GPGPU cores 3762, LSUs 3766) of graphics multiprocessor 3796. In at least one embodiment, register file 3758 is divided between each of functional units such that each functional unit is allocated a dedicated portion of register file 3758. In at least one embodiment, register file 3758 is divided between different thread groups being executed by graphics multiprocessor 3796.

In at least one embodiment, GPGPU cores 3762 can each include FPUs and/or integer ALUs that are used to execute instructions of graphics multiprocessor 3796. GPGPU cores 3762 can be similar in architecture or can differ in architecture. In at least one embodiment, a first portion of GPGPU cores 3762 include a single precision FPU and an integer ALU while a second portion of GPGPU cores 3762 include a double precision FPU. In at least one embodiment, FPUs can implement IEEE 754-2008 standard for floating point arithmetic or enable variable precision floating point arithmetic. In at least one embodiment, graphics multiprocessor 3796 can additionally include one or more fixed function or special function units to perform specific functions such as copy rectangle or pixel blending operations. In at least one embodiment one or more of GPGPU cores 3762 can also include fixed or special function logic.

In at least one embodiment, GPGPU cores 3762 include SIMD logic capable of performing a single instruction on multiple sets of data. In at least one embodiment GPGPU cores 3762 can physically execute SIMD4, SIMD8, and SIMD16 instructions and logically execute SIMD1, SIMD2, and SIMD32 instructions. In at least one embodiment, SIMD instructions for GPGPU cores 3762 can be generated at compile time by a shader compiler or automatically generated when executing programs written and compiled for single program multiple data ("SPMD") or SIMT architectures. In at least one embodiment, multiple threads of a program configured for an SIMT execution model can executed via a single SIMD instruction. For example, in at least one embodiment, eight SIMT threads that perform the same or similar operations can be executed in parallel via a single SIMD8 logic unit.

In at least one embodiment, memory and cache interconnect 3768 is an interconnect network that connects each functional unit of graphics multiprocessor 3796 to register file 3758 and to shared memory 3770. In at least one embodiment, memory and cache interconnect 3768 is a crossbar interconnect that allows LSU 3766 to implement load and store operations between shared memory 3770 and register file 3758. In at least one embodiment, register file 3758 can operate at a same frequency as GPGPU cores 3762, thus data transfer between GPGPU cores 3762 and register file 3758 is very low latency. In at least one embodiment, shared memory 3770 can be used to enable communication between threads that execute on functional units within graphics multiprocessor 3796. In at least one embodiment, cache memory 3772 can be used as a data cache for example, to cache texture data communicated between functional units and texture unit 3736. In at least one embodiment, shared memory 3770 can also be used as a program managed cached. In at least one embodiment, threads executing on GPGPU cores 3762 can programmatically store data within shared memory in addition to automatically cached data that is stored within cache memory 3772.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, a GPU may be communicatively coupled to host processor/cores over a bus or other interconnect (e.g., a high speed interconnect such as PCIe or NVLink). In at least one embodiment, a GPU may be integrated on a same package or chip as cores and communicatively coupled to cores over a processor bus/interconnect that is internal to a package or a chip. In at least one embodiment, regardless of a manner in which a GPU is connected, processor cores may allocate work to a GPU in a form of sequences of commands/instructions contained in a WD. In at least one embodiment, a GPU then uses dedicated circuitry/logic for efficiently processing these commands/instructions.

General Computing

The following figures set forth, without limitation, exemplary software constructs within general computing that can be used to implement at least one embodiment.

Figure 38:
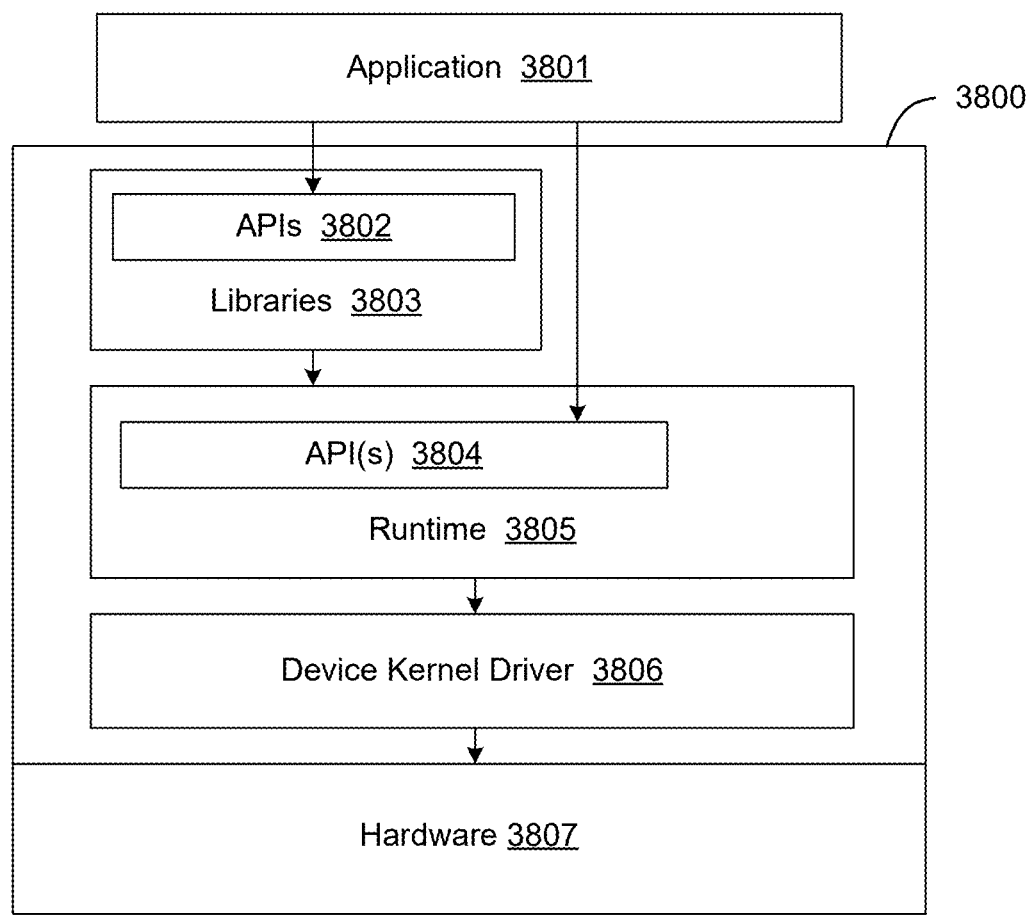
FIG. 38 illustrates a software stack of a programming platform, in accordance with at least one embodiment.

FIG. 38 illustrates a software stack of a programming platform, in accordance with at least one embodiment. In at least one embodiment, a programming platform is a platform for leveraging hardware on a computing system to accelerate computational tasks. A programming platform may be accessible to software developers through libraries, compiler directives, and/or extensions to programming languages, in at least one embodiment. In at least one embodiment, a programming platform may be, but is not limited to, CUDA, Radeon Open Compute Platform ("ROCm"), OpenCL (OpenCL™ is developed by Khronos group), SYCL, or Intel One API.

In at least one embodiment, a software stack 3800 of a programming platform provides an execution environment for an application 3801. In at least one embodiment, application 3801 may include any computer software capable of being launched on software stack 3800. In at least one embodiment, application 3801 may include, but is not limited to, an artificial intelligence ("AI")/machine learning ("ML") application, a high performance computing ("HPC") application, a virtual desktop infrastructure ("VDI"), or a data center workload.

In at least one embodiment, application 3801 and software stack 3800 run on hardware 3807. Hardware 3807 may include one or more GPUs, CPUs, FPGAs, AI engines, and/or other types of compute devices that support a programming platform, in at least one embodiment. In at least one embodiment, such as with CUDA, software stack 3800 may be vendor specific and compatible with only devices from particular vendor(s). In at least one embodiment, such as in with OpenCL, software stack 3800 may be used with devices from different vendors. In at least one embodiment, hardware 3807 includes a host connected to one more devices that can be accessed to perform computational tasks via application programming interface ("API") calls. A device within hardware 3807 may include, but is not limited to, a GPU, FPGA, AI engine, or other compute device (but may also include a CPU) and its memory, as opposed to a host within hardware 3807 that may include, but is not limited to, a CPU (but may also include a compute device) and its memory, in at least one embodiment.

In at least one embodiment, software stack 3800 of a programming platform includes, without limitation, a number of libraries 3803, a runtime 3805, and a device kernel driver 3806. Each of libraries 3803 may include data and programming code that can be used by computer programs and leveraged during software development, in at least one embodiment. In at least one embodiment, libraries 3803 may include, but are not limited to, pre-written code and subroutines, classes, values, type specifications, configuration data, documentation, help data, and/or message templates. In at least one embodiment, libraries 3803 include functions that are optimized for execution on one or more types of devices. In at least one embodiment, libraries 3803 may include, but are not limited to, functions for performing mathematical, deep learning, and/or other types of operations on devices. In at least one embodiment, libraries 3903 are associated with corresponding APIs 3902, which may include one or more APIs, that expose functions implemented in libraries 3903.

In at least one embodiment, application 3801 is written as source code that is compiled into executable code, as discussed in greater detail below in conjunction with FIG. 37. Executable code of application 3801 may run, at least in part, on an execution environment provided by software stack 3800, in at least one embodiment. In at least one embodiment, during execution of application 3801, code may be reached that needs to run on a device, as opposed to a host. In such a case, runtime 3805 may be called to load and launch requisite code on a device, in at least one embodiment. In at least one embodiment, runtime 3805 may include any technically feasible runtime system that is able to support execution of application S01.

In at least one embodiment, runtime 3805 is implemented as one or more runtime libraries associated with corresponding APIs, which are shown as API(s) 3804. One or more of such runtime libraries may include, without limitation, functions for memory management, execution control, device management, error handling, and/or synchronization, among other things, in at least one embodiment. In at least one embodiment, memory management functions may include, but are not limited to, functions to allocate, deallocate, and copy device memory, as well as transfer data between host memory and device memory. In at least one embodiment, execution control functions may include, but are not limited to, functions to launch a function (sometimes referred to as a "kernel" when a function is a global function callable from a host) on a device and set attribute values in a buffer maintained by a runtime library for a given function to be executed on a device.

Runtime libraries and corresponding API(s) 3804 may be implemented in any technically feasible manner, in at least one embodiment. In at least one embodiment, one (or any number of) API may expose a low-level set of functions for fine-grained control of a device, while another (or any number of) API may expose a higher-level set of such functions. In at least one embodiment, a high-level runtime API may be built on top of a low-level API. In at least one embodiment, one or more of runtime APIs may be language-specific APIs that are layered on top of a language-independent runtime API.

In at least one embodiment, device kernel driver 3806 is configured to facilitate communication with an underlying device. In at least one embodiment, device kernel driver 3806 may provide low-level functionalities upon which APIs, such as API(s) 3804, and/or other software relies. In at least one embodiment, device kernel driver 3806 may be configured to compile intermediate representation ("IR") code into binary code at runtime. For CUDA, device kernel driver 3806 may compile Parallel Thread Execution ("PTX") IR code that is not hardware specific into binary code for a specific target device at runtime (with caching of compiled binary code), which is also sometimes referred to as "finalizing" code, in at least one embodiment. Doing so may permit finalized code to run on a target device, which may not have existed when source code was originally compiled into PTX code, in at least one embodiment. Alternatively, in at least one embodiment, device source code may be compiled into binary code offline, without requiring device kernel driver 3806 to compile IR code at runtime.

Figure 39:
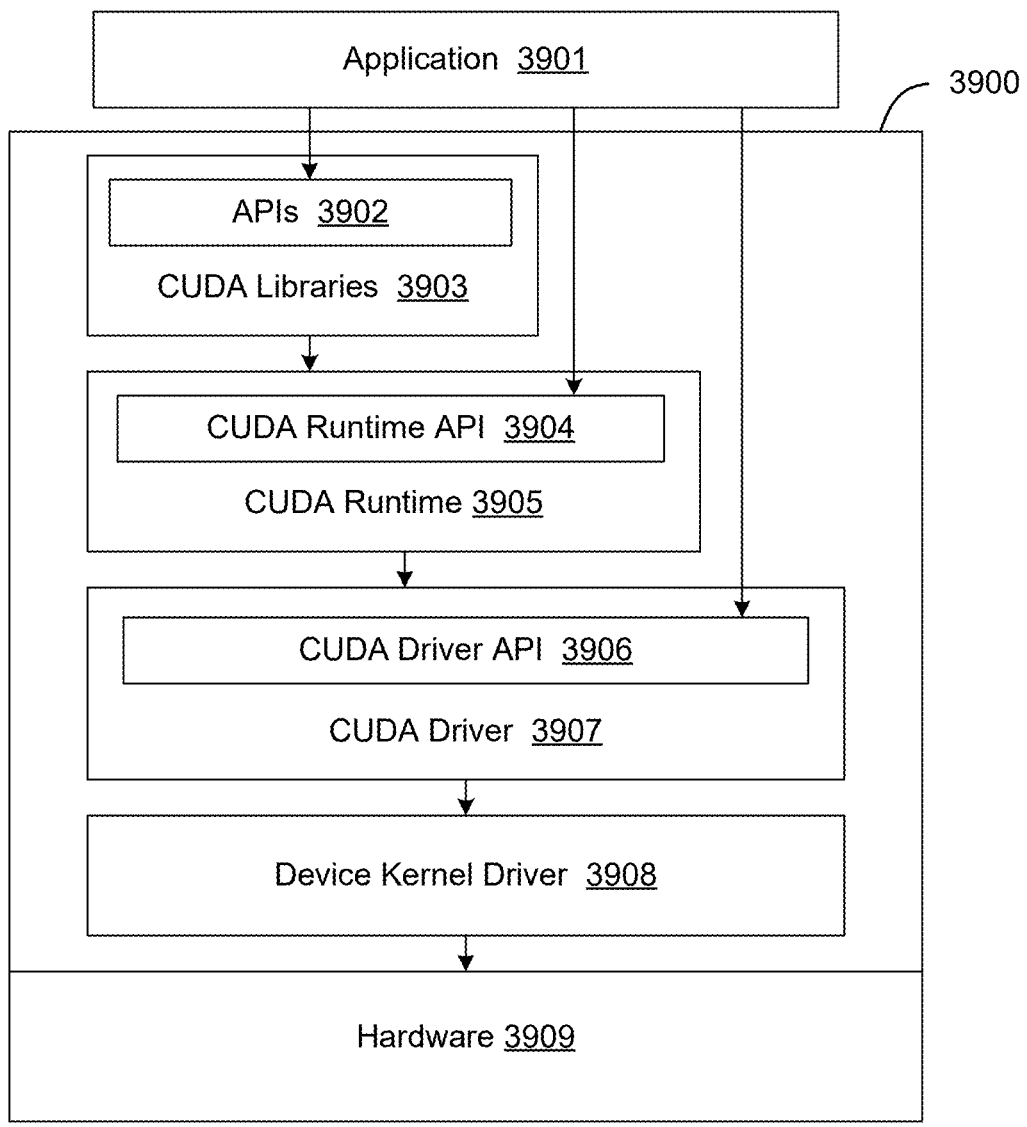
FIG. 39 illustrates a CUDA implementation of a software stack of FIG. 32, in accordance with at least one embodiment.

FIG. 39 illustrates a CUDA implementation of software stack 3800 of FIG. 38, in accordance with at least one embodiment. In at least one embodiment, a CUDA software stack 3900, on which an application 3901 may be launched, includes CUDA libraries 3903, a CUDA runtime 3905, a CUDA driver 3907, and a device kernel driver 3908. In at least one embodiment, CUDA software stack 3900 executes on hardware 3909, which may include a GPU that supports CUDA and is developed by NVIDIA Corporation of Santa Clara, CA.

In at least one embodiment, application 3901, CUDA runtime 3905, and device kernel driver 3908 may perform similar functionalities as application 3801, runtime 3805, and device kernel driver 3806, respectively, which are described above in conjunction with FIG. 38. In at least one embodiment, CUDA driver 3907 includes a library (libcuda.so) that implements a CUDA driver API 3906. Similar to a CUDA runtime API 3904 implemented by a CUDA runtime library (cudart), CUDA driver API 3906 may, without limitation, expose functions for memory management, execution control, device management, error handling, synchronization, and/or graphics interoperability, among other things, in at least one embodiment. In at least one embodiment, CUDA driver API 3906 differs from CUDA runtime API 3904 in that CUDA runtime API 3904 simplifies device code management by providing implicit initialization, context (analogous to a process) management, and module (analogous to dynamically loaded libraries) management. In contrast to high-level CUDA runtime API 3904, CUDA driver API 3906 is a low-level API providing more fine-grained control of a device, particularly with respect to contexts and module loading, in at least one embodiment. In at least one embodiment, CUDA driver API 3906 may expose functions for context management that are not exposed by CUDA runtime API 3904. In at least one embodiment, CUDA driver API 3906 is also language-independent and supports, e.g., OpenCL in addition to CUDA runtime API 3904. Further, in at least one embodiment, development libraries, including CUDA runtime 3905, may be considered as separate from driver components, including user-mode CUDA driver 3907 and kernel-mode device driver 3908 (also sometimes referred to as a "display" driver).

In at least one embodiment, CUDA libraries 3903 may include, but are not limited to, mathematical libraries, deep learning libraries, parallel algorithm n libraries, and/or signal/image/video processing libraries, which parallel computing applications such as application 3901 may utilize. In at least one embodiment, CUDA libraries 3903 may include mathematical libraries such as a cuBLAS library that is an implementation of Basic Linear Algebra Subprograms ("BLAS") for performing linear algebra operations, a cuFFT library for computing fast Fourier transforms ("FFTs"), and a cuRAND library for generating random numbers, among others. In at least one embodiment, CUDA libraries 3903 may include deep learning libraries such as a cuDNN library of primitives for deep neural networks and a TensorRT platform for high-performance deep learning inference, among others.

Figure 40:
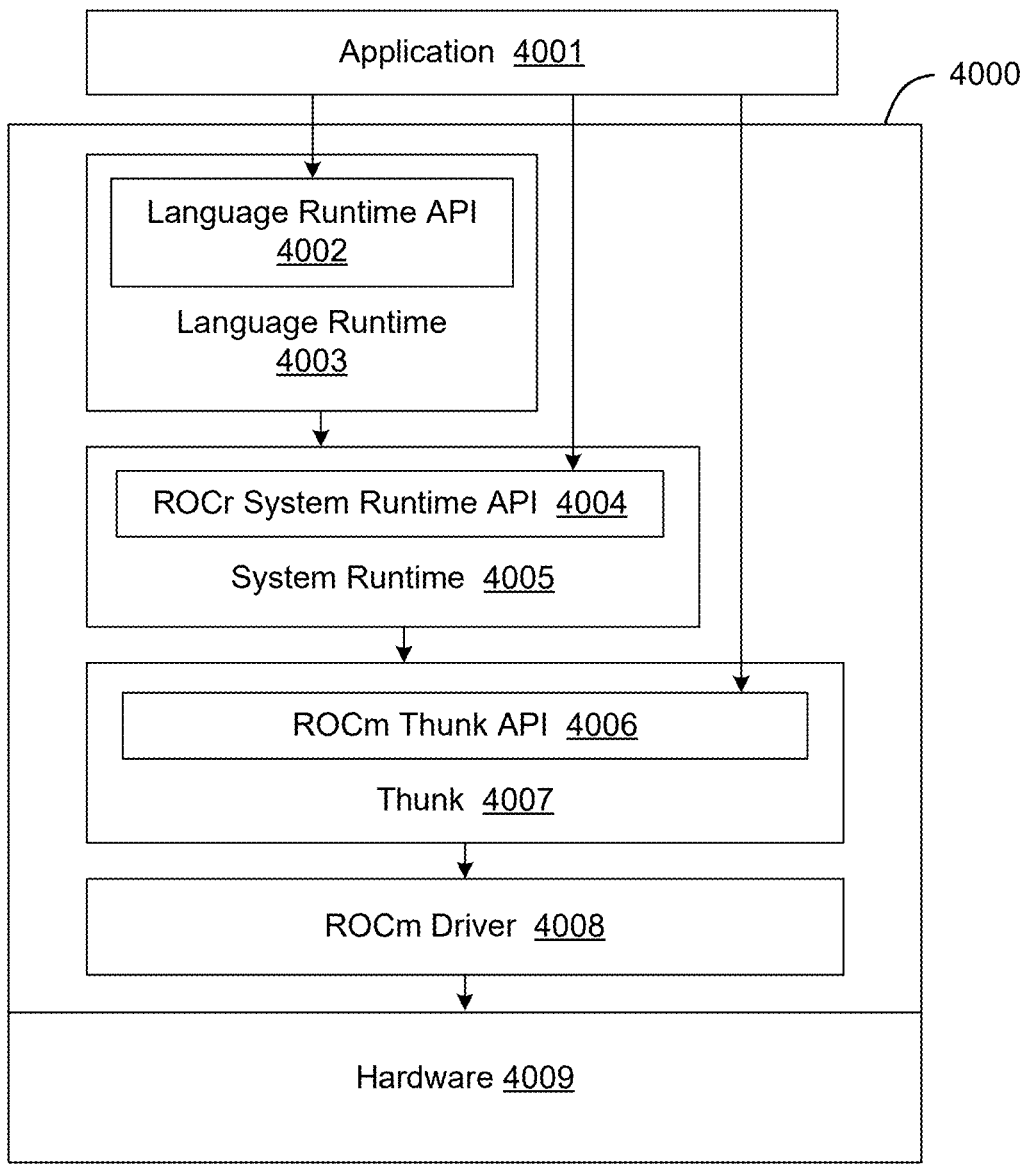
FIG. 40 illustrates a ROCm implementation of a software stack of FIG. 32, in accordance with at least one embodiment.

FIG. 40 illustrates a ROCm implementation of software stack 3800 of FIG. 38, in accordance with at least one embodiment. In at least one embodiment, a ROCm software stack 4000, on which an application 4001 may be launched, includes a language runtime 4003, a system runtime 4005, a thunk 4007, a ROCm kernel driver 4008, and a device kernel driver 4009. In at least one embodiment, ROCm software stack 4000 executes on hardware 4010, which may include a GPU that supports ROCm and is developed by AMD Corporation of Santa Clara, CA.

In at least one embodiment, application 4001 may perform similar functionalities as application 3801 discussed above in conjunction with FIG. 38. In addition, language runtime 4003 and system runtime 4005 may perform similar functionalities as runtime 3805 discussed above in conjunction with FIG. 38, in at least one embodiment. In at least one embodiment, language runtime 4003 and system runtime 4005 differ in that system runtime 4005 is a language-independent runtime that implements a ROCr system runtime API 4004 and makes use of a Heterogeneous System Architecture ("HAS") Runtime API. HAS runtime API is a thin, user-mode API that exposes interfaces to access and interact with an AMD GPU, including functions for memory management, execution control via architected dispatch of kernels, error handling, system and agent information, and runtime initialization and shutdown, among other things, in at least one embodiment. In contrast to system runtime 4005, language runtime 4003 is an implementation of a language-specific runtime API 4002 layered on top of ROCr system runtime API 4004, in at least one embodiment. In at least one embodiment, language runtime API may include, but is not limited to, a Heterogeneous compute Interface for Portability ("HIP") language runtime API, a Heterogeneous Compute Compiler ("HCC") language runtime API, or an OpenCL API, among others. HIP language in particular is an extension of C++ programming language with functionally similar versions of CUDA mechanisms, and, in at least one embodiment, a HIP language runtime API includes functions that are similar to those of CUDA runtime API 3904 discussed above in conjunction with FIG. 39, such as functions for memory management, execution control, device management, error handling, and synchronization, among other things.

In at least one embodiment, thunk (ROCt) 4007 is an interface that can be used to interact with underlying ROCm driver 4008. In at least one embodiment, ROCm driver 4008 is a ROCK driver, which is a combination of an AMDGPU driver and a HAS kernel driver (amdkfd). In at least one embodiment, AMDGPU driver is a device kernel driver for GPUs developed by AMD that performs similar functionalities as device kernel driver 3806 discussed above in conjunction with FIG. 38. In at least one embodiment, HAS kernel driver is a driver permitting different types of processors to share system resources more effectively via hardware features.

In at least one embodiment, various libraries (not shown) may be included in ROCm software stack 4000 above language runtime 4003 and provide functionality similarity to CUDA libraries 3903, discussed above in conjunction with FIG. 39. In at least one embodiment, various libraries may include, but are not limited to, mathematical, deep learning, and/or other libraries such as a hipBLAS library that implements functions similar to those of CUDA cuBLAS, a rocFFT library for computing FFTs that is similar to CUDA cuFFT, among others.

Figure 41:
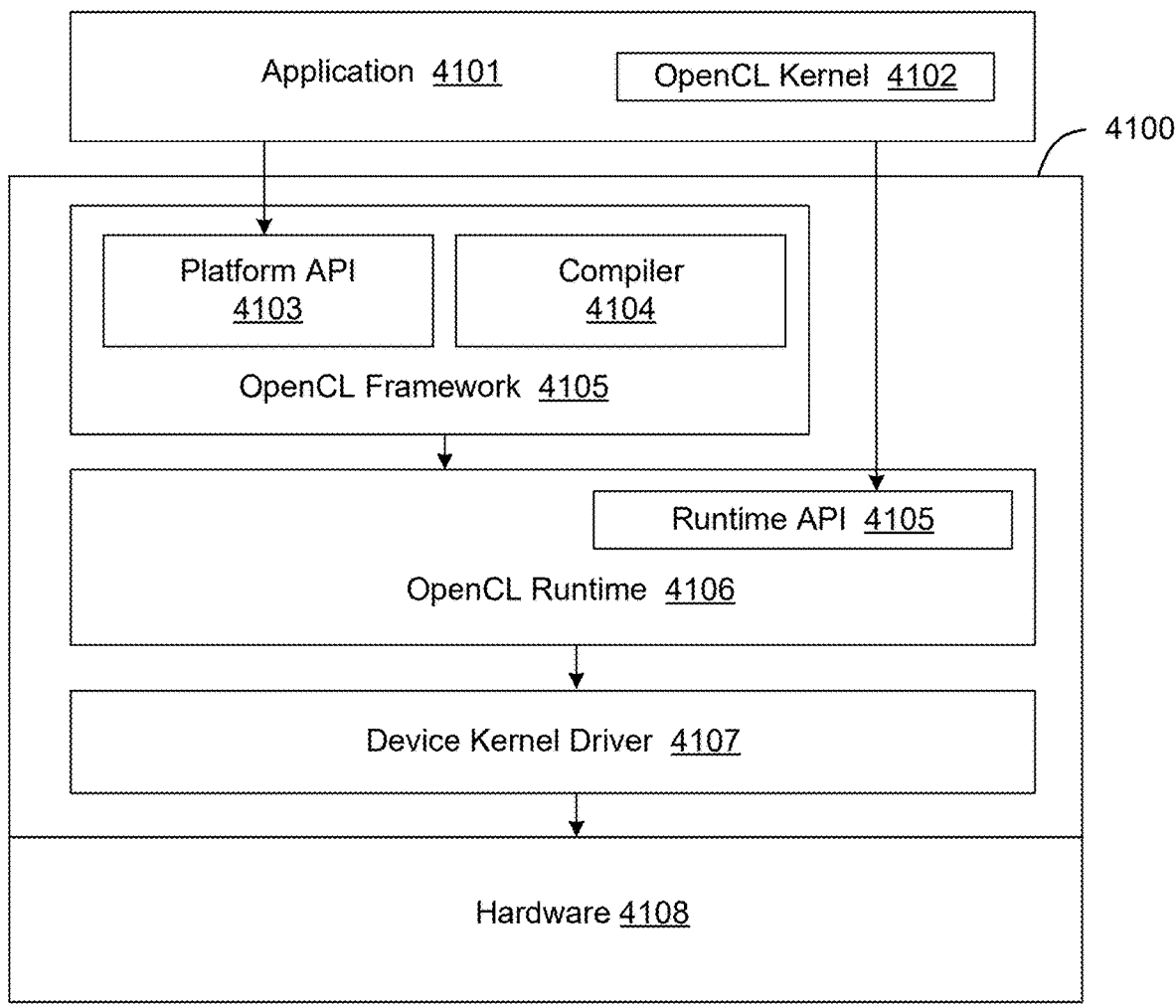
FIG. 41 illustrates an OpenCL implementation of a software stack of FIG. 32, in accordance with at least one embodiment.

FIG. 41 illustrates an OpenCL implementation of software stack 3800 of FIG. 38, in accordance with at least one embodiment. In at least one embodiment, an OpenCL software stack 4100, on which an application 4101 may be launched, includes an OpenCL framework 4105, an OpenCL runtime 4106, and a driver 4107. In at least one embodiment, OpenCL software stack 4100 executes on hardware 3909 that is not vendor-specific. As OpenCL is supported by devices developed by different vendors, specific OpenCL drivers may be required to interoperate with hardware from such vendors, in at least one embodiment.

In at least one embodiment, application 4101, OpenCL runtime 4106, device kernel driver 4107, and hardware 4108 may perform similar functionalities as application 3801, runtime 3805, device kernel driver 3806, and hardware 3807, respectively, that are discussed above in conjunction with FIG. 38. In at least one embodiment, application 4101 further includes an OpenCL kernel 4102 with code that is to be executed on a device.

In at least one embodiment, OpenCL defines a "platform" that allows a host to control devices connected to a host. In at least one embodiment, an OpenCL framework provides a platform layer API and a runtime API, shown as platform API 4103 and runtime API 4105. In at least one embodiment, runtime API 4105 uses contexts to manage execution of kernels on devices. In at least one embodiment, each identified device may be associated with a respective context, which runtime API 4105 may use to manage command queues, program objects, and kernel objects, share memory objects, among other things, for that device. In at least one embodiment, platform API 4103 exposes functions that permit device contexts to be used to select and initialize devices, submit work to devices via command queues, and enable data transfer to and from devices, among other things. In addition, OpenCL framework provides various built-in functions (not shown), including math functions, relational functions, and image processing functions, among others, in at least one embodiment.

In at least one embodiment, a compiler 4104 is also included in OpenCL framework 4105. Source code may be compiled offline prior to executing an application or online during execution of an application, in at least one embodiment. In contrast to CUDA and ROCm, OpenCL applications in at least one embodiment may be compiled online by compiler 4104, which is included to be representative of any number of compilers that may be used to compile source code and/or IR code, such as Standard Portable Intermediate Representation ("SPIR-V") code, into binary code. Alternatively, in at least one embodiment, OpenCL applications may be compiled offline, prior to execution of such applications.

Figure 42:
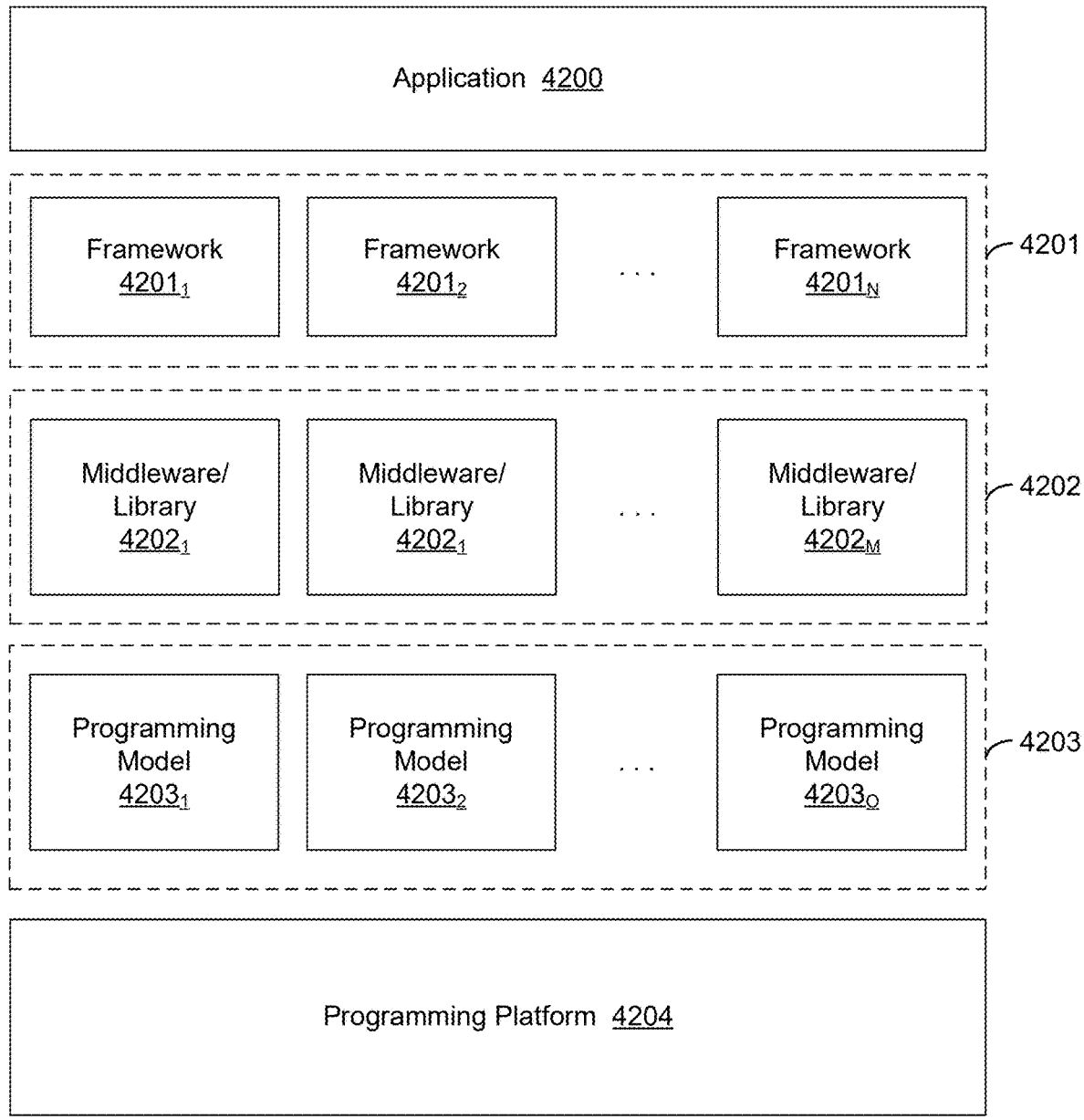
FIG. 42 illustrates software that is supported by a programming platform, in accordance with at least one embodiment.

FIG. 42 illustrates software that is supported by a programming platform, in accordance with at least one embodiment. In at least one embodiment, a programming platform 4204 is configured to support various programming models 4203, middlewares and/or libraries 4202, and frameworks 4201 that an application 4200 may rely upon. In at least one embodiment, application 4200 may be an AI/ML application implemented using, for example, a deep learning framework such as MXNet, PyTorch, or TensorFlow, which may rely on libraries such as cuDNN, NVIDIA Collective Communications Library ("NCCL"), and/or NVIDA Developer Data Loading Library ("DALI") CUDA libraries to provide accelerated computing on underlying hardware.

In at least one embodiment, programming platform 4204 may be one of a CUDA, ROCm, or OpenCL platform described above in conjunction with FIG. 33, FIG. 34, and FIG. 35, respectively. In at least one embodiment, programming platform 4204 supports multiple programming models 4203, which are abstractions of an underlying computing system permitting expressions of algorithms and data structures. Programming models 4203 may expose features of underlying hardware in order to improve performance, in at least one embodiment. In at least one embodiment, programming models 4203 may include, but are not limited to, CUDA, HIP, OpenCL, C++ Accelerated Massive Parallelism ("C++ AMP"), Open Multi-Processing ("OpenMP"), Open Accelerators ("OpenACC"), and/or Vulcan Compute.

In at least one embodiment, libraries and/or middlewares 4202 provide implementations of abstractions of programming models 4204. In at least one embodiment, such libraries include data and programming code that may be used by computer programs and leveraged during software development. In at least one embodiment, such middlewares include software that provides services to applications beyond those available from programming platform 4204. In at least one embodiment, libraries and/or middlewares 4202 may include, but are not limited to, cuBLAS, cuFFT, cuRAND, and other CUDA libraries, or rocBLAS, rocFFT, rocRAND, and other ROCm libraries. In addition, in at least one embodiment, libraries and/or middlewares 4202 may include NCCL and ROCm Communication Collectives Library ("RCCL") libraries providing communication routines for GPUs, a MIOpen library for deep learning acceleration, and/or an Eigen library for linear algebra, matrix and vector operations, geometrical transformations, numerical solvers, and related algorithms.

In at least one embodiment, application frameworks 4201 depend on libraries and/or middlewares 4202. In at least one embodiment, each of application frameworks 4201 is a software framework used to implement a standard structure of application software. An AI/ML application may be implemented using a framework such as Caffe, Caffe2, TensorFlow, Keras, PyTorch, or MxNet deep learning frameworks, in at least one embodiment.

Figure 43:
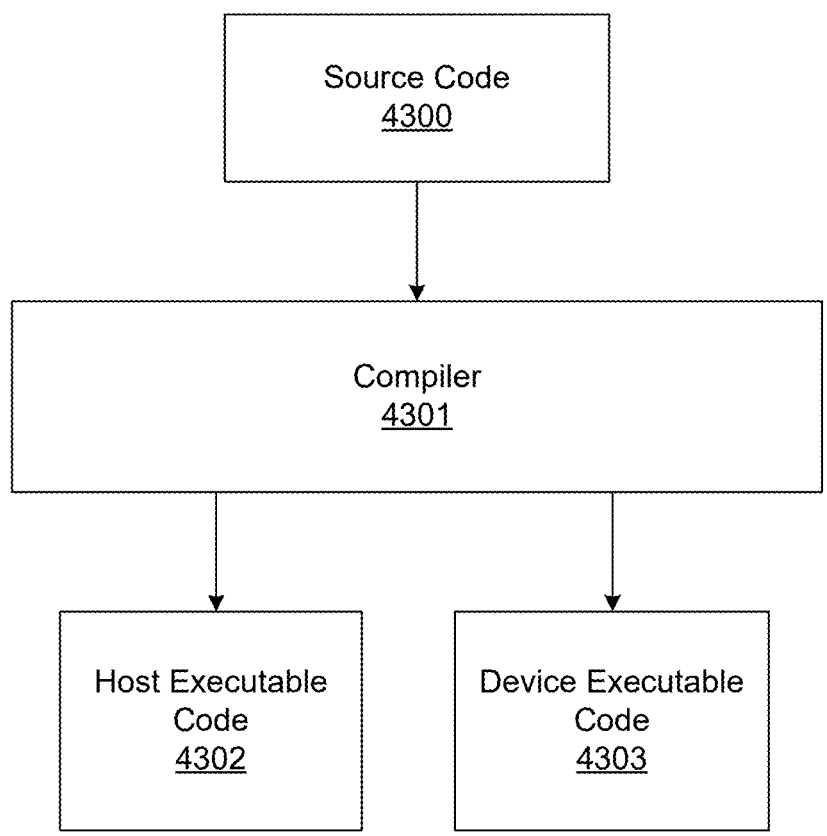
FIG. 43 illustrates compiling code to execute on programming platforms of FIGS. 32-35, in accordance with at least one embodiment.

FIG. 43 illustrates compiling code to execute on one of programming platforms of FIGS. 38-41, in accordance with at least one embodiment. In at least one embodiment, a compiler 4301 receives source code 4300 that includes both host code as well as device code. In at least one embodiment, complier 4301 is configured to convert source code 4300 into host executable code 4302 for execution on a host and device executable code 4303 for execution on a device. In at least one embodiment, source code 4300 may either be compiled offline prior to execution of an application, or online during execution of an application.

In at least one embodiment, source code 4300 may include code in any programming language supported by compiler 4301, such as C++, C, Fortran, etc. In at least one embodiment, source code 4300 may be included in a single-source file having a mixture of host code and device code, with locations of device code being indicated therein. In at least one embodiment, a single-source file may be a .cu file that includes CUDA code or a .hip.cpp file that includes HIP code. Alternatively, in at least one embodiment, source code 4300 may include multiple source code files, rather than a single-source file, into which host code and device code are separated.

In at least one embodiment, compiler 4301 is configured to compile source code 4300 into host executable code 4302 for execution on a host and device executable code 4303 for execution on a device. In at least one embodiment, compiler 4301 performs operations including parsing source code 4300 into an abstract system tree (AST), performing optimizations, and generating executable code. In at least one embodiment in which source code 4300 includes a single-source file, compiler 4301 may separate device code from host code in such a single-source file, compile device code and host code into device executable code 4303 and host executable code 4302, respectively, and link device executable code 4303 and host executable code 4302 together in a single file, as discussed in greater detail below with respect to FIG. 26.

In at least one embodiment, host executable code 4302 and device executable code 4303 may be in any suitable format, such as binary code and/or IR code. In a case of CUDA, host executable code 4302 may include native object code and device executable code 4303 may include code in PTX intermediate representation, in at least one embodiment. In a case of ROCm, both host executable code 4302 and device executable code 4303 may include target binary code, in at least one embodiment.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, a number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium. In at least one embodiment, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors— in at least one embodiment, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, in at least one embodiment, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or inter-process communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
a heat exchange device that exchanges heat between a first portion of a first coolant associated with a first cooling loop and a second coolant in a second cooling loop, the first portion of the first coolant and the second coolant to flow through the heat exchange device, wherein a second portion of the first coolant associated with the first cooling loop absorbs heat from one or more first components of a server, wherein the second coolant absorbs heat from one or more second components of the server, wherein the first cooling loop comprises one or more first manifolds to distribute the second portion of the first coolant to the server, and wherein the second cooling loop comprises one or more second manifolds to distribute the second coolant to the server.

2. The system of claim 1, wherein the one or more first components have a first power density that is greater than a second power density of the one or more second components.

3. The system of claim 1, further comprising:
a cooling device that receives the first coolant and transfers heat from the first coolant to an external environment external to a data center in which the server operates.

4. The system of claim 1, wherein the one or more first components are thermally coupled to one or more cold plates through which the first coolant flows, and wherein the second portion of the first coolant absorbs heat from the one or more first components via the one or more cold plates.

5. The system of claim 4, wherein the one or more second components and the one or more cold plates are immersed in the second coolant in a sealed environment through which the second coolant flows, and wherein the second coolant absorbs heat directly from the one or more second components.

6. The system of claim 5, wherein the sealed environment is a hermetically sealed chassis that houses the one or more first components and the one or more second components.

7. The system of claim 4, wherein the second coolant is a dielectric liquid coolant.

8. The system of claim 1, wherein the server is fluidly coupled to the one or more first manifolds via one or more first quick-disconnecting couplings, and wherein the server is fluidly coupled to the one or more second manifolds via one or more second quick-disconnecting couplings.

9. A method comprising:
exchanging heat, in a heat exchange device, between a first portion of a first coolant associated with a first cooling loop and a second coolant in a second cooling loop, the first portion of the first coolant and the second coolant to flow through the heat exchange device, wherein a second portion of the first coolant associated with the first cooling loop absorbs heat from one or more first components of a server, wherein the second coolant absorbs heat from one or more second components of the server, wherein the first cooling loop comprises one or more first manifolds to distribute the second portion of the first coolant to the server, and wherein the second cooling loop comprises one or more second manifolds to distribute the second coolant to the server.

10. The method of claim 9, wherein the one or more first components have a first power density that is greater than a second power density of the one or more second components.

11. The method of claim 9, further comprising:
receiving the first coolant at an external cooling device; and
transferring, by the external cooling device, heat from the first coolant to an external environment external to a data center in which the server operates.

12. The method of claim 9 wherein the one or more first components are thermally coupled to one or more cold plates through which the first coolant flows and wherein the second portion of the first coolant absorbs heat from the one or more first components via the one or more cold plates.

13. The method of claim 12 wherein the one or more second components and one or more cold plates are immersed in the second coolant in a sealed environment through which the second coolant flows and wherein the second coolant absorbs heat from the one or more second components.

14. The method of claim 13 wherein the sealed environment is a hermetically sealed chassis that houses the one or more first components and the one or more second components.

15. The method of claim 14, wherein the second coolant is a dielectric liquid coolant.

16. A system comprising: an external cooling device that supplies a first liquid coolant to a first cooling loop, wherein a first portion of the first liquid coolant in the first cooling loop absorbs heat from one or more first components of a server; and a heat transfer device that supplies a second liquid coolant to a second cooling loop, wherein the second liquid coolant in the second cooling loop absorbs heat from one or more second components of the server; wherein the heat transfer device receives a second portion of the first liquid coolant and transfers heat from the second liquid coolant to the second portion of the first liquid coolant, and wherein the external cooling device transfers heat from the first liquid coolant to an external environment, wherein the first cooling loop comprises one or more first manifolds to distribute the first portion of the first liquid coolant to the server, and wherein the second cooling loop comprises one or more second manifolds to distribute the second liquid coolant to the server.

17. The system of claim 16, wherein the one or more first components have a first power density that is greater than a second power density of the one or more second components.

18. The system of claim 16, wherein the one or more first components are thermally coupled to one or more cold plates through which the first portion of the first liquid coolant flows and wherein the first portion of the first liquid coolant absorbs heat from the one or more first components via the one or more cold plates.

19. The system of claim 18, wherein the one or more second components and the one or more cold plates are immersed in the second liquid coolant in a sealed environment through which the second liquid coolant flows and wherein the second liquid coolant absorbs heat directly from the one or more second components.

20. The system of claim 19, wherein the sealed environment is a hermetically sealed chassis that houses the one or more first components and the one or more second components.

* * * * *